US012622014B2

(12) United States Patent
Or-Bach

(10) Patent No.: US 12,622,014 B2
(45) Date of Patent: May 5, 2026

(54) 3D SEMICONDUCTOR DEVICE AND STRUCTURE WITH METAL LAYERS AND A POWER DELIVERY PATH

(71) Applicant: Monolithic 3D Inc., Klamath Falls, OR (US)

(72) Inventor: Zvi Or-Bach, Haifa (IL)

(73) Assignee: Monolithic 3D Inc., Allen, TX (US)

( * ) Notice: Subject to any disclaimer, the term of this patent is extended or adjusted under 35 U.S.C. 154(b) by 0 days.

(21) Appl. No.: 19/245,349

(22) Filed: Jun. 22, 2025

(65) Prior Publication Data

US 2025/0318173 A1 Oct. 9, 2025

Related U.S. Application Data

(63) Continuation of application No. 18/778,978, filed on Jul. 20, 2024, now Pat. No. 12,369,347, which is a (Continued)

(51) Int. Cl.
*H10D 30/60* (2025.01)
*G11C 11/404* (2006.01)
(Continued)

(52) U.S. Cl.
CPC ........... *H10D 30/60* (2025.01); *G11C 11/404* (2013.01); *G11C 11/4097* (2013.01); *G11C 16/02* (2013.01); *H10B 10/12* (2023.02); *H10B 12/20* (2023.02); *H10B 43/20* (2023.02); *H10B 63/30* (2023.02); *H10B 69/00* (2023.02); *H10D 30/711* (2025.01); *G11C 11/412* (2013.01);
(Continued)

(58) Field of Classification Search
CPC .. H10D 30/60; H10D 30/711; H10D 30/6735; H10D 30/6757; H10D 86/201; G11C 11/404; G11C 11/4097; G11C 16/02; G11C 11/412; G11C 16/0483; G11C 2213/71; G11C 13/0002; G11C 16/0408; G11C 16/0466; G11C 11/4091; H10B 10/12; H10B 12/20; H10B 43/20; H10B 63/30; H10B 69/00; H10B 63/845; H10B 10/125
See application file for complete search history.

(56) References Cited

U.S. PATENT DOCUMENTS

| | | | | | |
|---|---|---|---|---|---|
| 11,087,995 | B1 * | 8/2021 | Or-Bach | ................ | H10D 89/10 |
| 11,164,811 | B2 * | 11/2021 | Or-Bach | ............... | H10W 20/20 |
| 2025/0316648 | A1 * | 10/2025 | Or-Bach | ............... | H10W 70/60 |

* cited by examiner

*Primary Examiner* — Allison Bernstein
(74) *Attorney, Agent, or Firm* — PatentPC PowerPatent; Bao Tran

(57) ABSTRACT

A 3D semiconductor device, the device including: a first level including single crystal first transistors, a first metal layer, and a first isolation layer; a second level including second transistors and a second isolation layer, where the first level is overlaid by the second level; a third level including single crystal third transistors, where the second level is overlaid by the third level, where the third level includes a third isolation layer, and where the third level is bonded to the second level; a power delivery path to the second transistors, where at least a portion of the power delivery path is connected to at least one of the first transistors; and a plurality of capacitors, where the single crystal first transistors or the second transistors include at least two FinFet transistors, and where two of the at least two FinFet transistors have different threshold voltages (Vt).

20 Claims, 125 Drawing Sheets

Gate dielectric 326   Silicon oxide 330
BL contact 336   Gate electrode 334
n+ Silicon 328   BL 338

View along II plane

View along III plane

Related U.S. Application Data continuation-in-part of application No. 18/429,202, filed on Jan. 31, 2024, now Pat. No. 12,094,965, which is a continuation-in-part of application No. 18/388,852, filed on Nov. 12, 2023, now Pat. No. 11,935,949, which is a continuation-in-part of application No. 18/227,183, filed on Jul. 27, 2023, now Pat. No. 11,869,965, which is a continuation-in-part of application No. 18/125,053, filed on Mar. 22, 2023, now Pat. No. 11,757,030, which is a continuation-in-part of application No. 18/092,727, filed on Jan. 3, 2023, now Pat. No. 11,677,021, which is a continuation-in-part of application No. 17/961,565, filed on Oct. 7, 2022, now Pat. No. 11,575,038, which is a continuation of application No. 17/384,992, filed on Jul. 26, 2021, now Pat. No. 11,515,413, which is a continuation of application No. 17/222,784, filed on Apr. 5, 2021, now Pat. No. 11,121,246, which is a continuation of application No. 17/176,146, filed on Feb. 15, 2021, now Pat. No. 11,004,967, which is a continuation of application No. 16/226,628, filed on Dec. 19, 2018, now Pat. No. 10,964,807, which is a continuation of application No. 15/727,592, filed on Oct. 7, 2017, now Pat. No. 10,355,121, which is a continuation of application No. 15/351,389, filed on Nov. 14, 2016, now Pat. No. 9,799,761, which is a continuation of application No. 14/506,160, filed on Oct. 3, 2014, now Pat. No. 9,496,271, which is a continuation of application No. 13/792,202, filed on Mar. 11, 2013, now Pat. No. 8,902,663.

(51) Int. Cl.

| | |
|---|---|
| *G11C 11/4097* | (2006.01) |
| *G11C 11/412* | (2006.01) |
| *G11C 16/02* | (2006.01) |
| *G11C 16/04* | (2006.01) |
| *H10B 10/00* | (2023.01) |
| *H10B 12/00* | (2023.01) |
| *H10B 43/20* | (2023.01) |
| *H10B 63/00* | (2023.01) |
| *H10B 69/00* | (2023.01) |
| *H10D 30/69* | (2025.01) |

(52) U.S. Cl.

CPC ...... *G11C 16/0483* (2013.01); *G11C 2213/71* (2013.01)

(a) "1" state

Source 104
Gate 106
Drain 108
Box 118
Excess holes 102

(b) "0" state

Source 110
Gate 112
Drain 114
Box 116
Floating Body 120

(c) Current sensing

Drain current (A) 134
Gate voltage (V) 136
"1" state
"0" state
130
Id

Symbols p- Silicon 321

Silicon oxide 322

Silicon Oxide

Peripheral circuits I

Symbols

Gate electrode 324

Gate dielectric 326 p- Silicon 321

Silicon oxide 322

Symbols

Gate electrode 324

Gate dielectric 326 n+ Silicon 328

Silicon oxide 322

Silicon Oxide

Peripheral circuits 302

Gate dielectric 326    Silicon oxide 330

BL contact 336    Gate electrode 334 n+ Silicon 328    BL 338

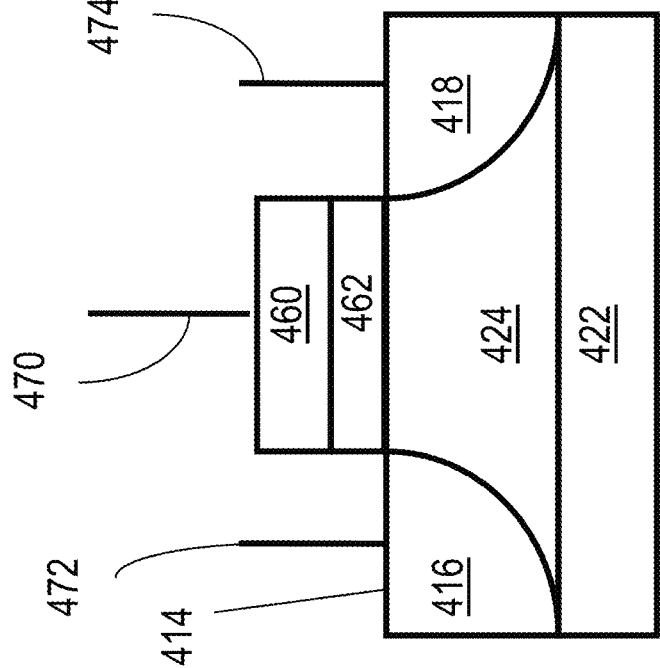
Fig. 4A

Symbols n+ Silicon regions 728

Silicon oxide 722/706

Gate electrode material

Gate dielectric 762

Structure before connections to terminals/interconnect

Isolation Dielectric 706

Peripheral circuits 702

712

712

760

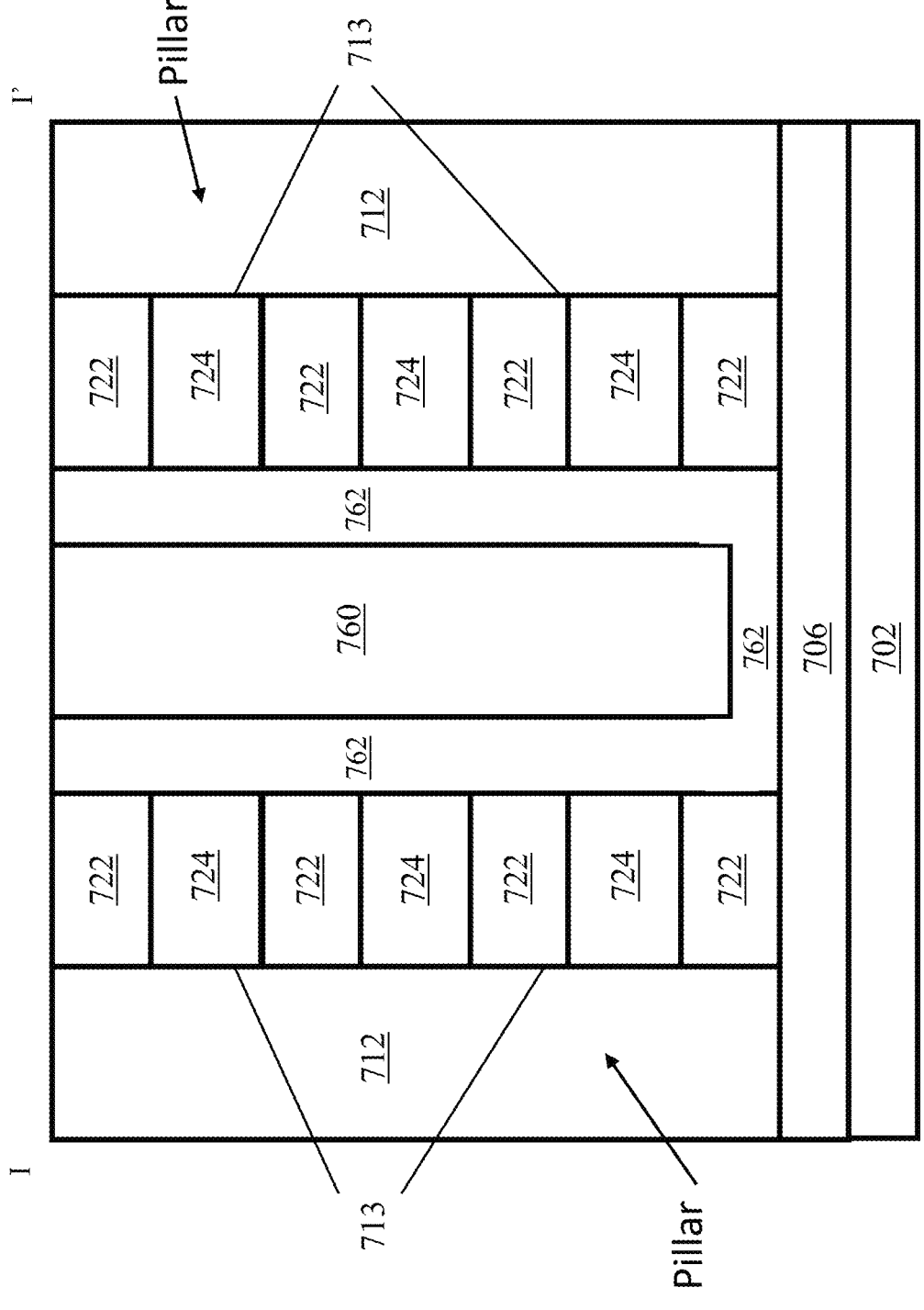
Fig. 7B – Cross Sectional View I of Fig. 7A

Fig. 7C – Cross Sectional View II of Fig. 7A

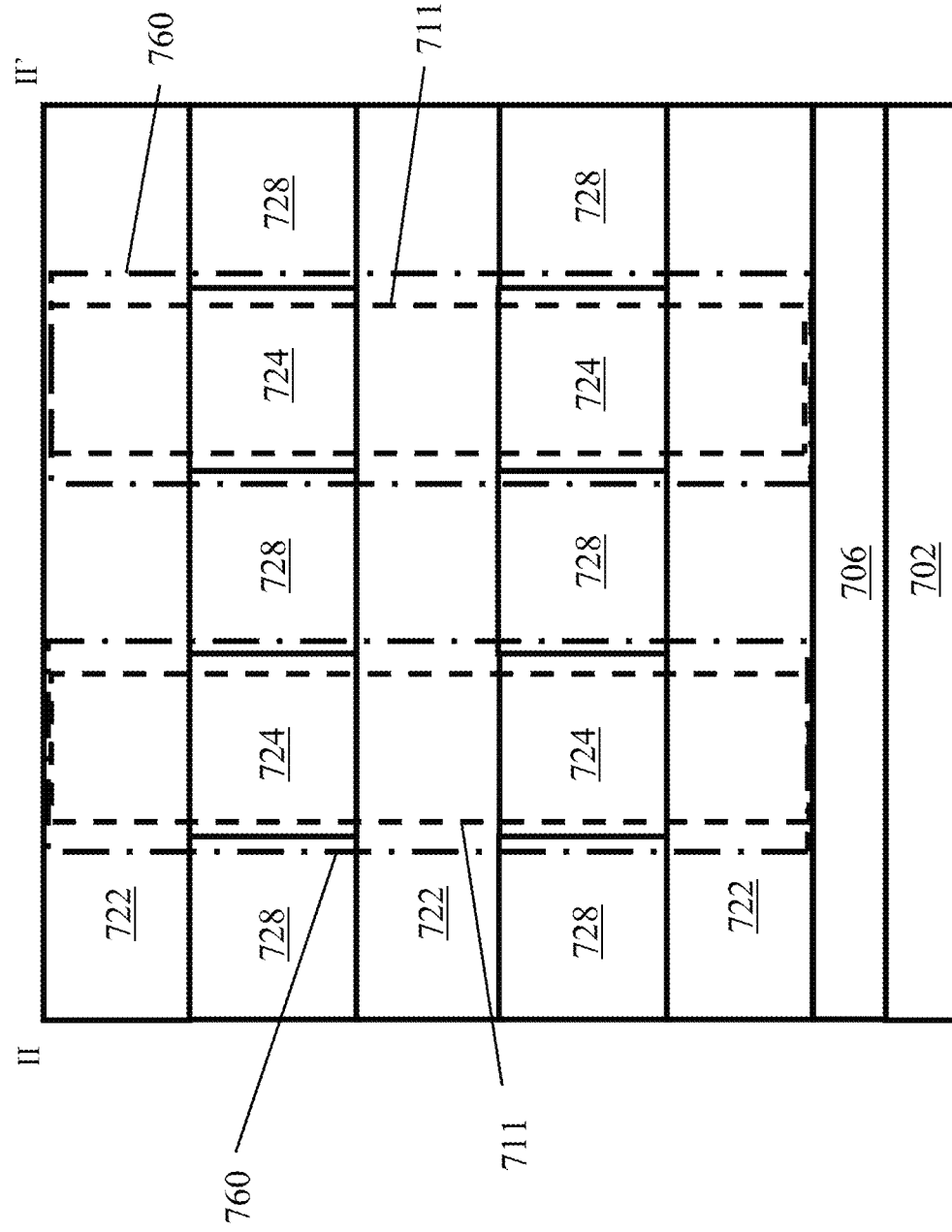
Fig. 7D — Cross Sectional View II of Fig. 7A, shadowed regions

Isolation Dielectric 706

Peripheral circuits 702

Symbols p- Silicon 721

Silicon oxide 722

711

760

711

712

Isolation Dielectric 706

Peripheral circuits 702

712

Symbols

Gate electrode material

Gate dielectric 762 n+ Silicon regions 728

Silicon oxide 722/706

750

760

760

752

712

712

Isolation Dielectric 706

Peripheral circuits 702

Symbols

Gate electrode
material

Gate dielectric 762

Back-Bias Connectivity 752 n+ Silicon regions 728

Silicon oxide 722/706

Gate Connectivity 750

711

760

711   711

711 724

711 724

760

724

Isolation Dielectric 706

Peripheral circuits 702

712

792

712

Symbols

Gate electrode
material

Gate dielectric 762 n+ Silicon regions 728

Silicon oxide 722/706 p- Silicon regions 724

Symbols n+ Silicon 1021

Silicon oxide 1022

Silicon Oxide

Peripheral circuits 1002

Symbols

Gate electrode 1024

Gate dielectric 1026 n+ Silicon 1021

Silicon oxide 1022

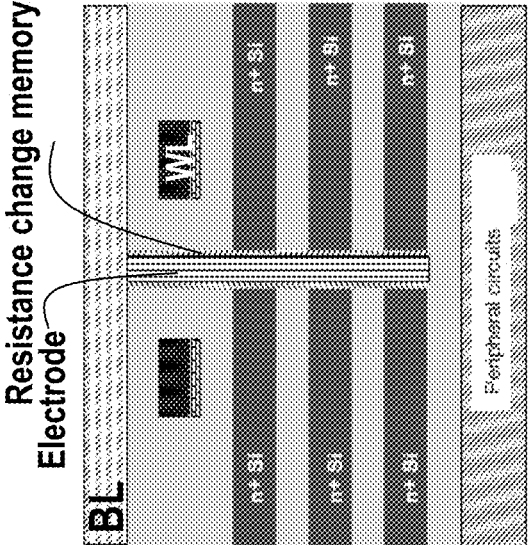
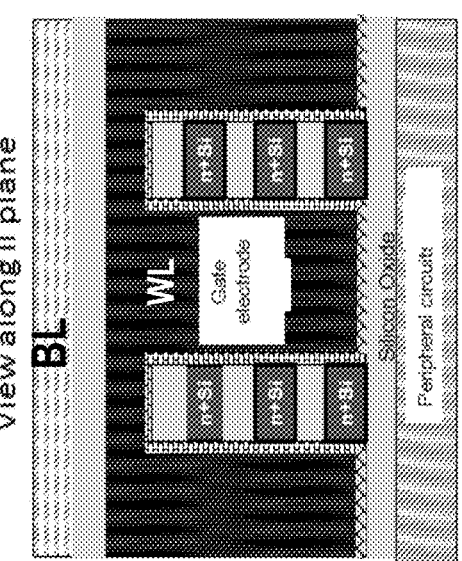
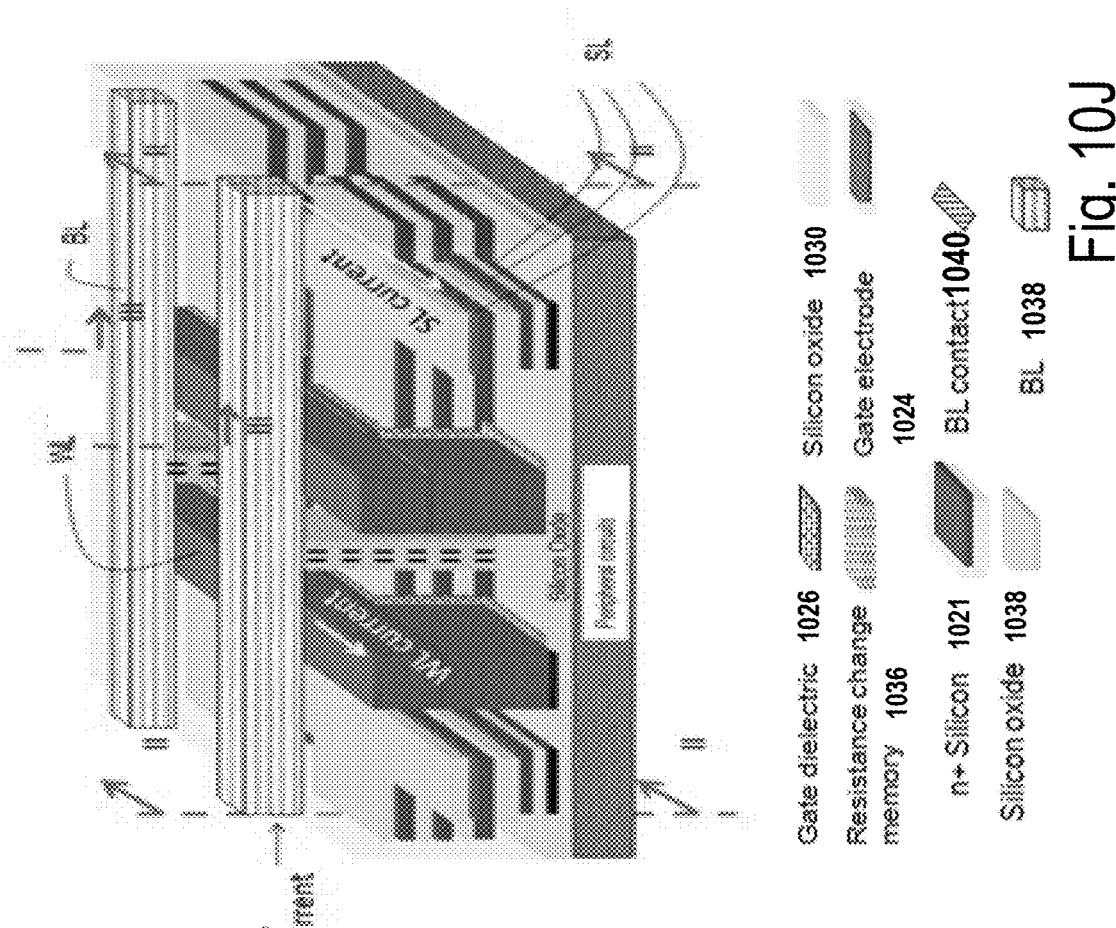
Gate dielectric 1026
Resistance change memory 1036
n+ Silicon 1021
Silicon oxide 1038
Silicon oxide 1030
Gate electrode 1024
BL contact 1040
BL 1038
Fig. 10J Silicon Oxide 1104

Peripheral circuits 1102

Symbols p- Silicon 1121

Silicon oxide 1122

Gate electrode 1124

Gate dielectric 1126

Silicon Oxide

Peripheral circuits 1102

Silicon Oxide

Peripheral circuits 1102

Symbols

Gate electrode 1124

Gate dielectric 1126 n+ Silicon 1128

Silicon oxide 1122

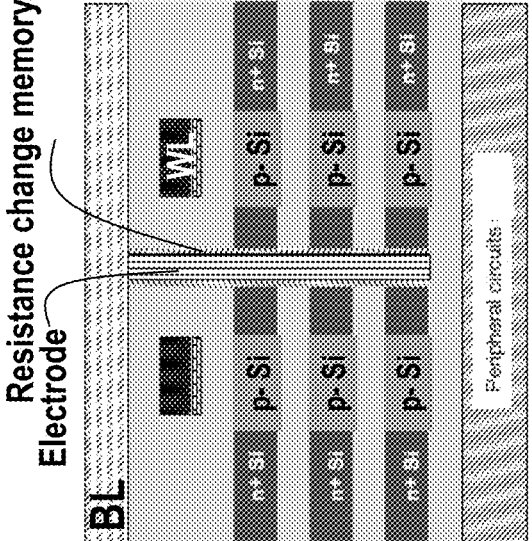
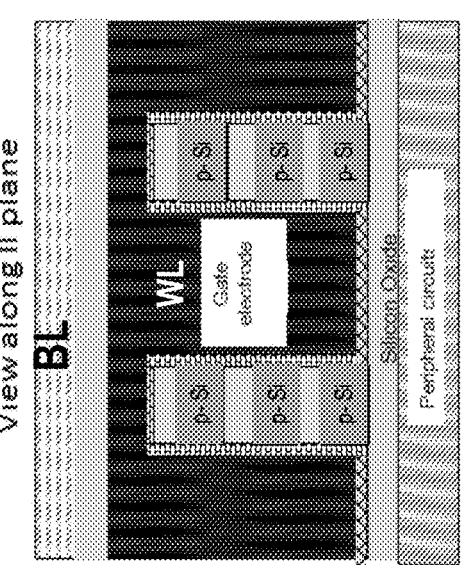
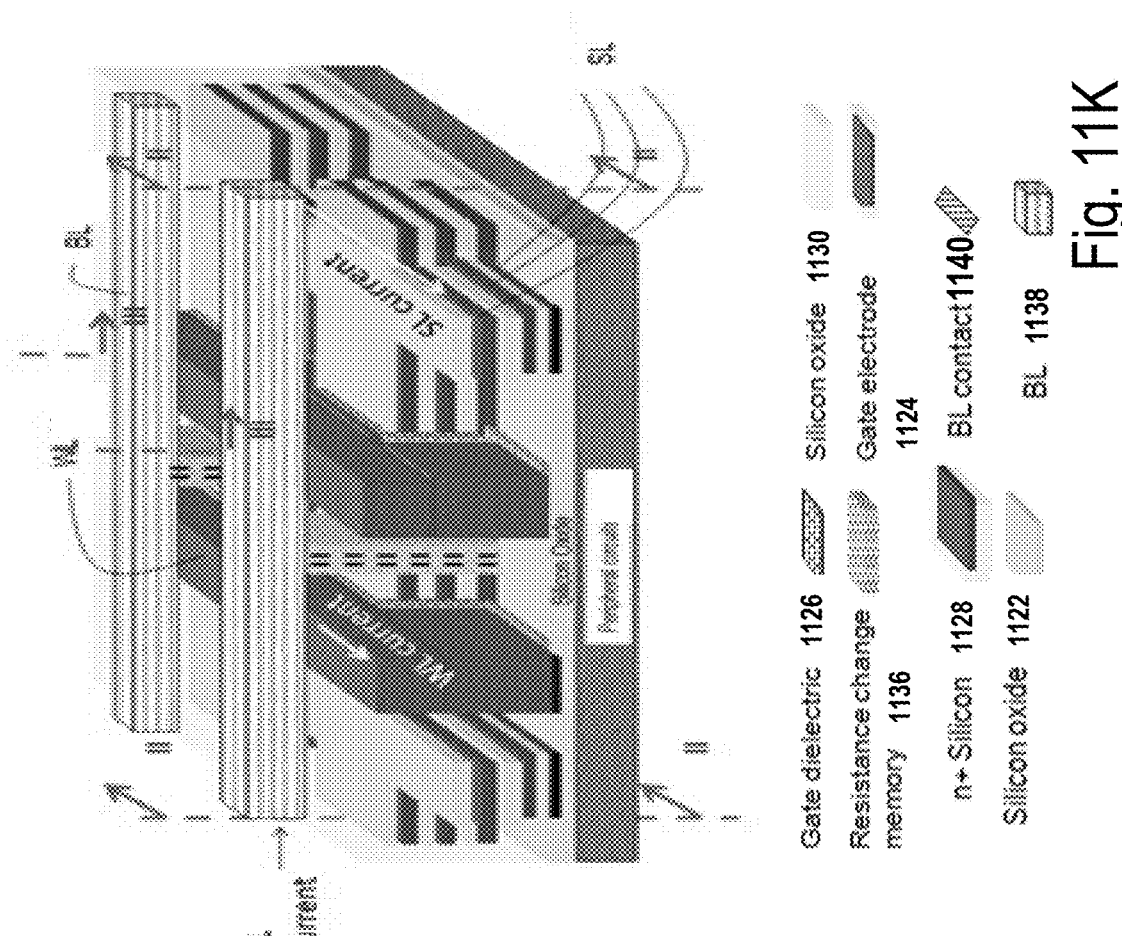
Gate dielectric　1126　　Silicon oxide　1130
Resistance change
memory　1136　　Gate electrode
1124
n+ Silicon　1128　　BL contact 1140
Silicon oxide　1122　　BL　1138
Fig. 11K p- Silicon 1206

Silicon Oxide 1208

Silicon Oxide 1204

Peripheral circuits 1202 p- 1218 n+ 1216 n+ p- n+ p- n+

Silicon Oxide

Silicon Oxide

Peripheral circuits 1202

Third Si/SiO₂ layer 1226

Second Si/SiO₂ layer 1224

First Si/SiO₂ layer 1222

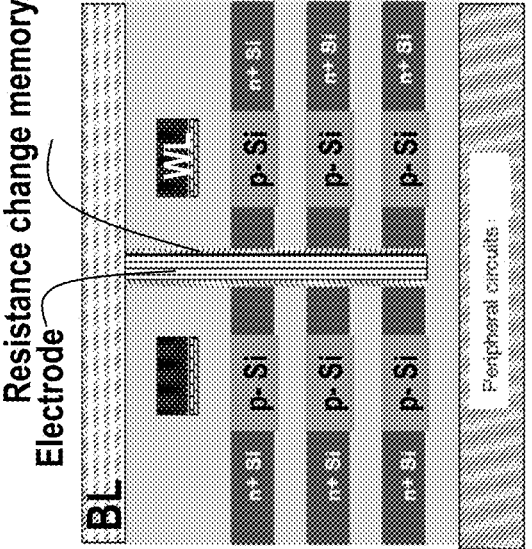
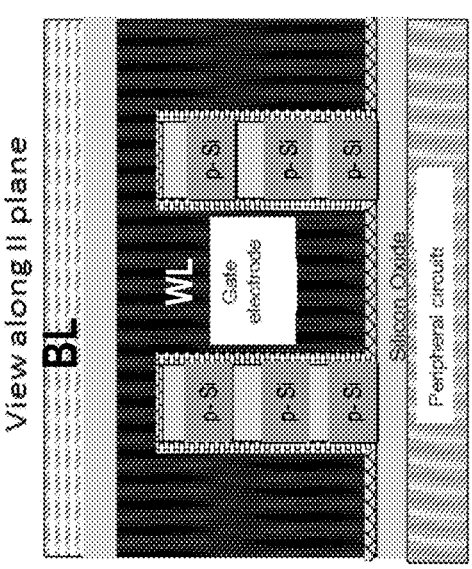
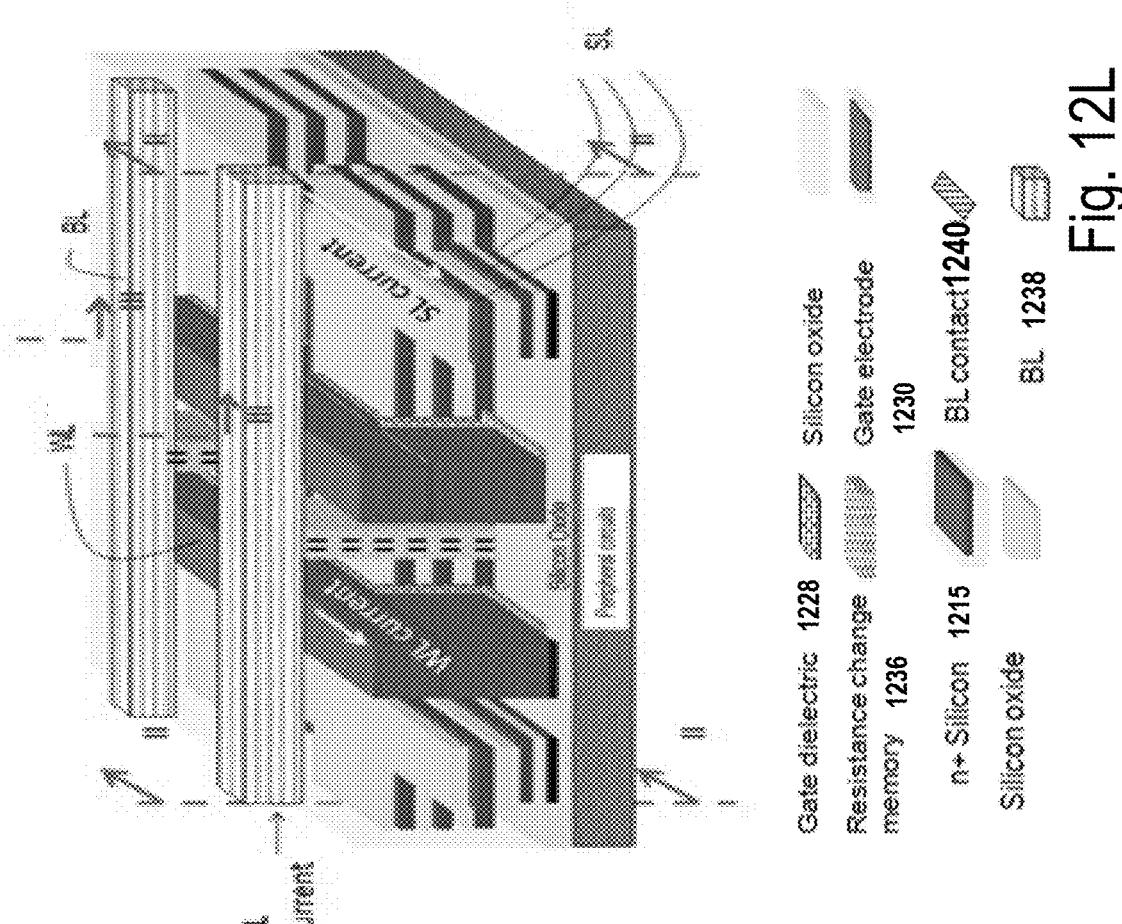
Gate dielectric  1228       Silicon oxide
Resistance change
memory  1236             Gate electrode
                         1230
n+ Silicon  1215         BL contact 1240
Silicon oxide            BL  1238
Fig. 12L

SL 1324

Res. change material 1322

BL 1318

Electrode 1326

Periphery 1306

WL 1320

2nd layer 1316

1st layer 1314

Periphery 1306

Silicon Oxide 1504

Peripheral circuits 1502

Symbols n+ Silicon

Silicon oxide

Silicon Oxide

Peripheral circuits 1502

Select gates   1538

NAND string   1536

Silicon Oxide

Peripheral circuits   1502

Symbols

Gate electrode   1524

Gate dielectric   1526 n+ Silicon

Silicon oxide

Doped Si 1602
Oxide 1604
Periphery 1606

Doped Si
Oxide
Doped Si
Oxide
Doped Si 1602
Oxide 1604
Periphery 1606

Oxide 1604
Doped Si 1602

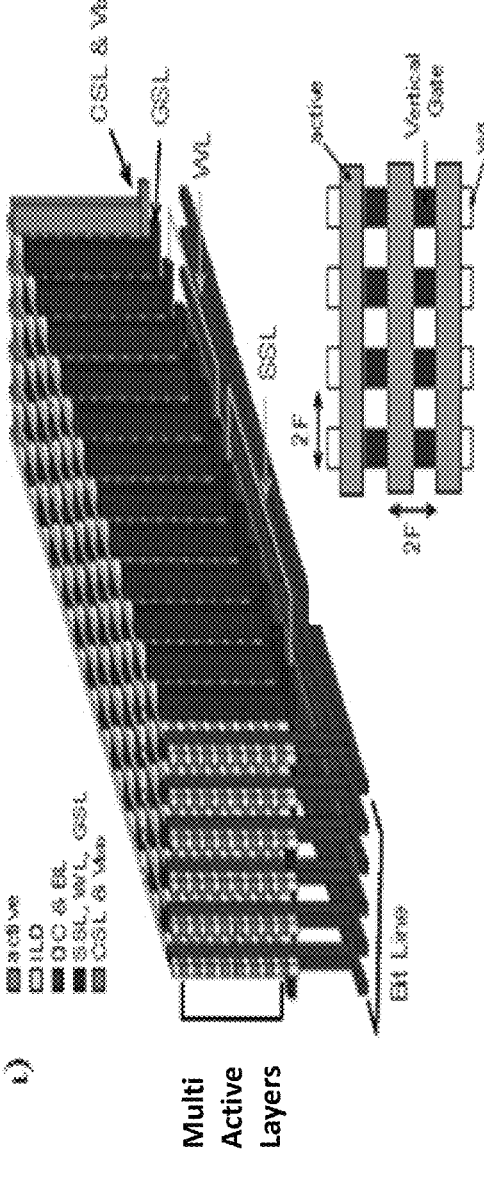
Architecture from "Multi-layered Vertical Gate NAND Flash overcoming stacking limit for terabit density storage", Symposium on VLSI Technology, 2009 by W. Kim, S. Choi, et al.
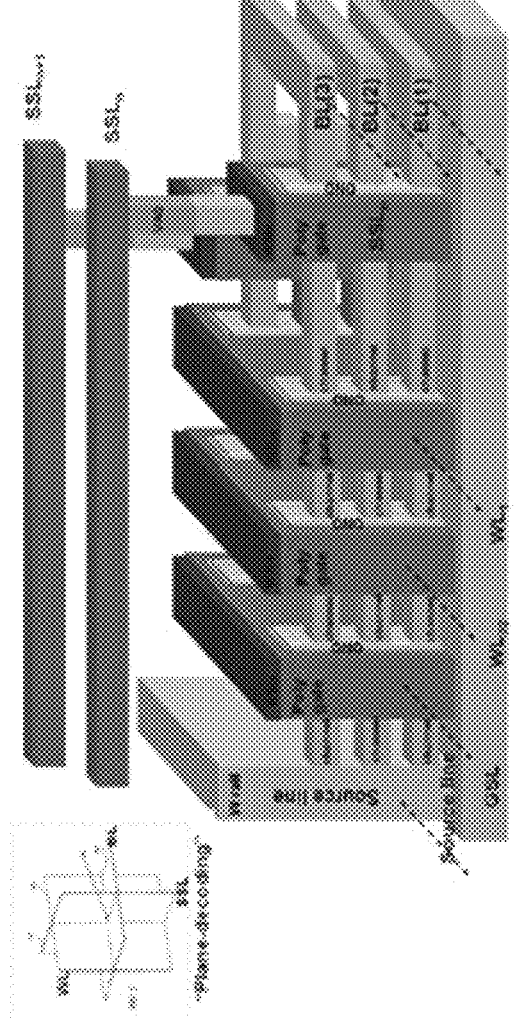
Architecture from "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al.
Fig. 16D

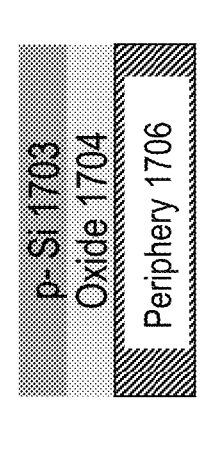
Oxide 1704
p-Si 1702
Fig. 17A
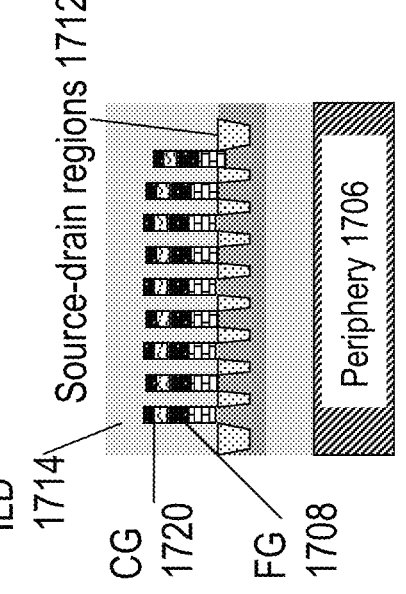
p-Si 1703
Oxide 1704
Periphery 1706
Fig. 17B
FG 1708
Tunnel oxide 1710
p-Si 1703
Oxide 1704
Periphery 1706
Fig. 17C
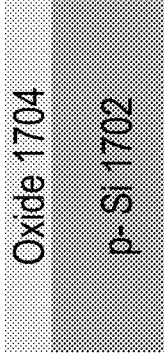
Source-drain regions 1712
ILD 1714
CG 1720
FG 1708
Periphery 1706
Fig. 17D Contacts 1718

Periphery 1706

2nd NAND string 1716

1st NAND string 1714

Periphery 1706 n+ Silicon 1816

Silicon Oxide 1808

Silicon Oxide 1804

Peripheral circuits 1802

Tunnel oxide 1808 n+ Silicon 1807

Silicon Oxide

Peripheral circuits 1802

Polysilicon for floating gate 1810

Silicon oxide layer, shown transparent for clarity n+ Silicon 1807

Polysilicon for floating gate 1810

Silicon Oxide

Peripheral circuits 1802

Silicon oxide layer, shown transparent for clarity n+ Silicon 1807

Polysilicon for floating gate 1811

Silicon Oxide

Peripheral circuits 1802

Figures 19A, 19B:
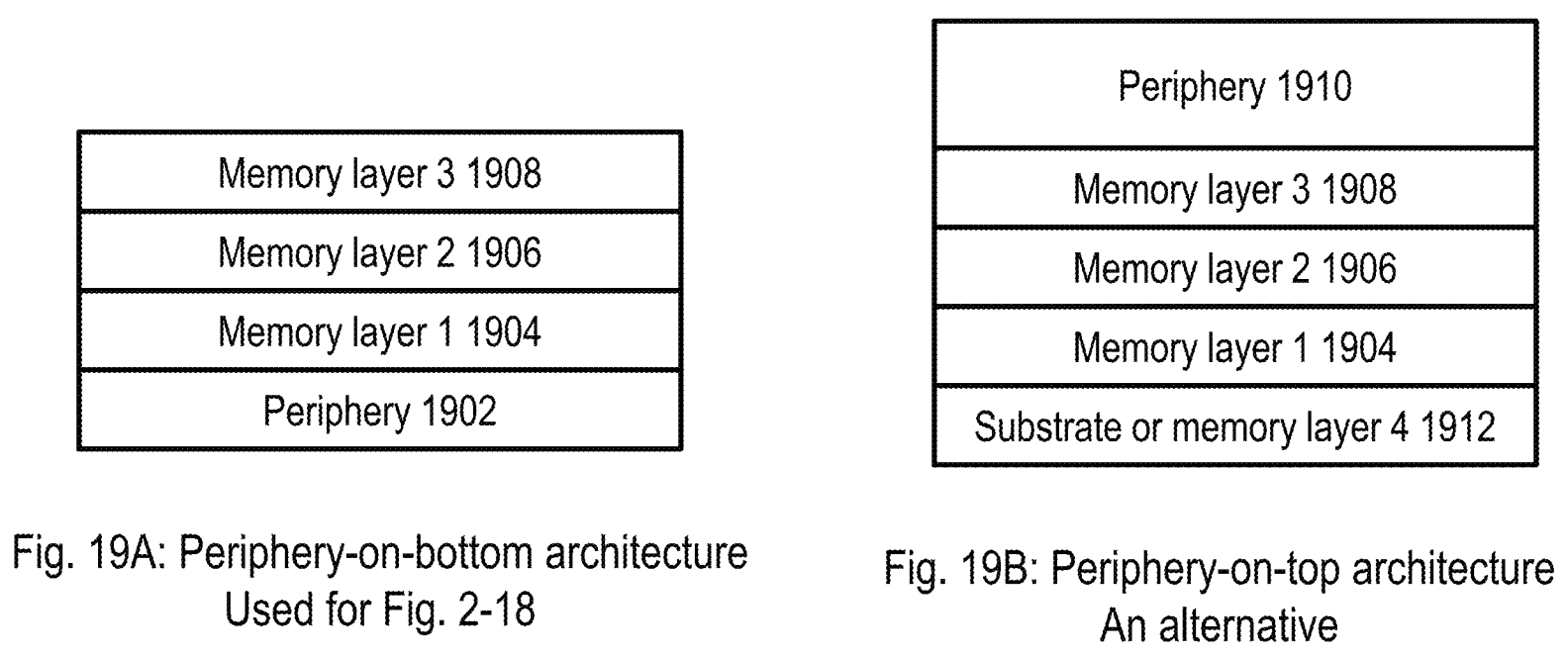

| Periphery 1910 | Memory layer 3 1908 | Memory layer 2 1906 | Memory layer 1 1904 | Substrate or memory layer 4 1912 |

Fig. 19B: Periphery-on-top architecture
An alternative

| Memory layer 3 1908 | Memory layer 2 1906 | Memory layer 1 1904 | Periphery 1902 |

Fig. 19A: Periphery-on-bottom architecture
Used for Fig. 2-18

Silicon oxide 2130

SL 2134

WL 2132

Electrode/BL contact 2140

Resistance change memory 2136

SL current path

Silicon Oxide

Peripheral circuits 2102

BL contact 2140 n+ Silicon 2110

Silicon oxide 2108

Gate dielectric 2126

Silicon oxide 2130

Gate electrode 2124

Resistance change memory 2136

BL 2138

WL 2132

BL current

SL current

SL 2134

Silicon Oxide

Peripheral circuits 2102

Gate dielectric 2126

Silicon oxide 2130 n+ Silicon 2110

BL contact 2140

Resistance change memory 2136

Gate electrode 2124

Silicon oxide 2108

BL 2138

2208

2206

Silicon Oxide

Silicon Oxide

Silicon Oxide

Silicon Oxide 2204

Silicon substrate without circuits 2202

2208

2210

Silicon Oxide

Silicon Oxide

Silicon Oxide

Silicon Oxide 2204

Silicon substrate without circuits 2202

3D SEMICONDUCTOR DEVICE AND STRUCTURE WITH METAL LAYERS AND A POWER DELIVERY PATH

CROSS REFERENCE TO RELATED APPLICATIONS

This application is a continuation-in-part of U.S. patent application Ser. No. 18/778,978, filed on Jul. 20, 2024; which is a continuation-in-part of U.S. patent application Ser. No. 18/429,202, filed on Jan. 31, 2024, now U.S. Pat. No. 12,094,965, issued on Sep. 17, 2024; which is a continuation-in-part of U.S. patent application Ser. No. 18/388, 852, filed on Nov. 12, 2023, now U.S. Pat. No. 11,935,949, issued on Mar. 19, 2024; which is a continuation-in-part of U.S. patent application Ser. No. 18/227,183, filed on Jul. 27, 2023, now U.S. Pat. No. 11,869,965, issued on Jan. 9, 2024; which is a continuation-in-part of U.S. patent application Ser. No. 18/125,053, filed on Mar. 22, 2023, now U.S. Pat. No. 11,757,030, issued on Sep. 12, 2023; which is a continuation-in-part of U.S. patent application Ser. No. 18/092, 727, filed on Jan. 3, 2023, now U.S. Pat. No. 11,677,021, issued on Jun. 13, 2023; which is a continuation-in-part of U.S. patent application Ser. No. 17/961,565, filed on Oct. 7, 2022, now U.S. Pat. No. 11,575,038, issued on Feb. 7, 2023; which is a continuation of U.S. patent application Ser. No. 17/384,992, filed on Jul. 26, 2021, now U.S. Pat. No. 11,515,413, issued on Nov. 29, 2022; which is a continuation of U.S. patent application Ser. No. 17/222,784, filed on Apr. 5, 2021, now U.S. Pat. No. 11,121,246, issued on Sep. 14, 2021; which is a continuation of U.S. patent application Ser. No. 17/176,146, filed on Feb. 15, 2021, now U.S. Pat. No. 11,004,967, issued on May 11, 2021; which is a continuation of U.S. patent application Ser. No. 16/226,628, filed on Dec. 19, 2018, now U.S. Pat. No. 10,964,807, issued on Mar. 30, 2021; which is a continuation of U.S. patent application Ser. No. 15/727,592, filed on Oct. 7, 2017, now U.S. Pat. No. 10,355,121, issued on Jul. 16, 2019; which is a continuation of U.S. patent application Ser. No. 15/351,389, filed on Nov. 14, 2016, now U.S. Pat. No. 9,799,761, issued on Oct. 24, 2017; which is a continuation of U.S. patent application Ser. No. 14/506,160, filed on Oct. 3, 2014, now U.S. Pat. No. 9,496,271, issued on Nov. 15, 2016: which is a continuation of U.S. patent application Ser. No. 13/792,202, which was filed on Mar. 11, 2013, now U.S. Pat. No. 8,902,663, issued on Dec. 2, 2014; the entire contents of all of the foregoing are incorporated herein by reference.

BACKGROUND OF THE INVENTION

1. Field of the Invention

This invention relates to the field of monolithic 3D integration to semiconductor chips performing logic and/or memory functions.

2. Discussion of Background Art

Over the past 40 years, the microelectronic industry has seen a dramatic increase in functionality and performance of Integrated Circuits (ICs). This has largely been due to the phenomenon of "scaling" i.e. component sizes within ICs have been reduced ("scaled") with every successive generation of technology. There are two main classes of components in Complementary Metal Oxide Semiconductor (CMOS) ICs, namely transistors and wires. With "scaling", transistor performance and density typically improve and this has contributed to the previously-mentioned increases in IC performance and functionality. However, wires (interconnects) that connect together transistors degrade in performance with "scaling". The situation today is that wires dominate performance, functionality and power consumption of ICs.

3D stacking of semiconductor chips is one avenue to tackle issues with wires. By arranging transistors in 3 dimensions instead of 2 dimensions (as was the case in the 1990s), one can place transistors in ICs closer to each other. This reduces wire lengths and keeps wiring delay low. However, there are many barriers to practical implementation of 3D stacked chips. These include:

Constructing transistors in ICs typically require high temperatures (higher than ~700° C.) while wiring levels are constructed at low temperatures (lower than ~400° C.). Copper or Aluminum wiring levels, in fact, can get damaged when exposed to temperatures higher than ~400° C. If one would like to arrange transistors in 3 dimensions along with wires, it has the challenge described below. For example, let us consider a 2 layer stack of transistors and wires i.e. Bottom Transistor Layer, above it Bottom Wiring Layer, above it Top Transistor Layer and above it Top Wiring Layer. When the Top Transistor Layer is constructed using Temperatures higher than 700° C., it can damage the Bottom Wiring Layer.

Due to the above mentioned problem with forming transistor layers above wiring layers at temperatures lower than 400° C., the semiconductor industry has largely explored alternative architectures for 3D stacking. In these alternative architectures, Bottom Transistor Layers, Bottom Wiring Layers and Contacts to the Top Layer are constructed on one silicon wafer. Top Transistor Layers, Top Wiring Layers and Contacts to the Bottom Layer are constructed on another silicon wafer. These two wafers are bonded to each other and contacts are aligned, bonded and connected to each other as well. Unfortunately, the size of Contacts to the other Layer is large and the number of these Contacts is small. In fact, prototypes of 3D stacked chips today utilize as few as 10,000 connections between two layers, compared to billions of connections within a layer. This low connectivity between layers is because of two reasons: (i) Landing pad size needs to be relatively large due to alignment issues during wafer bonding. These could be due to many reasons, including bowing of wafers to be bonded to each other, thermal expansion differences between the two wafers, and lithographic or placement misalignment. This misalignment between two wafers limits the minimum contact landing pad area for electrical connection between two layers; (ii) The contact size needs to be relatively large. Forming contacts to another stacked wafer typically involves having a Through-Silicon Via (TSV) on a chip. Etching deep holes in silicon with small lateral dimensions and filling them with metal to form TSVs is not easy. This places a restriction on lateral dimensions of TSVs, which in turn impacts TSV density and contact density to another stacked layer. Therefore, connectivity between two wafers is limited.

It is highly desirable to circumvent these issues and build 3D stacked semiconductor chips with a high-density of connections between layers. To achieve this goal, it is sufficient that one of three requirements must be met: (1) A technology to construct high-performance transistors with processing temperatures below ~400° C.; (2) A technology where standard transistors are fabricated in a pattern, which allows for high density connectivity despite the misalignment between the two bonded wafers; and (3) A chip architecture where process temperature increase beyond 400° C. for the transistors in the top layer does not degrade the characteristics or reliability of the bottom transistors and wiring appreciably. This patent application describes approaches to address options (1), (2) and (3) in the detailed description section. In the rest of this section, some background art that has previously tried to address options (1), (2) and (3) will be described.

U.S. Pat. No. 7,052,941 from Sang-Yun Lee ("S-Y Lee") describes methods to construct vertical transistors above wiring layers at less than 400° C. In these single crystal Si transistors, current flow in the transistor's channel region is in the vertical direction. Unfortunately, however, almost all semiconductor devices in the market today (logic, DRAM, flash memory) utilize horizontal (or planar) transistors due to their many advantages, and it is difficult to convince the industry to move to vertical transistor technology.

A paper from IBM at the Intl. Electron Devices Meeting in 2005 describes a method to construct transistors for the top stacked layer of a 2 chip 3D stack on a separate wafer. This paper is "Enabling SOI-Based Assembly Technology for Three-Dimensional (3D) Integrated Circuits (ICs)," *IEDM Tech. Digest*, p. 363 (2005) by A. W. Topol. D. C. La Tulipe. L. Shi, et al. ("Topol"). A process flow is utilized to transfer this top transistor layer atop the bottom wiring and transistor layers at temperatures less than 400° C. Unfortunately, since transistors are fully formed prior to bonding, this scheme suffers from misalignment issues. While Topol describes techniques to reduce misalignment errors in the above paper, the techniques of Topol still suffer from misalignment errors that limit vertical contact dimensions between two chips in the stack to >130 nm, and; hence, limits device density.

The textbook "Integrated Interconnect Technologies for 3D Nanoelectronic Systems" by Bakir and Meindl ("Bakir") describes a 3D stacked DRAM concept with horizontal (i.e. planar) transistors. Silicon for stacked transistors is produced using selective epitaxy technology or laser recrystallization. Unfortunately, however, these technologies have higher defect density compared to standard single crystal silicon and do not provide a mono-crystalline stacked layer or layers. This higher defect density degrades transistor performance and device yield.

In the NAND flash memory industry, several organizations have attempted to construct 3D stacked memory. These attempts predominantly use transistors constructed with poly-Si or selective epi technology as well as charge-trap concepts. References that describe these attempts to 3D stacked memory include "Integrated Interconnect Technologies for 3D Nanoelectronic Systems", Artech House, 2009 by Bakir and Meindl ("Bakir"), "Bit Cost Scalable Technology with Punch and Plug Process for Ultra High Density Flash Memory", Symp. VLSI Technology Tech. Dig. pp. 14-15, 2007 by H. Tanaka, M. Kido, K. Yahashi, et al. ("Tanaka"), "A Highly Scalable 8-Layer 3D Vertical-Gate (VG) TFT NAND Flash Using Junction-Free Buried Channel BE-SONOS Device," Symposium on VLSI Technology, 2010 by W. Kim, S. Choi, et al. ("W. Kim"). "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al. ("Lue") and "Sub-50 nm Dual-Gate Thin-Film Transistors for Monolithic 3-D Flash", IEEE Trans. Elect. Dev., vol. 56, pp. 2703-2710. November 2009 by A. J. Walker ("Walker"). An architecture and technology that utilizes single crystal Silicon using epi growth is described in "A Stacked SONOS Technology, Up to 4 Levels and 6 nm Crystalline Nanowires, with Gate-All-Around or Independent Gates (ΦFlash), Suitable for Full 3D Integration". International Electron Devices Meeting, 2009 by A. Hubert, et al ("Hubert"). However, the approach described by Hubert has some challenges including the use of difficult-to-manufacture nanowire transistors, higher defect densities due to formation of Si and SiGe layers atop each other, high temperature processing for long times, difficult manufacturing, etc.

It is clear based on the background art mentioned above that invention of novel technologies for 3D stacked chips will be useful.

The following patent, patent publications, and patent applications are incorporated herein by reference: U.S. Pat. Nos. 8,273,610, 8,298,875, 8,362,482, 8,378,715, 8,379, 458, 8,450,804, 8,557,632, 8,574,929, 8,581,349, 8,642,416, 8,669,778, 8,674,470, 8,687,399, 8,742,476, 8,803,206, 8,836,073, 8,902,663, 8,994,404, 9,023,688, 9,029,173, 9,030,858, 9,117,749, 9,142,553, 9,219,005, 9,385,058, 9,406,670, 9,460,978, 9,509,313, 9,640,531, 9,691,760, 9,711,407, 9,721,927, 9,799,761, 9,871,034, 9,953,870, 9,953,994, 10,014,292, 10,014,318, 10,515,981, 10,892, 016, 10,991,675, 11,121,121, 11,502,095, 10,892,016, 11,270,988; and pending U.S. Patent Application Publications and applications, Ser. Nos. 14/642,724, 15/150,395, 15/173,686, 62/651,722; 62/681,249, 62/713,345, 62/770, 751, 62/952,222, 62/824,288, 63/075,067, 63/091,307, 63/115,000, 63/220,443, 2021/0242189, 2020/0013791; and PCT Applications (and Publications): PCT/US2010/052093, PCT/US2011/042071 (WO2012/015550), PCT/US2016/ 52726 (WO2017053329), PCT/US2017/052359 (WO2018/ 071143), PCT/US2018/016759 (WO2018144957), PCT/ US2018/52332 (WO 2019/060798), PCT/US2021/44110, and PCT/US22/44165. The entire contents of all of the foregoing patents, publications, and applications are incorporated herein by reference.

Electro-Optics: There is also work done for integrated monolithic 3D including layers of different crystals, such as U.S. Pat. Nos. 8,283,215, 8,163,581, 8,753,913, 8,823,122, 9,197,804, 9,419,031, 9,941,319, 10,679,977, 10,943,934, 10,998,374, 11,063,071, and 11,133,344. The entire contents of all of the foregoing patents, publications, and applications are incorporated herein by reference.

SUMMARY

In one aspect, a 3D semiconductor device, the device including: a first level including single crystal first transistors, a first metal layer, and a first isolation layer, a second level including second transistors and a second isolation layer, where the first level is overlaid by the second level; a third level including single crystal third transistors, where the second level is overlaid by the third level, where the third level includes a third isolation layer, and where the third level is bonded to the second level; a power delivery path to the second transistors, where at least a portion of the power delivery path is connected to at least one of the first transistors; and a plurality of capacitors, where the single crystal first transistors or the second transistors include at least two FinFet transistors, and where two of the at least two FinFet transistors have different threshold voltages (Vt).

In another aspect, a 3D semiconductor device, the device including: a first level including single crystal first transistors, a first metal layer, and a first isolation layer, a second level including second transistors and a second isolation layer, where the first level is overlaid by the second level; a third level including third transistors; a fourth level including a single crystal layer, where the second level is overlaid by the third level, where the third level is overlaid by the fourth level, where the third level includes a third isolation layer, and where the third level is bonded to the second level; and a power delivery path to the second transistors, where at least a portion of the power delivery path is connected to at least one of the single crystal first transistors; and where the first level includes power delivery control for at least one of the second transistors.

In another aspect, a 3D semiconductor device, the device including: a first level including single crystal first transistors, a first metal layer, and a first isolation layer, a second level including second transistors and a second isolation layer, where the first level is overlaid by the second level; a third level including third transistors; a fourth level including a single crystal layer, where the second level is overlaid by the third level, where the third level is overlaid by the fourth level, where the third level includes a third isolation layer, and where the third level is bonded to the second level; and a power delivery path to the second transistors, where at least a portion of the power delivery path is connected to at least one of the first transistors, where the second level includes an array of memory cells, where each of the memory cells include at least one of the second transistors, and where the first level includes control circuits to control data written to the array of memory cells.

BRIEF DESCRIPTION OF THE DRAWINGS

FIGS. 4A-4G are drawing illustrations of techniques to refresh floating body DRAM cells;

FIGS. 7A-7J are drawing illustrations of a 3D floating body DRAM with two stable states;

FIGS. 10A-10J are drawing illustrations of a zero-mask per layer 3D resistive memory with a junction-less transistor;

FIGS. 11A-11K are drawing illustrations of an alternative zero-mask per layer 3D resistive memory;

FIGS. 12A-12L are drawing illustrations of a one-mask per layer 3D resistive memory;

FIGS. 16A-16D are drawing illustrations of a fewer-masks per layer 3D horizontally-oriented charge-trap memory;

FIGS. 17A-17F are drawing illustrations of a two-mask per layer 3D horizontally-oriented floating-gate memory;

FIGS. 19A-19B are drawing illustrations of periphery on top of memory layers;

DETAILED DESCRIPTION

Embodiments of the invention are now described with reference to the indicated figures, it being appreciated that the figures illustrate the subject matter not to scale or to measure. Many figures describe process flows for building devices. These process flows, which may be a sequence of steps for building a device, may have many structures, numerals and labels that may be common between two or more adjacent steps. In such cases, some labels, numerals and structures used for a certain step's figure may have been described in previous steps' figures.

The entirety of U.S. Pat. Nos. 8,379,458, 8,273,610 and 8,803,206 are incorporated herein by reference.

Section 1: Monolithic 3D DRAM

This Section describes some novel monolithic 3D Dynamic Random Access Memories (DRAMs). Some embodiments of this invention may involve floating body DRAM. Background information on floating body DRAM and its operation is given in "Floating Body RAM Technology and its Scalability to 32 nm Node and Beyond," *Electron Devices Meeting*, 2006. *IEDM '06. International*, vol., no., pp. 1-4. 11-13 Dec. 2006 by T. Shino, N. Kusunoki, T. Higashi, et al. Overview and future challenges of floating body RAM (FBRAM) technology for 32 nm technology node and beyond, Solid-State Electronics, Volume 53, Issue 7, Papers Selected from the 38th European Solid-State Device Research Conference—ESSDERC'08, July 2009, Pages 676-683, ISSN 0038-1101, DOI: 10.1016/j.sse.2009.03.010 by Takeshi Hamamoto, Takashi Ohsawa, et al., "New Generation of Z-RAM," *Electron Devices*

*Meeting,* 2007. *IEDM* 2007. *IEEE International,* vol., no., pp. 925-928. 10-12 Dec. 2007 by Okhonin. S.; Nagoga. M.; Carman. E. et al. The above publications are incorporated herein by reference.

Figure 1:
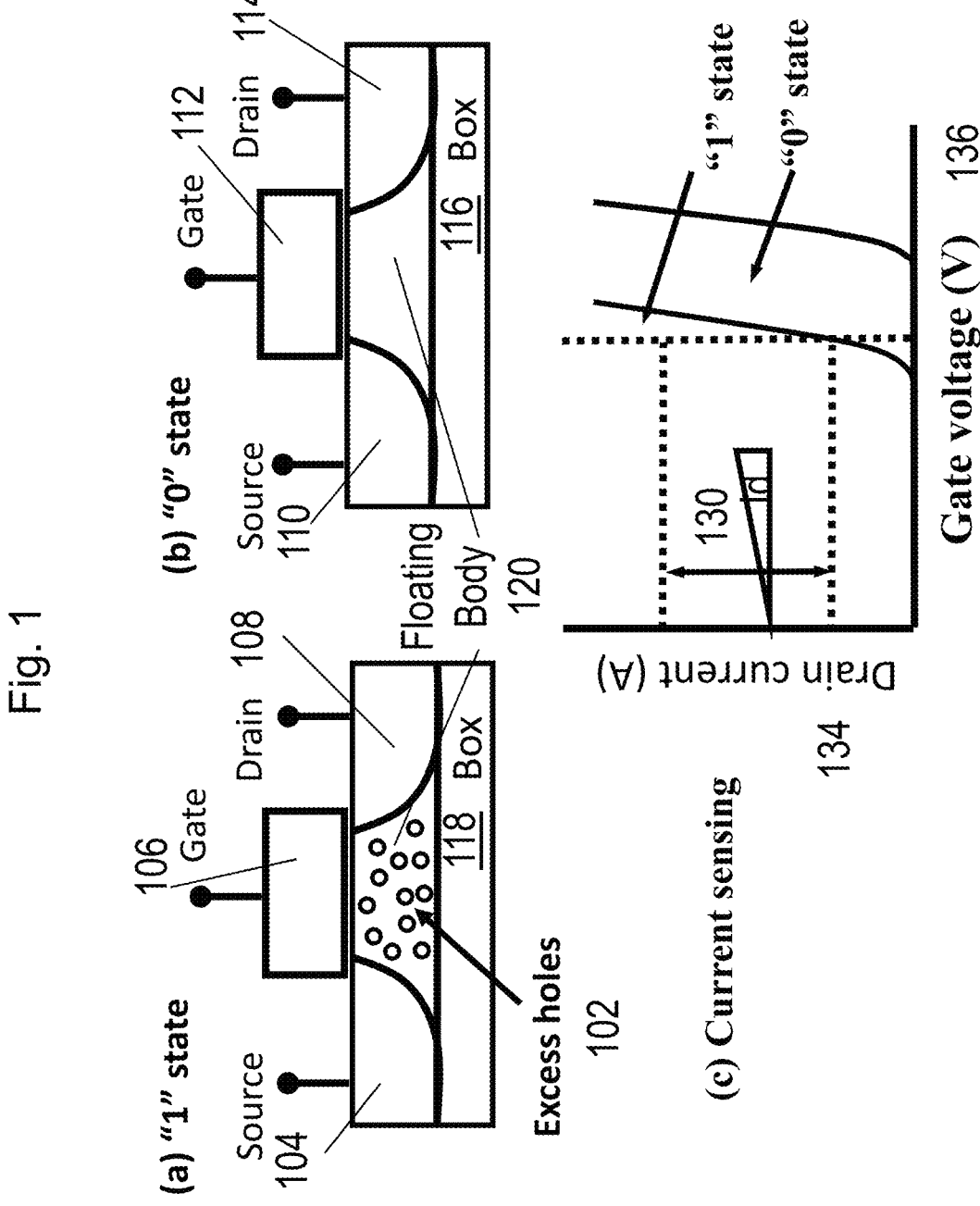
FIG. 1 is a drawing illustration of a floating-body DRAM transistor in on & off charge states.

As illustrated in FIG. 1 the fundamentals of operating a floating body DRAM are described. In order to store a '1' bit, excess holes 102 may exist in the floating body region 120 and change the threshold voltage of the memory cell transistor including source 104, gate 106, drain 108, floating body region 120, and buried oxide (BOX) 118. This is shown in FIG. 1(*a*). The '0' bit may correspond to no charge being stored in the floating body region 120 and may affect the threshold voltage of the memory cell transistor including source 110, gate 112, drain 114, floating body region 120, and buried oxide (BOX) 116. This is shown in FIG. 1(*b*). The difference in threshold voltage between the memory cell transistor depicted in FIG. 1(*a*) and FIG. 1(*b*) may manifest itself as a change in the drain current 134 of the transistor at a particular gate voltage 136. This is described in FIG. 1(*c*). This current differential 130 may be sensed by a sense amplifier circuit to differentiate between '0' and '1' states and thus function as a memory bit.

Figures 2A, 2B:
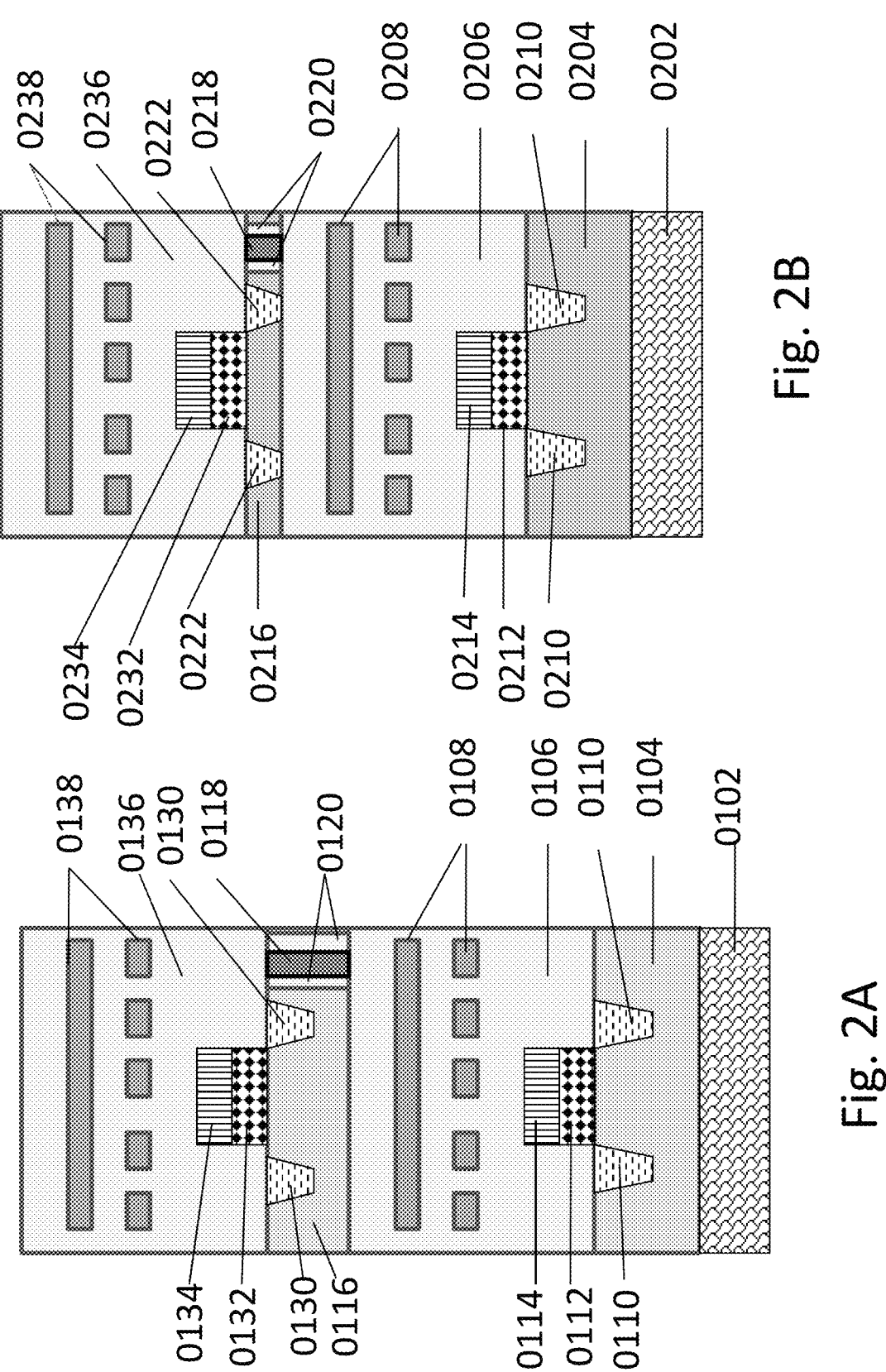
FIGS. 2A-2C are an exemplary drawing illustration of the power distribution network of a 3D integrated circuit

FIG. 2A illustrates a 3D integrated circuit. Two crystalline layers, 0104 and 0116, which may include semiconductor materials such as, for example, mono-crystalline silicon, germanium, GaAs, InP, and graphene, are shown. For this illustration, mono-crystalline (single crystal) silicon may be used. Silicon layer 0116 could be thinned down from its original thickness, and its final thickness could be in the range of about 0.01 um to about 50 um, for example, 10 nm, 100 nm, 200 nm, 0.4 um, 1 um, 2 um or 5 um. Silicon layer 0104 could be thinned down from its original thickness, and its final thickness could be in the range of about 0.01 um to about 50 um, for example, 10 nm, 100 nm, 200 nm, 0.4 um, 1 um, 2 um or 5 um; however, due to strength considerations, silicon layer 0104 may also be of thicknesses greater than 100 um, depending on, for example, the strength of bonding to heat removal apparatus 0102. Silicon layer 0104 may include transistors such as, for example, MOSFETS, FinFets, BJTs, HEMTs, HBTs, which may include gate electrode region 0114, gate dielectric region 0112, source and drain junction regions (not shown), and shallow trench isolation (STI) regions 0110. Silicon layer 0116 may include transistors such as, for example, MOSFETS, FinFets, BJTs, HEMTs, HBTs, which may include gate electrode region 0134, gate dielectric region 0132, source and drain junction regions (not shown), and shallow trench isolation (STI) regions 0130. A through-silicon via (TSV) 0118 could be present and may have an associated surrounding dielectric region 0120. Wiring layers 0108 for silicon layer 0104 and wiring dielectric regions 0106 may be present and may form an associated interconnect layer or layers. Wiring layers 0138 for silicon layer 0116 and wiring dielectric 0136 may be present and may form an associated interconnect layer or layers. Through-silicon via (TSV) 0118 may connect to wiring layers 0108 and wiring layers 0138 (not shown). The heat removal apparatus 0102 may include a heat spreader and/or a heat sink. The heat removal problem for the 3D integrated circuit shown in FIG. 1 is immediately apparent. The silicon layer 0116 is far away from the heat removal apparatus 0102, and it may be difficult to transfer heat among silicon layer 0116 and heat removal apparatus 0102. Furthermore, wiring dielectric regions 0106 may not conduct heat well, and this increases the thermal resistance among silicon layer 0116 and heat removal apparatus 0102. Silicon layer 0104 and silicon layer 0116 may be may be substantially absent of semiconductor dopants to form an undoped silicon region or layer, or doped, such as, for example, with elemental or compound species that form a p+, or p, or p−, or n+, or n, or n− silicon layer or region. The heat removal apparatus 0102 may include an external surface from which heat transfer may take place by methods such as air cooling, liquid cooling, or attachment to another heat sink or heat spreader structure.

FIG. 2B illustrates an exemplary 3D integrated circuit that could be constructed, for example, using techniques described in U.S. Pat. Nos. 8,273,610, 8,557,632, and 8,581, 349. The contents of the foregoing patent and applications are incorporated herein by reference. Two crystalline layers, 0204 and 0216, which may include semiconductor materials such as, for example, mono-crystalline silicon, germanium, GaAs, InP, and graphene, are shown. For this illustration, mono-crystalline (single crystal) silicon may be used. Silicon layer 0216 could be thinned down from its original thickness, and its final thickness could be in the range of about 0.01 um to about 50 um, for example, 10 nm, 100 nm, 200 nm, 0.4 um, 1 um, 2 um or 5 um. Silicon layer 0204 could be thinned down from its original thickness, and its final thickness could be in the range of about 0.01 um to about 50 um, for example, 10 nm, 100 nm, 200 nm, 0.4 um, 1 um, 2 um or 5 um; however, due to strength considerations, silicon layer 0204 may also be of thicknesses greater than 100 um, depending on, for example, the strength of bonding to heat removal apparatus 0202. Silicon layer 0204 may include transistors such as, for example, MOSFETS, FinFets, BJTs, HEMTs, HBTs, which may include gate electrode region 0214, gate dielectric region 0212, source and drain junction regions (not shown for clarity) and shallow trench isolation (STI) regions 0210. Silicon layer 0216 may include transistors such as, for example, MOS-FETS, FinFets, BJTs, HEMTs, HBTs, which may include gate electrode region 0234, gate dielectric region 0232, source and drain junction regions (not shown for clarity), and shallow trench isolation (STI) regions 0222. It can be observed that the STI regions 0222 can go right through to the bottom of silicon layer 0216 and provide good electrical isolation. This, however, may cause challenges for heat removal from the STI surrounded transistors since STI regions 0222 are typically composed of insulators that do not conduct heat well. Therefore, the heat spreading capabilities of silicon layer 0216 with STI regions 0222 are low. A through-layer via (TLV) 0218 may be present and may include an associated surrounding dielectric region 0220. Wiring layers 0208 for silicon layer 0204 and wiring dielectric regions 0206 may be present and may form an associated interconnect layer or layers. Wiring layers 0238 for silicon layer 0216 and wiring dielectric 0236 may be present and may form an associated interconnect layer or layers. Through-layer via (TLV) 0218 may connect to wiring layers 0208 and wiring layers 0238 (not shown). The heat removal apparatus 0202 may include a heat spreader and/or a heat sink. The heat removal problem for the 3D integrated circuit shown in FIG. 2 is immediately apparent. The silicon layer 0216 may be far away from the heat removal apparatus 0202, and it may be difficult to transfer heat among silicon layer 0216 and heat removal apparatus 0202. Furthermore, wiring dielectric regions 0206 may not conduct heat well, and this increases the thermal resistance among silicon layer 0216 and heat removal apparatus 0202. The heat removal challenge is further exacerbated by the poor heat spreading properties of silicon layer 0216 with STI regions 0222. Silicon layer 0204 and silicon layer 0216 may be may be substantially absent of semiconductor dopants to form an undoped silicon region or layer, or doped, such as, for example, with elemental or compound species that form a p+, or p, or p−, or n+, or n, or n− silicon layer or region. The heat removal apparatus 0202 may include an external surface from which heat transfer may take place by methods such as air cooling, liquid cooling, or attachment to another heat sink or heat spreader structure.

Figure 2C:
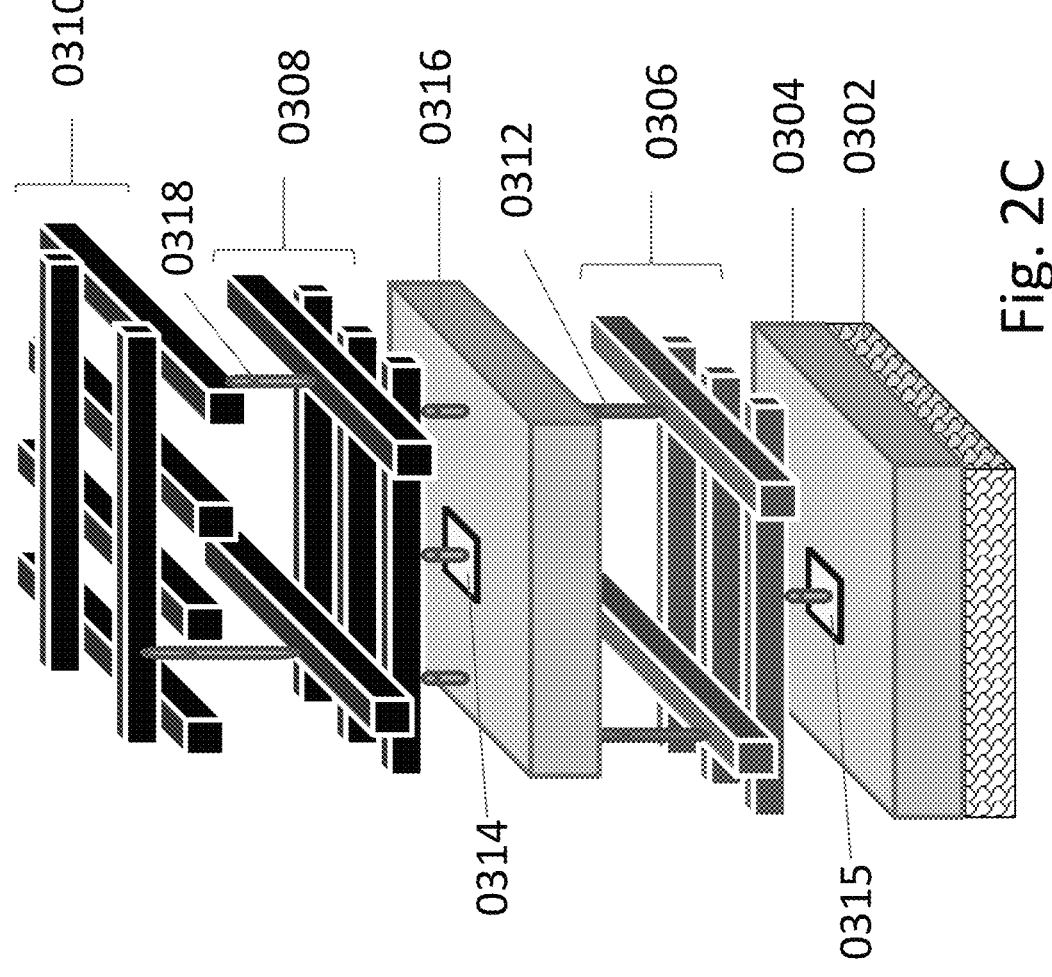

FIG. 2C illustrates how the power or ground distribution network of a 3D integrated circuit could assist heat removal. FIG. 3 illustrates an exemplary power distribution network or structure of the 3D integrated circuit. As shown in FIGS. 1 and 2, a 3D integrated circuit, could, for example, be constructed with two silicon layers, first silicon layer 0304 and second silicon layer 0316. The heat removal apparatus 0302 could include, for example, a heat spreader and/or a heat sink. The power distribution network or structure could consist of a global power grid 0310 that takes the supply voltage (denoted as VDD) from the chip/circuit power pads and transfers VDD to second local power grid 0308 and first local power grid 0306, which transfers the supply voltage to logic/memory cells, transistors, and/or gates such as second transistor 0314 and first transistor 0315. Second layer vias 0318 and first layer vias 0312, such as the previously described TSV or TLV, could be used to transfer the supply voltage from the global power grid 0310 to second local power grid 0308 and first local power grid 0306. The global power grid 0310 may also be present among first silicon layer 0304 and second silicon layer 0316. The 3D integrated circuit could have a similarly designed and laid-out distribution networks, such as for ground and other supply voltages, as well. The power grid may be designed and constructed such that each layer or strata of transistors and devices may be supplied with a different value Vdd. For example, first silicon layer 0304 may be supplied by its power grid to have a Vdd value of 1.0 volts and second silicon layer 0316 a Vdd value of 0.8 volts. Furthermore, the global power grid 0310 wires may be constructed with substantially higher conductivity, for example 30% higher, 50% higher, 2× higher, than local power grids, for example, such as first local power grid 0306 wires and second local power grid 0308 wires. The thickness, linewidth, and material composition for the global power grid 0310 wires may provide for the higher conductivity, for example, the thickness of the global power grid 0310 wires may be twice that of the local power grid wires and/or the linewidth of the global power grid 0310 wires may be 2× that of the local power grid wires. Moreover, the global power grid 0310 may be optimally located in the top strata or layer of transistors and devices.

Typically, many contacts may be made among the supply and ground distribution networks and first silicon layer 0304. Due to this, there could exist a low thermal resistance among the power/ground distribution network and the heat removal apparatus 0302. Since power/ground distribution networks may be typically constructed of conductive metals and could have low effective electrical resistance, the power/ground distribution networks could have a low thermal resistance as well. Each logic/memory cell or gate on the 3D integrated circuit (such as, for example, second transistor 0314) is typically connected to VDD and ground, and therefore could have contacts to the power and ground distribution network. The contacts could help transfer heat efficiently (for example, with low thermal resistance) from each logic/memory cell or gate on the 3D integrated circuit (such as, for example, second transistor 0314) to the heat removal apparatus 0302 through the power/ground distribution network and the silicon layer 0304. Silicon layer 0304 and silicon layer 0316 may be may be substantially absent of semiconductor dopants to form an undoped silicon region or layer, or doped, such as, for example, with elemental or compound species that form a p+, or p, or p−, or n+, or n, or n− silicon layer or region. The heat removal apparatus 0302 may include an external surface from which heat transfer may take place by methods such as air cooling, liquid cooling, or attachment to another heat sink or heat spreader structure.

Defect annealing, such as furnace thermal or optical annealing, of thin layers of the crystalline materials generally included in 3D-ICs to the temperatures that may lead to substantial dopant activation or defect anneal, for example above 600° C., may damage or melt the underlying metal interconnect layers of the stacked 3D-IC, such as copper or aluminum interconnect layers. An embodiment of the invention is to form 3D-IC structures and devices wherein a heat spreading, heat conducting and/or optically reflecting or absorbent material layer or layers (which may be called a shield) is incorporated between the sensitive metal interconnect layers and the layer or regions being optically irradiated and annealed, or annealed from the top of the 3D-IC stack using other methods. An exemplary generalized process flow is shown in FIGS. 2D-2G. The 3D-ICs may be constructed in a 3D stacked layer using procedures outlined herein (such as, for example, FIGS. 39, 40, 41 of parent now U.S. Pat. No. 8,674,470) and in U.S. Pat. Nos. 8,273,610 and 8,557,632 and 8,581,349. The contents of the foregoing applications are incorporated herein by reference. The topside defect anneal may include optical annealing to repair defects in the crystalline 3D-IC layers and regions (which may be caused by the ion-cut implantation process), and may be utilized to activate semiconductor dopants in the crystalline layers or regions of a 3D-IC, such as, for example, LDD, halo, source/drain implants. The 3D-IC may include, for example, stacks formed in a monolithic manner with thin layers or stacks and vertical connection such as TLVs, and stacks formed in an assembly manner with thick (>2 um) layers or stacks and vertical connections such as TSVs. Optical annealing beams or systems, such as, for example, a laser-spike anneal beam from a commercial semiconductor material oriented single or dual-beam continuous wave (CW) laser spike anneal DB-LSA system of Ultratech Inc., San Jose, CA, USA (10.6 um laser wavelength), or a short pulse laser (such as 160 ns), with 308 nm wavelength, and large area (die or step-field sized, including 1 cm2) irradiation such as offered by Excico of Gennevilliers, France, may be utilized (for example, see Huet, K., "Ultra Low Thermal Budget Laser Thermal Annealing for 3D Semiconductor and Photovoltaic Applications," NCCAVS 2012 Junction Technology Group. Semicon West. San Francisco, Jul. 12, 2012). Additionally, the defect anneal may include, for example, laser anneals (such as suggested in Rajendran, B., "Sequential 3D IC Fabrication: Challenges and Prospects", Proceedings of VLSI Multi Level Interconnect Conference 2006, pp. 57-64). Ultrasound Treatments (UST), megasonic treatments, and/or microwave treatments. The topside defect anneal ambient may include, for example, vacuum, high pressure (greater than about 760 torr), oxidizing atmospheres (such as oxygen or partial pressure oxygen), and/or reducing atmospheres (such as nitrogen or argon). The topside defect anneal may include temperatures of the layer being annealed above about 400° C. (a high temperature thermal anneal), including, for example, 600° C., 800° C., 900° C., 1000° C., 1050° C., 1100° C. and/or 1120° C., and the sensitive metal interconnect (for example, may be copper or aluminum containing) and/or device layers below may not be damaged by the annealing process, for example, which may include sustained temperatures that do not exceed 200° C., exceed 300° C., exceed 370° C., or exceed 400° C. As understood by those of ordinary skill in the art, short-timescale (nanoseconds to milliseconds) temperatures above 400° C. may also be acceptable for damage avoidance, depending on the acceptor layer interconnect metal systems used. The topside defect anneal may include activation of semiconductor dopants, such as, for example, ion implanted dopants or PLAD applied dopants. It will also be understood by one of ordinary skill in the art that the methods, such as the heat sink/shield layer and/or use of short pulse and short wavelength optical anneals, may allow almost any type of transistor, for example, such as FinFets, bipolar, nanowire transistors, to be constructed in a monolithic 3D fashion as the thermal limit of damage to the underlying metal interconnect systems is overcome. Moreover, multiple pulses of the laser, other optical annealing techniques, or other anneal treatments such as microwave, may be utilized to improve the anneal, activation, and yield of the process. The transistors formed as described herein may include many types of materials; for example, the channel and/or source and drain may include single crystal materials such as silicon, germanium, or compound semiconductors such as GaAs, InP, GaN, SiGe, and although the structures may be doped with the tailored dopants and concentrations, they may still be substantially crystalline or mono-crystalline.

Figures 2D, 2E, 2F, 2G:
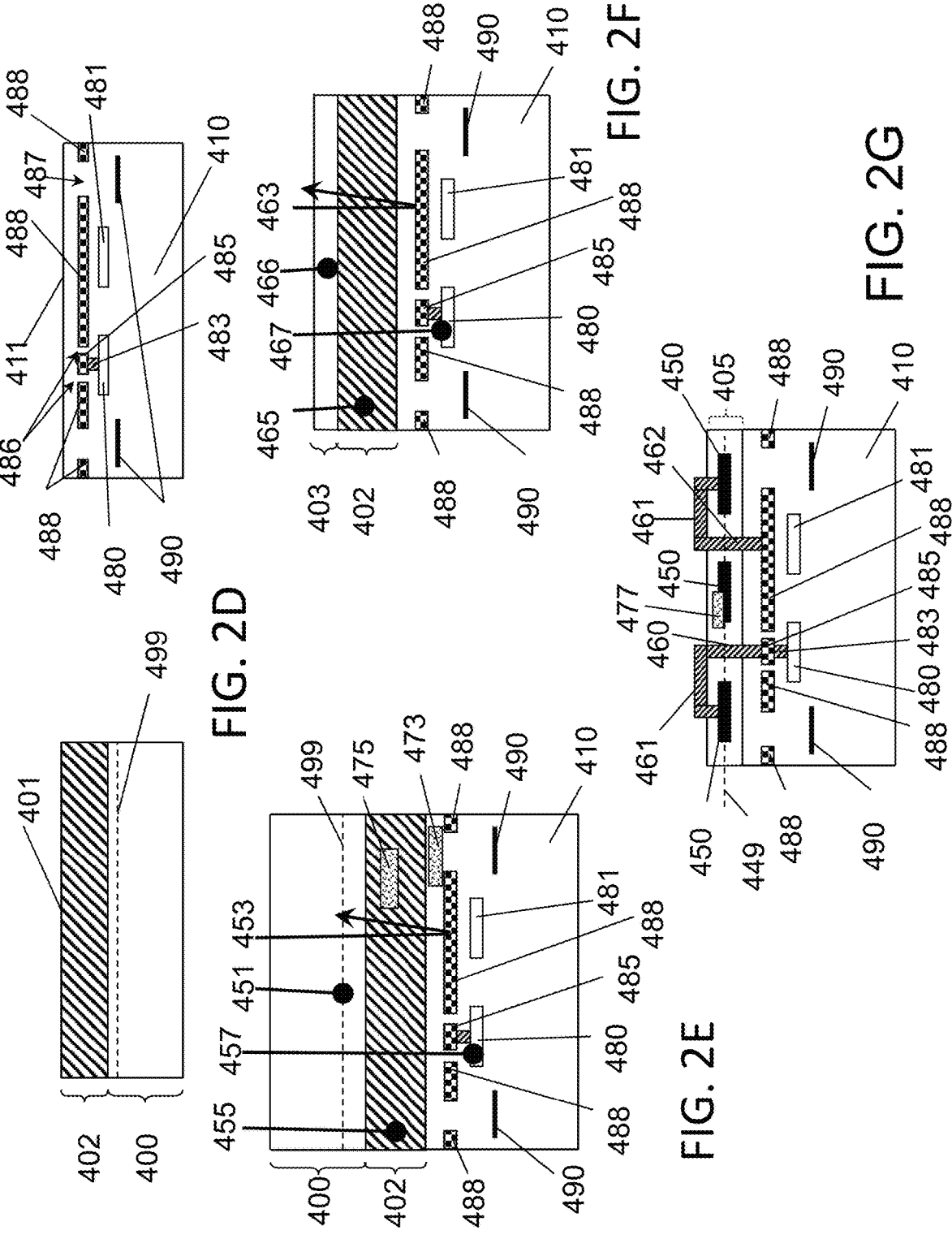
FIGS. 2D-2G are exemplary drawing illustrations of the integration of 3D-IC

As illustrated in FIG. 2D, a generalized process flow may begin with a donor wafer 400 that may be preprocessed with wafer sized layers 0402 of conducting, semi-conducting or insulating materials that may be formed by deposition, ion implantation and anneal, oxidation, epitaxial growth, combinations of above, or other semiconductor processing steps and methods. For example, donor wafer 0400 and wafer sized layers 0402 may include semiconductor materials such as, for example, mono-crystalline silicon, germanium, GaAs, InP, and graphene. For this illustration, mono-crystalline (single crystal) silicon and associated silicon oriented processing may be used. The donor wafer 0400) may be preprocessed with a layer transfer demarcation plane (shown as dashed line) 0499, such as, for example, a hydrogen implant cleave plane, before or after (typical) wafer sized layers 0402 are formed. Layer transfer demarcation plane 0499 may alternatively be formed within wafer sized layers 0402. Other layer transfer processes, some described in the referenced patent documents, may alternatively be utilized. Damage/defects to the crystalline structure of donor wafer 0400 may be annealed by some of the annealing methods described, for example the short wavelength pulsed laser techniques, wherein the donor wafer 0400 wafer sized layers 0402 and portions of donor wafer 0400 may be heated to defect annealing temperatures, but the layer transfer demarcation plane 0499 may be kept below the temperate for cleaving and/or significant hydrogen diffusion. Dopants in at least a portion of wafer sized layers 0402 may also be electrically activated. Thru the processing, donor wafer 0400 and/or wafer sized layers 0402 could be thinned from its original thickness, and their/its final thickness could be in the range of about 0.01 um to about 50 um, for example, 10 nm, 100 nm, 200 nm, 0.4 um, 1 um, 2 um or 5 um. Donor wafer 0400 and wafer sized layers 0402 may include preparatory layers for the formation of horizontally or vertically oriented types of transistors such as, for example, MOSFETS, FinFets, FD-RCATs, BJTs, HEMTs, HBTs, JFETs, JLTs, or partially processed transistors (for example, the replacement gate HKMG process described in the referenced patent documents). Donor wafer 0400 and wafer sized layers 0402 may include the layer transfer devices and/or layer or layers contained herein this document or referenced patent documents, for example, DRAM Si/SiO2 layers, RCAT doped layers, multi-layer doped structures, or starting material doped or undoped monocrystalline silicon, or polycrystalline silicon. Donor wafer 0400 and wafer sized layers 0402 may have alignment marks (not shown). Acceptor wafer 0410 may be a preprocessed wafer, for example, including monocrystalline bulk silicon or SOI, that may have fully functional circuitry including metal layers (including aluminum or copper metal interconnect layers that may connect acceptor wafer 0410 transistors and metal structures, such as TLV landing strips and pads, prepared to connect to the transferred layer devices) or may be a wafer with previously transferred layers, or may be a blank carrier or holder wafer, or other kinds of substrates suitable for layer transfer processing. Acceptor wafer 0410 may have alignment marks 0490 and metal connect pads or strips 0480 and ray blocked metal interconnect 0481. Acceptor wafer 0410 may include transistors such as, for example, MOSFETS, FinFets, FD-RCATs, BJTs, JFETs, JLTs, HEMTs, and/or HBTs. Acceptor wafer 0410 may include shield/heat sink layer 0488, which may include materials such as, for example, Aluminum, Tungsten (a refractory metal), Copper, silicon or cobalt based silicides, or forms of carbon such as carbon nanotubes or DLC (Diamond Like Carbon). Shield/heat sink layer 0488 may have a thickness range of about 50 nm to about 1 mm, for example, 50 nm, 100 nm, 200 nm, 300 nm, 500 nm, 0.1 um, 1 um, 2 um, and 10 um. Shield/heat sink layer 0488 may include isolation openings 0486, and alignment mark openings 0487, which may be utilized for short wavelength alignment of top layer (donor) processing to the acceptor wafer alignment marks 0490. Shield/heat sink layer 0488 may include shield path connect 0485 and shield path via 0483. Shield path via 0483 may thermally and/or electrically couple and connect shield path connect 0485 to acceptor wafer 0410 interconnect metallization layers such as, for example, metal connect pads or strips 0480 (shown). If two shield/heat sink layers 0488 are utilized, one on top of the other and separated by an isolation layer common in semiconductor BEOL, such as carbon doped silicon oxide, shield path connect 0485 may also thermally and/or electrically couple and connect each shield/heat sink layer 0488 to the other and to acceptor wafer 0410 interconnect metallization layers such as, for example, metal connect pads or strips 0480, thereby creating a heat conduction path from the shield/heat sink layer 0488 to the acceptor wafer substrate, and a heat sink. The topmost shield/heat sink layer may include a higher melting point material, for example a refractory metal such as Tungsten, and the lower heat shield layer may include a lower melting point material such as copper.

Bonding surfaces, donor bonding surface 0401 and acceptor bonding surface 0411, may be prepared for wafer bonding by depositions (such as silicon oxide), polishes, plasma, or wet chemistry treatments to facilitate successful wafer to wafer bonding. The insulation layer, such as deposited bonding oxides and/or before bonding preparation existing oxides, between the donor wafer transferred layer and the acceptor wafer topmost metal layer, may include thicknesses of less than 1 um, less than 500 nm, less than 400 nm, less than 300 nm, less than 200 nm, or less than 100 nm.

As illustrated in FIG. 2E, the donor wafer 0400 with wafer sized layers 0402 and layer transfer demarcation plane 0499 may be flipped over, aligned, and bonded to the acceptor wafer 0410. The donor wafer 0400 with wafer sized layers 0402 may have alignment marks (not shown). Various topside defect anneals may be utilized. For this illustration, an optical beam such as the laser annealing previously described is used. Optical anneal beams may be optimized to focus light absorption and heat generation at or near the layer transfer demarcation plane (shown as dashed line) 0499 to provide a hydrogen bubble cleave with exemplary cleave ray 0451. The laser assisted hydrogen bubble cleave with the absorbed heat generated by exemplary cleave ray 0451 may also include a pre-heat of the bonded stack to, for example, about 100° C. to about 400° C., and/or a thermal rapid spike to temperatures above about 200° C. to about 600° C. The laser assisted ion-cut cleave may provide a smoother cleave surface upon which better quality transistors may be manufactured. Reflected ray 0453 may be reflected and/or absorbed by shield/heat sink layer 0488 regions thus blocking the optical absorption of ray blocked metal interconnect 0481 and potentially enhancing the efficiency of optical energy absorption of the wafer sized layers 0402. Additionally, shield/heat sink layer 0488 may laterally spread and conduct the heat generated by the topside defect anneal, and in conjunction with the dielectric materials (low heat conductivity) above and below shield/heat sink layer 0488, keep the interconnect metals and low-k dielectrics of the acceptor wafer interconnect layers cooler than a damage temperature, such as, for example, 400° C. Annealing of dopants or annealing of damage, such as from the H cleave implant damage, may be accomplished by optical annealing rays, such as repair ray 0455. A small portion of the optical energy, such as unblocked ray 0457, may hit and heat, or be reflected, by (a few rays as the area of the heat shield openings, such as 0424, is small compared to the die or device area) such as metal connect pads or strips 0480. Heat generated by absorbed photons from, for example, cleave ray 0451, reflected ray 0453, and/or repair ray 0455 may also be absorbed by shield/heat sink layer 0488 regions and dissipated laterally and may keep the temperature of underlying metal layers, such as ray blocked metal interconnect 0481, and other metal layers below it, cooler and prevent damage. Shield/heat sink layer 0488 may act as a heat spreader. A second layer of shield/heat sink layer 0488 (not shown) may have been constructed (during the acceptor wafer 0410 formation) with a low heat conductive material sandwiched between the two heat sink layers, such as silicon oxide or carbon doped 'low-k' silicon oxides, for improved thermal protection of the acceptor wafer interconnect layers, metal and dielectrics. Electrically conductive materials may be used for the two layers of shield/heat sink layer 0488 and thus may provide, for example, a Vss and a Vdd plane for power delivery that may be connected to the donor layer transistors above, as well may be connected to the acceptor wafer transistors below. Shield/heat sink layer 0488 may include materials with a high thermal conductivity greater than 10 W/m-K, for example, copper (about 400 W/m-K), aluminum (about 237 W/m-K), Tungsten (about 173 W/m-K). Plasma Enhanced Chemical Vapor Deposited Diamond Like Carbon-PECVD DLC (about 1000) W/m-K), and Chemical Vapor Deposited (CVD) graphene (about 5000 W/m-K). Shield/heat sink layer 0488 may be sandwiched and/or substantially enclosed by materials with a low thermal conductivity less than 10 W/m-K, for example, silicon dioxide (about 1.4 W/m-K). The sandwiching of high and low thermal conductivity materials in layers, such as shield/heat sink layer 0488 and under & overlying dielectric layers, spreads the localized heat/light energy of the topside anneal laterally and protect the underlying layers of interconnect metallization & dielectrics, such as in the acceptor wafer, from harmful temperatures or damage. Further, absorber layers or regions, for example, including amorphous carbon, amorphous silicon, and phase changing materials (see U.S. Pat. Nos. 6,635,588 and 6,479,821 to Hawryluk et al, for example), may be utilized to increase the efficiency of the optical energy capture in conversion to heat for the desired annealing or activation processes. For example, pre-processed layers 0402 may include a layer or region of optical absorbers such as transferred absorber region 0475, acceptor wafer 0410 may include a layer or region of optical absorbers such as acceptor absorber region 0473, and second device layer 0405 may include a layer or region of optical absorbers such as post transfer absorber regions 0477 (shown in FIG. 2G). Transferred absorber region 0475, acceptor absorber region 0473, and/or post transfer absorber regions 0477 may be permanent (could be found within the device when manufacturing is complete) or temporary so is removed during the manufacturing process.

As illustrated in FIG. 2F, the donor wafer 0400 may be cleaved at or thinned to (or past, not shown) the layer transfer demarcation plane 0499, leaving donor wafer portion 0403 and the pre-processed layers 0402 bonded to the acceptor wafer 0410, by methods such as, for example, ion-cut or other layer transfer methods. The layer transfer demarcation plane 0499 may instead be placed in the pre-processed layers 0402. Optical anneal beams, in conjunction with reflecting layers and regions and absorbing enhancement layers and regions, may be optimized to focus light absorption and heat generation within or at the surface of donor wafer portion 0403 and provide surface smoothing and/or defect annealing (defects may be from the cleave and/or the ion-cut implantation), and/or post ion-implant dopant activation with exemplary smoothing/annealing ray 0466. The laser assisted smoothing/annealing with the absorbed heat generated by exemplary smoothing/annealing ray 0466 may also include a pre-heat of the bonded stack to, for example, about 100° C. to about 400° C., and/or a thermal rapid spike to temperatures above about 200° C. to about 600° C. Moreover, multiple pulses of the laser may be utilized to improve the anneal, activation, and yield of the process. Reflected ray 0463 may be reflected and/or absorbed by shield/heat sink layer 0488 regions thus blocking the optical absorption of ray blocked metal interconnect 0481. Annealing of dopants or annealing of damage, such as from the H cleave implant damage, may be also accomplished by a set of rays such as repair ray 0465. A small portion of the optical energy, such as unblocked ray 0467, may hit and heat, or be reflected, by a few rays (as the area of the heat shield openings, such as 0424, is small) such as metal connect pads or strips 0480. Heat generated by absorbed photons from, for example, smoothing/annealing ray 0466, reflected ray 0463, and/or repair ray 0465 may also be absorbed by shield/heat sink layer 0488 regions and dissipated laterally and may keep the temperature of underlying metal layers, such as ray blocked metal interconnect 0481, and other metal layers below it, cooler and prevent damage. A second layer of shield/heat sink layer 0488 may be constructed with a low heat conductive material sandwiched between the two heat sink layers, such as silicon oxide or carbon doped 'low-k' silicon oxides, for improved thermal protection of the acceptor wafer interconnect layers, metal and dielectrics. Shield/heat sink layer 0488 may act as a heat spreader. When there may be more than one shield/heat sink layer 0488 in the device, the heat conducting layer closest to the second crystalline layer may be constructed with a different material, for example a high melting point material, for example a refractory metal such as tungsten, than the other heat conducting layer or layers, which may be constructed with, for example, a lower melting point material such as aluminum or copper. Electrically conductive materials may be used for the two layers of shield/heat sink layer 0488 and thus may provide, for example, a Vss and a Vdd plane that may be connected to the donor layer transistors above, as well may be connected to the acceptor wafer transistors below. Furthermore, some or all of the layers utilized as shield/heat sink layer 0488, which may include shapes of material such as the strips or fingers, may be driven by a portion of the second layer transistors and circuits (within the transferred donor wafer layer or layers) or the acceptor wafer transistors and circuits, to provide a programmable back-bias to at least a portion of the second layer transistors. The programmable back bias may utilize a circuit to do so, for example, such as shown in FIG. 17B of U.S. Pat. No. 8,273,610, the contents incorporated herein by reference; wherein the 'Primary' layer may be the second layer of transistors for which the back-bias is being provided, the 'Foundation' layer could be either the second layer transistors (donor) or first layer transistors (acceptor), and the routing metal lines connections 1723 and 1724 may include portions of the shield/heat sink layer 0488 layer or layers. Moreover, some or all of the layers utilized as shield/heat sink layer 0488, which may include strips or, may be driven by a portion of the second layer transistors and circuits (within the transferred donor wafer layer or layers) or the acceptor wafer transistors and circuits to provide a programmable power supply to at least a portion of the second layer transistors. The programmable power supply may utilize a circuit to do so, for example, such as shown in FIG. 17C of U.S. Pat. No. 8,273,610, the contents incorporated herein by reference; wherein the 'Primary' layer may be the second layer of transistors for which the programmable power supplies are being provided to, the 'Foundation' layer could be either the second layer transistors (donor) or first layer transistors (acceptor), and the routing metal line connections from Vout to the various second layer transistors may include portions of the shield/heat sink layer 0488 layer or layers. The Vsupply on line 17C12 and the control signals on control line 17C16 may be controlled by and/or generated in the second layer transistors (donor, for example donor wafer device structures 0450) or first layer transistors (acceptor, for example acceptor wafer transistors and devices 0 493), or off chip circuits. Furthermore, some or all of the layers utilized as shield/heat sink layer 0488, which may include strips or fingers or other shapes, may be utilized to distribute independent power supplies to various portions of the second layer transistors (donor, for example donor wafer device structures 0450) or first layer transistors and circuits; for example, one power supply and/or voltage may be routed to the sequential logic circuits of the second layer and a different power supply and/or voltage routed to the combinatorial logic circuits of the second layer. Patterning of shield/heat sink layer 0488 or layers can impact their heat-shielding capacity. This impact may be mitigated, for example, by enhancing the top shield/heat sink layer 0488 areal density, creating more of the secondary shield/heat sink layers 0488, or attending to special CAD rules regarding their metal density, similar to CAD rules that are required to accommodate Chemical-Mechanical Planarization (CMP). These constraints would be integrated into a design and layout EDA tool.

As illustrated in FIG. 2G, the remaining donor wafer portion 0403 may be removed by polishing or etching and the transferred layers 0402 may be further processed to create second device layer 0405 which may include donor wafer device structures 0450 and metal interconnect layers (such as second device layer metal interconnect 0461) that may be precisely aligned to the acceptor wafer alignment marks 0490. Donor wafer device structures 0450 may include, for example, CMOS transistors such as N type and P type transistors, or at least any of the other transistor or device types discussed herein this document or referenced patent documents. The details of CMOS in one transferred layer and the orthogonal connect strip methodology may be found as illustrated in at least FIGS. 30-4, 73-80, and 94 and related specification sections of U.S. Pat. No. 8,273,610. As discussed above and herein this document and referenced patent documents, annealing of dopants or annealing of damage, such as from the dopant application such as ion-implantation, or from etch processes during the formation of the transferred layer transistor and device structures, may be accomplished by optical annealing. Donor wafer device structures 0450 may include transistors and/or semiconductor regions wherein the dopant concentration of the regions in the horizontal plane, such as shown as exemplary dopant plane 0449, may have regions that differ substantially in dopant concentration, for example, 10× greater, and/or may have a different dopant type, such as, for example p-type or n-type dopant. Additionally, the annealing of deposited dielectrics and etch damage, for example, oxide depositions and silicon etches utilized in the transferred layer isolation processing, for example, STI (Shallow Trench Isolation) processing or strained source and drain processing, may be accomplished by optical annealing. Second device layer metal interconnect 0461 may include electrically conductive materials such as copper, aluminum, conductive forms of carbon, and tungsten. Donor wafer device structures 0450 may utilize second device layer metal interconnect 0461 and thru layer vias (TLVs) 0460 to electrically couple (connection paths) the donor wafer device structures 0450 to the acceptor wafer metal connect pads or strips 0480, and thus couple donor wafer device structures (the second layer transistors) with acceptor wafer device structures (first layer transistors). Thermal TLVs 0462 may be constructed of thermally conductive but not electrically conductive materials, for example, DLC (Diamond Like Carbon), and may connect donor wafer device structures 0450 thermally to shield/heat sink layer 0488. TLVs 0460 may be constructed out of electrically and thermally conductive materials, such as Tungsten, Copper, or aluminum, and may provide a thermal and electrical connection path from donor wafer device structures 0450 to shield/heat sink layer 0488, which may be a ground or Vdd plane in the design/layout. TLVs 0460 and thermal TLVs 0462 may be also constructed in the device scribelanes (pre-designed in base layers or potential dicelines) to provide thermal conduction to the heat sink, and may be sawed/diced off when the wafer is diced for packaging. Shield/heat sink layer 0488 may be configured to act as an emf (electro-motive force) shield to prevent direct layer to layer cross-talk between transistors in the donor wafer layer and transistors in the acceptor wafer. In addition to static ground or Vdd biasing, shield/heat sink layer 0488 may be actively biased with an anti-interference signal from circuitry residing on, for example, a layer of the 3D-IC or off chip. TLVs 0460 may be formed through the transferred layers 0402. As the transferred layers 0402 may be thin, on the order of about 200 nm or less in thickness, the TLVs may be easily manufactured as a typical metal to metal via may be, and said TLV may have state of the art diameters such as nanometers or tens to a few hundreds of nanometers, such as, for example about 150 nm or about 100 nm or about 50 nm. The thinner the transferred layers 0402, the smaller the thru layer via diameter obtainable, which may result from maintaining manufacturable via aspect ratios. Thus, the transferred layers 0402 (and hence. TLVs 0460) may be, for example, less than about 2 microns thick, less than about 1 micron thick, less than about 0.4 microns thick, less than about 200 nm thick, less than about 150 nm thick, less than about 100 nm thick, less than about 50 nm thick, less than about 20 nm thick, or less than about 5 nm thick. The thickness of the layer or layers transferred according to some embodiments of the invention may be designed as such to match and enable the most suitable obtainable lithographic resolution (and enable the use of conventional state of the art lithographic tools), such as, for example, less than about 10 nm, 14 nm, 22 nm or 28 nm line width resolution and alignment capability, such as, for example, less than about 5 nm, 10 nm., 20 nm, or 40 nm alignment accuracy/precision/error, of the manufacturing process employed to create the thru layer vias or any other structures on the transferred layer or layers. The above TLV dimensions and alignment capability and transferred layer thicknesses may be also applied to any of the discussed TLVs or transferred layers described elsewhere herein. Transferred layers 0402 may be considered to be overlying the metal layer or layers of acceptor wafer 0410. Alignment marks in acceptor wafer 0410 and/or in transferred layers 0402 may be utilized to enable reliable contact to transistors and circuitry in transferred layers 0402 and donor wafer device structures 0450 and electrically couple them to the transistors and circuitry in the acceptor wafer 0410. The donor wafer 0400 may now also be processed, such as smoothing and annealing, and reused for additional layer transfers. The transferred layers 0402 and other additional regions created in the transferred layers during transistor processing are thin and small, having small volumes on the order of 2×10-16 cm3 (2×105 nm3 for a 100 nm by 100 nm×20 nm thick device). As a result, the amount of energy to manufacture with known in the art transistor and device formation processing, for example, annealing of ion-cut created defects or activation of dopants and annealing of doping or etching damages, is very small and may lead to only a small amount of shield layer or layers or regions or none to effectively shield the underlying interconnect metallization and dielectrics from the manufacturing processing generated heat. The energy may be supplied by, for example, pulsed and short wavelength optical annealing techniques described herein and incorporated references, and may include the use of optical absorbers and reflectors and optical/thermal shielding and heat spreaders, some of which are described herein and incorporated references.

A floating-body DRAM has thus been constructed, with (1) horizontally-oriented transistors—i.e., current flowing in substantially the horizontal direction in transistor channels, (2) some of the memory cell control lines. e.g., source-lines SL, constructed of heavily doped silicon and embedded in the memory cell layer, (3) side gates simultaneously deposited over multiple memory layers, and (4) monocrystalline (or single-crystal) silicon layers obtained by layer transfer techniques such as ion-cut.

FIGS. 3A-K describe another process flow to construct a horizontally-oriented monolithic 3D DRAM. This monolithic 3D DRAM utilizes the floating body effect and double-gate transistors. No mask is utilized on a "per-memory-layer" basis for the monolithic 3D DRAM concept shown in FIGS. 3A-K, and all other masks are shared between different layers. The process flow may include several steps in the following sequence.

Figure 3A:
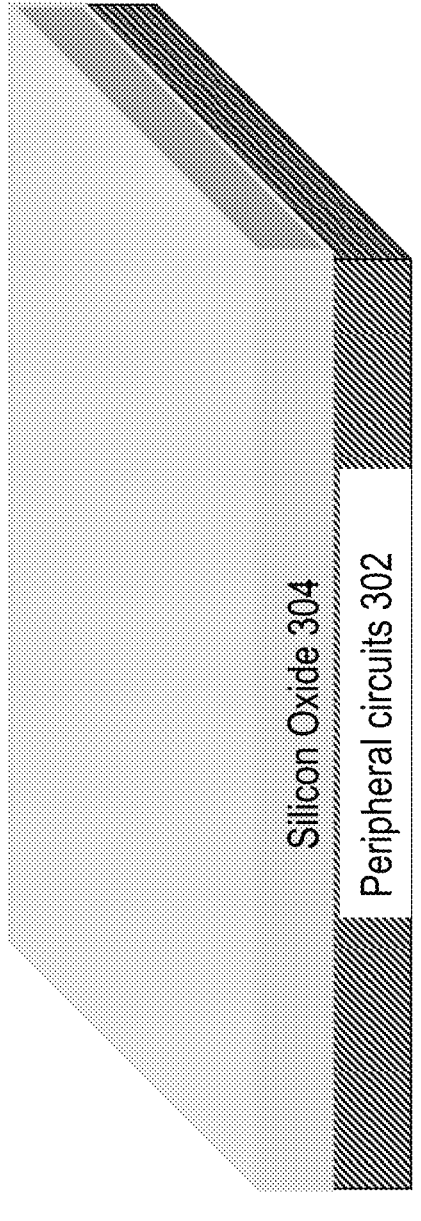
FIGS. 3A-3K are drawing illustrations of a zero-mask per layer 3D floating body DRAM.

Step (A): Peripheral circuits with tungsten, or conventional aluminum/copper, wiring 302 are first constructed and above this a layer of silicon dioxide 304 may be deposited. FIG. 3A shows a drawing illustration after Step (A).

Figure 3B:
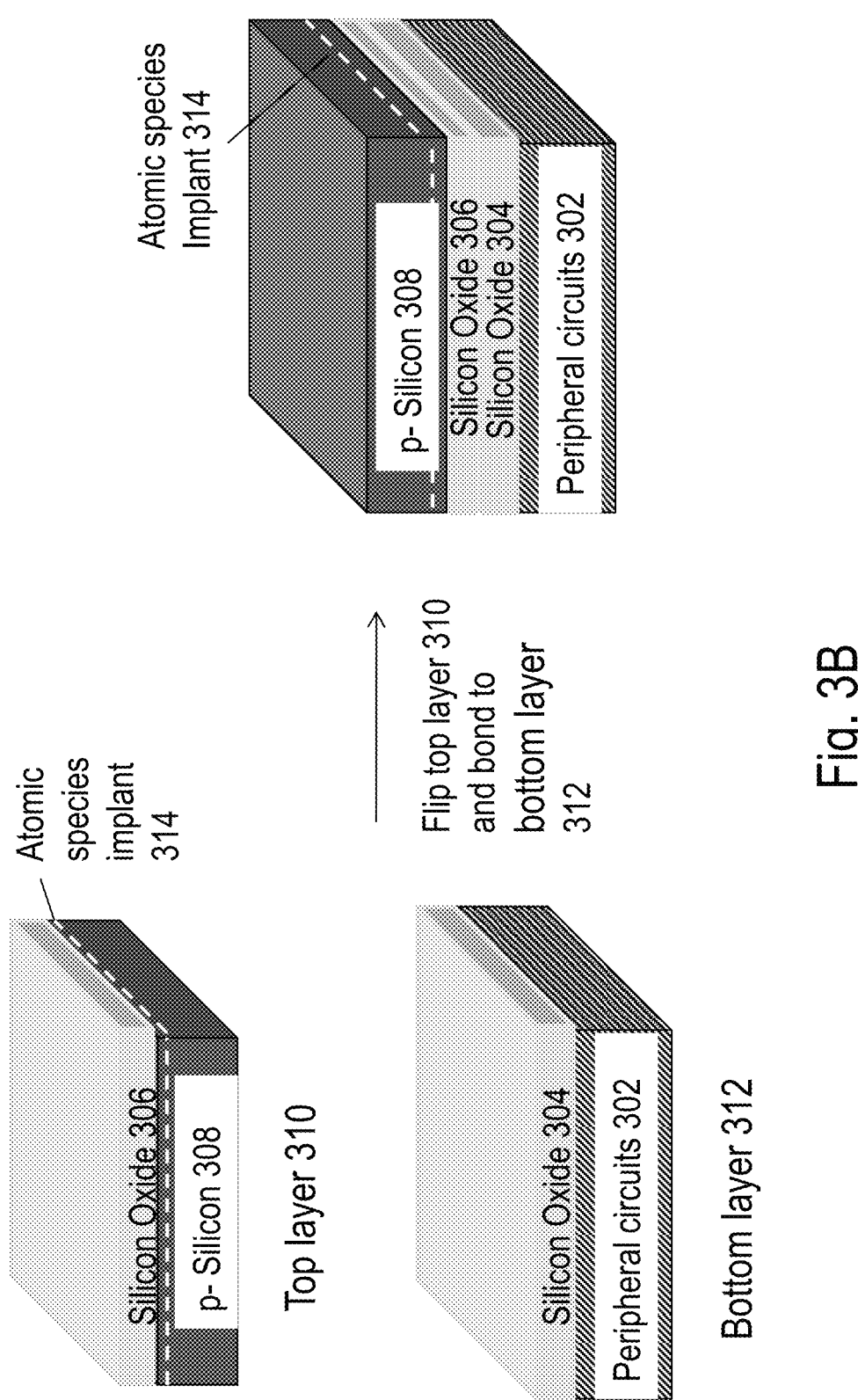

Step (B): FIG. 3B illustrates the structure after Step (B). A wafer of p– Silicon 308 has an oxide layer 306 grown or deposited above it. Following this, hydrogen may be implanted into the p– Silicon wafer at a certain depth indicated by 314. Alternatively, some other atomic species such as Helium could be (co-)implanted. This hydrogen implanted p– Silicon wafer 308 may form top layer 310. The bottom layer 312 may include the peripheral circuits 302 with oxide layer 304. The top layer 310 may be flipped and bonded to the bottom layer 312 using oxide-to-oxide bonding.

Figure 3C:
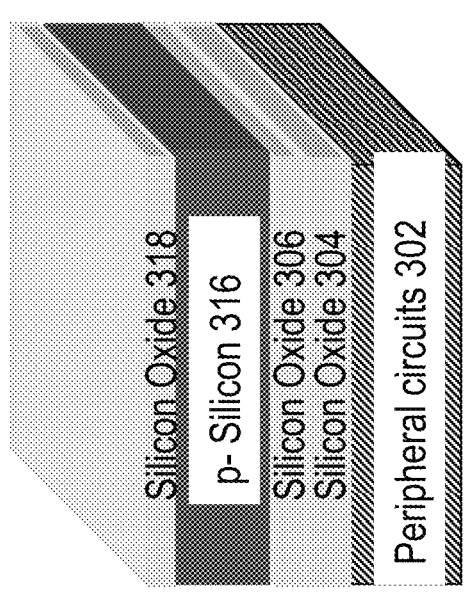

Step (C): FIG. 3C illustrates the structure after Step (C). The bonded stack of top and bottom wafers after Step (B) may be cleaved at the hydrogen plane 314 using either a anneal or a sideways mechanical force or other means. A CMP process may then be conducted. A layer of silicon oxide 318 may be deposited atop the p– Silicon layer 316. Thus, a single-crystal p– Si layer 316 may be atop the peripheral circuits, and this has been achieved using layer-transfer techniques.

Figure 3D:
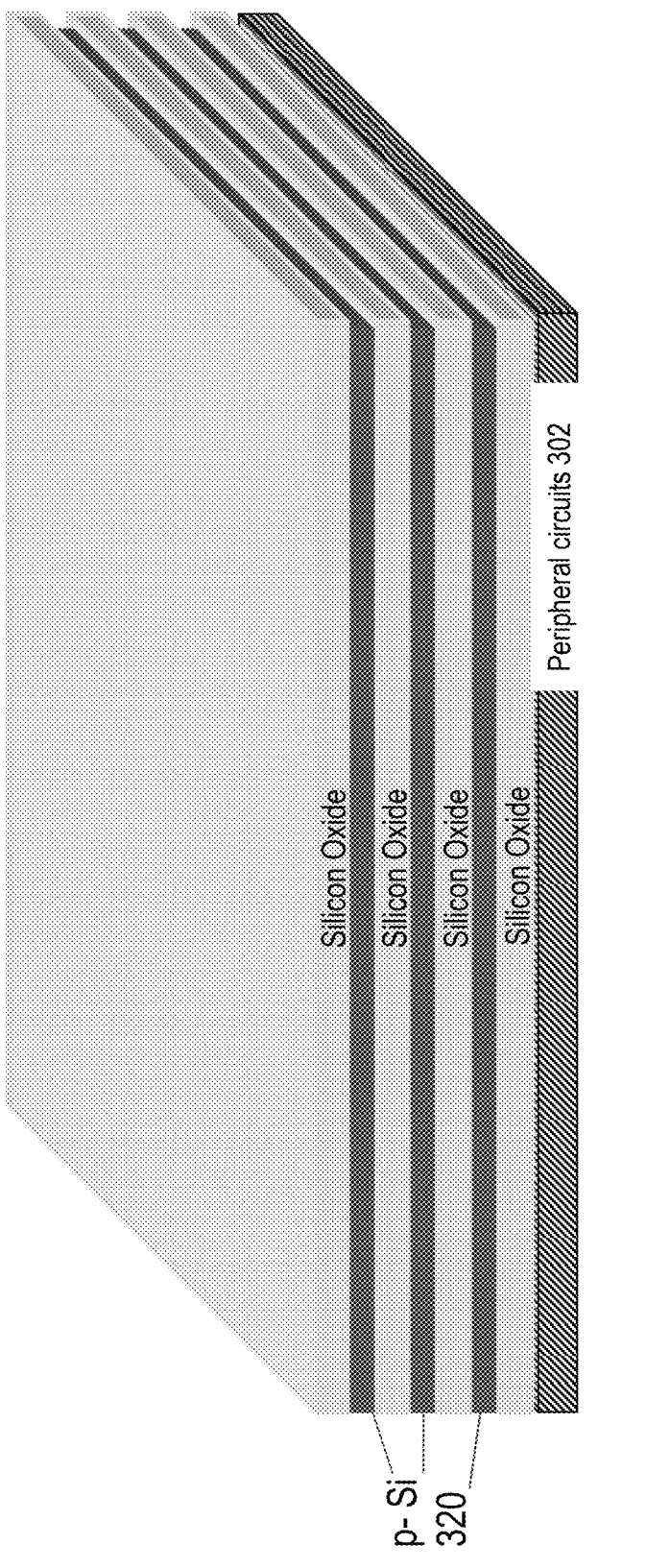

Step (D): FIG. 3D illustrates the structure after Step (D). Using methods similar to Step (B) and (C), multiple p– silicon layers 320 may be formed with silicon oxide layers in between. The composition of the 'SiO₂' layer within the stacked p– Si/SiO₂ layers may be insulators or dielectrics other than silicon dioxide such as, for example, a low-k dielectric, carbon containing silicon oxides, amorphous carbon. The thickness of the 'SiO₂' insulator layer within the stacked p– Si/SiO₂ layers may be adjusted to minimize layer to layer, strata to strata disturb mechanisms, and may include thicknesses of 50 nm, 75 nm, 100 nm, 150 nm, 200 nm, 500 nm, and less than 1000 nm. A thin conductive layer, such as a metal, may also be formed between the two bonding oxides to form a field shield to mitigate layer to layer, strata to strata disturb mechanisms, and may be electrically floating or tied to a bias, such as ground or Vdd. The stacked Si/SiO₂ layers, may alternatively be formed by successive ion implants of oxygen atoms/ions to various depths from the top surface of a monocrystalline silicon wafer/substrate and then heat treated to form oxide layers thus forming silicon layers in-between the oxide layers, a layered 'SIMOX' process approach.

Figure 3E:
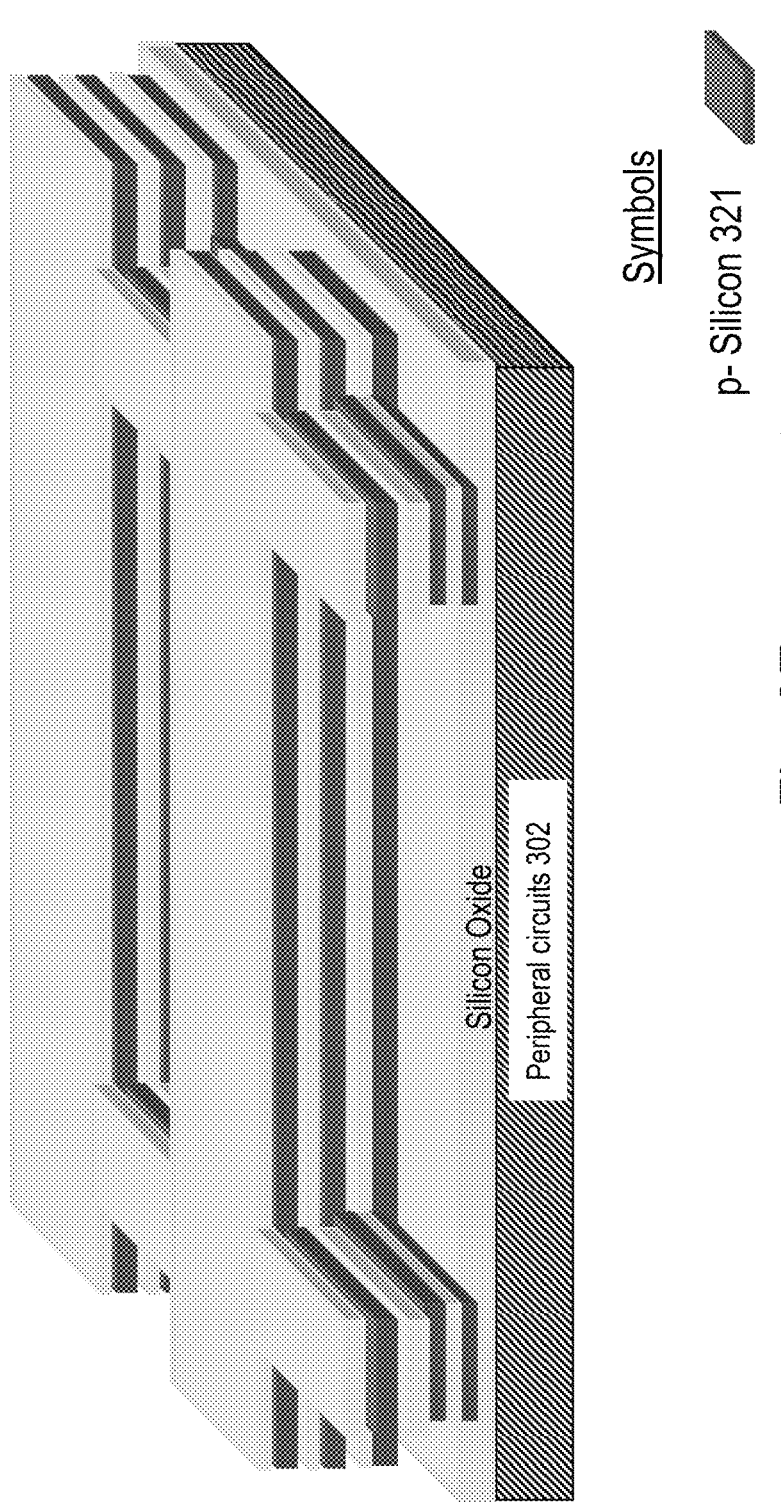

Step (E): FIG. 3E illustrates the structure after Step (E) including silicon oxide regions 322. Lithography and etch processes may be utilized to make a structure, such as, for example, as shown in FIG. 3E.

Figure 3F:
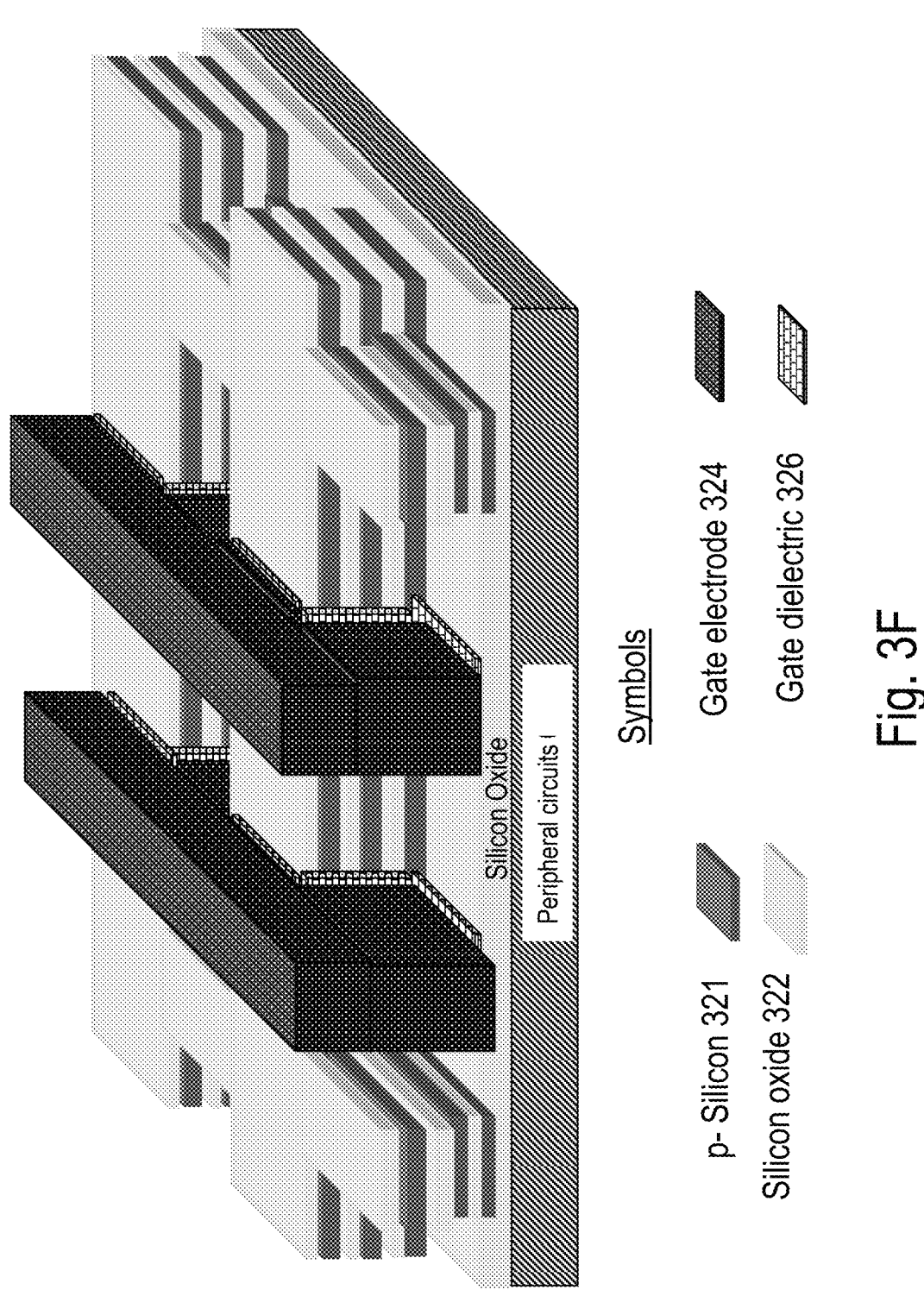

Step (F): FIG. 3F illustrates the structure after Step (F). Gate dielectric 326 and gate electrode 324 may be deposited following which a CMP may be done to planarize the gate electrode 324 regions. Lithography and etch are utilized to define gate regions. Gate dielectric 326 and gate electrode 324 may be, for example, a HKMG structure or a TEL SPA radical oxidation oxide and an appropriate work function electrode, for example, tungsten, degenerately doped polysilicon or amorphous silicon. Although the width of the p– regions 321 near and under the gates are illustrated as being larger than the thickness, one skilled in the art would recognize that the reverse (i.e., thickness larger than width) could be formed to provide increased gate control of the transistor channel.

Figure 3G:
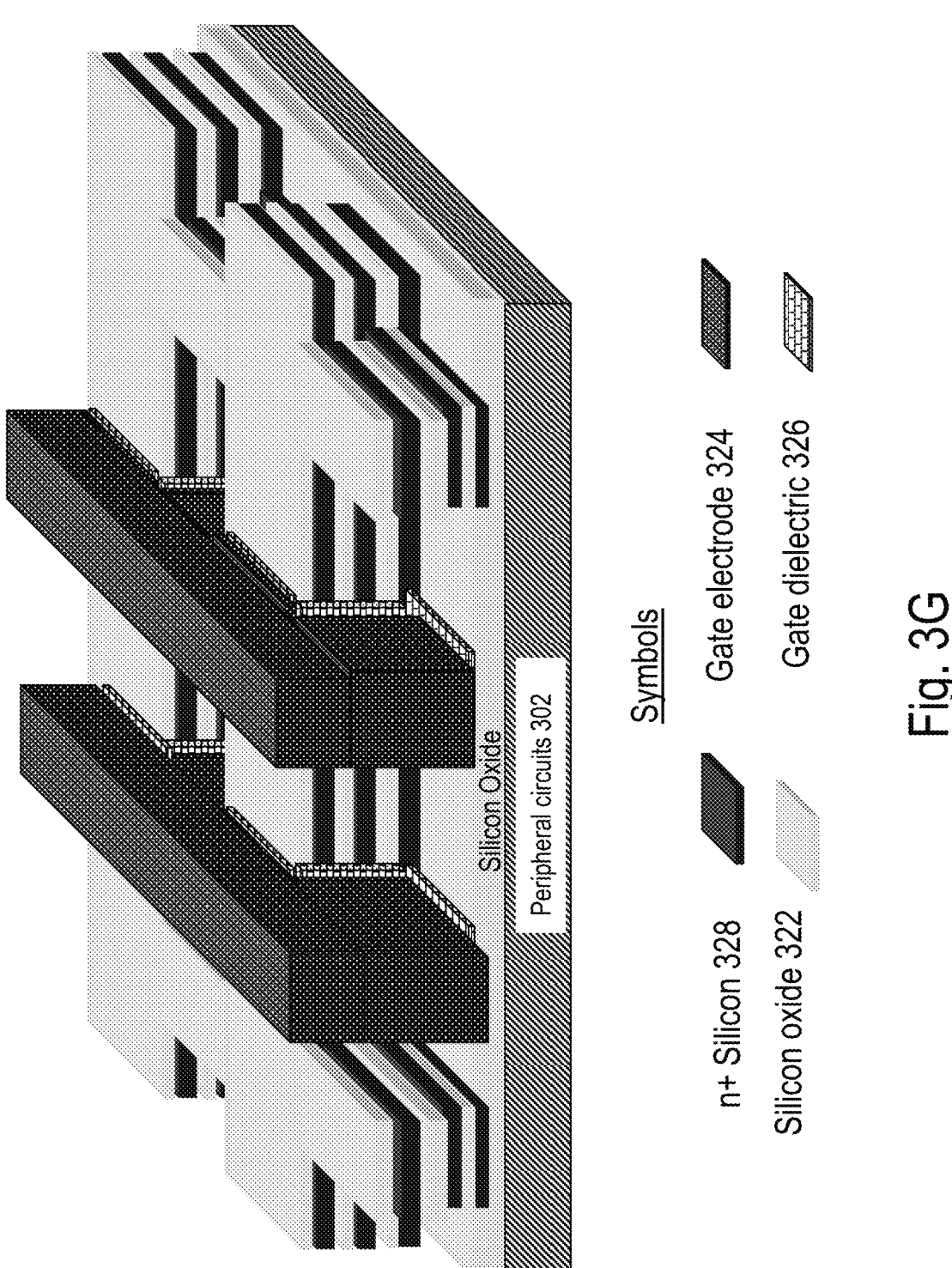

Step (G): FIG. 3G illustrates the structure after Step (G) including N+ silicon regions 328. Using the hard mask (and remaining photoresist may be utilized as part of the 'hard mask') defined in Step (F), p– regions not covered by the gate may be implanted to form n+ regions. Spacers may be utilized during this multi-step implantation process and layers of silicon present in different layers of the stack may have different spacer widths to account for lateral straggle of buried layer implants. Bottom layers could have larger spacer widths than top layers. A thermal annealing step, such as an RTA or spike anneal or laser anneal or flash anneal, may be conducted to activate the n+ implanted doped regions. The optical anneal system, such as the laser, spike, flash anneals, may be utilized to crystalize the polysilicon or amorphous silicon.

Figure 3H:
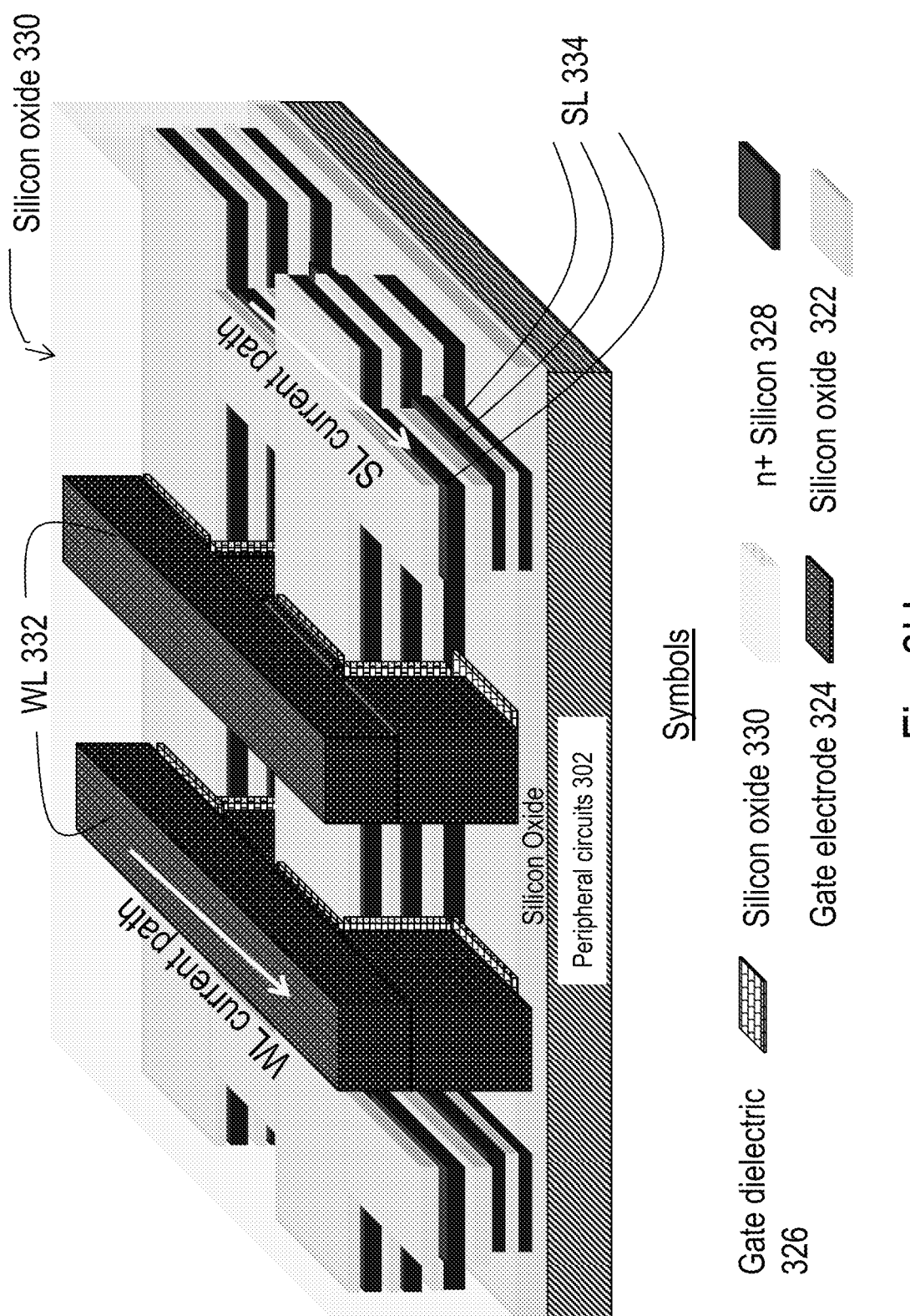

Step (H): FIG. 3H illustrates the structure after Step (H). A silicon oxide layer 330 may be deposited and planarized. For clarity, the silicon oxide layer is shown transparent, along with word-line (WL) 332 and source-line (SL) 334 regions.

Figure 3I:
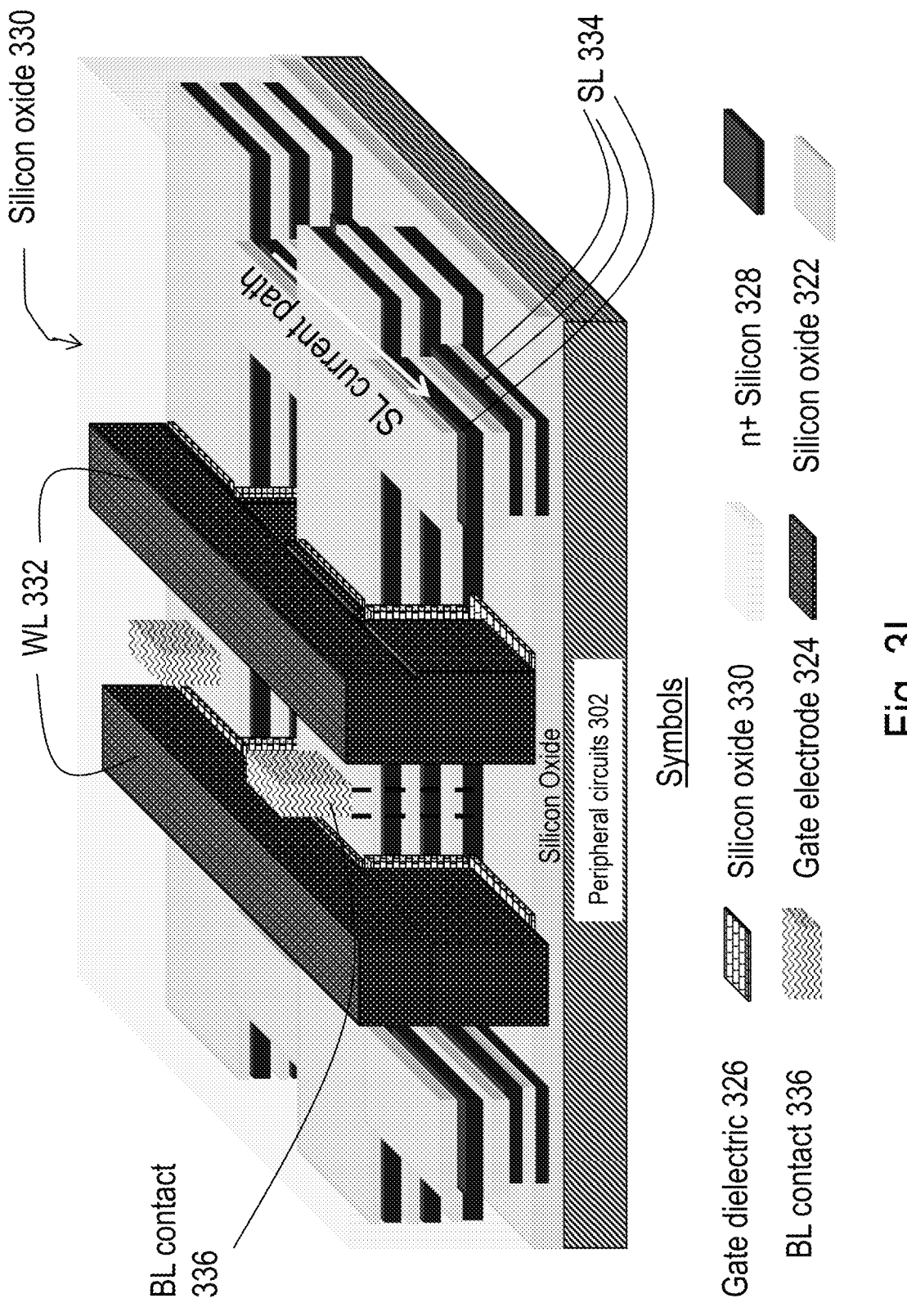

Step (I): FIG. 3I illustrates the structure after Step (I). Bit-line (BL) contacts 336 are formed by etching and deposition. These BL contacts may be shared among the layers of memory. Bit line contacts may be formed, for example, as sidewall structures or end-wall structures, with various overlaps as required by the process and layout.

Figure 3J:
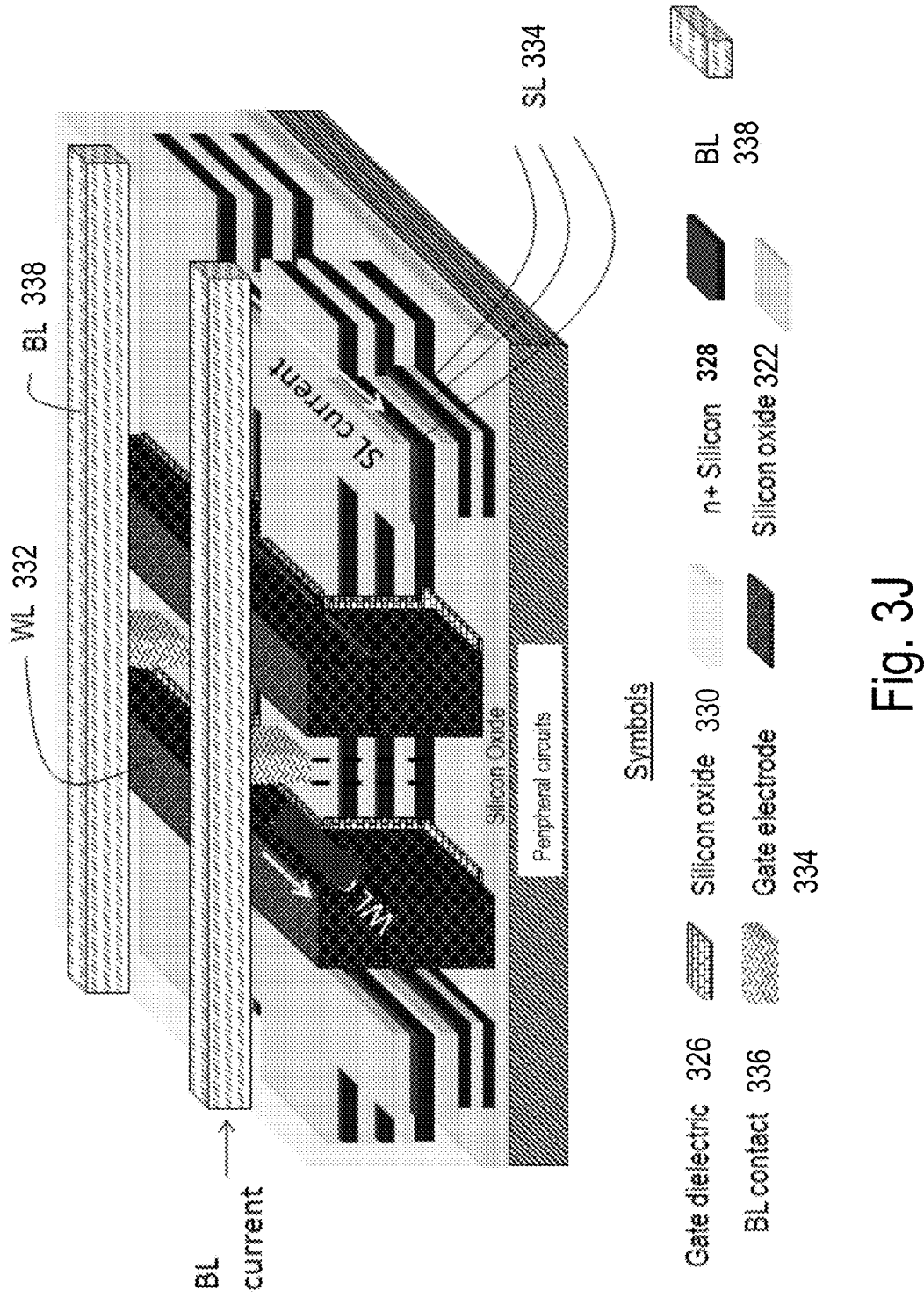

Step (J): FIG. 3J illustrates the structure after Step (J). BLs 338 may be constructed. Contacts may be made to BLs, WLs and SLs of the memory array at its edges. SL contacts can be made into stair-like structures using techniques described in "Bit Cost Scalable Technology with Punch and Plug Process for Ultra High Density Flash Memory." *VLSI Technology,* 2007 *IEEE Symposium on,* vol., no., pp. 14-15. 12-14 Jun. 2007 by Tanaka, H.; Kido, M.; Yahashi, K.; Oomura, M.; et al., following which contacts can be constructed to them. Formation of stair-like structures for SLs could be done in steps prior to Step (J) as well.

Figure 3K:
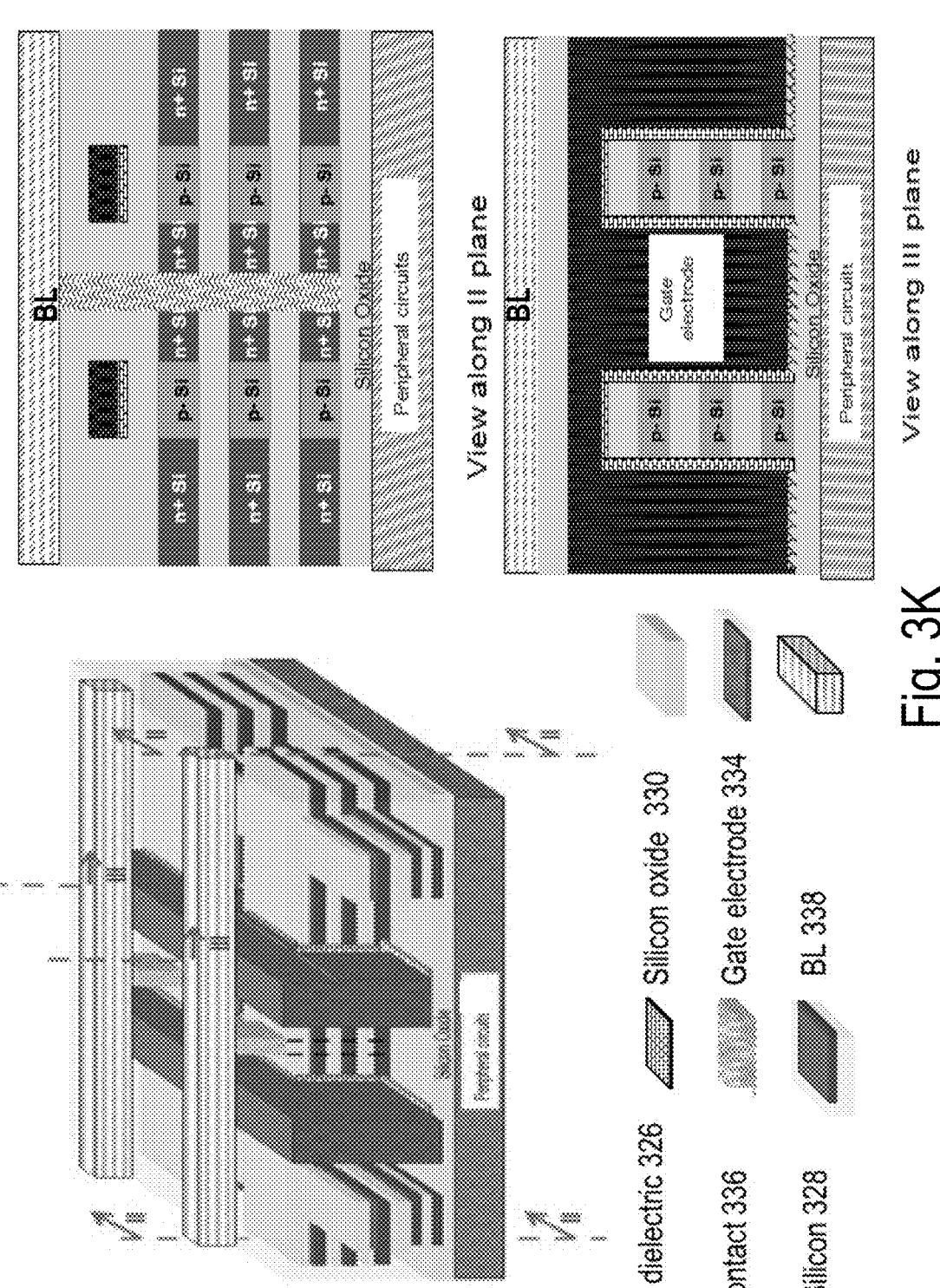

FIG. 3K shows cross-sectional views of the array for clarity. Double-gated transistors may be utilized along with the floating body effect for storing information.

A floating-body DRAM has thus been constructed, with (1) horizontally-oriented transistors—i.e. current flowing in substantially the horizontal direction in transistor channels (2) some of the memory cell control lines, e.g., source-lines SL, constructed of heavily doped silicon and embedded in the memory cell layer. (3) side gates simultaneously deposited over multiple memory layers, and (4) monocrystalline (or single-crystal) silicon layers obtained by layer transfer techniques such as ion-cut.

With the explanations for the formation of monolithic 3D DRAM with ion-cut in this section, it is clear to one skilled in the art that alternative implementations are possible. BL and SL nomenclature has been used for two terminals of the 3D DRAM array, and this nomenclature can be interchanged. Each gate of the double gate 3D DRAM can be independently controlled for better control of the memory cell. To implement these changes, the process steps in FIGS. 2 and 3 may be modified. Moreover, selective epi technology or laser recrystallization technology could be utilized for implementing structures shown in FIG. 2A-M and FIG. 3A-K. Various other types of layer transfer schemes and anneal/shielding techniques that have been described in the referenced and incorporated patents can be utilized for construction of various 3D DRAM structures. Furthermore, buried wiring, i.e. where wiring for memory arrays is below the memory layers but above the periphery, may also be used. In addition, other variations of the monolithic 3D DRAM concepts are possible, such as, for example, forming the periphery circuits above and/or below the memory stack layers.

The positive charge stored, such as in the floating body DRAM described in FIGS. 2-3, may decrease over time due to the diode leakage current of the p-n junctions formed between the floating body and n+ regions and due to charge recombination. A method to refresh all memory cells in parallel have been described in "Autonomous Refresh of Floating Body Cell (FBC)". Ohsawa et al., pp. 801-804. International Electron Device Meeting. 2008 ("Ohsawa"). U.S. Pat. No. 7,170,807 "Data Storage Device and Refreshing Method for Use with Such Device", Fazan et al. ("Fazan") and in U.S. Pat. No. 8,264,875 "A Semiconductor Memory Device Having an Electrically Floating Body Transistor". Widjaja and Or-Bach ("Widjaja"), which are incorporated by reference herein in entirety. Ohsawa and Fazan teach an autonomous refresh method by applying a periodic gate and drain voltage pulses and Widjaja describes a parallel refresh method by applying a bias to the back bias terminal.

Figure 4B:
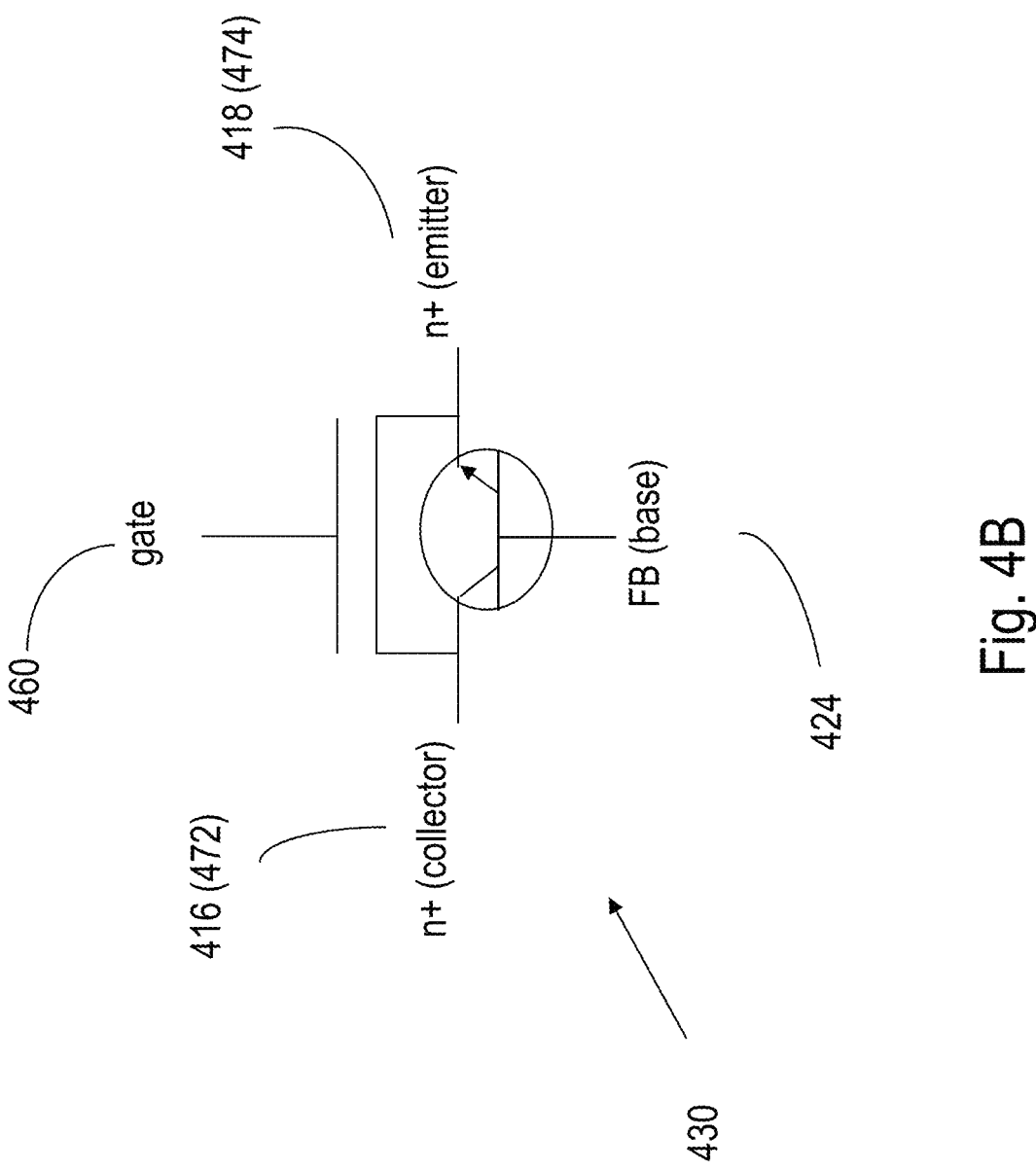

FIG. 4A is a drawing illustration of the cross-section of a memory cell 450 in a memory layer of the 3D DRAM device shown in FIG. 2L. FIG. 4B is a drawing illustration of the equivalent circuit representation of the memory cell shown in FIG. 4A. The refresh operation will be described with reference to FIGS. 4A and 4B, although the same principle applies to other 3D DRAM described herein, for example, as shown in FIG. 3K.

As shown in FIG. 4A, memory cell 450 may include a floating body 424 of p-type conductivity. The floating body 424 may be bounded by an insulating region 422, n+ regions 416 and 418, and by the surface 414. A gate 460 may be positioned in-between the n+ regions 416 and 418, and may be insulated from the floating body region 424 by an insulating layer 462, and may be connected to gate connectivity 470.

As shown in FIG. 4B, inherent in the each of the floating body DRAM memory cells 450 is n-p-n bipolar device 430 formed by n+ region 416 (the collector region), floating body 424 (the base region), and n+ region 418 (the emitter region). The collector n+ region 416 can be connected to the SL terminal 472 and the emitter region 418 can be connected to the BL terminal 474, or vice versa. The refresh operation can be performed by applying a positive voltage to the collector n+ region 416 while simultaneously grounding the emitter region 418. The refresh operation is relatively independent of the voltage applied to gate 460. In some embodiments of the invention, the gate may be grounded.

If floating body 424 is sufficiently positively charged, a state corresponding to logic-1, the bipolar device 430 will be turned on. In particular, the voltage across the reversed biased p-n junction between the floating body 424 and the collector n+ region 416 may cause a small current to flow across the junction. Some of the current may be in the form of hot carriers accelerated by the electric field across the junction. These hot carriers may collide with atoms in the semiconductor lattice which may generate hole-electron pairs in the vicinity of the junction. The electrons may be swept into the collector n+ region 416 by the electric field, while the holes may be swept into the floating body region 424.

The hole current flowing into the floating region 424 (usually referred to as the base current) will maintain the logic-1 state data. The efficiency of the refresh operation can be enhanced by designing the bipolar device formed by collector n+ region 416, floating region 424, and emitter region 418 to be a low-gain bipolar device, where the bipolar gain is defined as the ratio of the collector current flowing out of collector n+ region 416 to the base current flowing into the floating region 424.

Figure 4C:
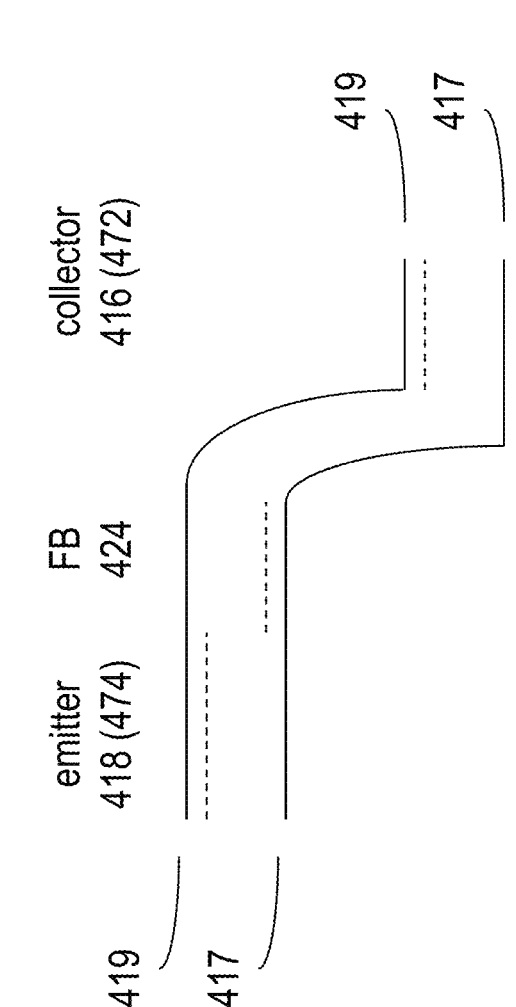

FIG. 4C is a drawing illustration of the energy band diagram of the intrinsic n-p-n bipolar device 430 when the floating body region 424 is positively charged and a positive bias voltage is applied to the collector n+ region 416. The dashed lines indicate the Fermi levels in the various regions of the n-p-n transistor 430. The Fermi level is located in the band gap between the solid line 417 indicating the top of the valance band (the bottom of the band gap) and the solid line 419 indicating the bottom of the conduction band (the top of the band gap) as is well known in the art. The positive charge in the floating body region lowers the energy barrier of electron flow into the base region. Once injected into the floating body region 424, the electrons will be swept into the collector n+ region 416 due to the positive bias applied to the collector n+ region 416. As a result of the positive bias, the electrons may be accelerated and create additional hot carriers (hot hole and hot electron pairs) through an impact ionization mechanism. The resulting hot electrons flow into the collector n+ region 416 while the resulting hot holes will subsequently flow into the floating body region 424. This process restores the charge on floating body 424 and will maintain the charge stored in the floating body region 424 which will keep the n-p-n bipolar transistor 430 on for as long as a positive bias is applied to the collector n+ region 416.

If floating body 424 is neutrally charged (the voltage on floating body 424 being equal to the voltage on grounded emitter region 418), a state corresponding to logic-0, no appreciable current will flow through the n-p-n transistor 430. The bipolar device 430 will remain off and no appreciable impact ionization occurs. Consequently memory cells in the logic-0 state will remain in the logic-0 state.

Figure 4D:
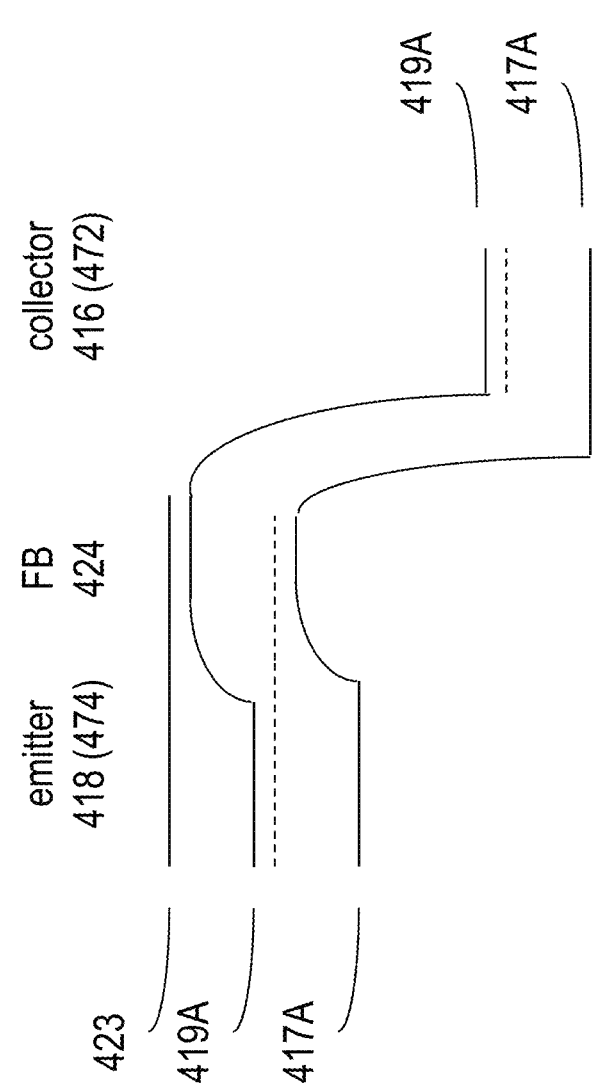

FIG. 4D shows the energy band diagram of the intrinsic n-p-n bipolar device 430 when the floating body region 424 is neutrally charged and a bias voltage is applied to the collector n+ region 416. In this state the energy level of the band gap bounded by solid lines 417A and 419A is different in the various regions of n-p-n bipolar device 430. Because the potential of the floating body region 424 and the emitter region 418 is substantially equal, the Fermi levels are constant, resulting in an energy barrier between the emitter region 418 and the floating body region 424. Solid line 423 indicates, for reference purposes, the energy barrier between the emitter region 418 and the floating body region 424. The energy barrier prevents electron flow from the emitter region 418 to the floating body region 424. Thus the n-p-n bipolar device 430 will remain off.

Figure 4E:
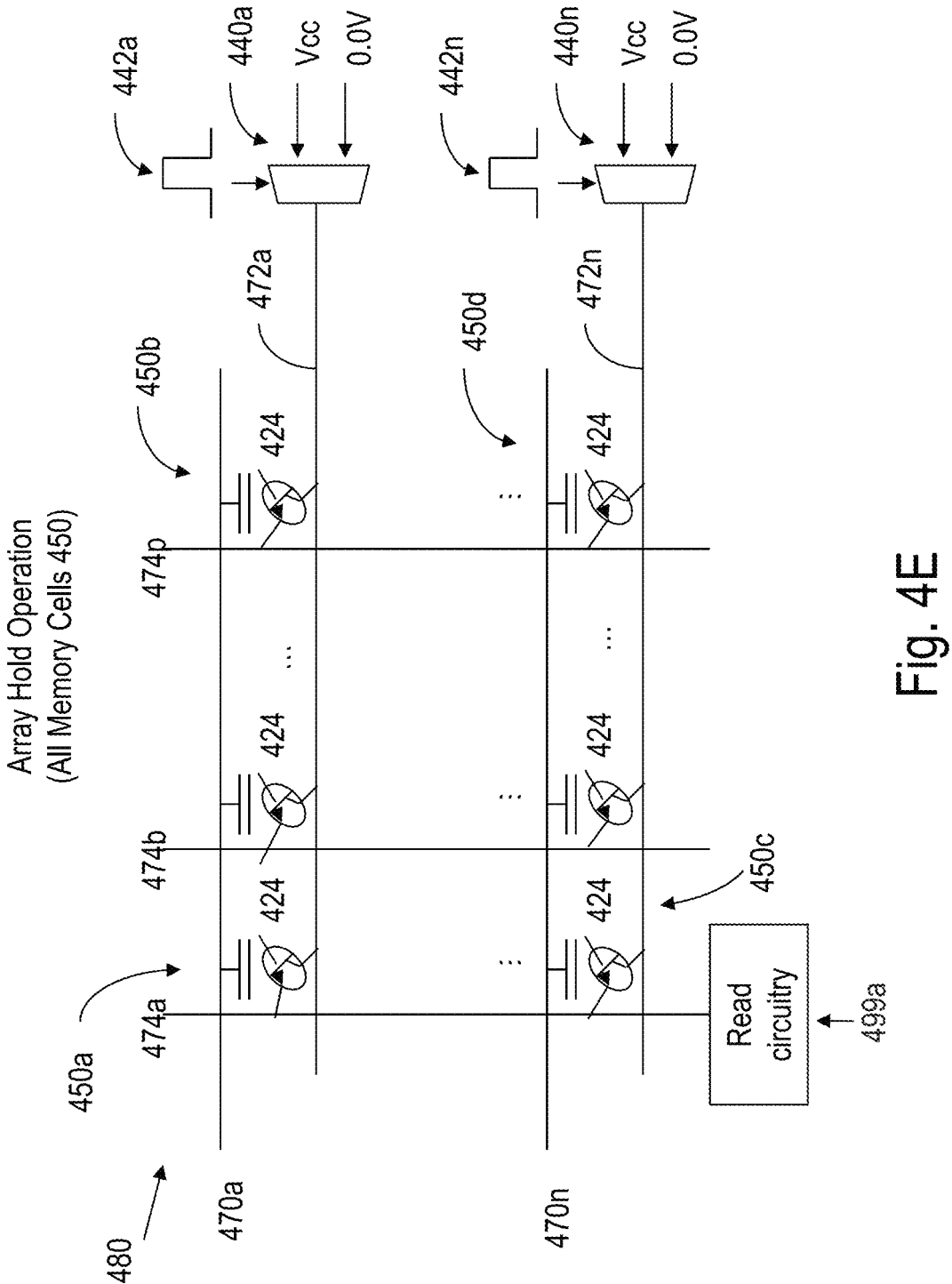

FIG. 4E is a drawing illustration of an exemplary refresh operation in an exemplary array 480 formed by a plurality of memory cell 450 (corresponds to a memory layer of the 3D DRAM device, such as those described herein) is shown in FIG. 4E. Present in FIG. 4E are word lines (WLs) 470a through 470n, source lines (SLs) 472a through 472n, and bit lines (BLs) 474a through 474p. In this example, each of the word lines 470a through 470n is associated with a single row of memory cells 450 and is coupled to the gate 460 of each memory cell 450 in that row. Similarly, each of the source lines 472a through 472n is associated with a single row of memory cells 450 and is coupled to the collector n+ region 416 of each memory cell 450 in that row. Each of the bit lines 474a through 474p is associated with a single column of memory cells 450 and is coupled to the emitter region 418 of each memory cell 450 in that column. In this exemplary refresh operation, there is no individually selected memory cell. Rather cells are selected in rows by the source lines 472a through 472n and may be selected as individual rows, as multiple rows, or as all of the rows comprising array 480. Cells can also be selected in columns by bit lines 474a through 474p and may be selected as individual columns, as multiple columns, or as all of the columns comprising array 480.

Persons of ordinary skill in the art will appreciate that while exemplary array 480 is shown as a single continuous array in FIG. 4E, that many other organizations and layouts are possible like, for example, word lines may be segmented or buffered, bit lines may be segmented or buffered, source lines may be segmented or buffered, the array 480 may be broken into two or more sub-arrays, control circuits such as word decoders, column decoders, segmentation devices, sense amplifiers, write amplifiers may be arrayed around exemplary array 480 or inserted between sub-arrays of array 480. Thus the exemplary embodiments, features, design options, etc., described are not limiting in any way.

Also shown in FIG. 4E are multiplexers 440a through 440n and voltage waveforms 442a through 442n. A constant positive bias can be applied to the collector n+ regions 416 of memory cells 450 (through SL terminal 472). Alternatively, a periodic pulse of positive voltage can be applied to the collector n+ regions 416 of memory cells 450 through SL terminal 472 as opposed to applying a constant positive bias to reduce the power consumption of the memory cell 450. FIG. 4E further shows multiplexers 440a through 440n each coupled to one of the source lines 472a through 472n that determine the bias voltages applied to SL terminals 472a through 472n, which will be determined by different operating modes. The pulsing of the voltage on the SL terminals may be controlled, for example, by applying pulses of logic signals such as, for example, waveforms 442a through 442n to the select input of multiplexers 440a through 440n thereby selecting, for example, ground (0.0 volts) or a power supply voltage such as $V_{CC}$. Many other techniques may be used to pulse the voltage applied to SL terminals 472a through 472n such as, for example, applying the waveforms 442a through 442n at different times, or applying them simultaneously, or coupling the select inputs of multiplexers 442a through 442n together and applying a single pulsed waveform to all of the multiplexers 442a through 442n simultaneously (not shown in the figure). Many other options will readily suggest themselves to persons of ordinary skill in the art. Thus the described exemplary embodiments are not limiting in any way.

Figure 4F:
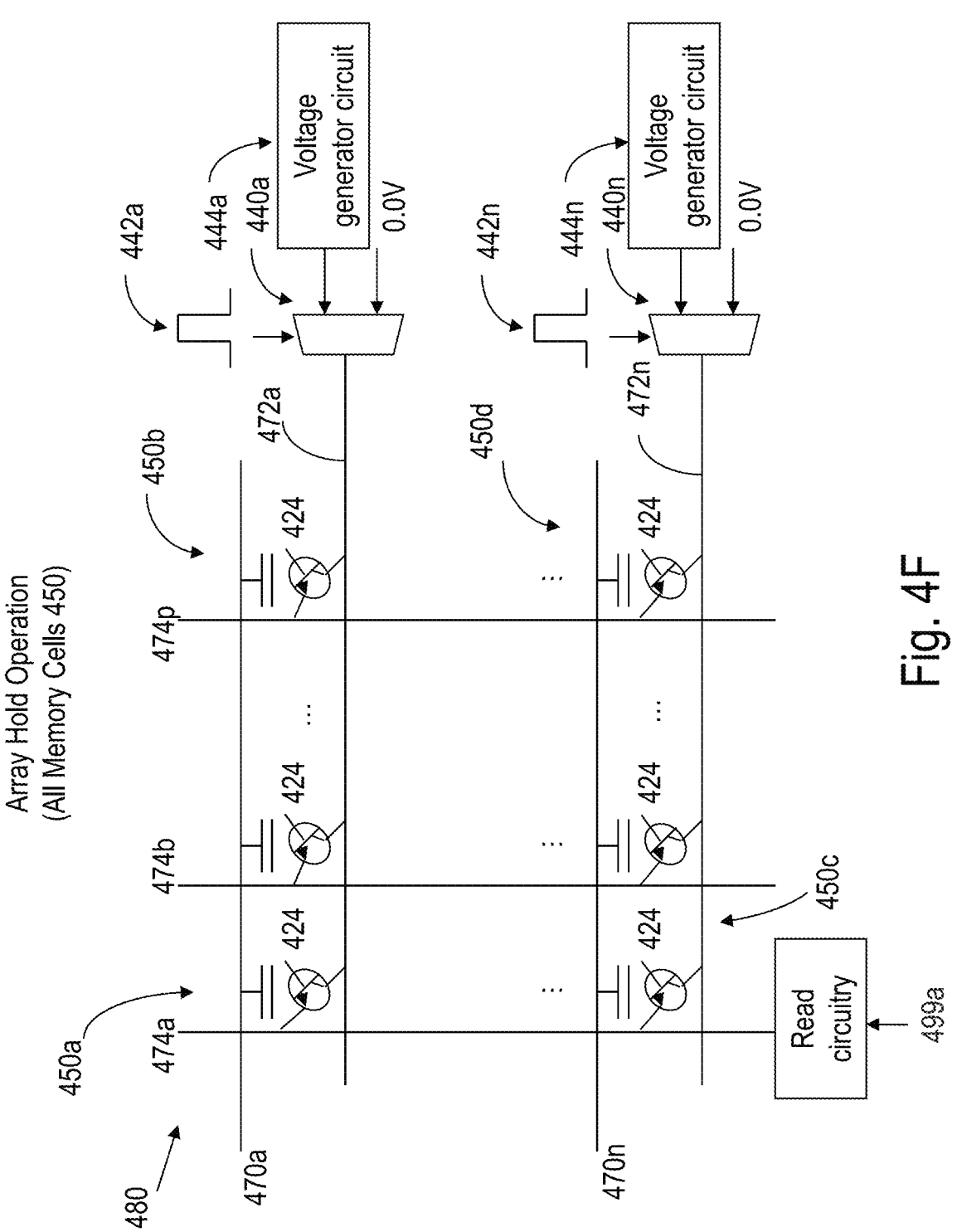

FIG. 4F is a drawing illustration of another method to provide voltage pulses to SL terminals 472a through 472n of exemplary array 480 of memory cells 450. The positive input signals to multiplexers 440a through 440n may be generated by voltage generator circuits 444a through 444n coupled to one input of each of the multiplexers 440a through 440n. Alternatively, a single voltage generator circuit may be coupled to each of the multiplexers 440a through 440n reducing the amount of overhead circuitry required to refresh the memory cells 450 of array 480. Other embodiments are possible including, for example, applying the waveforms 442a through 442n at different times, or applying them simultaneously, or coupling the select inputs of multiplexers 442a through 442n together and applying a single pulsed waveform to all of the multiplexers 442a through 442n simultaneously (not shown in the figure).

Figure 4G:
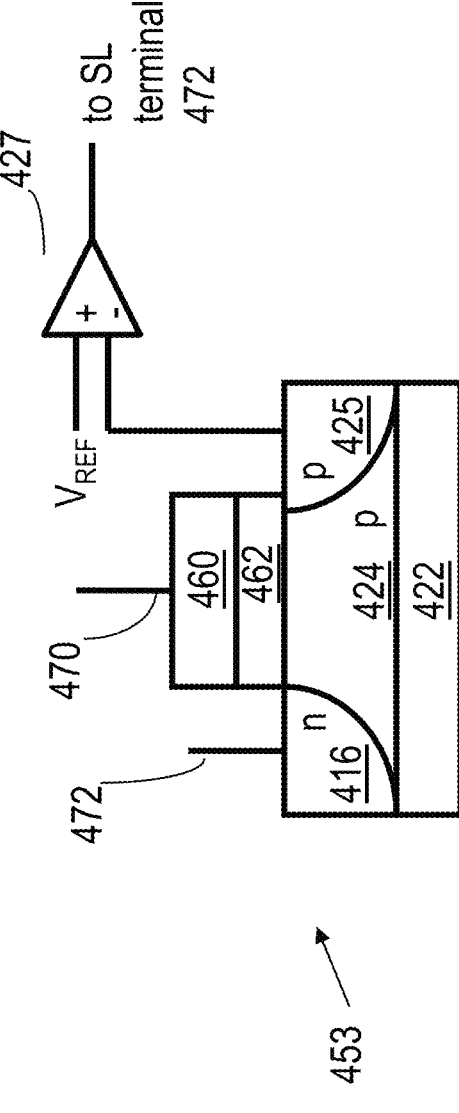

FIG. 4G is a drawing illustration of a reference generator circuit suitable for use as reference generator circuits 444a through 444n in FIG. 4F. The reference generator includes reference cell 453, which may consist of a modified version of memory cell 450 described above with region 425 of p-type conductivity. The p-type region 425 allows for a direct sensing of the floating body region 424 potential. P-type region 425 is drawn separately even though it has the same conductivity type as floating body region 424 because it may be doped differently, such as, for example, a higher concentration of doping than floating body region 424, to facilitate contacting it. The reference cell 453 for example can be configured to be in state logic-1 where the potential of the floating body region 424 is positive, for example at +0.5V. The potential sensed through the p-type region is then compared with a reference value $V_{REF}$, e.g. +0.5V, by operational amplifier 427. If the potential of the floating body region 424 is less than the reference value, the voltage applied to the SL terminal 472 (which is connected to drain n+ region 416 of the reference cell 453 and is also connected to collector n+ region 416 of the memory cell 450) may be increased by operational amplifier 427 until the potential of the floating body region 424 reaches the desired reference voltage. If the potential of the floating body 424 region is higher than that of the reference value, the voltage applied to SL terminal 472 can be reduced by operational amplifier 427 until the potential of the floating body region 424 reaches the desired reference voltage. Reference voltage $V_{REF}$ may be generated in many different ways such as, for example, using a band gap reference, a resistor string, a digital-to-analog converter, and so on. Similarly alternate voltage generators of types known in the art may be used.

Also shown in FIGS. 4E and 4F, read circuitry 499a may be coupled to the bit line 474a. In some embodiments, a reading circuit 499b through 499p (not shown in FIGS. 4E and 4F) may be coupled to each bit of the bit lines 474b through 474p, while in other embodiments reading circuit 499a may be shared between multiple columns using a decoding scheme (not shown).

Figures 5A, 5B:
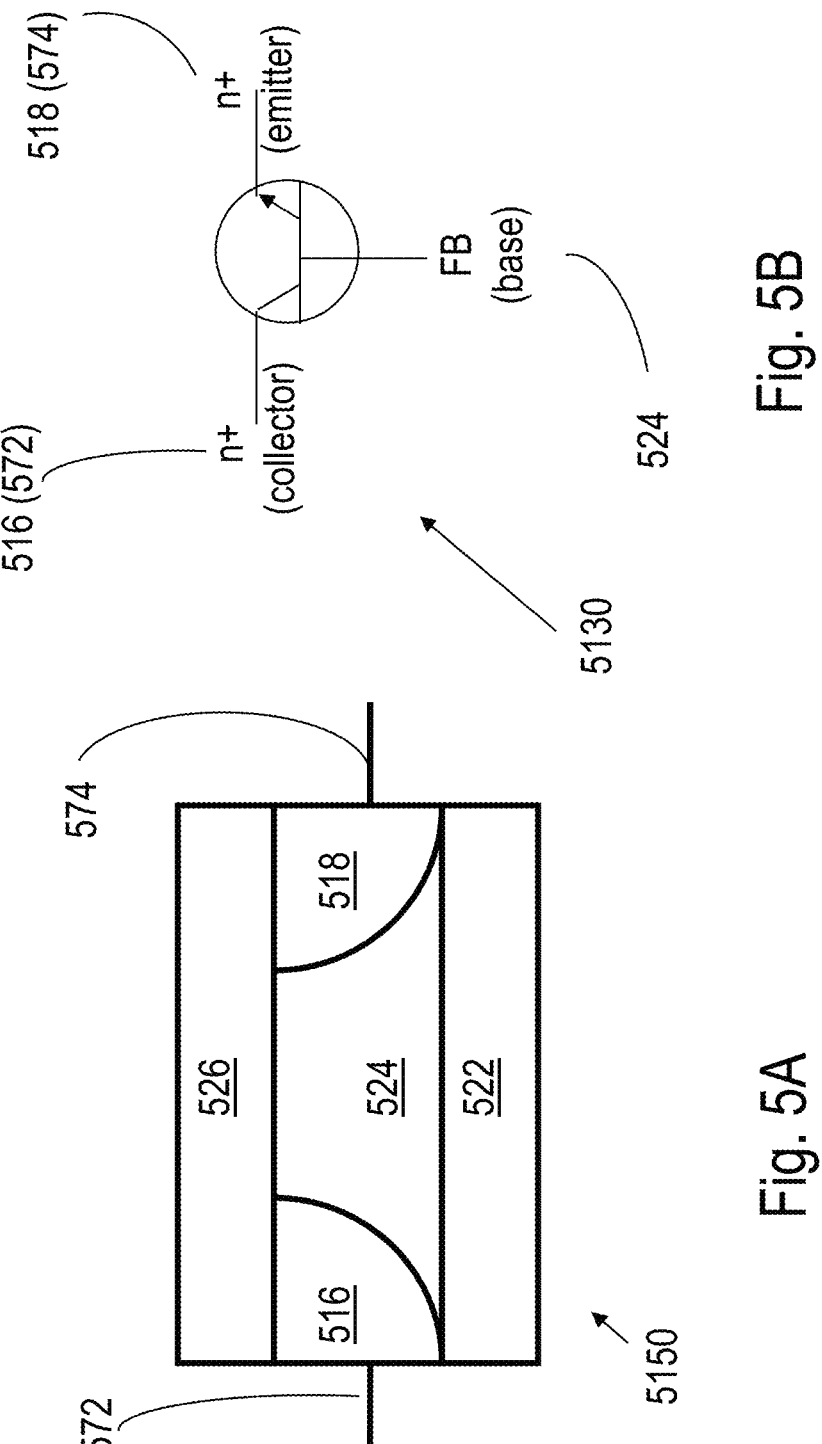
FIGS. 5A-5H are drawing illustrations of additional techniques to refresh floating body DRAM cells.

FIG. 5A is a drawing illustration of another embodiment of a gateless memory cell 5150 in a memory layer of the 3D DRAM device. FIG. 5B is a drawing illustration of the equivalent circuit representation of the memory cell shown in FIG. 5A. Similar to memory cell 450 shown in FIG. 4A, memory cell 5150 includes a floating body 524 of p-type conductivity. The floating body 524 is bounded by the insulator layer 522, n+ regions 516 and 518, and by the insulator layer 526. A difference to the memory cell 450 shown in FIG. 4A is that no gate electrode exists in memory cell 5150. The n+ regions 516 and 518 may be configured differently, for example, the n+ region acting as the emitter region (n+ region 518) is typically more heavily doped than the n+ collector region (n+ region 516).

As shown in FIG. 5B, floating body DRAM cell 5150 may include an n-p-n bipolar device 5130, n-p-n bipolar device 5130 may include n+ region 516 (the collector region), floating body 524 (the base region), and n+ region 518 (the emitter region). The collector region can be connected to the SL terminal 572 and the emitter region can be connected to the BL terminal 574, or vice versa.

Figure 5C:
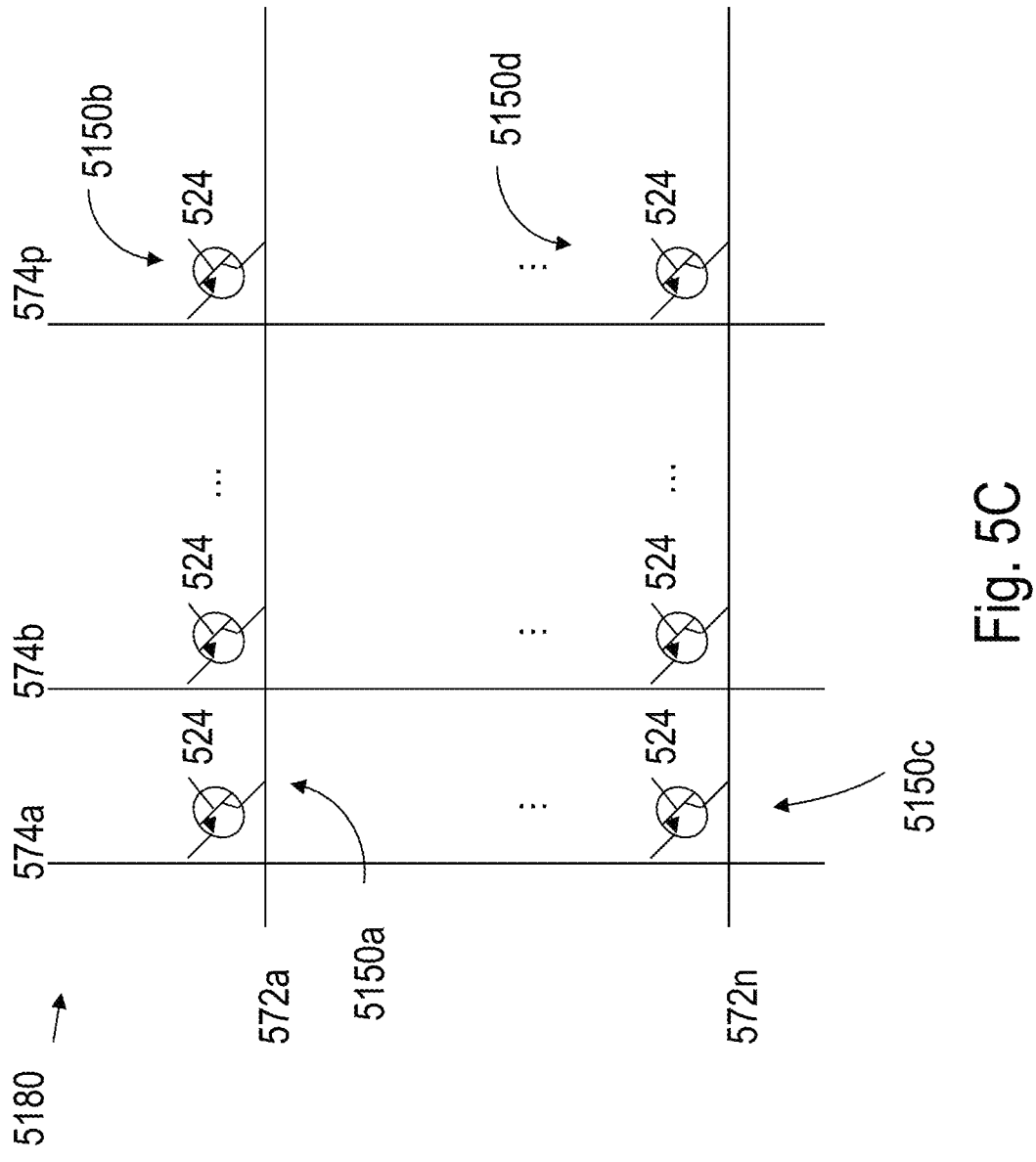

FIG. 5C is a drawing illustration of an exemplary memory array 5180 which will be used in subsequent drawing figures to illustrate the various operations that may be performed on memory cell 5150 when arranged in an array to create a memory device. Memory array 5180 comprises in part representative memory cells 5150a, 5150b, 5150c, and 5150d. In operations where a single memory cell is selected, representative memory cell 5150a will represent the selected cell while the representative memory cells 5150b, 5150c, and 5150d will represent the various cases of unselected memory cells sharing a row, sharing a column, or sharing neither a row nor a column respectively with selected representative memory cell 5150a. Similarly in the case of operations performed on a single row or column, representative memory cell 5150a will be on the selected row or column.

The memory cell states are represented by the charge in the floating body 524, which modulates the intrinsic n-p-n bipolar device 5130. The collector region can be connected to the SL terminal 572 and the emitter region can be connected to the BL terminal 574, or vice versa. If cell 5150 has a substantial number of holes stored in the body region 524, then the memory cell may have a higher bipolar current (e.g. current flowing from BL to SL terminals during read operation) compared to if cell 5150 does not store an appreciable amount of holes in body region 524.

Figure 5D:
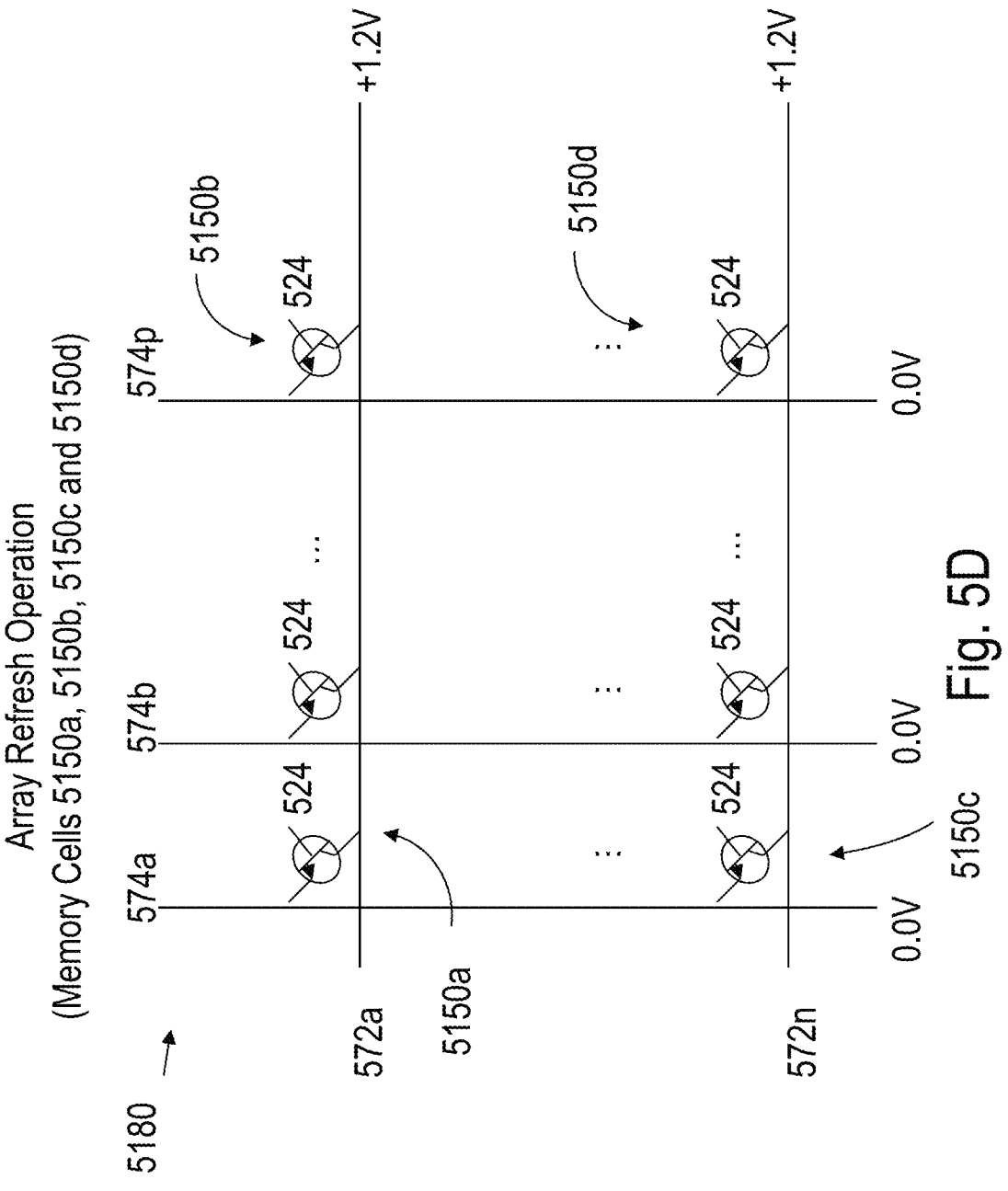

The positive charge stored in the body region 524 may decrease over time due to the p-n diode leakage formed by floating body 524 and n+ regions 516 and 518, and due to charge recombination. A refresh operation applied to the entire memory array 5180 is illustrated in FIG. 5D. The refresh operation on memory cell 5150 can be performed by applying a positive bias to the collector region 516 (connected for example to SL terminal 572) while grounding the emitter region 518 (connected for example to BL terminal 574). If floating body 524 is substantially positively charged (i.e. in a state logic-1), the n-p-n bipolar transistor 5130 will be turned on.

A fraction of the bipolar transistor 5130 current will then flow into floating body region 524 and maintain the state logic-1 data. The efficiency of the refresh operation can be enhanced by designing the bipolar transistor 5130 to be a low-gain bipolar device, where the bipolar gain is defined as the ratio of the collector current flowing out of collector region 516 to the base current flowing into floating body region 524.

For memory cells in state logic-0 data, the bipolar device will not be turned on, and consequently no appreciable base hole current will flow into floating region 524. Therefore, memory cells in state logic-0 will remain in state logic-0).

A periodic pulse of positive voltage can be applied to the SL terminal 572 as opposed to applying a constant positive bias to reduce the power consumption of the memory cell 5150.

In the entire array refresh operation of FIG. 5D, source line terminals 572a through 572n may be biased at +1.2V and bit lines 574a through 574p may be biased to 0.0V. This refreshes substantially all of the cells in memory array 5180.

Figure 5E:
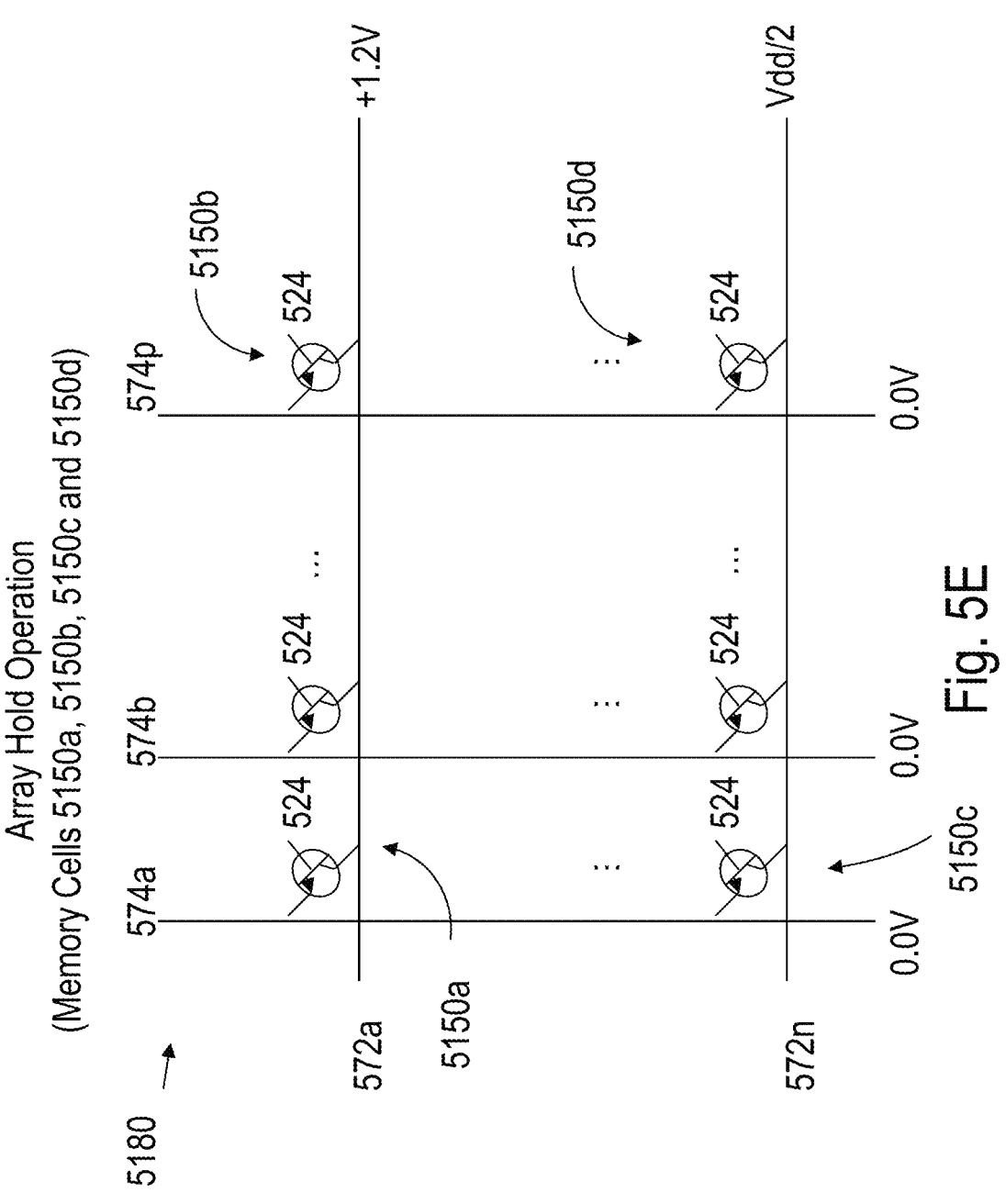

A single row operation can also be performed on memory array 5180 as illustrated in FIG. 5E, where selected source line terminal 572a may be biased at +1.2V while the unselected source line terminals 572b (not shown) through 572n may be biased at Vdd/2, and bit lines 574a through 574p may be biased to 0.0V. This refreshes substantially all of the selected cells in memory array 5180.

Figure 5F:
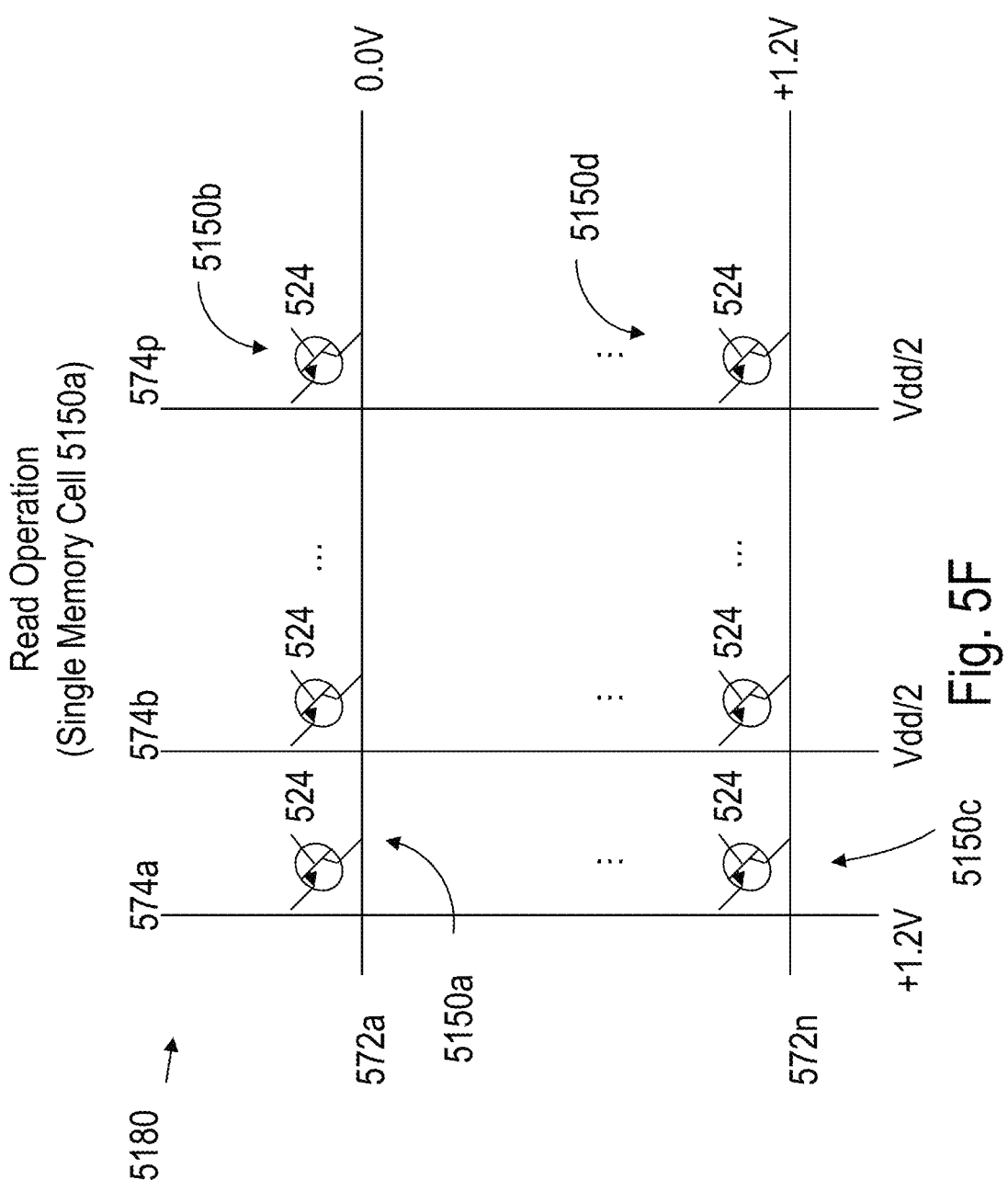

A single memory cell read operation is illustrated in FIG. 5F. The read operation for memory cell 5150a, for example, can be performed by sensing the current of the bipolar device 5130 by applying a positive voltage to the selected BL terminal 574a and zero voltage to the selected SL terminal 572a. The positive voltage applied to the selected BL terminal may be less than or equal to the positive voltage applied to the SL terminal during the refresh operation. The unselected BL terminals may remain at Vdd/2 and the unselected SL terminals may remain at a positive voltage.

FIG. 5F shows the bias condition for the selected memory cell 5150$a$ and unselected memory cells 5150$b$, 5150$c$, and 5150$d$ in memory array 5180. In this particular non-limiting embodiment, about 0.0 volts may be applied to the selected SL terminal 572$a$ while about +1.2V is applied to the unselected source line terminals 572$b$ (not shown) through 572$n$, about +1.2 volts is applied to the selected BL terminal 574$a$ while 0.0V is applied to the unselected bit line terminals 574$b$ through 574$p$. These voltage levels are exemplary only and may vary from embodiment to embodiment.

Current will flow through intrinsic bipolar device 5130 if the floating body is substantially positively charged and no current to flow if the floating body is substantially discharged since the bipolar device 5130 is off. As described above, the n+ regions 516 and 518 can be configured asymmetrically such that the current flowing through the selected cell 5150$a$ during read operation (from the BL terminal 574 to the SL terminal 572) may be higher than the refresh current flowing through the unselected memory cells (from the SL terminal 572 to the BL terminal 574), although similar bias conditions are applied to selected and unselected memory cells 5150 (with the bias conditions are reversed between the BL and SL terminals of the selected and unselected memory cells 5150).

For memory cell 5150$b$ sharing the same row as the selected memory cell 5150$a$, the SL terminal 572$a$ and the BL terminal 574$p$ are both biased to 0.0V and consequently these cells will not be at the refresh mode. However, because read operation is accomplished much faster (in the order of nanoseconds) when compared to the lifetime of the charge in the floating body 524 (in the order of milliseconds), it should cause little disruption to the charge stored in the floating body.

For memory cell 5150$c$ sharing the same column as the selected memory cell 5150$a$, a positive voltage is applied to the BL terminal 574$a$ and SL terminal 572$n$. No base current will flow into the floating body 524 because there is no appreciable potential difference between SL terminal 572 and BL terminal 574 (i.e. the emitter and collector terminals of the n-p-n bipolar device 5130). However, because the read operation is accomplished much faster (in the order of nanoseconds) compared to the lifetime of the charge in the floating body 524 (in the order of milliseconds), it should cause little disruption to the charge stored in the floating body.

For memory cell 5150$d$ sharing neither the same row nor the same column as the selected memory cell 5150$a$, both the SL terminal 572$n$ will remain positively charged and the BL terminal 574$p$ may remain grounded. Representative memory cell 5150$d$ will be in the refresh mode, where memory cells in state logic-1 will maintain the charge in floating body 524 because the intrinsic bipolar device 5130 will generate hole current to replenish the charge in floating body 524, while memory cells in state logic-0 will remain in neutral state.

The various voltage bias levels above are exemplary only. They will vary from embodiment to embodiment as a function of both design choice and the process technology used.

Figure 5G:
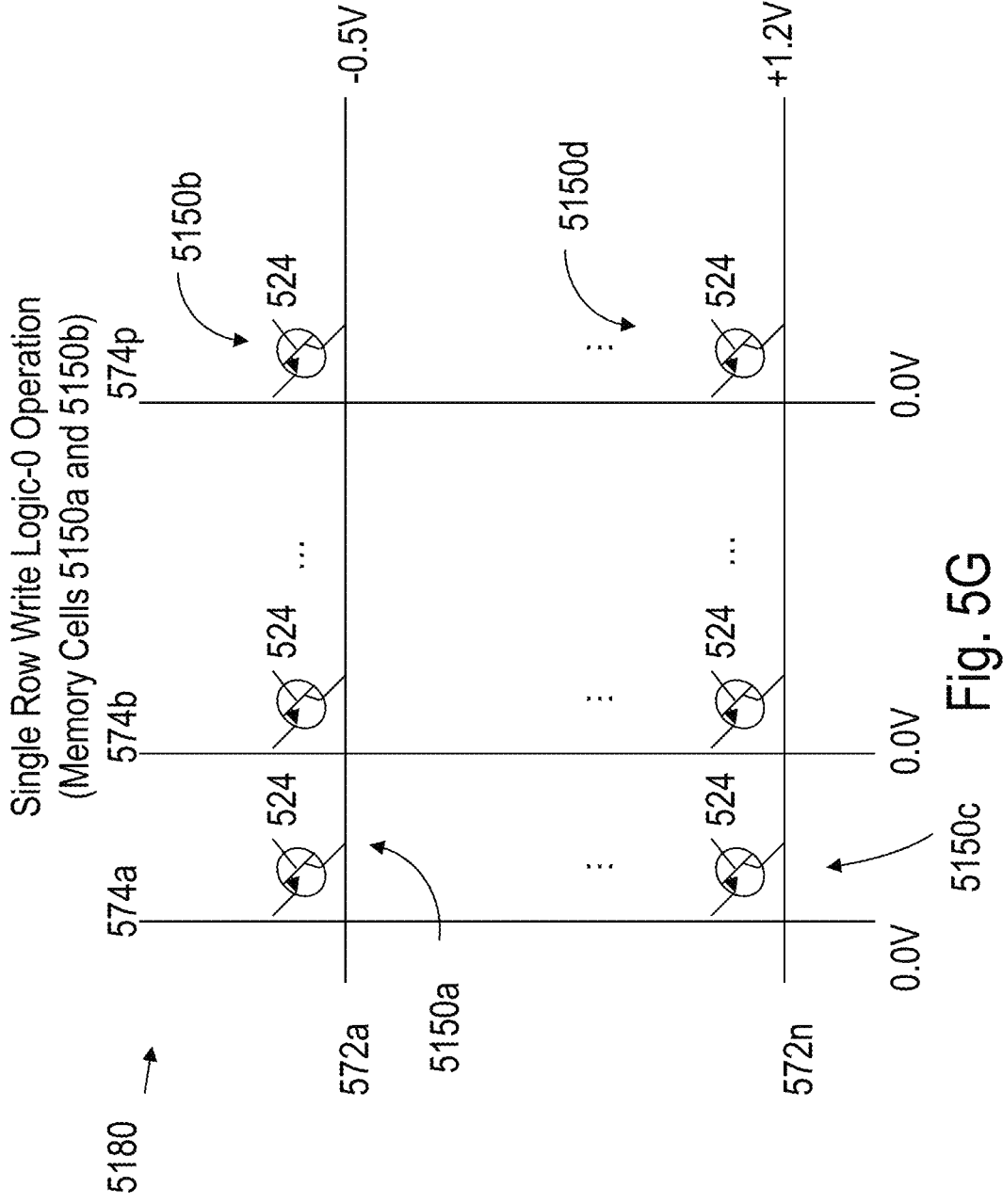

FIG. 5G illustrates a single row write logic-0 operation. In FIG. 5G the selected row SL terminal 572$a$ may be biased negatively at about −0.5V while the unselected row SL terminals 572$b$ (not shown) through 572$n$ may be biased at about +1.2V and all the BL terminals 574$a$ through 574$p$ may be biased at 0.0V. This causes the selected cells such as representative memory cells 5150$a$ and 5150$b$ to have their bipolar devices turn on due to forward bias on the floating body 524 to collector region 516, thereby evacuating the holes from the floating body 524.

For the unselected rows (which in this case is all the memory cells 5150 in memory array 5180 not on the selected row), the SL terminal 572 is at +1.2V and the BL terminal 574 is at 0.0V, which corresponds to the refresh operation described above.

A write logic-0 operation can also be performed on a column basis by applying a negative bias to the BL terminal 574 as opposed to the SL terminal 572. The SL terminal 572 will be zero or positively biased. Under these conditions, substantially all memory cells sharing the same BL terminal 574 will be written into state logic-0 and substantially all the other cells will be in the refresh operation.

The various voltage bias levels above are exemplary only. They will vary from embodiment to embodiment as a function of both design choice and the process technology used.

Figure 5H:
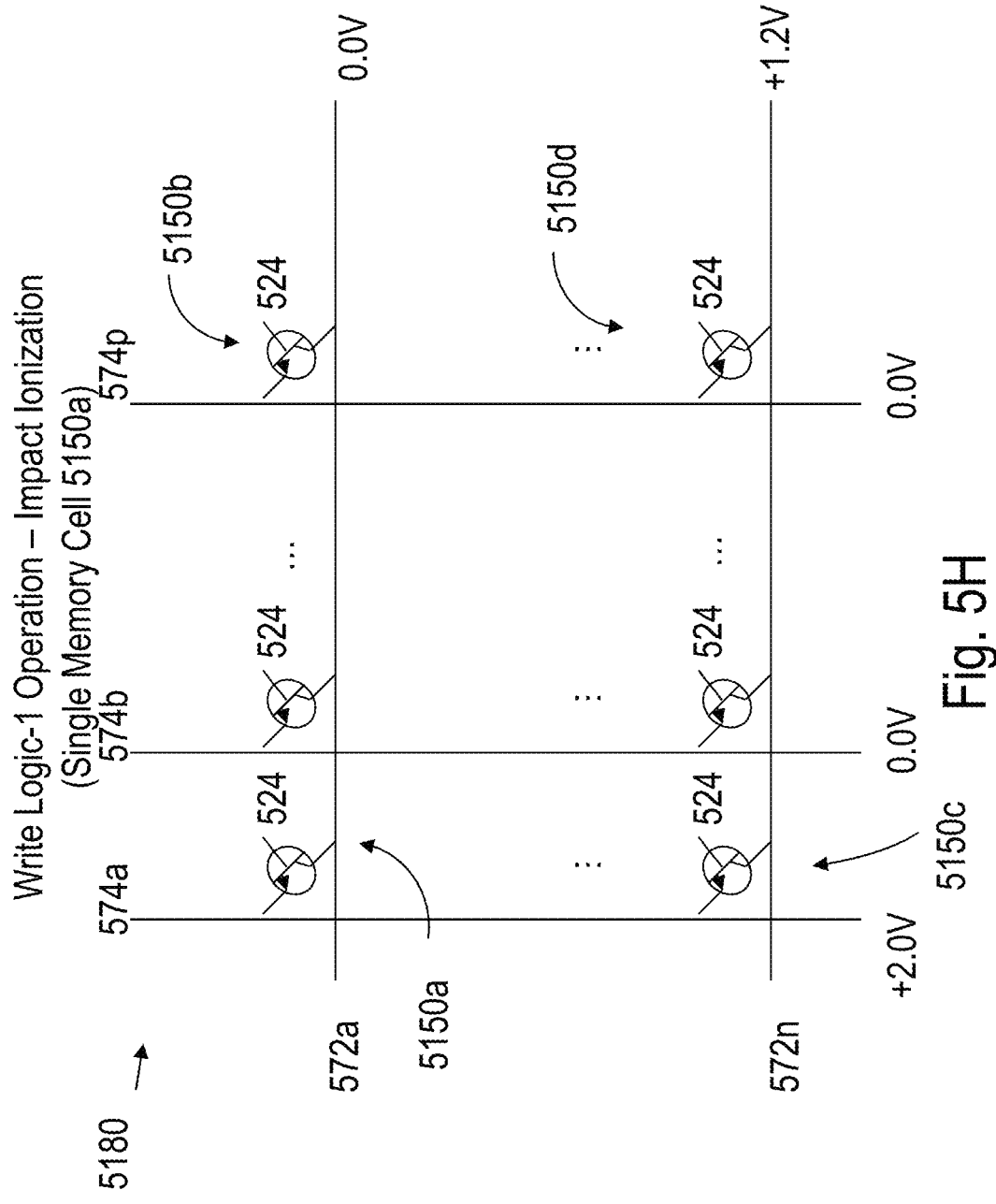

A write logic-1 operation can be performed on memory cell 5150 through an impact ionization mechanism as described in FIG. 5H. An example of the bias condition of the selected memory cell 5150$a$ under impact ionization write logic-1 operation is illustrated in FIG. 5H. A positive bias may be applied to the BL terminal 574, while zero voltage may be applied to the selected SL terminal 572. The positive bias applied to the BL terminal 574 may be greater than the positive voltage applied to the SL terminal 572 during refresh operation. The positive bias applied to the BL terminal is large enough to turn on bipolar device 5130 regardless of the initial state of the data in selected memory cell 5150$a$. This results in a base hole current to the floating body 524 of the selected memory cell 5150$a$ charging it up to a logic-1 state.

In one particular non-limiting embodiment, the following bias conditions may be applied to the selected memory cell 5150$a$: a potential of about 0.0 volts is applied to selected SL terminal 572$a$ and a potential of about +2.0 volts is applied to selected BL terminal 574$a$. The following bias conditions may be applied to the unselected terminals: about +1.2 volts is applied to SL terminals 572$b$ (not shown) through 572$n$, and about 0.0 volts is applied to BL terminals 574$b$ through 574$p$. FIG. 5H shows the bias condition for the selected and unselected memory cells in memory array 5180. The various voltage bias levels above are exemplary only. They will vary from embodiment to embodiment as a function of both design choice and the process technology used.

For representative memory cell 5150$b$ sharing the same row as the selected memory cell 5150$a$, SL terminal 572$a$ and BL terminal 574$p$ may be grounded. Bipolar device 5130 will be off and the memory cell 5150$b$ will not be at the refresh mode. However, because write operation is accomplished much faster (in the order of nanoseconds) compared to the lifetime of the charge in the floating body 524 (in the order of milliseconds), it should cause little disruption to the charge stored in the floating body.

For representative memory cell 5150$c$ sharing the same column as the selected memory cell 5150$a$, a greater positive voltage is applied to the BL terminal 574$a$ and a lesser positive voltage is applied to SL terminal 572$n$. Less base current will flow into the floating body 524 than in selected memory cell 5150$a$ because of the lower potential difference between SL terminal 572 and BL terminal 574 (i.e. the emitter and collector terminals of the n-p-n bipolar device 5130). However, because the write operation is accomplished much faster (in the order of nanoseconds) compared to the lifetime of the charge in the floating body 524 (in the order of milliseconds), it should cause little disruption to the charge stored in the floating body.

For representative memory cell 5150*d* sharing neither the same column nor the same row as the selected memory cell 5150*a*, the SL terminal 572 is positively charged and the BL terminal is grounded. Representative memory cell 5150*d* will be at refresh mode, where memory cells in state logic-1 will maintain the charge in floating body 524 because the intrinsic bipolar device 5130 will generate hole current to replenish the charge in floating body 524 and where memory cells in state logic-0 will remain in neutral state.

The various voltage bias levels above are exemplary only. They will vary from embodiment to embodiment as a function of both design choice and the process technology used. Also, the first conductivity type may be changed from p-type to n-type and the second conductivity type may be changed from n-type to p-type, and the polarities of the applied biases may be reversed. Thus the invention is not to be limited in any way except by the appended claims.

An important feature of a DRAM device is a low refresh rate. It is even desirable if a two stable states memory could be achieved without interfering with the memory access for read and write, as it would remove the necessity of a refresh operation. Such a memory could be called SRAM (Static Random Access Memory). There are some 2D structures that presented such type of memories; for example, K. Sakui, T. Hasegawa, T. Fuse, S. Watanabe, K. Ohuchi, and F. Masuoka, "A new static memory cell based on the reverse base current effect of bipolar transistors," IEEE Trans. Electron Devices, vol. 36, no. 6, pp. 1215-1217, June 1989; M. Reisch, "On bistable behavior and open-base breakdown of bipolar transistors in the avalanche regime—Modeling and applications," IEEE Trans. Electron Devices, vol. 39, no. 6, pp. 1398-1409, June 1992; and US Patent Publication No. 2012/0230123 "Method of Maintaining the State of Semiconductor Memory Having Electrically Floating Body Transistor". These three documents are incorporated by reference herein in their entirety.

Figure 6:
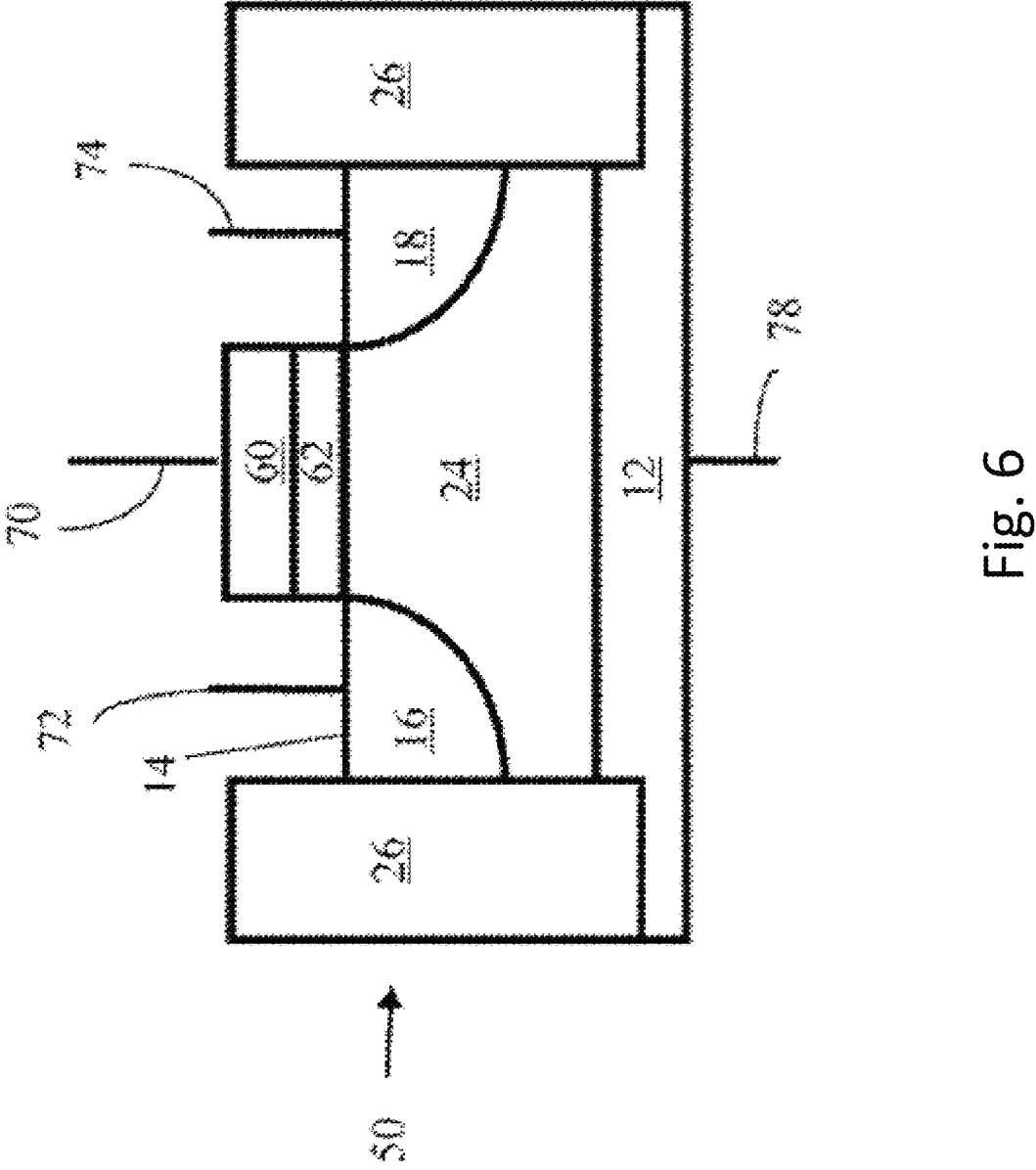
FIG. 6 is a drawing illustration of a floating body memory cell.

FIG. 6 is a drawing illustration of a Floating Body memory cell 50 with a buried well region 12, where applying a back bias (through terminal 78) to the n-type buried well region 12 (also referred to as the back bias region 12) may maintain the charge stored in the floating body region 24. FIG. 6 may be found as FIG. 1A of the US Patent Publication No. 2012/0230123. The floating body 24 may be P type, the drain 16 and source 18 may be N type, the gate oxide 62 and the gate 60 may include, such as, for example, SiO2 and polysilicon or HKMG, and the floating body transistor may be isolated by deep trench isolations 26. The user terminals for writing and reading the memory may be drain 72, source 74, and gate 70. The top surface 14 of the mono-crystal may be the upper side of the wafer. Interconnect layers, such as is known by those skilled in the art, may be formed to connect the memory cell (not shown). A key to the two charge states holding of the floating body memory is the application of a positive back bias, such as 1.2 volt, to the back bias region 12 (through terminal 78). The NPN bipolar transistor formed between the n-type back bias region 12, the p-type floating body region 24, and the n-type drain 16 or source 18 is the key to the unique charging mechanism as described in these referenced art and before in respect to at least FIGS. 4A, 4B, 5A and 5B. A key to the self-charging mechanism, as had been detailed in the referenced art, is having the structure meet the formula (M−1) *β~1, which is related to the structure feature and design of the memory cell 50, where β is the gain of the bipolar transistor and M is the impact ionization multiplication factor.

In the following we present a 3D RAM architecture having two stable states, the two stable states may be two stable floating body charge levels. The structure and process flow have similarities to a previous description, such as FIGS. 3A-K and associated text. A device and method to form back-bias region for 3D floating body memory architecture is described below.

Figure 7A:
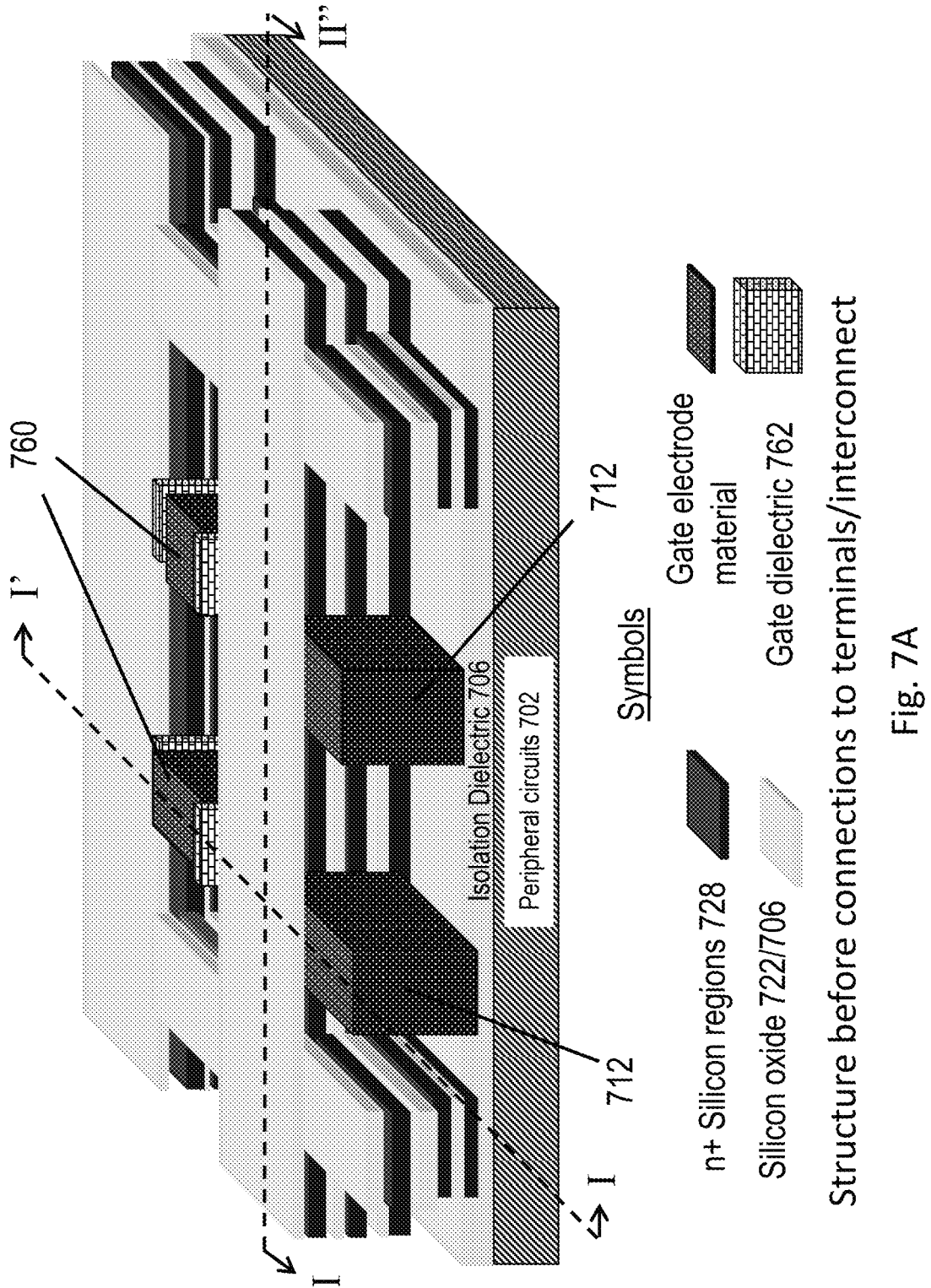
Figure 7C:
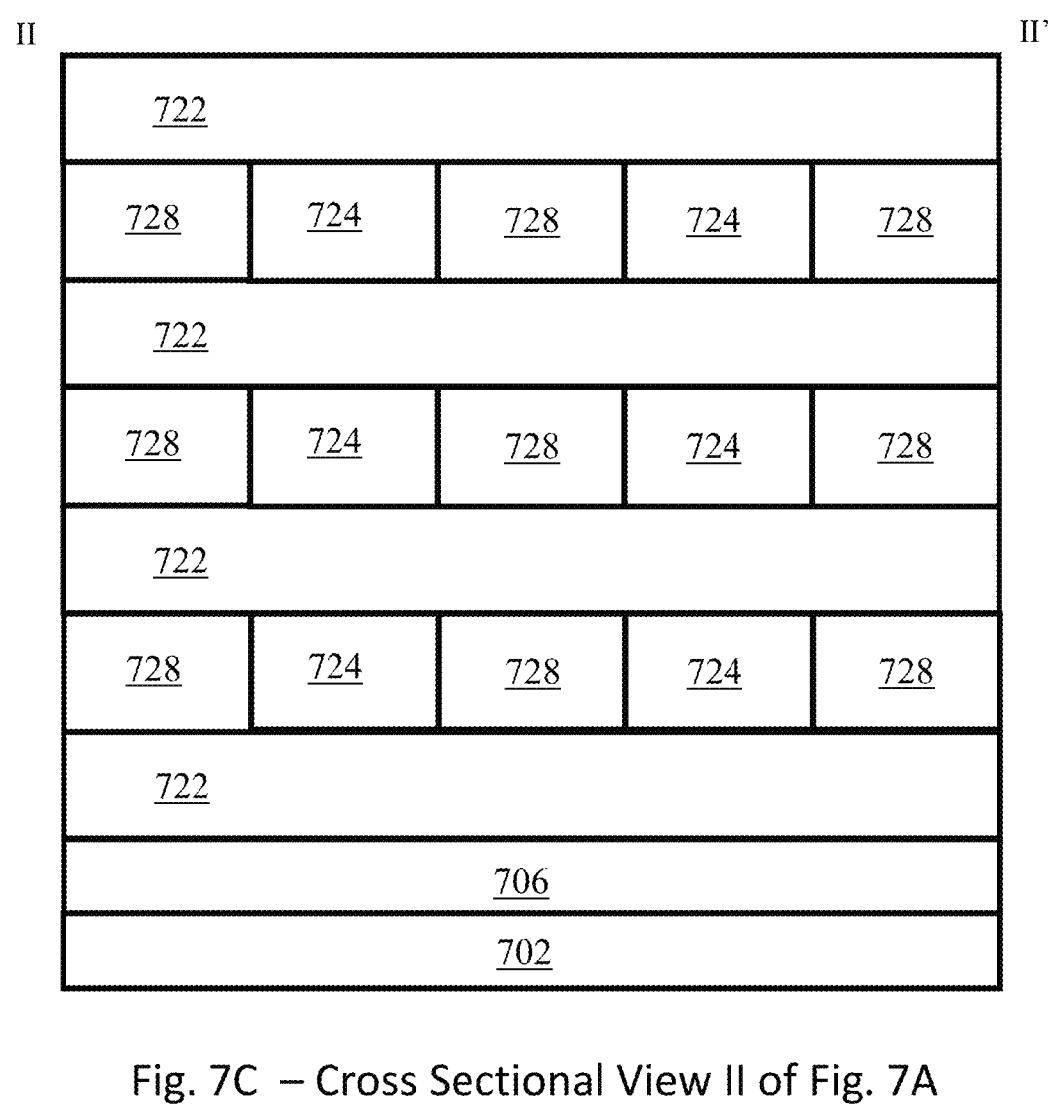

As illustrated in FIGS. 7A, 7B, 7C, and 7D, FIG. 7A is a drawing illustration of an embodiment of a three-dimensional view of a 3D RAM structure and device architecture prior to the interconnect stage of the process flow (similar to FIG. 7G), FIG. 7B is a drawing illustration of cross-sectional cut I of FIG. 7A, FIG. 7C is a drawing illustration of cross-sectional cut II of FIG. 7A, and FIG. 7D is a drawing illustration of cross-sectional cut II of FIG. 7A with the gate material and perforated gate dielectric overlap/under-lap depicted. FIGS. 7A, 7B, 7C, and 7D may include n+ silicon regions 728, silicon oxide regions 722, gate regions 760, back-bias regions 712, gate dielectric regions 762, p− channel regions 724, isolation dielectric 706, gate dielectric openings 711, and peripheral circuits 702. FIG. 7D may include a shadowed overlay image of gate regions 760 and gate dielectric openings 711 depicting the overlap and underlaps of these regions with respect to p− channel regions 724. FIG. 7B may include surface 713, wherein back-bias region 712 may be in physical contact and make electrical connection to p− channel region 724.

A floating body transistor in the stack may include a single side gate (gate regions 760) on one side of floating body p− channel region 724 and a back-bias region 712 formed on the other side of the floating body p− channel region 724. Gate region 760) may be insulated from the floating body p− channel region 724 with a gate dielectric regions 762, yet still modulate the channel. In this case the back-bias is not horizontal such as in FIG. 4A but rather vertical such as back bias regions 712 of FIG. 7B. N+ silicon regions 728 may be connected and utilized as either a source or drain to help form the two stable states floating body transistor.

A process flow that may be utilized to form the structure shown in FIGS. 7A-7D is described as follows. Many steps may be similar to those used to form the structure shown in FIG. 3E.

Figure 7E:
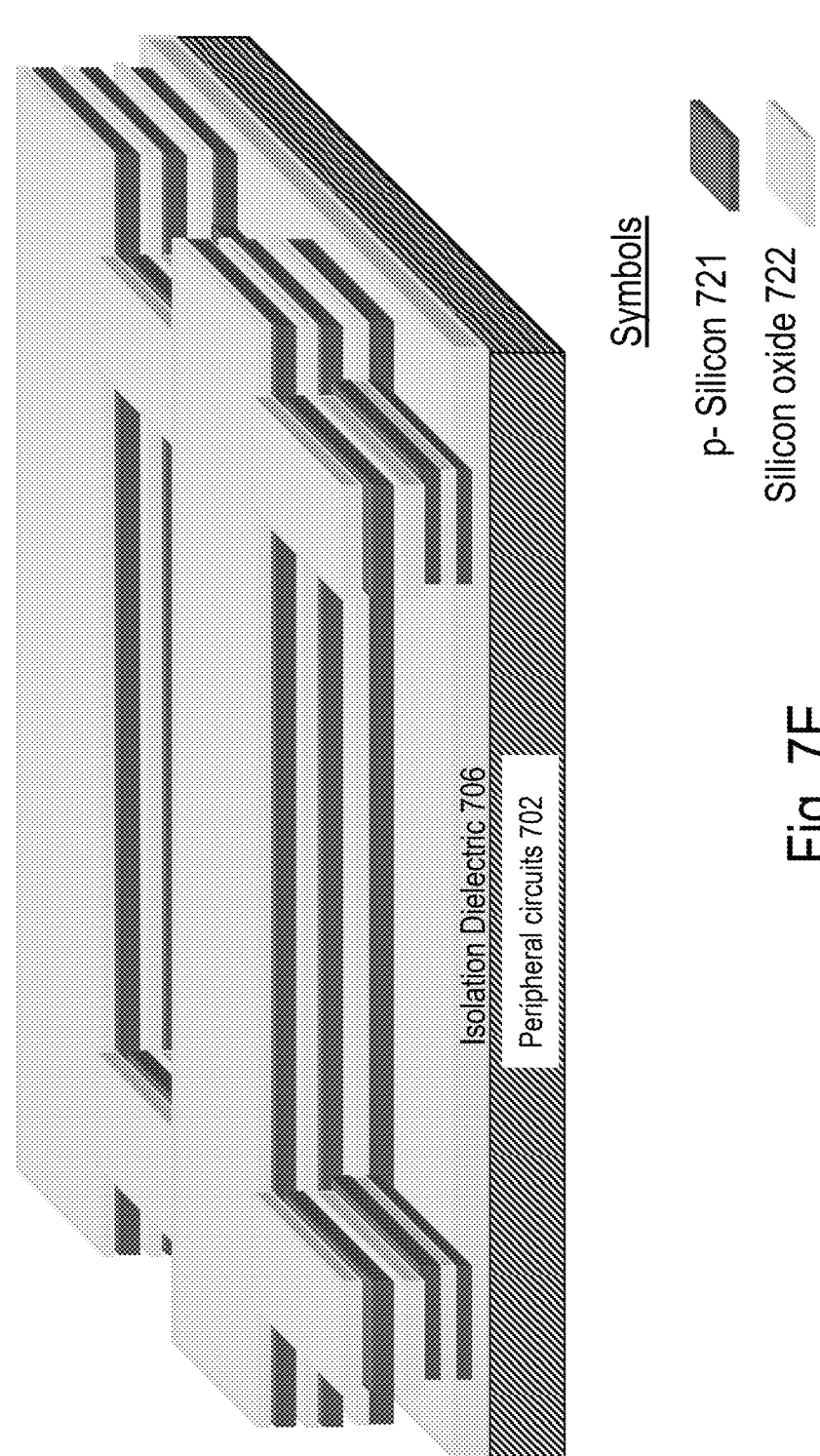

As illustrated in FIG. 7E, multiple mono-crystalline p− silicon layers may be formed with silicon oxide layers in-between and then lithography and etch processes may be utilized to make a structure, such as, for example, as shown in FIG. 7E. Thus p− silicon regions 721 and silicon oxide regions 722 may be stacked and formed above peripheral circuits 702. Processes to form the structure in FIG. 7E may include the steps described with respect to FIGS. 3A to 3E herein. Peripheral circuits 702 may be constructed with tungsten, or conventional aluminum/copper, wiring and may have isolation and/or bonding oxide above it (in-between the top metallization/wiring of peripheral circuits 702 and the bottom p-silicon region in the stack, such as isolation oxide 706. The composition of the silicon oxide regions 722 within the stacked Si/SiO₂ layers may be insulators or dielectrics other than silicon dioxide such as, for example, a low-k dielectric, carbon containing silicon oxides, amorphous carbon. The thickness of silicon oxide regions 722 within the stacked Si/SiO₂ layers may be adjusted to minimize layer to layer, strata to strata disturb mechanisms, and may include thicknesses of 50 nm, 75 nm, 100 nm, 150 nm, 200 nm, 500 nm, and less than 1000 nm. A thin conductive layer, such as a metal, may also be formed between the two bonding oxides to form a field shield to mitigate layer to layer, strata to strata disturb mechanisms, and may be electrically floating or tied to a bias, such as ground or Vdd. The stacked $Si/SiO_2$ layers may alternatively be formed by successive ion implants of oxygen atoms/ions to various depths from the top surface of a mono-crystalline silicon wafer/substrate and then heat treated to form oxide layers thus forming silicon layers in-between the oxide layers, a layered 'SIMOX' process approach.

Figure 7F:
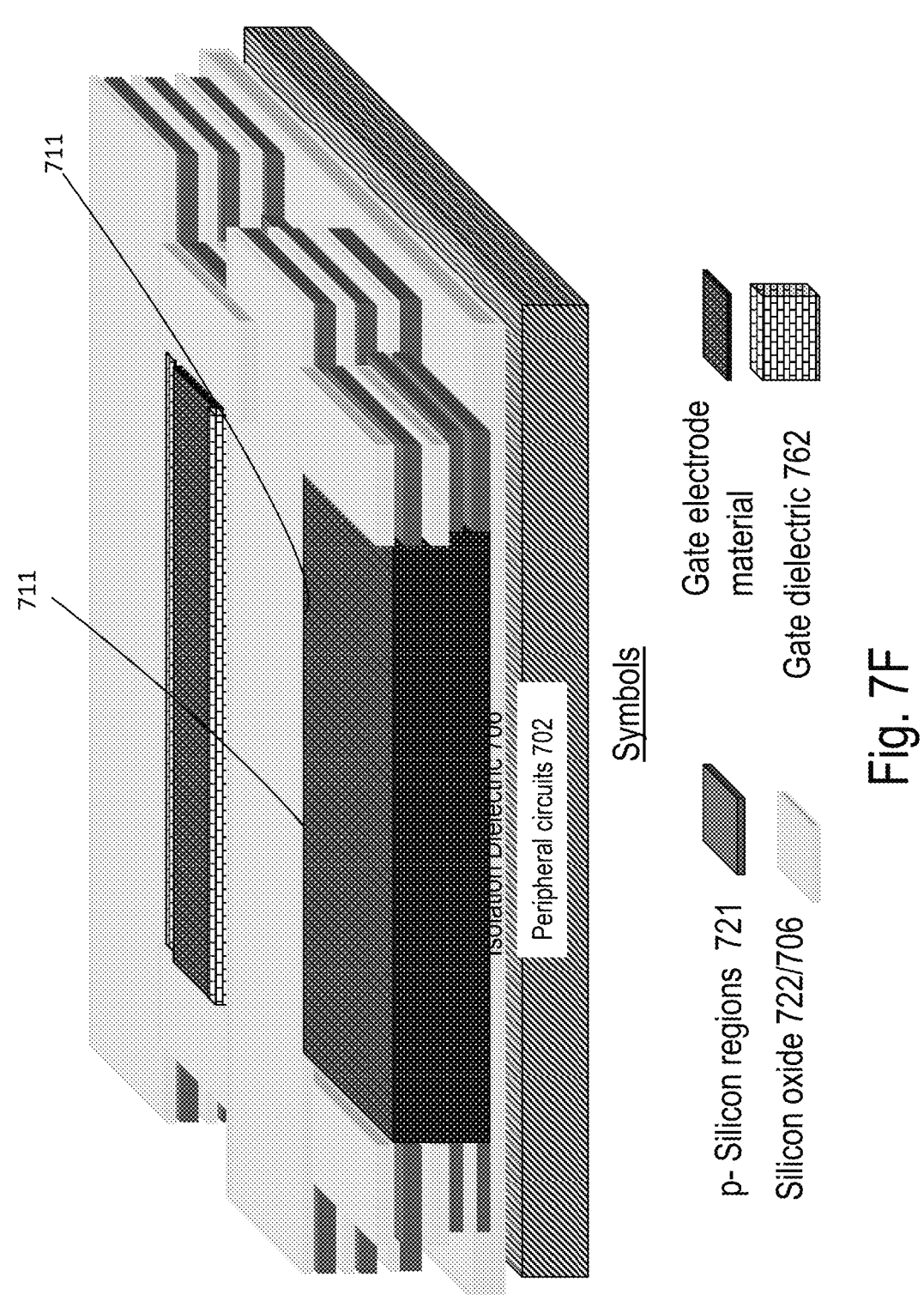

As illustrated in FIG. 7F, a perforated gate dielectric layer 762 (partially shown for clarity) may be formed which has gate dielectric openings 711 on one face of the p– silicon 721 and silicon oxide 722 layer stack, a gate electrode material may be deposited and CMP'd substantially to the top of the $Si/SiO_2$ stack. The gate dielectric may be grown on the exposed surfaces of p– silicon regions 721 (for example, with the TEL SPA tool radical oxidation oxide) or deposited substantially over the structure's surface, such as, for example, in the well-known HKMG formation processing, a lithographic step and etch of the deposited gate dielectric may thus form perforated gate dielectric layer 762 and gate dielectric openings 711 on one face of the p– silicon 721 and silicon oxide 722 layer stack and leave the gate dielectric intact another face of the p– silicon 721 and silicon oxide 722 layer stack. A gate electrode material, such as, for example, doped amorphous or polysilicon, or the well-known metal stack of HKMG processing, may be deposited, thus bringing the conductive gate electrode material in direct contact and electrical connection with exposed faces of the p-silicon 721, and forming a field effect device of gate electrode influence thru the gate dielectric of the eventual transistor p– channel regions 724 formed by portions of p-silicon 721 layers. The gate electrode material may be in-situ doped during deposition, or doped at a later step. CMP may be performed to planarize the gate electrode material. The top face of the topmost silicon oxide region 722 may have an etch stop/CMP stop material, such as, for example, SiN or a-carbon, placed on it at an earlier stage, so to provide a CMP stop, thus enabling the formation of separate gate and back bias control regions. Although the width of the p– regions 721 near and under the gates are illustrated as being larger than the thickness, one skilled in the art would recognize that the reverse (i.e., thickness larger than width) could be formed to provide increased gate control of the transistor channel.

Figure 7G:
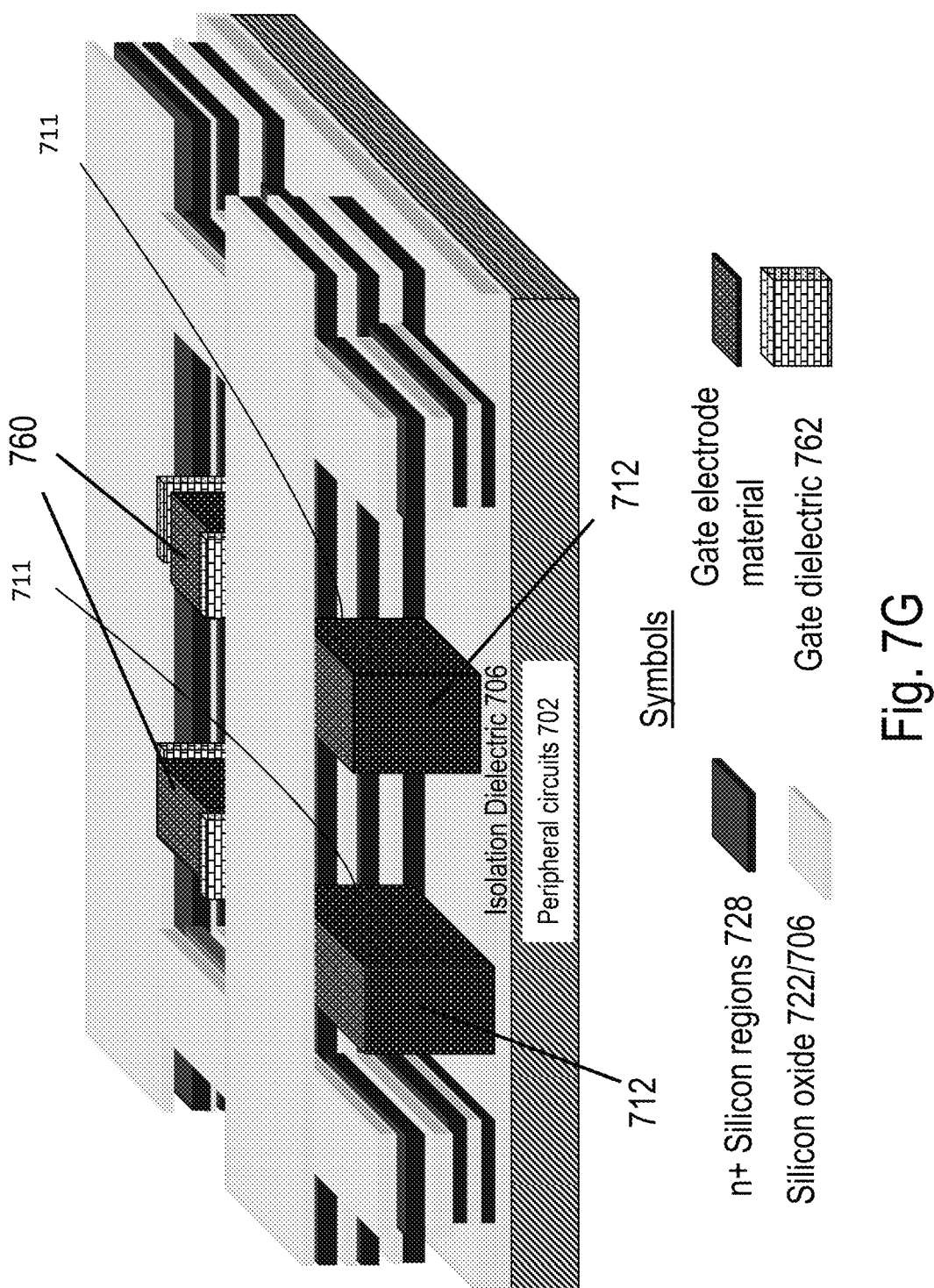

As illustrated in FIG. 7G, n+ silicon regions 728, gate regions 760 and back-bias regions 712 may be formed. The gate may be lithography defined. The widths of the gate structure regions and the gate dielectric openings 711 may be designed such that the gate structure regions will substantially always overlap the gate dielectric openings 711. Using the remaining photoresist of the gate structure regions lithography, portions of p– regions 721 not covered by the gate structure regions photoresist may be implanted to form n+ regions 728, and thus form p– channel regions 724. This multi-step implantation process may utilize different implant energies. The gate may then be etched to define gate structure regions shown in FIG. 7G, thus forming gate regions 760 and back-bias regions 712, and the photoresist stripped. A thermal annealing step, such as an RTA or spike anneal or laser anneal or flash anneal, may be conducted to activate the n+ implanted doped regions. The optical anneal system, such as the laser, spike, flash anneals, may be utilized to crystalize any deposited polysilicon or amorphous silicon (which may be used as a gate electrode material depending on process design choice). The structure valleys may be filled with a dielectric (not shown for clarity), such as, for example, SACVD oxides, and then CMP'd substantially to or partially into the topmost silicon oxide layer 722 of the Si/SiO2 stack, or substantially to or partially into the CMP/etch stop layer as previously discussed. Thus, horizontal floating gate transistors with separate gate and back bias control regions on the previously exposed sides of each p– transistor channel region, and horizontal select lines (as has been described before in connection to FIG. 3 herein, and in the incorporated patent references) may be formed in a stack configuration.

Figure 7H:
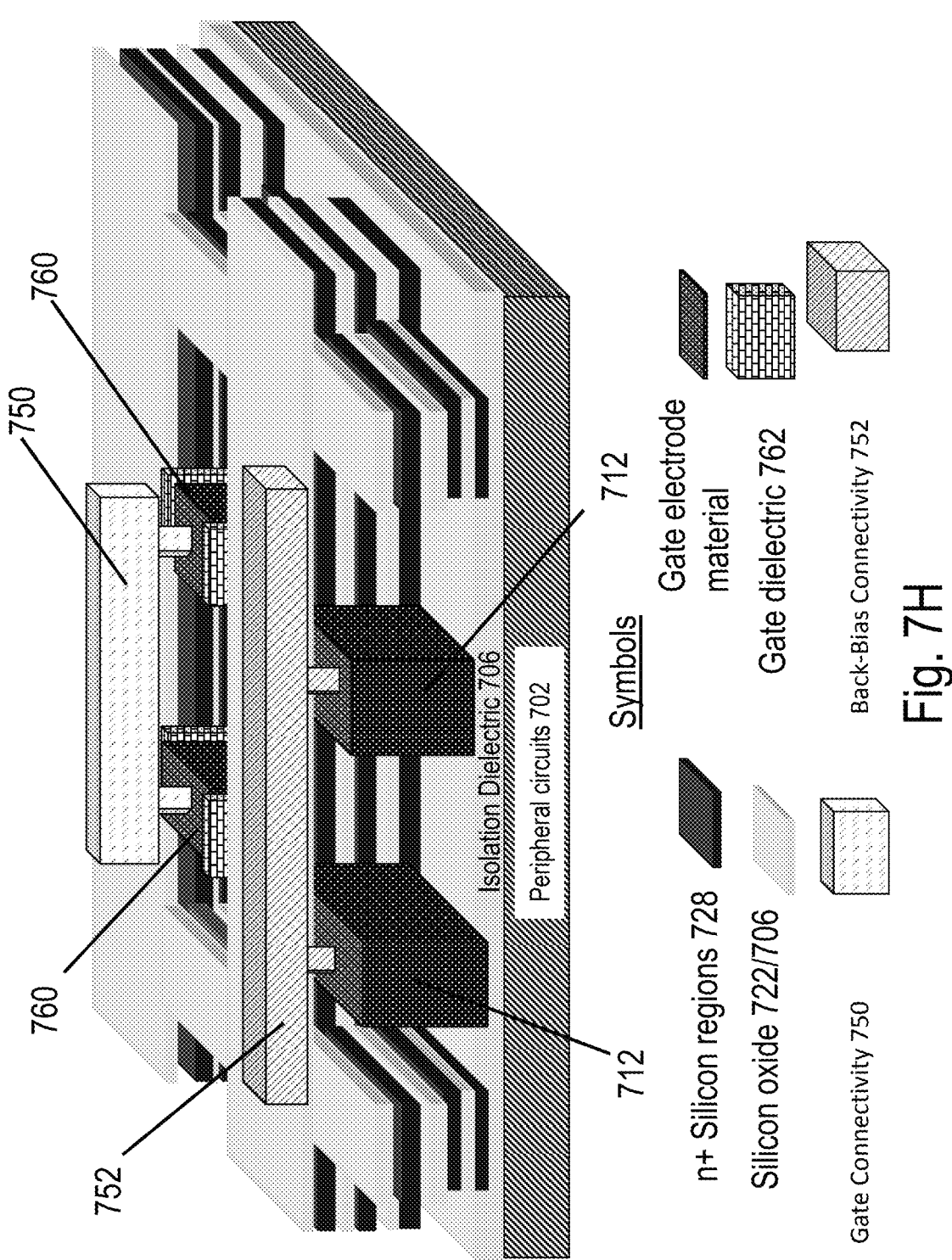
Figure 71:
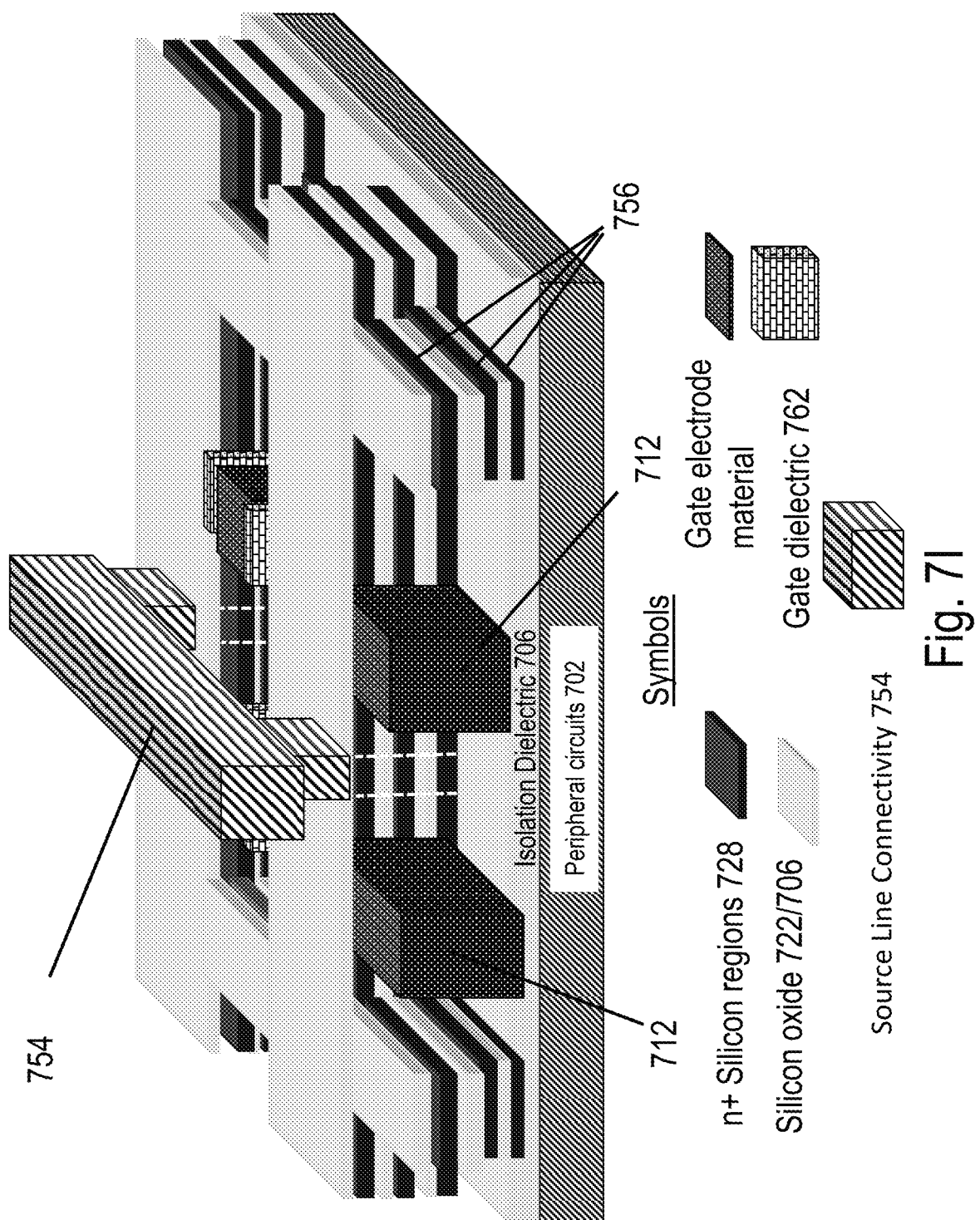

As illustrated in FIG. 7H, an inter-layer dielectric, such as, for example silicon oxide or doped silicon dioxides, may be deposited and planarized. For clarity, the silicon oxide layer is shown transparent. Contacts to gate regions 760 and the associated local metallization gate connectivity 750, as well as contacts to back-bias regions 712 and the associated local metallization back-bias connectivity 752 may be formed using known methods in the art.

As illustrated in FIG. 7I, Source-Line (SL) connectivity 754, such as contacts and metal lines, may be formed by etching and deposition using known methods in the art. These SL contacts may be shared among the layers of memory. Gate connectivity 750 and back-bias connectivity 752 are not shown in FIG. 7I for clarity. The bit lines (BL) 756 are shown as a portion of the n+ silicon regions 728. Bit line contacts may be formed, for example, as sidewall structures or end-wall structures, with various overlaps as required by the process and layout.

Further, using known methods in the art, gate connectivity 750 may be connected to form the WL—word select lines. Contacts may be made to BLs, WLs and SLs of the memory array at its edges. BL contacts can be made into stair-like structures using techniques described in "Bit Cost Scalable Technology with Punch and Plug Process for Ultra High Density Flash Memory," *VLSI Technology,* 2007 *IEEE Symposium on,* vol., no., pp. 14-15, 12-14 Jun. 2007 by Tanaka, H.; Kido, M.; Yahashi, K.; Oomura, M.; et al., following which contacts can be constructed to them. Formation of stair-like structures for BLs could be done in steps prior to FIG. 7I. Electrical connection to the underlying peripheral circuits may be accomplished with vertical conductive vias, for example, the thru layer via or thru silicon via processes and structures, which may be described in the incorporated patent references or known by those skilled in the art. In addition, thermal vias may be utilized to carry heat, whether from processing or from operation, away from the upper layer without harming the underlying metallization or devices.

Figure 7J:
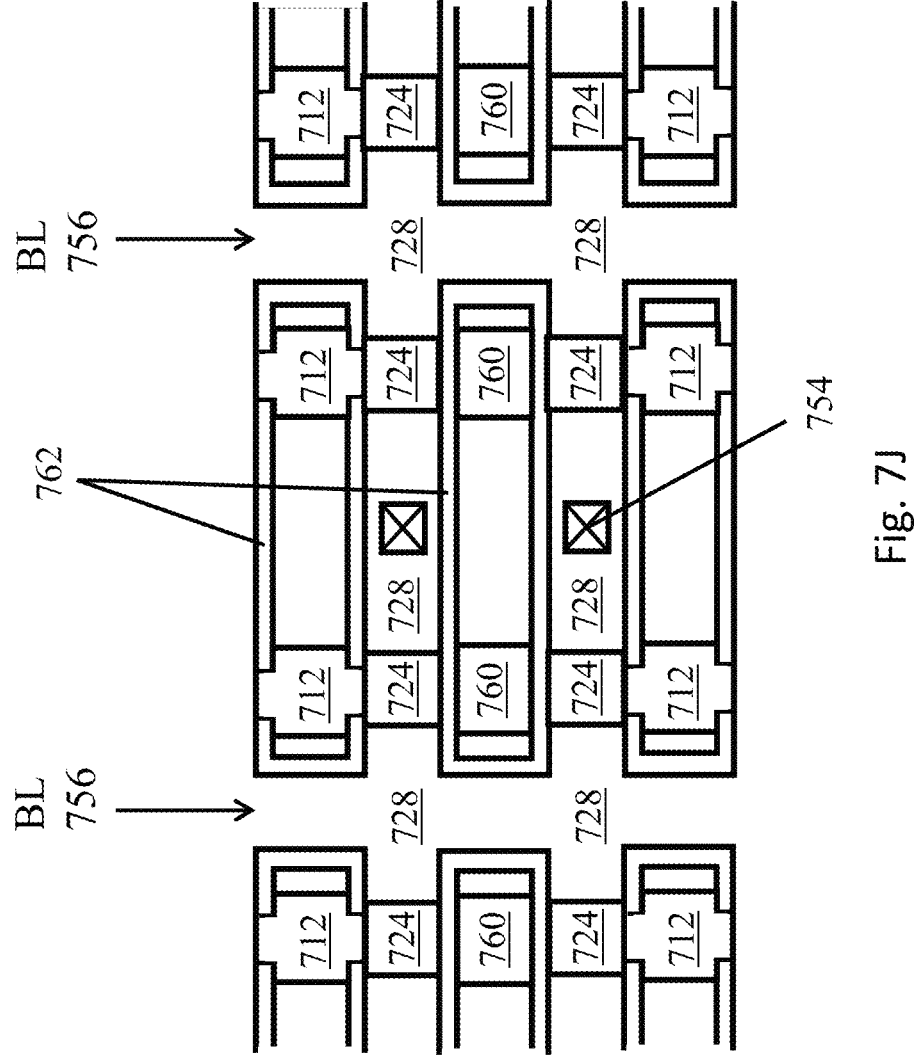

FIG. 7J is a top view exemplary illustration of the floating body transistors sharing on one side of the $Si/SiO_2$ stacks (n+ regions 728 and floating body p– channel regions 724) gate regions 760 and on the other side of the $Si/SiO_2$ stacks back bias regions 712 connected to p– channel regions 724 in the openings of the perforated gate dielectric layer 762. The back-bias regions act as the collector of the bipolar charging transistor as illustrated in FIG. 4B. Bipolar transistors that utilize a polysilicon collector with monocrystalline base and emitter are well known in the art to perform well. The contacts of the source line connectivity 754 are shown, but the metal lines, as well as the SL staircase and WL connectivity are not shown for clarity. Back-bias regions 712 may be mutually connected to a bias source.

Persons of ordinary skill in the art will appreciate that the illustrations in FIGS. 7A through 7J are exemplary only and are not drawn to scale. Such skilled persons will further appreciate that many variations are possible such as, for example, the Si/SiO2 stack may be formed with the N+ and p− regions already formed by stacking with 1-mask per stack layer processing as described, for example, in FIG. 2 herein. Further, it may not be necessary to overlap the implant gate structure regions and the gate dielectric openings 711. Moreover, perforated gate dielectric layer 762 may not need to be perforated, and control of the back-bias effects may be performed thru the gate dielectric from an efield influence modulated by the back bias regions 712, or by band bending with an Esaki diode structure. Furthermore, peripheral circuits may be on top of the memory stack layers rather than on the bottom, and connected accordingly. Moreover, a prior to the n+ implant step anneal to repair damages that were formed during prior step such as layer transfer ion cut related damages and etch step related damages, may be performed. Furthermore, some of the memory global control lines could be implemented in the bottom base layer peripheral circuits 702 and connected to the upper memory structure as it is processed. This could be done for the back-bias connections. For example, instead of the back-bias connectivity 752 being formed after the memory stack, the base layers from the peripheral circuits 702 may provide the back-bias connection. In such case before depositing the gate electrode material, a contact to those connections would be etched in the soon to be back bias regions 712. Many other modifications within the scope of the present invention will suggest themselves to such skilled persons after reading this specification. Thus the invention is to be limited only by the appended claims.

The impact ionization efficiency of the polysilicon collector in the architecture illustrated in FIGS. 7A-7D may typically be low (the (M−1) factor is typically less than $10^{-3}$). As a result, a large current may be required in the holding operation. Using FIG. 6 and its description as a guide, to further improve the efficiency of the holding operation, the source region (16 of FIG. 6) or the drain region (18 of FIG. 6), which may be either of the n+ regions 728 on the sides of p− channel regions 724, may be used as the collector region/node and the polysilicon region, back bias region 712, may now act as the emitter region/node. The holding operation is still governed by the n-p-n bipolar transistor formed by one of the source/drain regions 16 or 18 (n+ regions 728), the floating body region 24 (p− channel regions 724), and the polysilicon region 12 (back bias region 712). The back-bias node employed in the holding operation may now be selected from one of the source/drain regions 16 or 18 (n+ regions 728). The terminals used for accessing (i.e. reading and writing) the memory cell are now connected to the polysilicon region 12 (back bias region 712), the other source/drain region 16 or 18 (n+ regions 728) not used as the back-bias region, and the gate electrode 60 (gate regions 760).

Figure 7K:
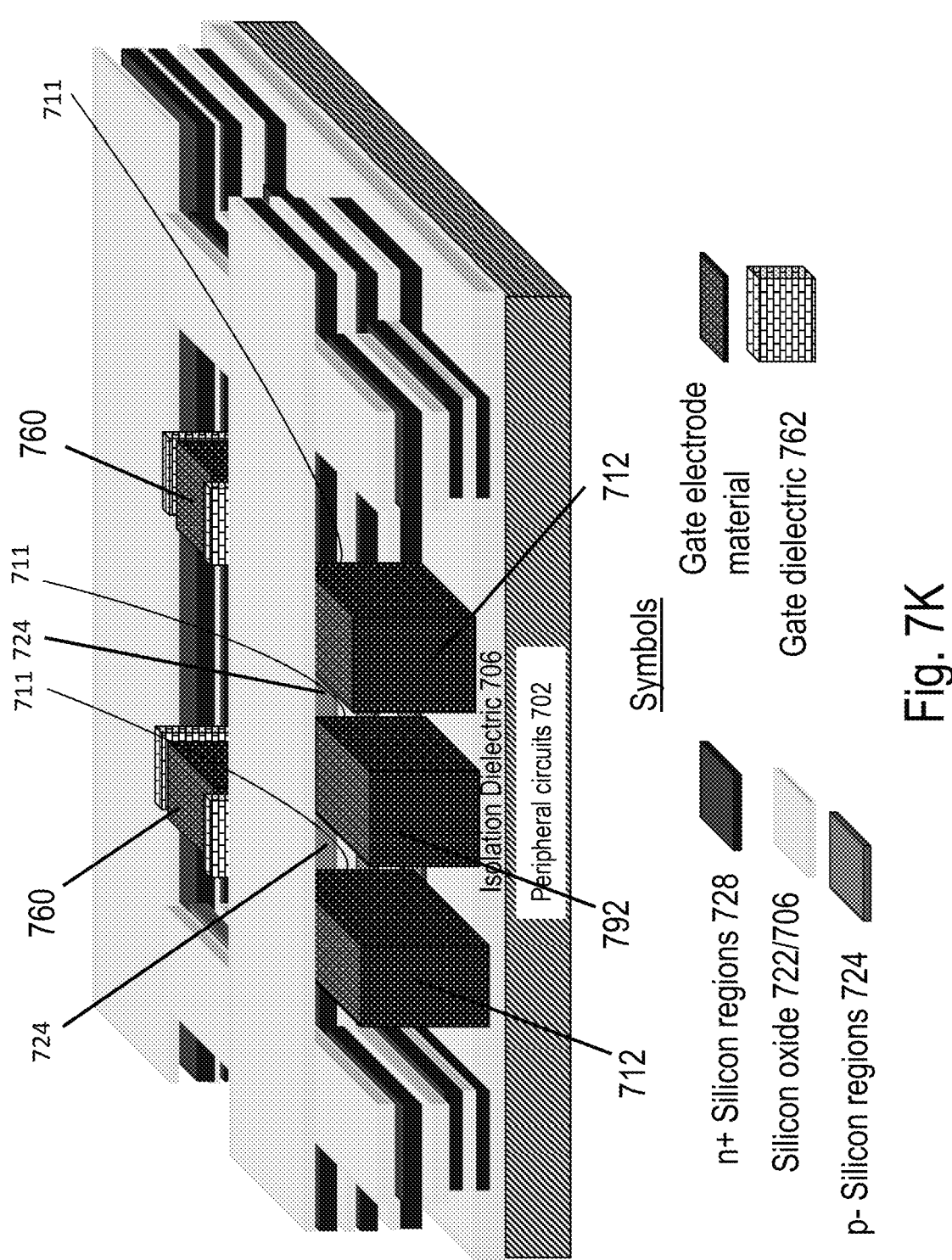
FIGS. 7K-7L are drawing illustrations of a 3D floating body DRAM dual port RAM with two stable states.

As illustrated in FIG. 7K, a dual port RAM may be constructed utilizing many of the concepts and flow of FIGS. 7A-7J. The processing may proceed to generate the structure of FIG. 7F (with some extra removal areas of the perforated gate oxide). At this point, the flow and processing described related to FIG. 7G may be utilized, but the lithographic pattern to form the n+ implanted regions and the gate regions, back-bias regions, and mid-FB junction connection will be different. Using the remaining photoresist of the gate structure regions lithography, portions of p− regions 721 not covered by the gate structure regions photoresist may be implanted to form n+ regions 728, and thus form a common p− channel region 724 that not only includes the region directly between gate regions 760 and back-bias regions 712, but also between those regions so to form a commoned p− region (indicated on the topmost silicon layer in the drawing where visible), which will be the common floating body. Additionally, the photolithography pattern may include covering the gate fill area which may become mid-FB junction connection 792. Mid-FB junction connection 792 may directly connect to the common floating body p− channel region 724 in the common location (between the gate/body-bias pairs) as that side wall face may be opened up in the earlier formation of perforated gate dielectric 762 at gate dielectric openings 711 (in a similar fashion as the back-bias regions 712). Gate connectivity, back-bias connectivity, mid-FB junction connection, and BL connectivity may then be formed using well known techniques to those skilled in the art. Mid-FB junction connection 792 may include an opposite conductivity type doping than that of common floating body p-channel region 724 so to form a junction connection at the related gate dielectric opening 711.

Figure 7L:
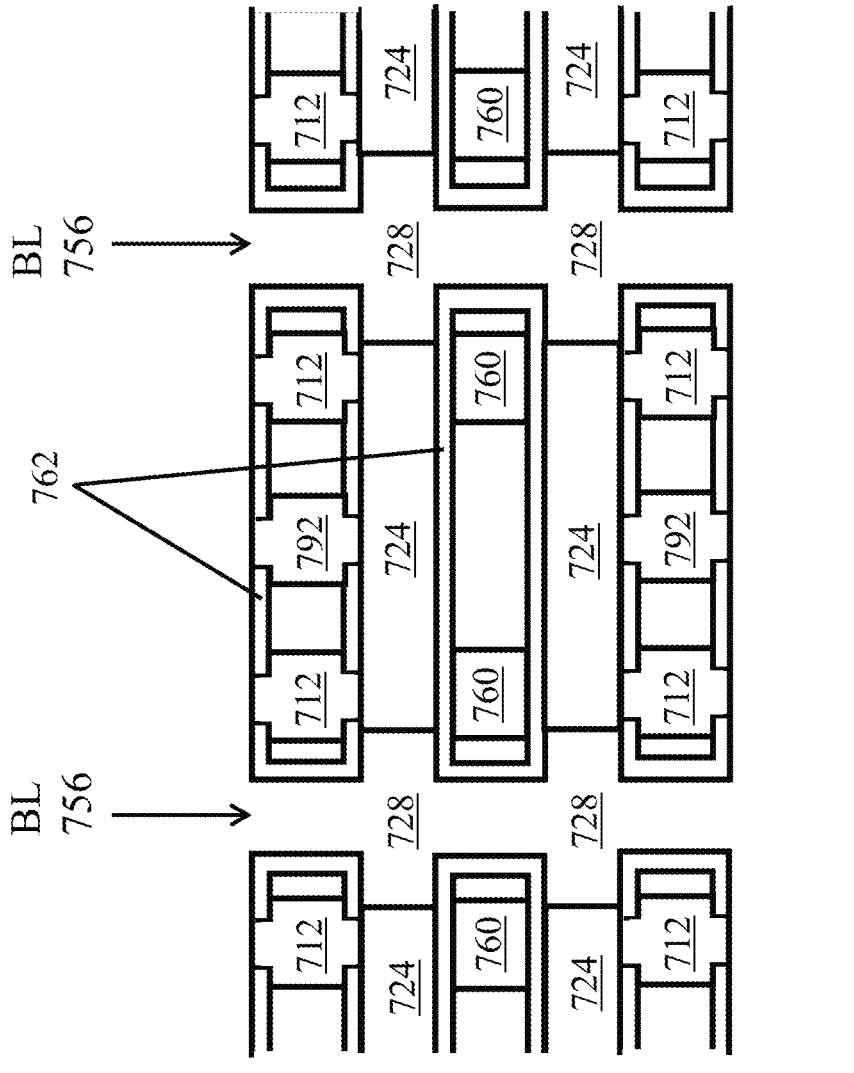

FIG. 7L is a top view exemplary illustration of the dual port RAM floating body transistors sharing on one side of the Si/SiO$_2$ stacks (n+ regions 728 and commoned floating body p− channel regions 724) gate regions 760 and on the other side of the Si/SiO$_2$ stacks back bias regions 712 and mid-FB junction connection 792 connected to commoned floating body p− channel regions 724 in the openings of the perforated gate dielectric layer 762. The back-bias regions act as the collector of the bipolar charging transistor as illustrated in FIG. 4B.

Figure 7M:
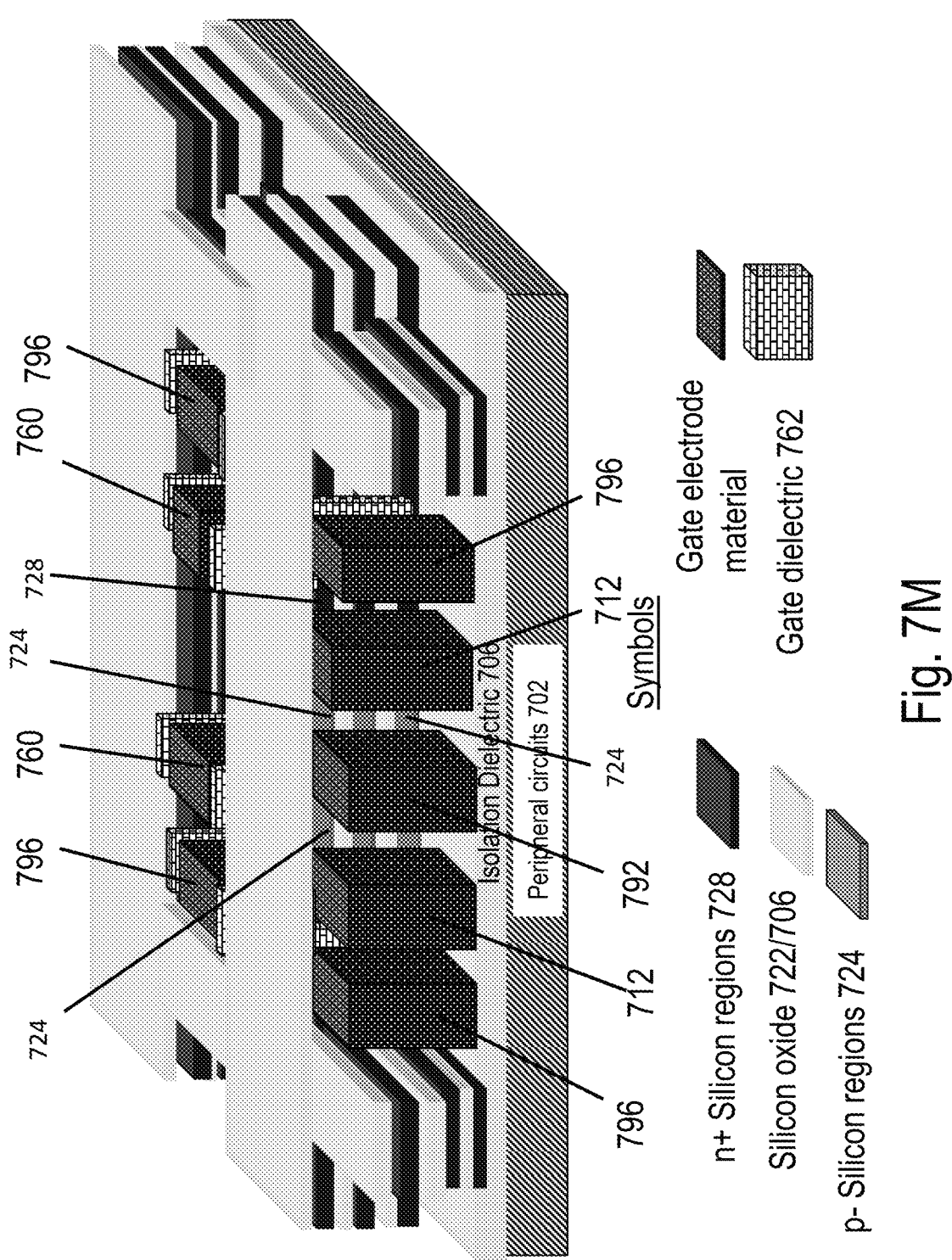
FIGS. 7M-7N are drawing illustrations of a 3D floating body DRAM dual port RAM with integrated select transistors with two stable states.

As illustrated in FIG. 7M, a dual port RAM with integrated select transistors may be constructed utilizing many of the concepts and flow of FIGS. 7A-7L. The processing may proceed to generate the structure of FIG. 7F (with some extra removal areas of the perforated gate oxide). At this point, the flow and processing described related to FIG. 7G may be utilized, but the lithographic pattern to form the n+ implanted regions and the gate regions, back-bias regions, select gates, and mid-FB junction connection will be different. Using the remaining photoresist of the gate structure regions lithography, portions of p− regions 721 not covered by the gate structure regions photoresist may be implanted to form n+ regions 728, and thus form a common p− channel region 724 that not only includes the region directly between gate regions 760 and back-bias regions 712, but also between those regions so to form a commoned p− region (indicated on the topmost silicon layer in the drawing where visible), which may be the common floating body. The p− channel regions of the select transistor gates 796 may also be masked off from the implants. Additionally, the photolithography pattern may include covering the gate fill area which will become mid-FB junction connection 792. Mid-FB junction connection 792 may directly connect to the p− channel region 724 in the common location (between the gate/body-bias pairs) as that side wall face is opened up in the earlier formation of perforated gate dielectric 762 at gate dielectric openings 711 (in a similar fashion as the back-bias regions 712). The select gates may have the perforated gate dielectric 762 between the gate and the channel. Gate connectivity, back-bias connectivity, select gate connections, mid-FB junction connection, and BL connectivity may then be formed using well known techniques to those skilled in the art. Mid-FB junction connection 792 may include an opposite conductivity type doping than that of common floating body p− channel region 724 so to form a junction connection at the related gate dielectric opening 711.

Figure 7N:
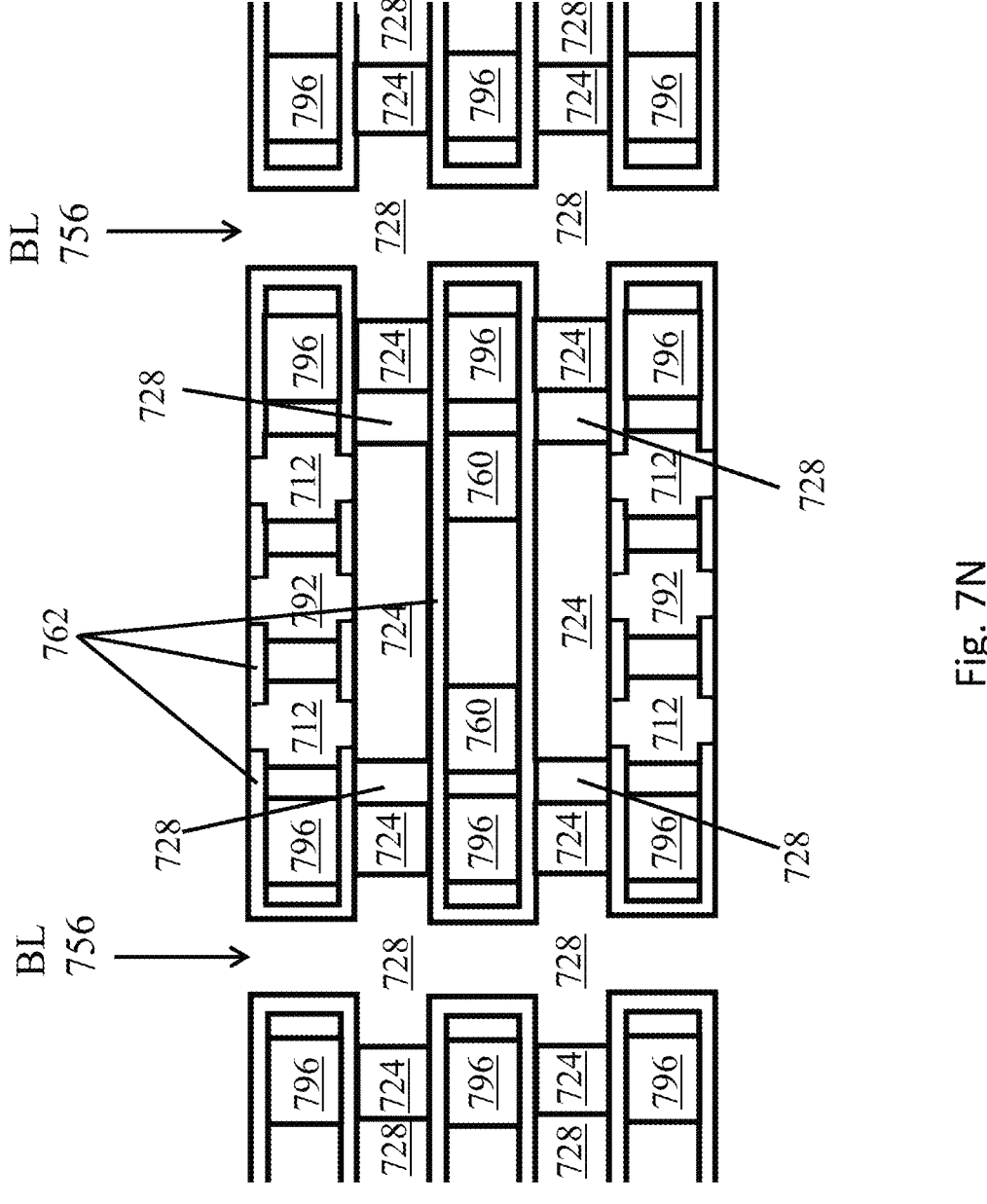

FIG. 7N is a top view exemplary illustration of the dual port RAM with integrated select transistors wherein the floating body transistors are sharing on one side of the Si/SiO$_2$ stacks (n+ regions 728 and floating body p– channel regions 724) gate regions 760 and on the other side of the Si/SiO$_2$ stacks back bias regions 712 and mid-FB junction connection 792 connected to commoned p– channel regions 724 in the openings of the perforated gate dielectric layer 762. The back-bias regions act as the collector of the bipolar charging transistor as illustrated in FIG. 4B. The select gates 796, double gated around the associated channel region of p– channel regions 724, may be utilized to control access to the floating body transistor on that level and region of the stack.

Figure 8:
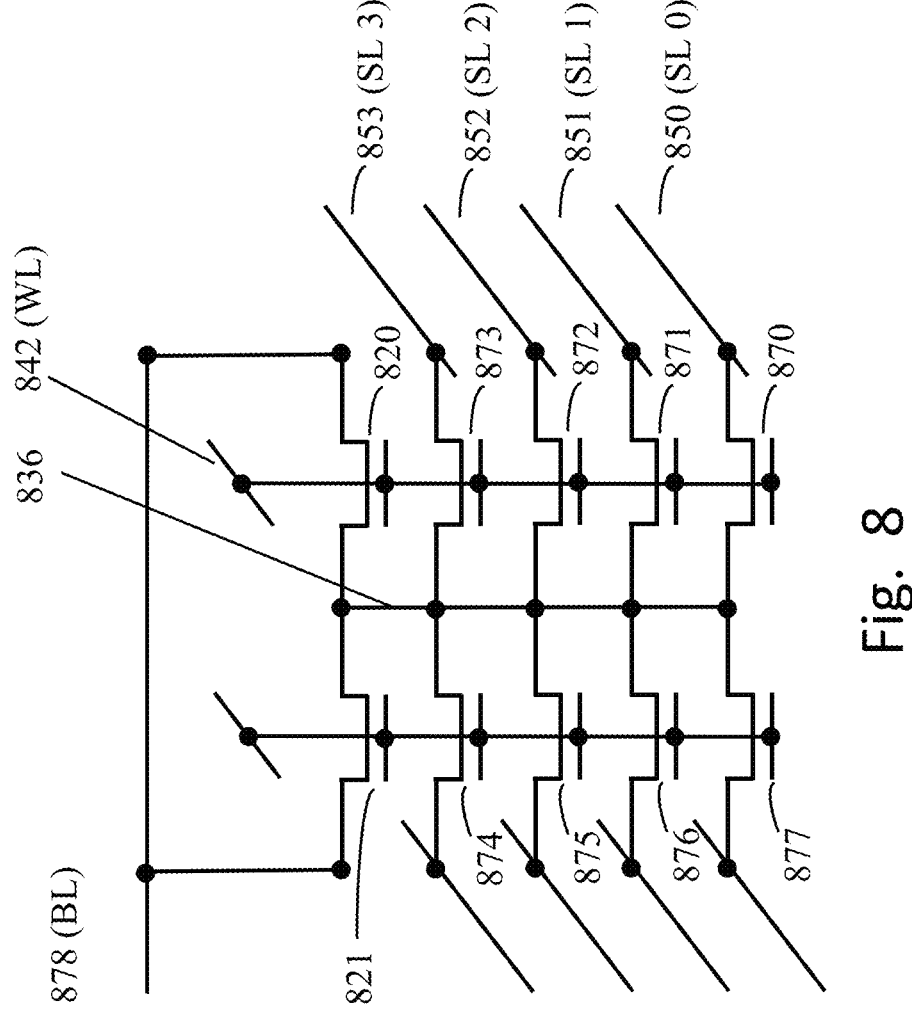
FIG. 8 is a drawing illustration of an architecture with a shared bit line access device.

As illustrated in FIG. 8, another embodiment of the 3D RAM architecture having two stable states wherein in the top mono-crystalline layer at least one of the two devices within the source lines of that layer may include an access device. Access transistor 820 may be connected in series to the floating body transistor selected to achieve an improved read and write access time. Second access transistor 821 may also be utilized in parallel with access transistor 820 for more access current when connected to the BL 878 as shown, or may function as another floating body device bit if connected to its own SL (not shown). The construction of the architecture may be similar to the structure described in FIGS. 7A-7J, with modifications described below.

Floating body transistors 870, 871, 872, and 873 may overlay each other and be connected to corresponding Select or Source Lines 850, 851, 852, and 853 respectively. The select lines may be formed by the N+ mono-crystalline layers of source lines (SL) 756 as described in FIG. 7. Overlying the floating body transistors may be access transistor 820 which may be connected to the floating body transistors, such as floating body transistors 873, 872, 871, 870, by the deep contact connection 836. Deep contact connection 836 may be the deep contact portion of bit line connectivity 754 described in FIG. 7I. Access transistor 820 may share the same gate connection, Word Line 842 as the floating body transistors on the stack below it, such as floating body transistors 870, 871, 872, and 873. Floating body transistors 870, 871, 872, and 873 may be selected by their source line connections Select or Source Lines 850, 851, 852, and 853 respectively. As well, floating body transistors 874, 875, 876, and 877 may be selected by their corresponding source line connections and accessed by the bit line 878 thru access transistor 820, second access transistor 821, or a combination of both access transistor. The read and write signal to the selected floating body may be transferred via the serially connected access transistor, such as access transistor 820, resulting in a shorter write or read cycle.

During the read operation, the access transistors of the unselected word lines are turned off, for example by applying 0.0 volt. As a result, the leakage path due to the unselected memory cells in the unselected word lines are prevented by being disconnected from the bit line 878. The leakage currents, if the leakage path is not disconnected, in a large density memory array (as expected from a 3D architecture) may be large enough to slow down or even disrupt the sensing operation of the sense amplifier.

Persons of ordinary skill in the art will appreciate that the illustration in FIG. 8 is exemplary only and is not drawn to scale. Such skilled persons will further appreciate that many variations are possible such as, for example, the access transistors could be constructed on the first mono-crystalline layer (layer closest to the peripheral circuits) and directly connected to the bit line control from the peripheral circuits below. Furthermore, by rearranging the stacked structure single mask layer etch layout geometry, a separate access device and floating body device on each layer could be constructed and accessed. Many other modifications within the scope of the present invention will suggest themselves to such skilled persons after reading this specification. Thus the invention is to be limited only by the appended claims.

Forming the peripheral circuitry on top of (or 'above') the memory stack fabric is an additional embodiment. For example, the techniques illustrated in FIG. 22F herein illustrate the formation of peripheral circuits 2298 on top of the memory fabric. Such could be used for the memory fabric described in relation to FIG. 7A to FIG. 7J. In some cases it might be desirable to have peripheral circuits both underneath the memory fabric and above it, using techniques describe herein or in the other patents incorporated by reference. An additional embodiment includes wherein the memory fabric is first built on an SOI wafer as has been described in respect to illustrations of FIG. 19 and FIG. 20 herein. The 3D memory fabric may be first formed and both top and bottom surfaces could be used for a deep connection etch and both surfaces could be used to form the memory control lines such as bit-lines, and then the peripheral circuits could be formed on one of both surfaces utilizing the 3D techniques described here and or in the patents incorporated herein.

An important advantage of the two stable states memory is in respect to low power standby operation. When the device is placed into standby, the back bias voltage could be dropped to about 50% of Vcc, for example, about 0.8 volt. Other combinatorial circuits could be disconnected from the power for further reduction of power consumption. As normal operation resumes, the voltage of the power supply and that of the back-bias would be brought up to standard levels and the circuit could resume normal operation. This is one way in which power consumption could be reduced without losing the data stored in the memory.

In some cases it might be advantageous to use laser or other annealing techniques to further improve the quality of the polysilicon by re-crystallization. Another alternative is to deposit the polysilicon with no doping or p type doping, and then perform an implant step to dope the polysilicon with N doping at the desired depth. Depth control of ion implantation is quite accurate which could be an important advantage for very thin layers and stacks. Activation could be done before low melting point metals, such as, for example, copper and aluminum, get deposited, and activation could be done for many layers simultaneously as discussed before. Use of optical anneal techniques to activate dopants in the Si/SiO2 memory stack may also be employed to minimize damage to the underlying metallization.

Figure 9:
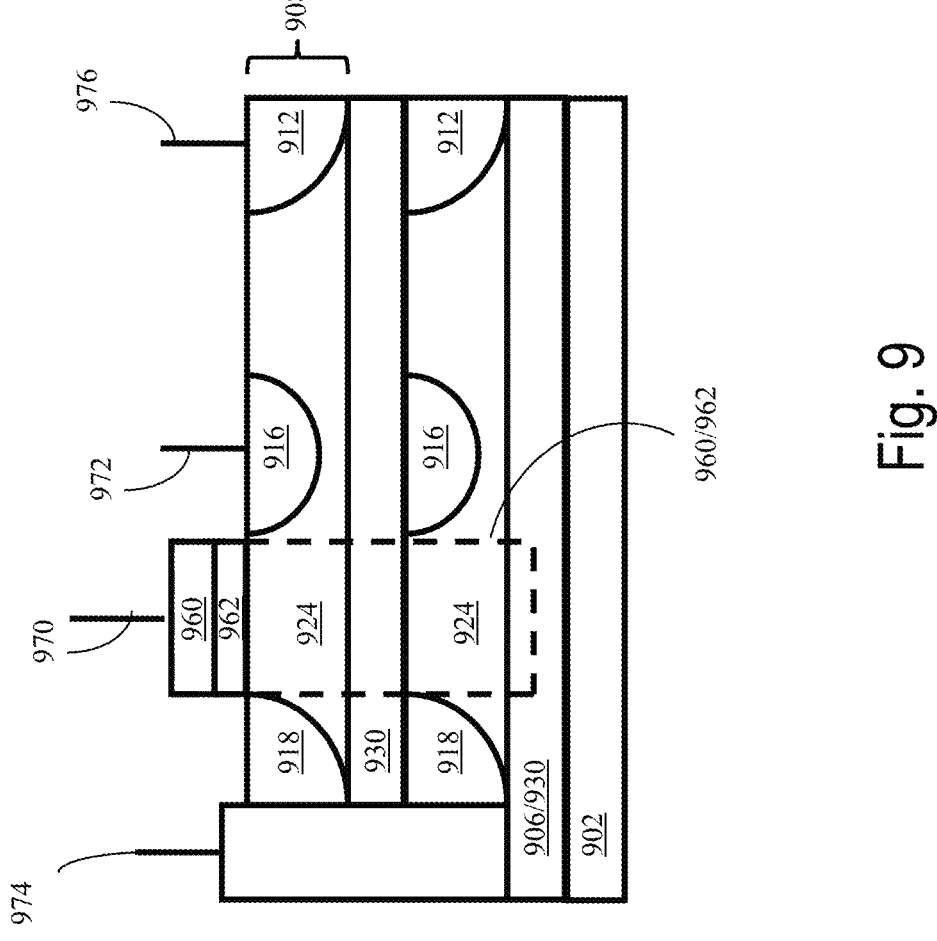
FIG. 9 is a drawing illustration of two stable states memory back bias region formed in the same mono-crystalline layer/region as the floating body channel.

As illustrated in FIG. 9, an embodiment wherein a two stable states memory may be formed with the back bias region that is formed in the same mono-crystalline layer/region as the floating body channel. The back bias region 912 may be spaced apart from the source region 916 and the drain region 918, and lie in the same mono-crystalline layer 908. The holding operation is performed through the n-p-n bipolar transistor formed by the source region 916, floating body region 924, and the back bias region 912. In this embodiment, the back bias region 912 is formed in the same mono-crystalline layer that includes the floating body transistor (formed by the source region 916, drain region 918, and the gate region 960 with gate dielectric 962), wherein the floating body region 24 may be storing the charge. Gate region 960 (including gate connectivity 970) and gate dielectric 962 are shown in dashes indicating shadowed, wherein they both overlap and form side gates on both illustrated layers of mono-crystalline material. In this illustration, mono-crystalline layer 908 may have a 3-side gate and the mono-crystalline layer below a two sided gate. The mono-crystalline layers may be isolated by oxide dielectric layers 930 and isolation dielectric 906 which may be utilized to isolate, and form bonding, of the memory stack to the peripheral circuits 902. Drain regions 918 may be commoned by deep drain contact 974 and access to the source regions 916 may be accomplished by source connectivity 972. Back-bias regions 912 may be accessed by bb connectivity 976.

Section 2: Monolithic 3D Resistance-Based Memory

While many of today's memory technologies rely on charge storage, several companies are developing non-volatile memory technologies based on resistance of a material changing. Examples of these resistance-based memories include phase change memory, Metal Oxide memory, resistive RAM (RRAM), memristors, solid-electrolyte memory, ferroelectric RAM, MRAM, etc. Background information on these resistive-memory types is given in "Overview of candidate device technologies for storage-class memory," *IBM Journal of Research and Development*, vol. 52, no. 4.5, pp. 449-464, July 2008 by Burr, G. W.; Kurdi, B. N.; Scott, J. C.; Lam, C. H.; Gopalakrishnan, K.; Shenoy, R. S. Typical RRAM materials may include transition metal oxides such as TiOx, NiOx, HFOx, WoX, TaOx, VoX, CuOx, SrToOx, CuSiOx, SiOx, TiON, and electrodes may include Pt, TiN/Ti, TiN, Ru, Ni, W, TaN, Ir, Au STT-MRAM materials may include Ir, PtMn, CoFe, Ru, CoFeB, MgO, CoFeB, Ta.

FIGS. 10A-10J describe a novel memory architecture for resistance-based memories, and a procedure for its construction. The memory architecture utilizes junction-less transistors and has a resistance-based memory element in series with a transistor selector. No mask is utilized on a "per-memory-layer" basis for the monolithic 3D resistance change memory (or resistive memory) concept shown in FIG. 10A-10J, and all other masks may be shared between different layers. The process flow may include several steps that occur in the following sequence.

Figure 10A:
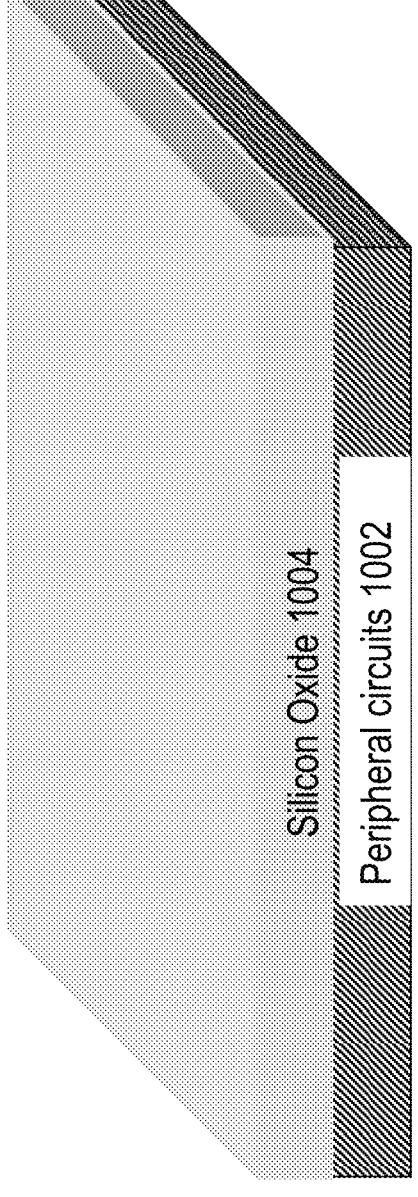

Step (A): Peripheral circuits 1002 may be first constructed and above this an insulator layer, such as a layer of silicon dioxide, oxide layer 1004 may be deposited. FIG. 10A shows a drawing illustration after Step (A).

Figure 10B:
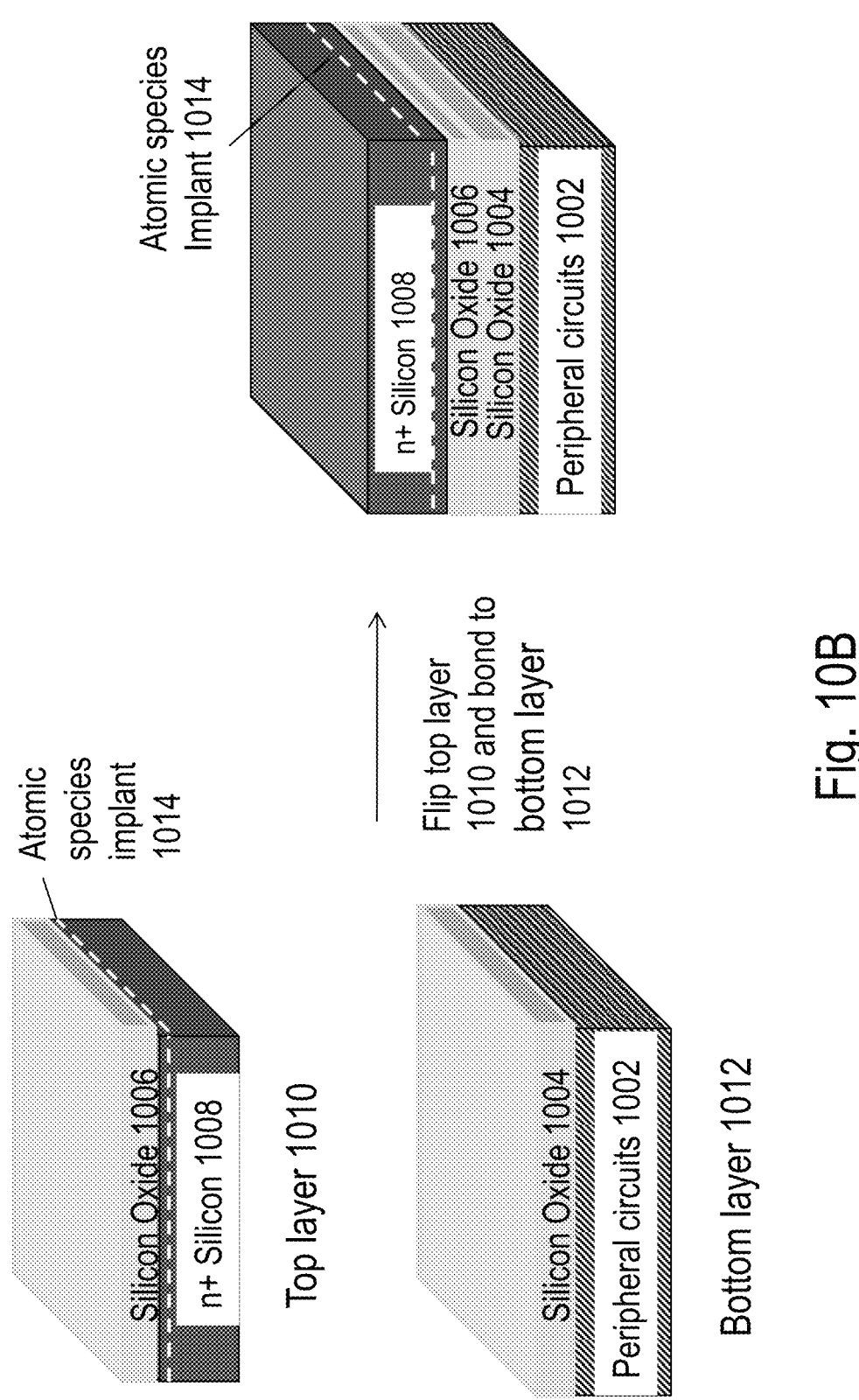

Step (B): FIG. 10B illustrates the structure after Step (B). A wafer of n+ Silicon 1008 may have an oxide layer 1006 grown or deposited above it. Following this, hydrogen may be implanted into the n+ Silicon wafer at a certain depth indicated by 1014. Alternatively, some other atomic species such as Helium could be (co-)implanted. This hydrogen implanted n+ Silicon wafer 1008 may form the top layer 1010. The bottom layer 1012 may include the peripheral circuits 1002 with oxide layer 1004. The top layer 1010 may be flipped and bonded to the bottom layer 1012 using oxide-to-oxide bonding.

Figure 10C:
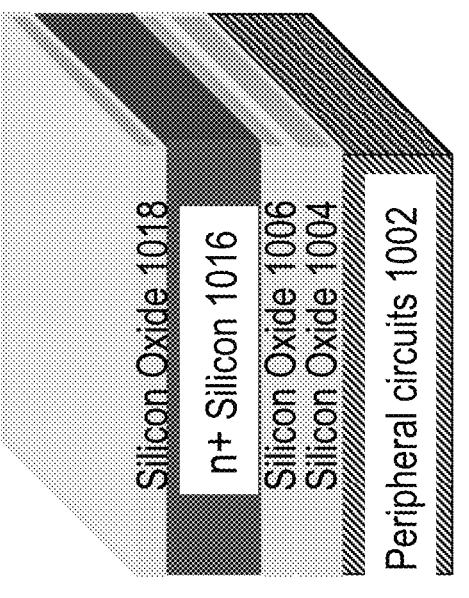

Step (C): FIG. 10C illustrates the structure after Step (C). The stack of top and bottom wafers after Step (B) may be cleaved at the hydrogen plane 1014 using either a anneal or a sideways mechanical force or other means. A CMP process may then conducted. A layer of silicon oxide 1018 may then be deposited atop the n+ Silicon layer 1016. At the end of this step, a single-crystal n+ Si layer 1016 exists atop the peripheral circuits, and this has been achieved using layer-transfer techniques.

Figure 10D:
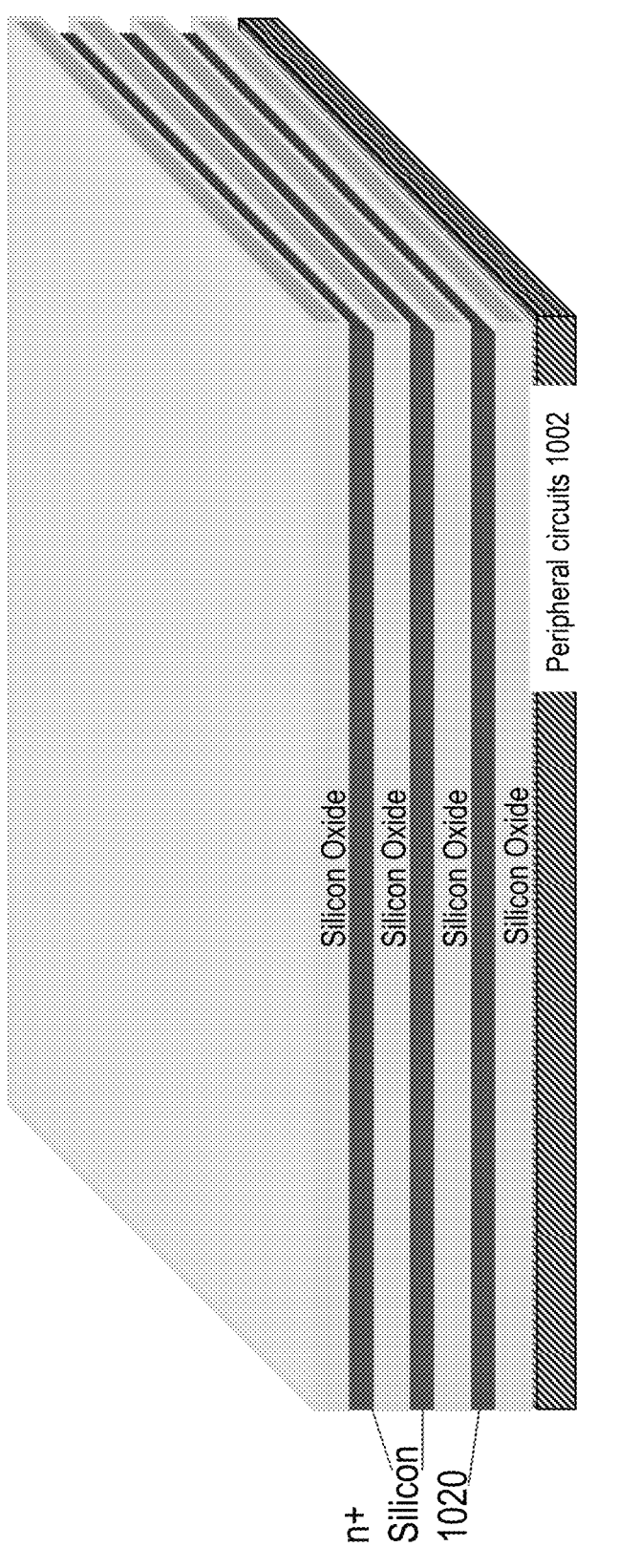

Step (D): FIG. 10D illustrates the structure after Step (D). Using methods similar to Step (B) and (C), multiple n+ silicon layers 1020 may be formed with silicon oxide layers in between. The composition of the silicon oxide regions within the stacked Si/SiO$_2$ layers may be insulators or dielectrics other than silicon dioxide such as, for example, a low-k dielectric, carbon containing silicon oxides, amorphous carbon. The thickness of the silicon oxide regions within the stacked Si/SiO$_2$ layers may be adjusted to minimize layer to layer, strata to strata disturb mechanisms, and may include thicknesses of 50 nm, 75 nm, 100 nm, 150 nm, 200 nm, 500 nm, and less than 1000 nm. A thin conductive layer, such as a metal, may also be formed between the two bonding oxides to form a field shield to mitigate layer to layer, strata to strata disturb mechanisms, and may be electrically floating or tied to a bias, such as ground or Vdd. The stacked Si/SiO$_2$ layers may alternatively be formed by successive ion implants of oxygen atoms/ions to various depths from the top surface of a mono-crystalline silicon wafer/substrate and then heat treated to form oxide layers thus forming silicon layers in-between the oxide layers, a layered 'SIMOX' process approach.

Figure 10E:
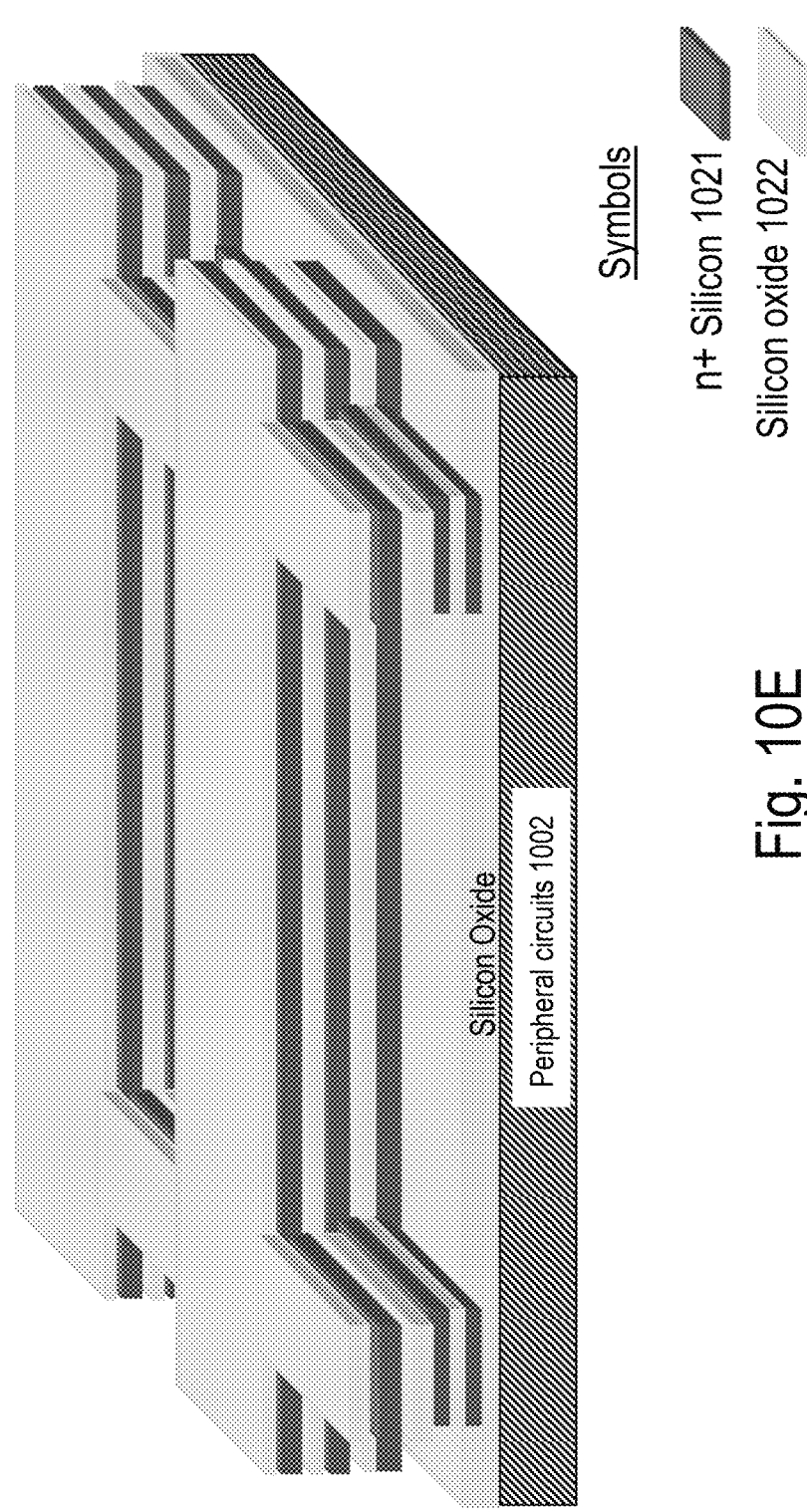

Step (E): FIG. 10E illustrates the structure after Step (E). Lithography and etch processes may then be utilized to make a structure as shown in the figure.

Figure 10F:
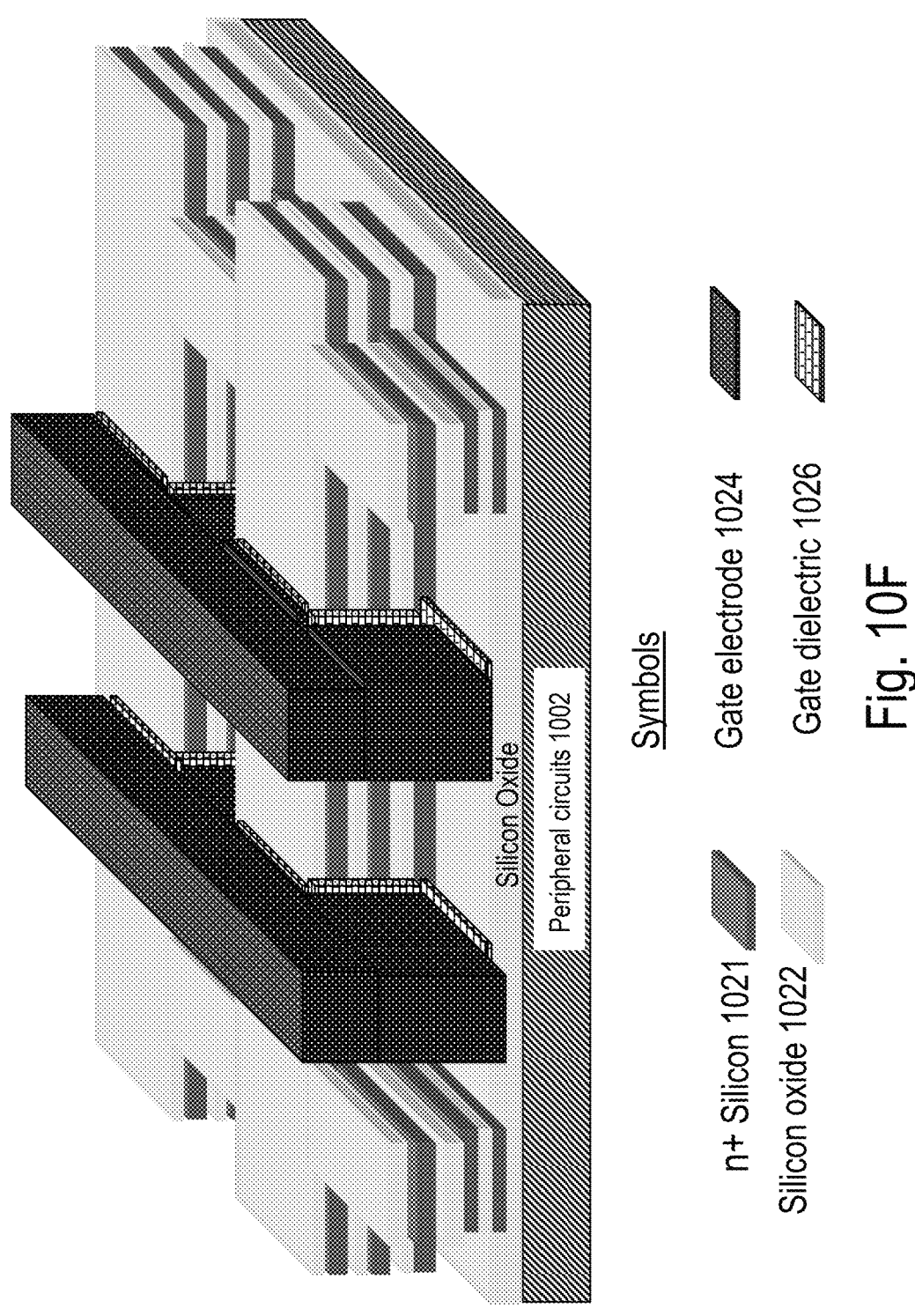

Step (F): FIG. 10F illustrates the structure after Step (F). Gate dielectric 1026 and gate electrode 1024 may then be deposited following which a CMP may be performed to planarize the gate electrode 1024 regions. Lithography and etch may be utilized to define gate regions. Gate dielectric 1026 and gate electrode 1024 may be, for example, a HKMG structure or a TEL SPA radical oxidation oxide and an appropriate work function electrode, for example, tungsten, degenerately doped polysilicon or amorphous silicon. Although the width of the n+ regions 1021 near and under the gates are illustrated as being larger than the thickness, one skilled in the art would recognize that the reverse (i.e., thickness larger than width) could be formed to provide increased gate control of the transistor channel.

Figure 10G:
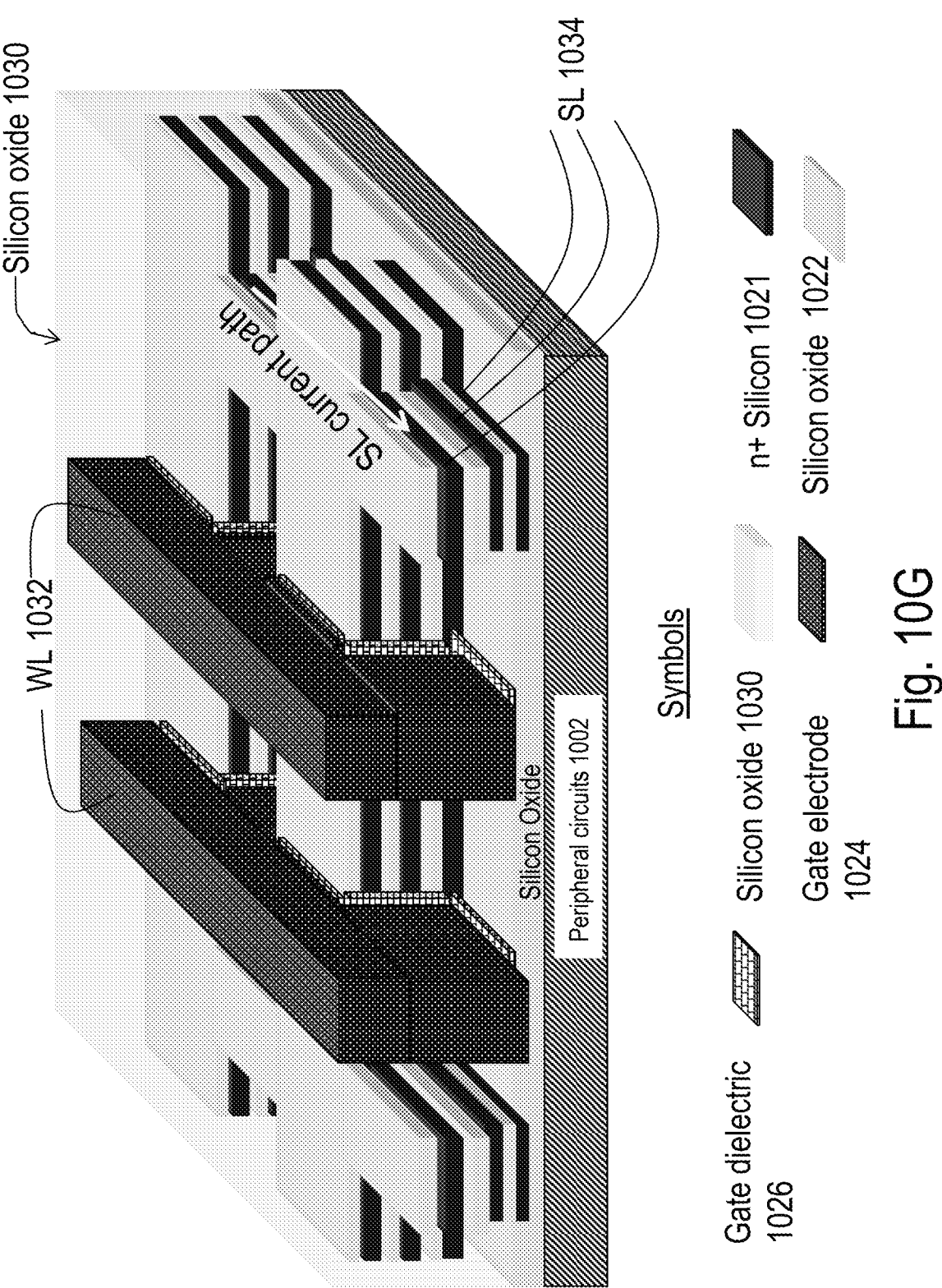

Step (G): FIG. 10G illustrates the structure after Step (G). A silicon oxide layer 1030 may then be deposited and planarized. The silicon oxide layer is shown transparent in the figure for clarity, along with word-line (WL) 1032 and source-line (SL) 1034 regions.

Figure 10H:
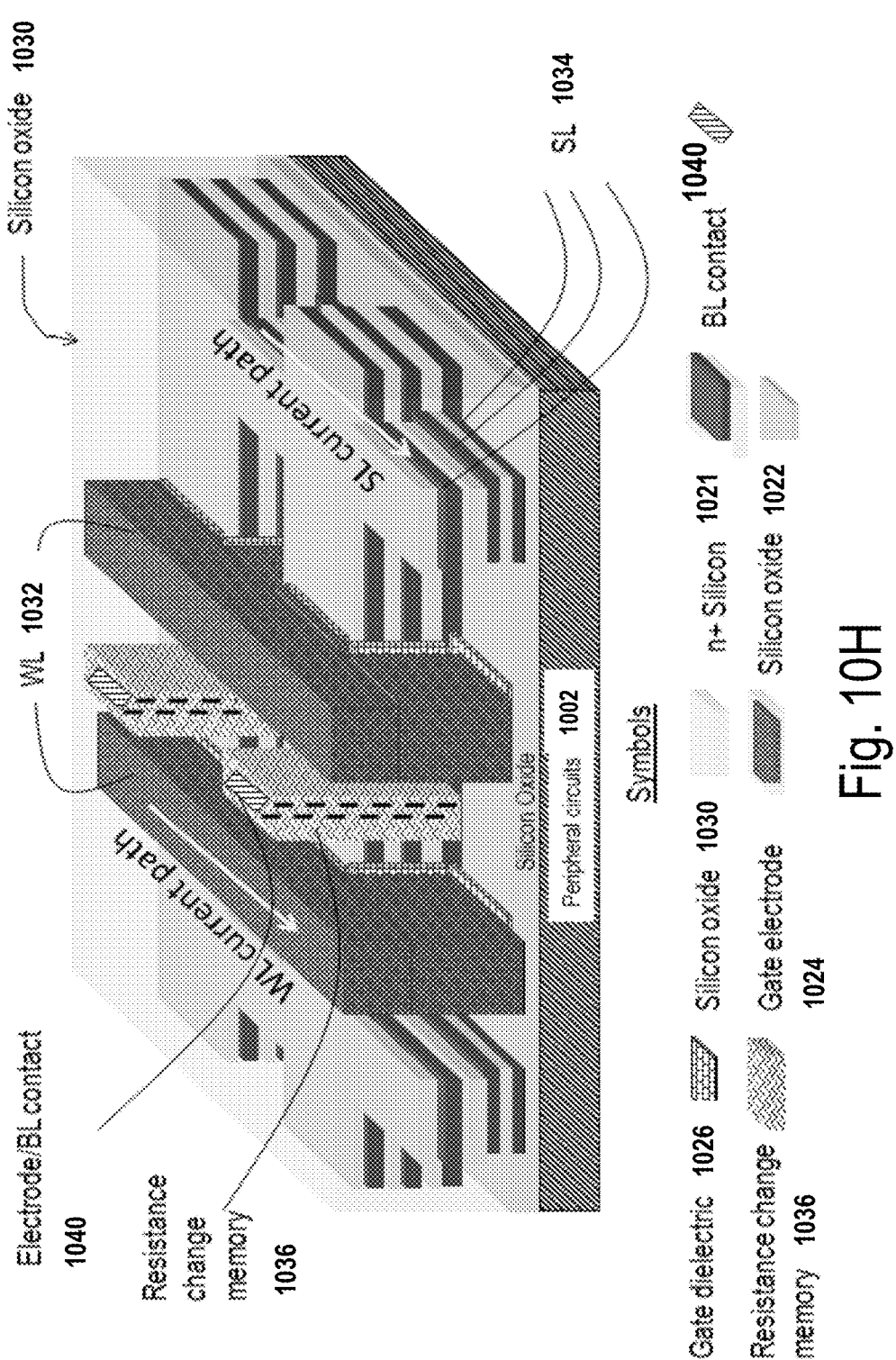

Step (H): FIG. 10H illustrates the structure after Step (H). Vias may be etched through multiple layers of silicon and silicon dioxide as shown in the figure. A resistance change memory material 1036 may then be deposited (preferably with atomic layer deposition (ALD)). Examples of such a material include hafnium oxide, well known to change resistance by applying voltage. An electrode for the resistance change memory element may then be deposited (preferably using ALD) and is shown as electrode/BL contact 1040. A CMP process may then be conducted to planarize the surface. It can be observed that multiple resistance change memory elements in series with junctionless transistors are created after this step.

Figure 10I:
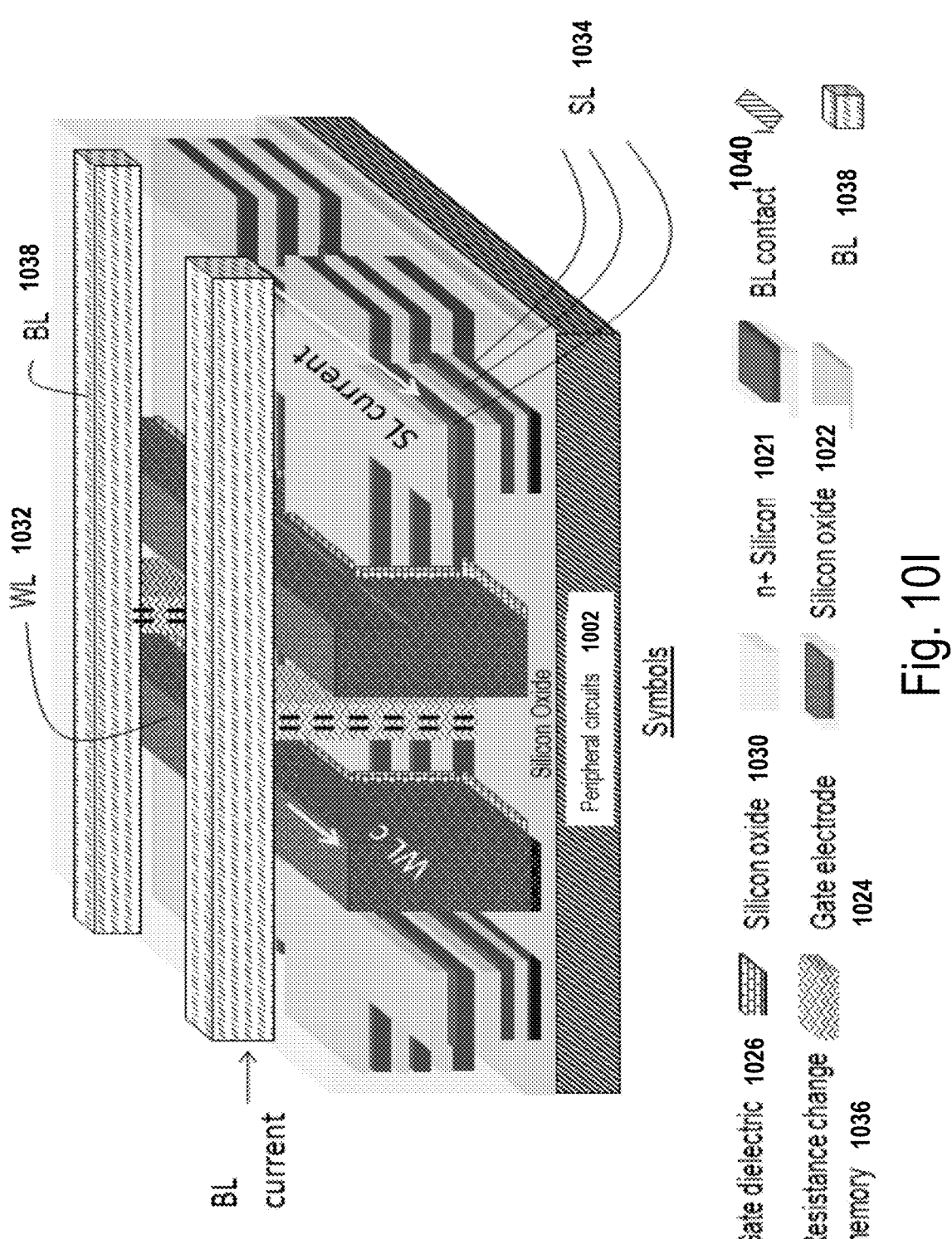

Step (I): FIG. 10I illustrates the structure after Step (I). BLs 1038 may then be constructed. Contacts may be made to BLs, WLs and SLs of the memory array at its edges. SL contacts can be made into stair-like structures using techniques described in in "Bit Cost Scalable Technology with Punch and Plug Process for Ultra High Density Flash Memory," *VLSI Technology*, 2007 *IEEE Symposium on*, vol., no., pp. 14-15, 12-14 Jun. 2007 by Tanaka, H.; Kido, M.; Yahashi, K.; Oomura, M.; et al., following which contacts can be constructed to them. Formation of stair-like structures for SLs could be achieved in steps prior to Step (I) as well.

FIG. 10J shows cross-sectional views of the array for clarity.

A 3D resistance change memory has thus been constructed, with (1) horizontally-oriented transistors—i.e. current flowing in substantially the horizontal direction in transistor channels, (2) some of the memory cell control lines, e.g., source-lines SL, constructed of heavily doped silicon and embedded in the memory cell layer, (3) side gates that are simultaneously deposited over multiple memory layers for transistors, and (4) monocrystalline (or single-crystal) silicon layers obtained by layer transfer techniques such as ion-cut.

FIG. 11A-K describe an alternative process flow to construct a horizontally-oriented monolithic 3D resistive memory array. This embodiment has a resistance-based memory element in series with a transistor selector. No mask is utilized on a "per-memory-layer" basis for the monolithic 3D resistance change memory (or resistive memory) concept shown in FIG. 11A-K, and all other masks may be shared between different layers. The process flow may include several steps as described in the following sequence.

Figure 11A:
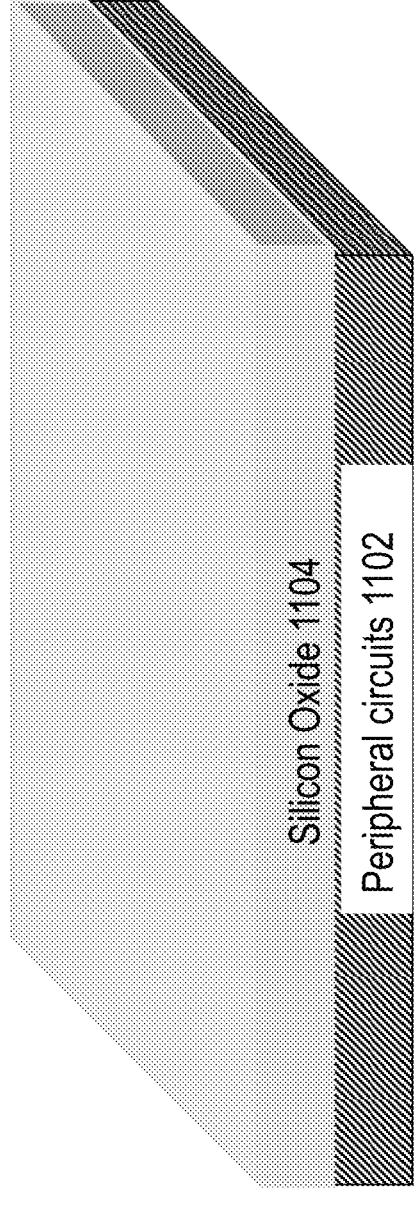

Step (A): Peripheral circuits with tungsten wiring 1102 may be first constructed and above this a layer of silicon dioxide 1104 is deposited. FIG. 11A shows a drawing illustration after Step (A).

Figure 11B:
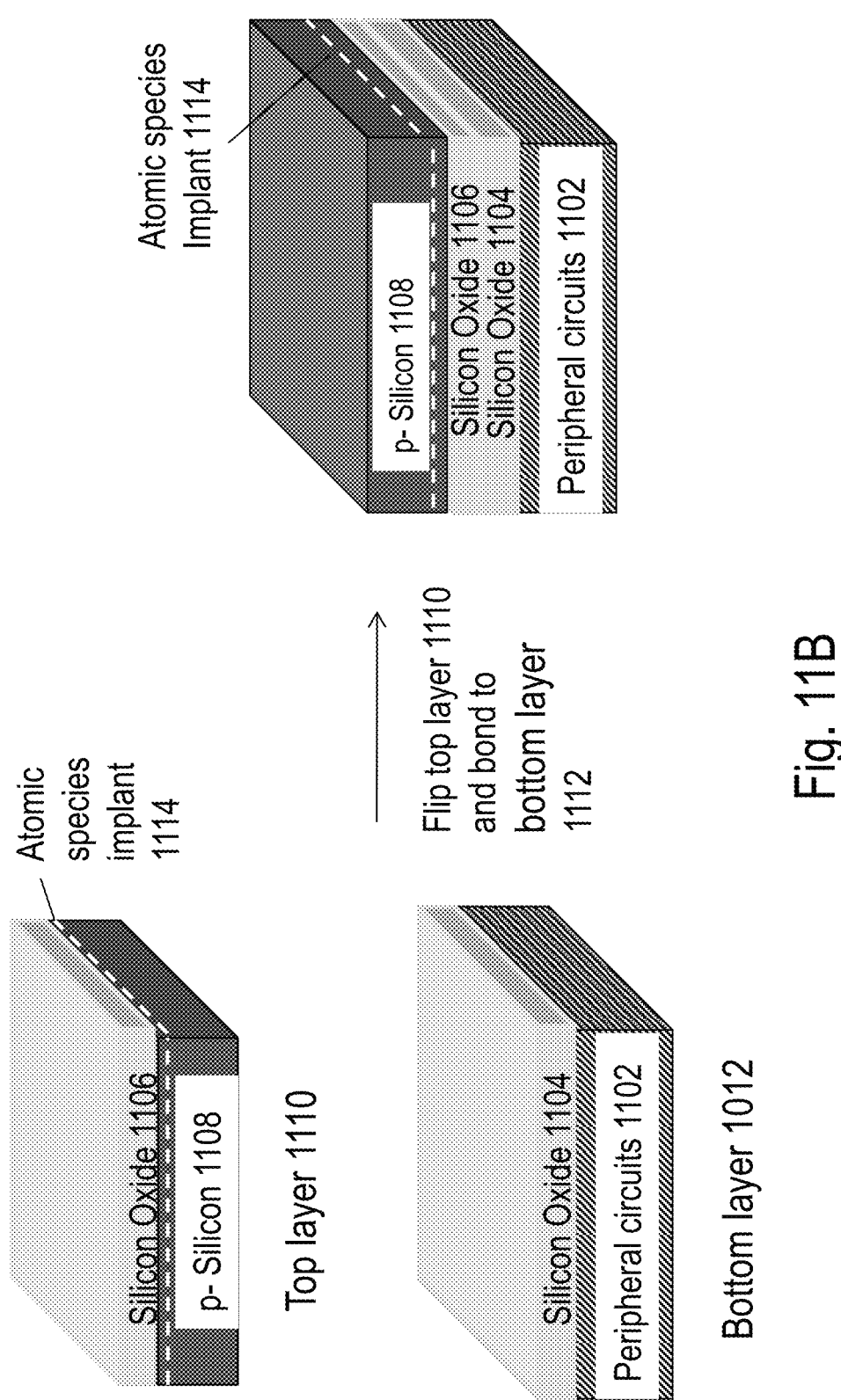

Step (B): FIG. 11B illustrates the structure after Step (B). A wafer of p– Silicon 1108 may have an oxide layer 1106 grown or deposited above it. Following this, hydrogen may be implanted into the p– Silicon wafer at a certain depth indicated by 1114. Alternatively, some other atomic species such as Helium could be (co-)implanted. This hydrogen implanted p– Silicon wafer 1108 may form the top layer 1110. The bottom layer 1112 may include the peripheral circuits 1102 with oxide layer 1104. The top layer 1110 may be flipped and bonded to the bottom layer 1112 using oxide-to-oxide bonding.

Figure 11C:
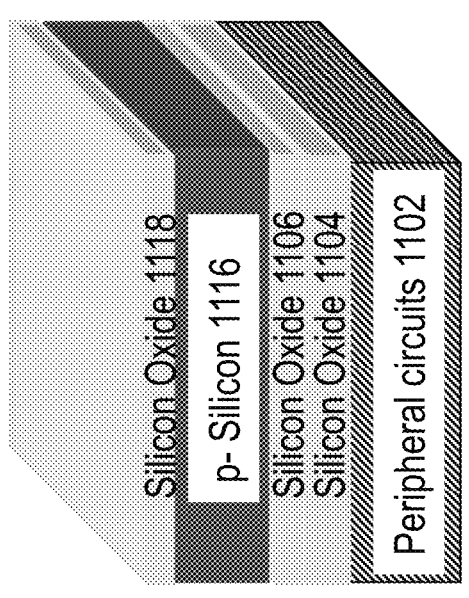

Step (C): FIG. 11C illustrates the structure after Step (C). The stack of top and bottom wafers after Step (B) may be cleaved at the hydrogen plane 1114 using either a anneal or a sideways mechanical force or other means. A CMP process may then be conducted. A layer of silicon oxide 1118 may then be deposited atop the p– Silicon layer 1116. At the end of this step, a single-crystal p– Silicon layer 1116 exists atop the peripheral circuits, and this has been achieved using layer-transfer techniques.

Figure 11D:
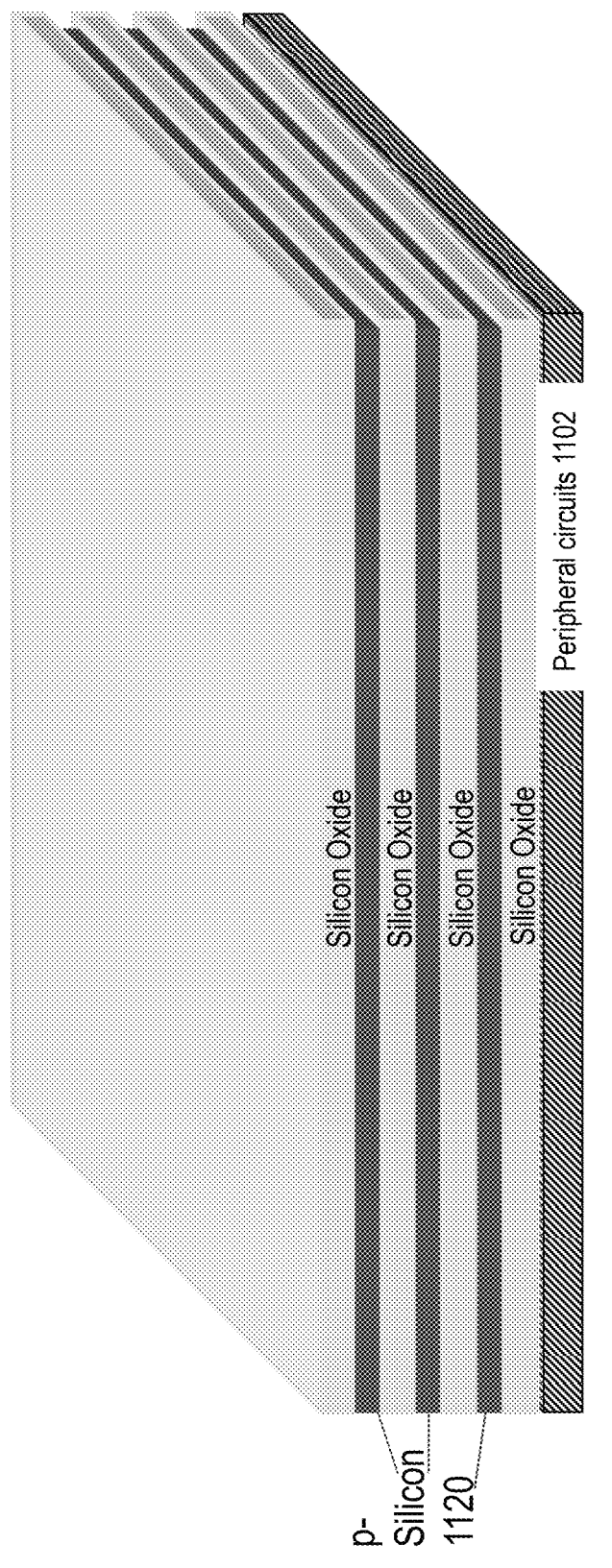

Step (D): FIG. 11D illustrates the structure after Step (D). Using methods similar to Step (B) and (C), multiple p– silicon layers 1120 may be formed with silicon oxide layers in between. The composition of the silicon oxide regions within the stacked Si/SiO$_2$ layers may be insulators or dielectrics other than silicon dioxide such as, for example, a low-k dielectric, carbon containing silicon oxides, amorphous carbon. The thickness of silicon oxide regions within the stacked Si/SiO$_2$ layers may be adjusted to minimize layer to layer, strata to strata disturb mechanisms, and may include thicknesses of 50 nm, 75 nm, 100 nm, 150 nm, 200 nm, 500 nm, and less than 1000 nm. A thin conductive layer, such as a metal, may also be formed between the two bonding oxides to form a field shield to mitigate layer to layer, strata to strata disturb mechanisms, and may be electrically floating or tied to a bias, such as ground or Vdd. The stacked Si/SiO$_2$ layers may alternatively be formed by successive ion implants of oxygen atoms/ions to various depths from the top surface of a mono-crystalline silicon wafer/substrate and then heat treated to form oxide layers thus forming silicon layers in-between the oxide layers, a layered 'SIMOX' process approach.

Figure 11E:
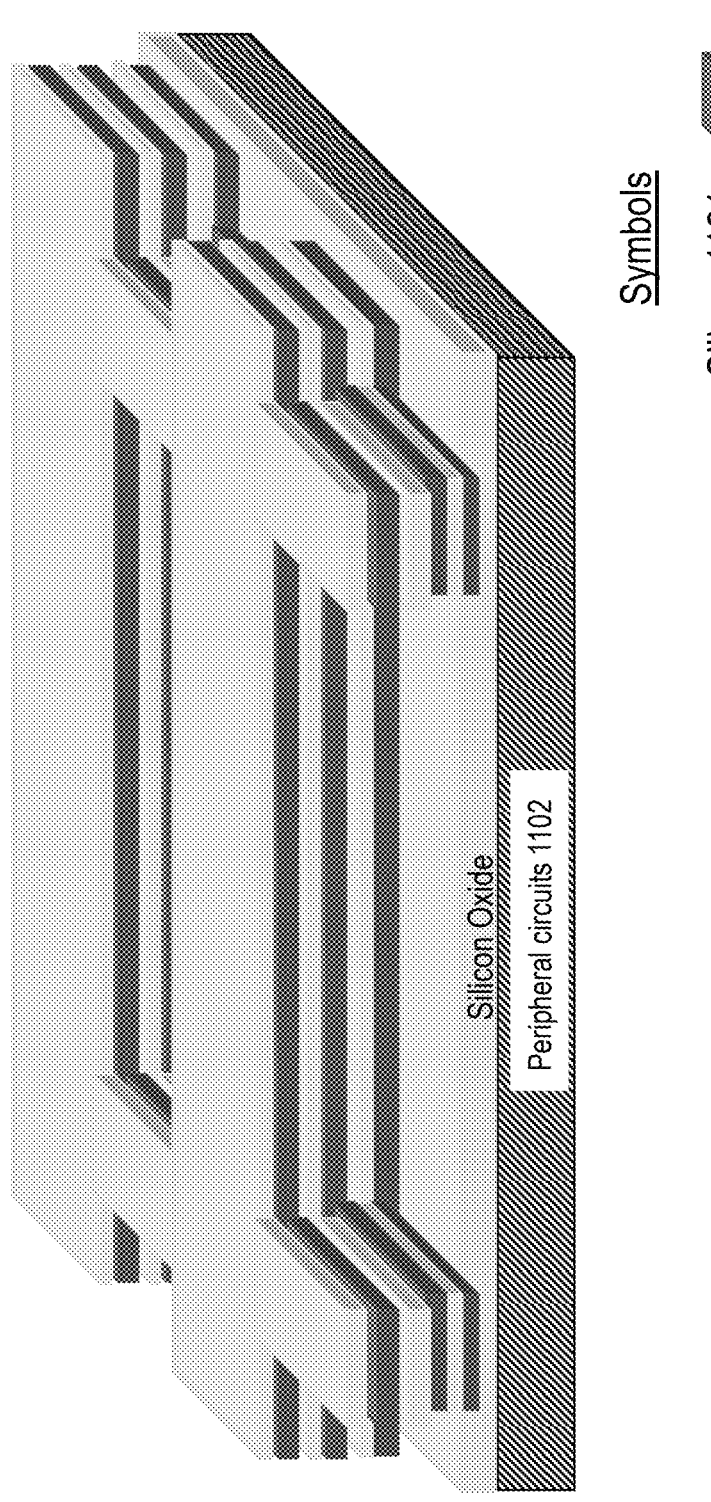

Step (E): FIG. 11E illustrates the structure after Step (E), including insulator regions such as silicon oxide 1122. Lithography and etch processes may then be utilized to construct a structure as shown in the figure.

Figure 11F:
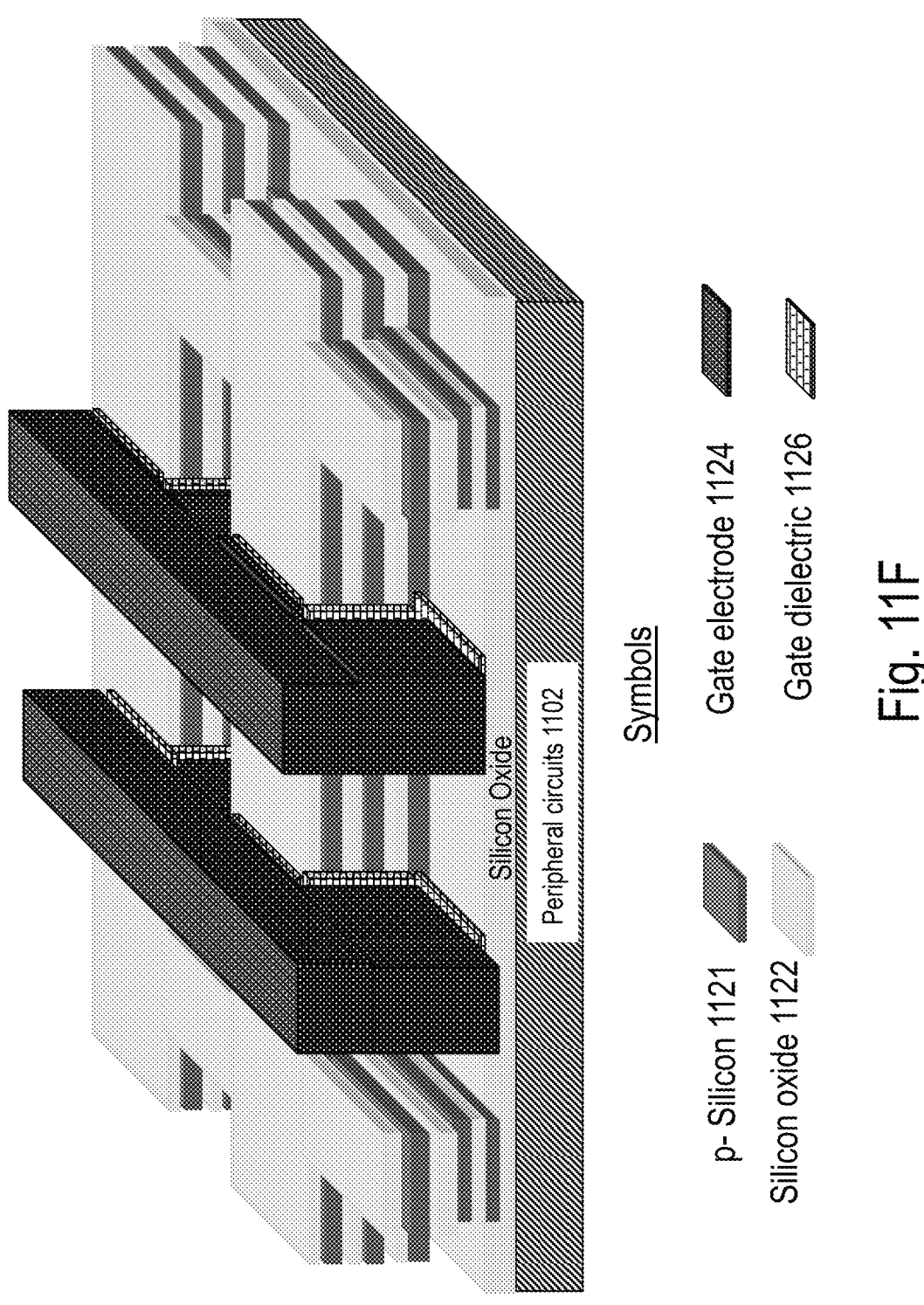

Step (F): FIG. 11F illustrates the structure on after Step (F). Gate dielectric 1126 and gate electrode 1124 may then be deposited following which a CMP may be done to planarize the gate electrode 1124 regions. Lithography and etch may be utilized to define gate regions. Gate dielectric 1126 and gate electrode 1124 may be, for example, a HKMG structure or a TEL SPA radical oxidation oxide and an appropriate work function electrode, for example, tungsten, degenerately doped polysilicon or amorphous silicon. Although the width of the p– regions 1121 near and under the gates are illustrated as being larger than the thickness, one skilled in the art would recognize that the reverse (i.e., thickness larger than width) could be formed to provide increased gate control of the transistor channel.

Figure 11G:
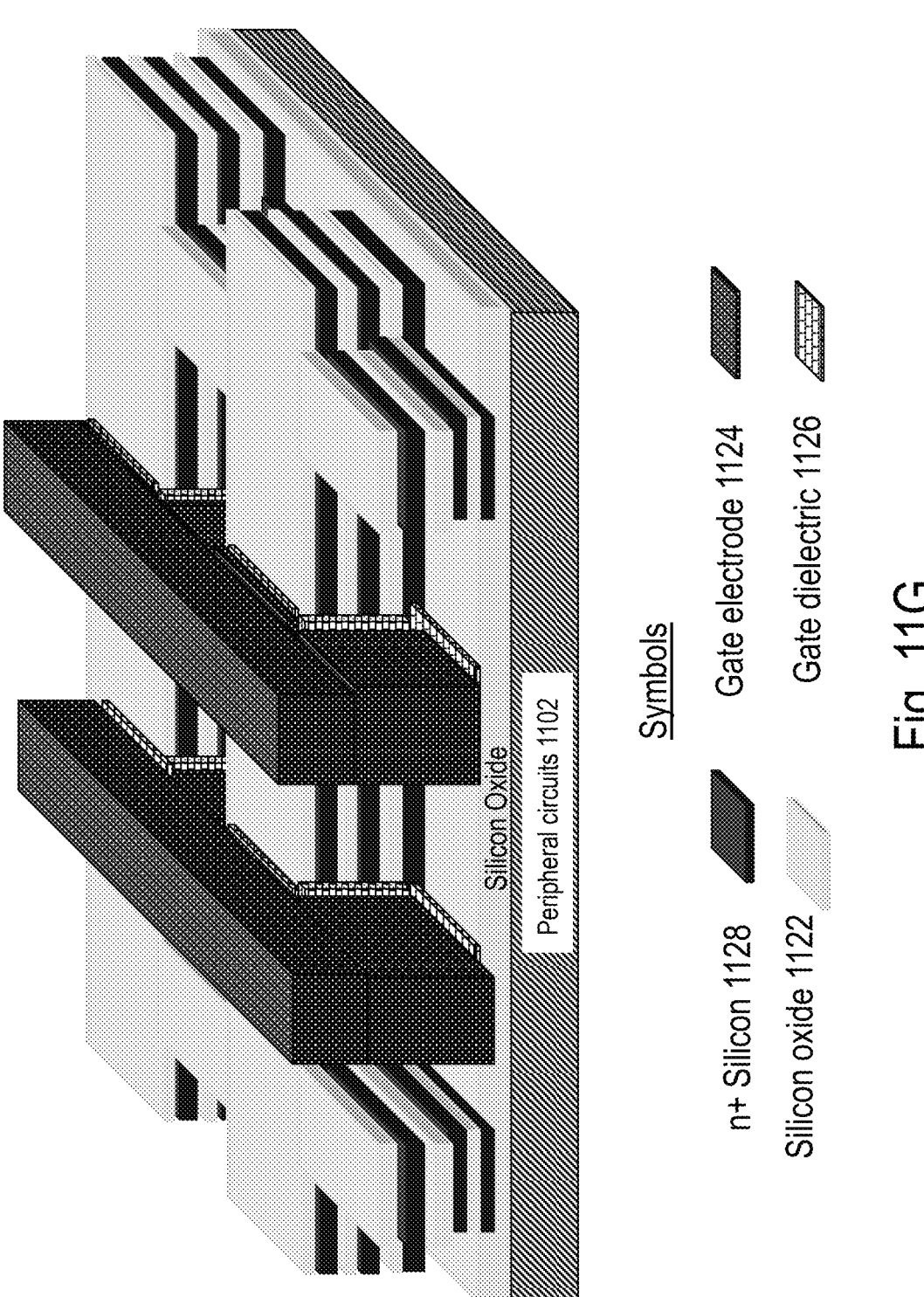

Step (G): FIG. 11G illustrates the structure after Step (G). Using the hard mask defined in Step (F), p– regions not covered by the gate may be implanted to form n+ regions 1128. Spacers may be utilized during this multi-step implantation process and layers of silicon present in different layers of the stack may have different spacer widths to account for lateral straggle of buried layer implants. Bottom layers could have larger spacer widths than top layers. A thermal annealing step, such as a RTA or spike anneal or laser anneal or flash anneal, may then be conducted to activate n+ doped regions.

Figure 11H:
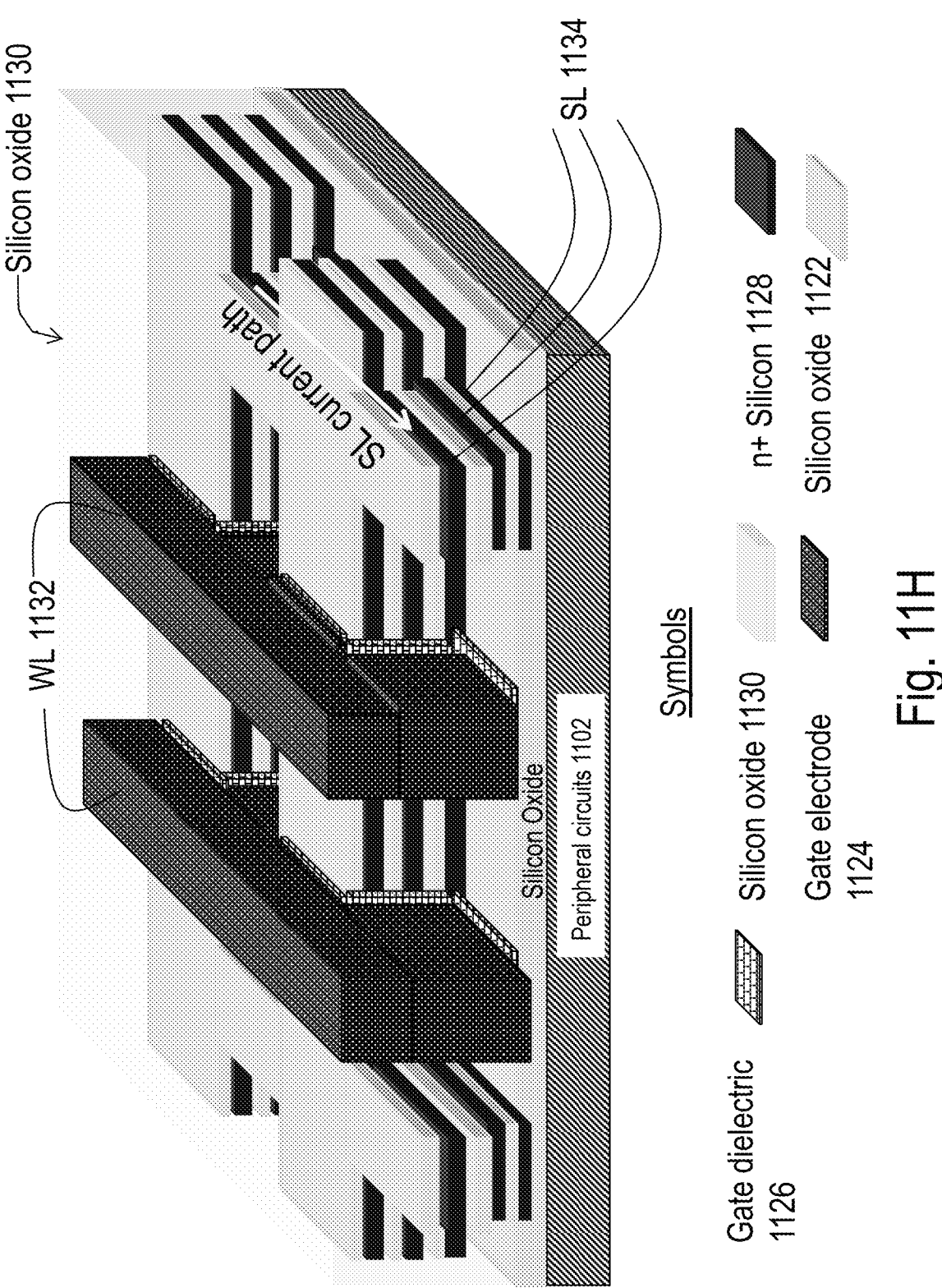

Step (H): FIG. 11H illustrates the structure after Step (H). A silicon oxide layer 1130 may then be deposited and planarized. The silicon oxide layer is shown transparent in the figure for clarity, along with word-line (WL) 1132 and source-line (SL) 1134 regions.

Figure 11I:
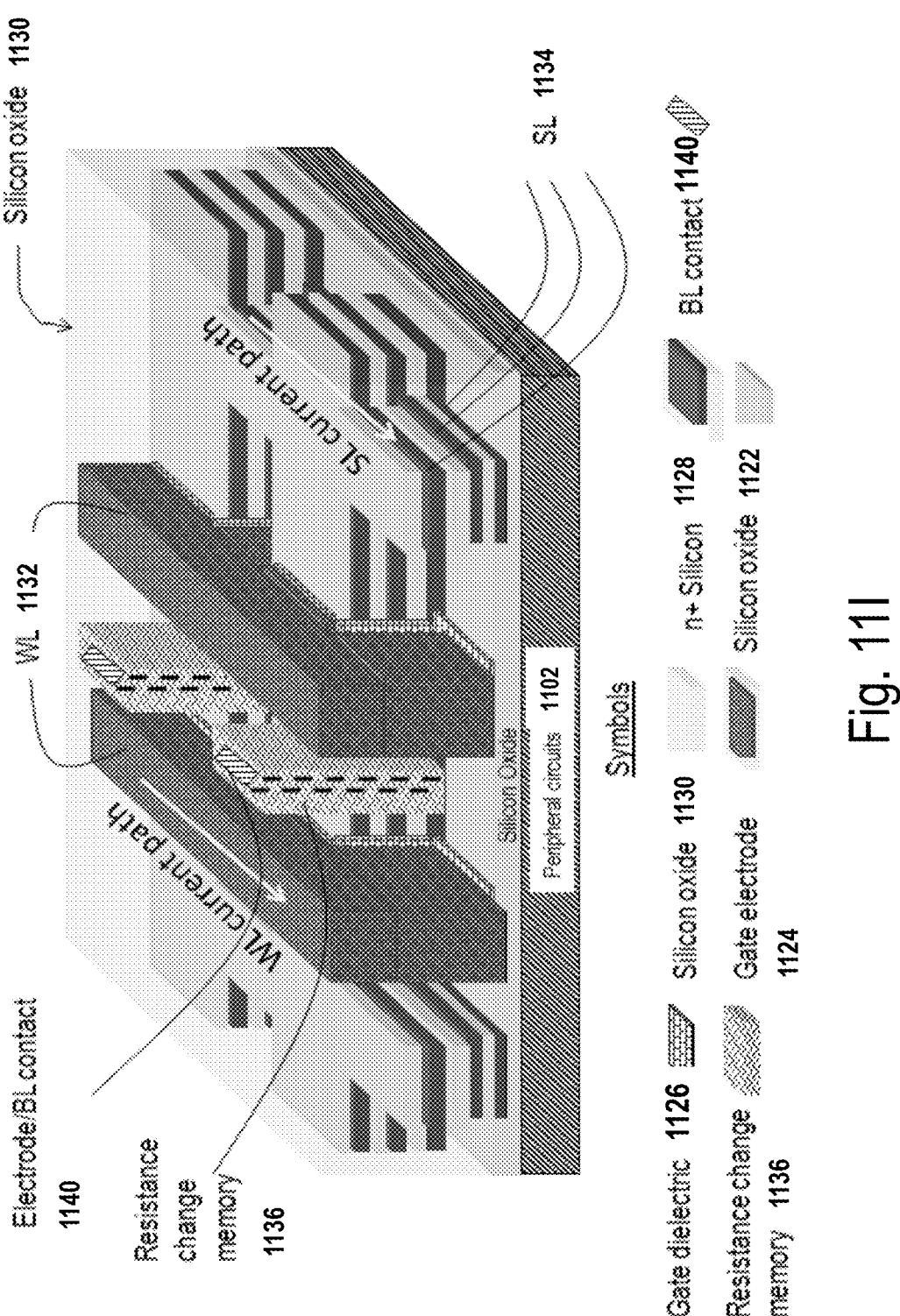

Step (I): FIG. 11I illustrates the structure after Step (I). Vias may be etched through multiple layers of silicon and silicon dioxide as shown in the figure. A resistance change memory material 1136 may then be deposited (preferably with atomic layer deposition (ALD)). Examples of such a material include hafnium oxide, which is well known to change resistance by applying voltage. An electrode for the resistance change memory element may then be deposited (preferably using ALD) and is shown as electrode/BL contact 1140. A CMP process may then be conducted to planarize the surface. It can be observed that multiple resistance change memory elements in series with transistors are created after this step.

Figure 11J:
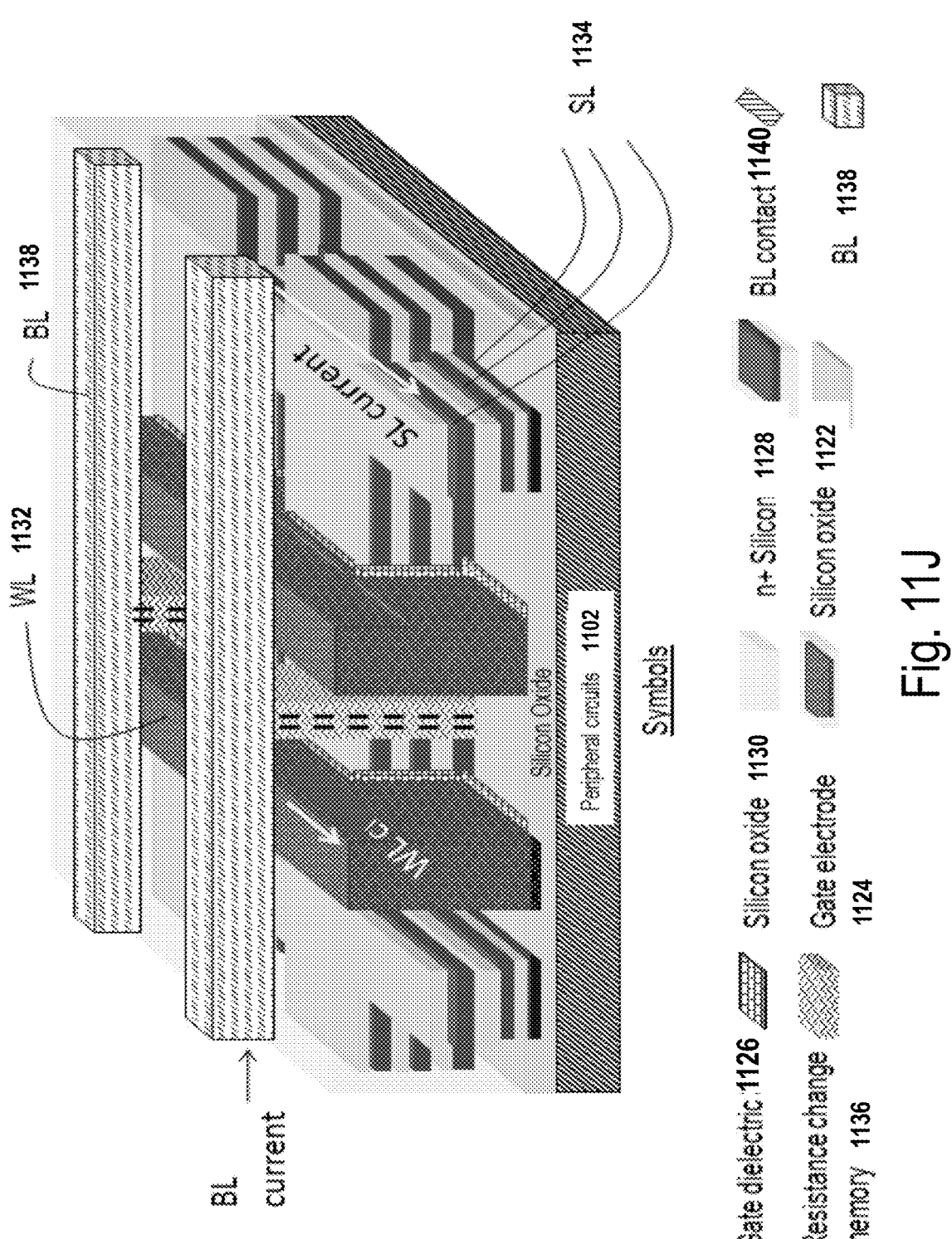

Step (J): FIG. 11J illustrates the structure after Step (J). BLs 1138 may be constructed. Contacts may be made to BLs, WLs and SLs of the memory array at its edges. SL contacts can be made into stair-like structures using techniques described in "Bit Cost Scalable Technology with Punch and Plug Process for Ultra High Density Flash Memory," *VLSI Technology,* 2007 *IEEE Symposium on, vol., no., pp.* 14-15, 12-14 Jun. 2007 by Tanaka, H.; Kido, M.; Yahashi, K.; Oomura, M.; et al., following which contacts can be constructed to them.

Formation of stair-like structures for SLs could be done in steps prior to Step (I) as well.

FIG. 11K shows cross-sectional views of the array for clarity.

A 3D resistance change memory has thus been constructed, with (1) horizontally-oriented transistors—i.e. current flowing in substantially the horizontal direction in transistor channels, (2) some of the memory cell control lines—e.g., source-lines SL, constructed of heavily doped silicon and embedded in the memory cell layer, (3) side gates simultaneously deposited over multiple memory layers for transistors, and (4) monocrystalline (or single-crystal) silicon layers obtained by layer transfer techniques such as ion-cut.

FIG. 12A-L describes an alternative process flow to construct a horizontally-oriented monolithic 3D resistive memory array. This embodiment has a resistance-based memory element in series with a transistor selector. One mask is utilized on a "per-memory-layer" basis for the monolithic 3D resistance change memory (or resistive memory) concept shown in FIG. 12A-L, and all other masks may be shared between different layers. The process flow may include several steps as described in the following sequence.

Figure 12A:
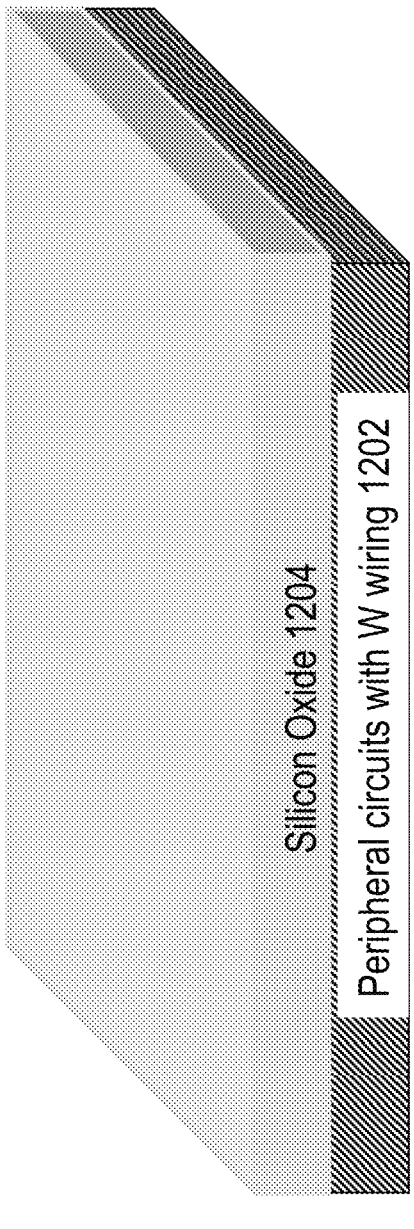

Step (A): Peripheral circuits 1202 with tungsten wiring may be first constructed and above this a layer of silicon dioxide 1204 may be deposited. FIG. 12A illustrates the structure after Step (A).

Figure 12B:
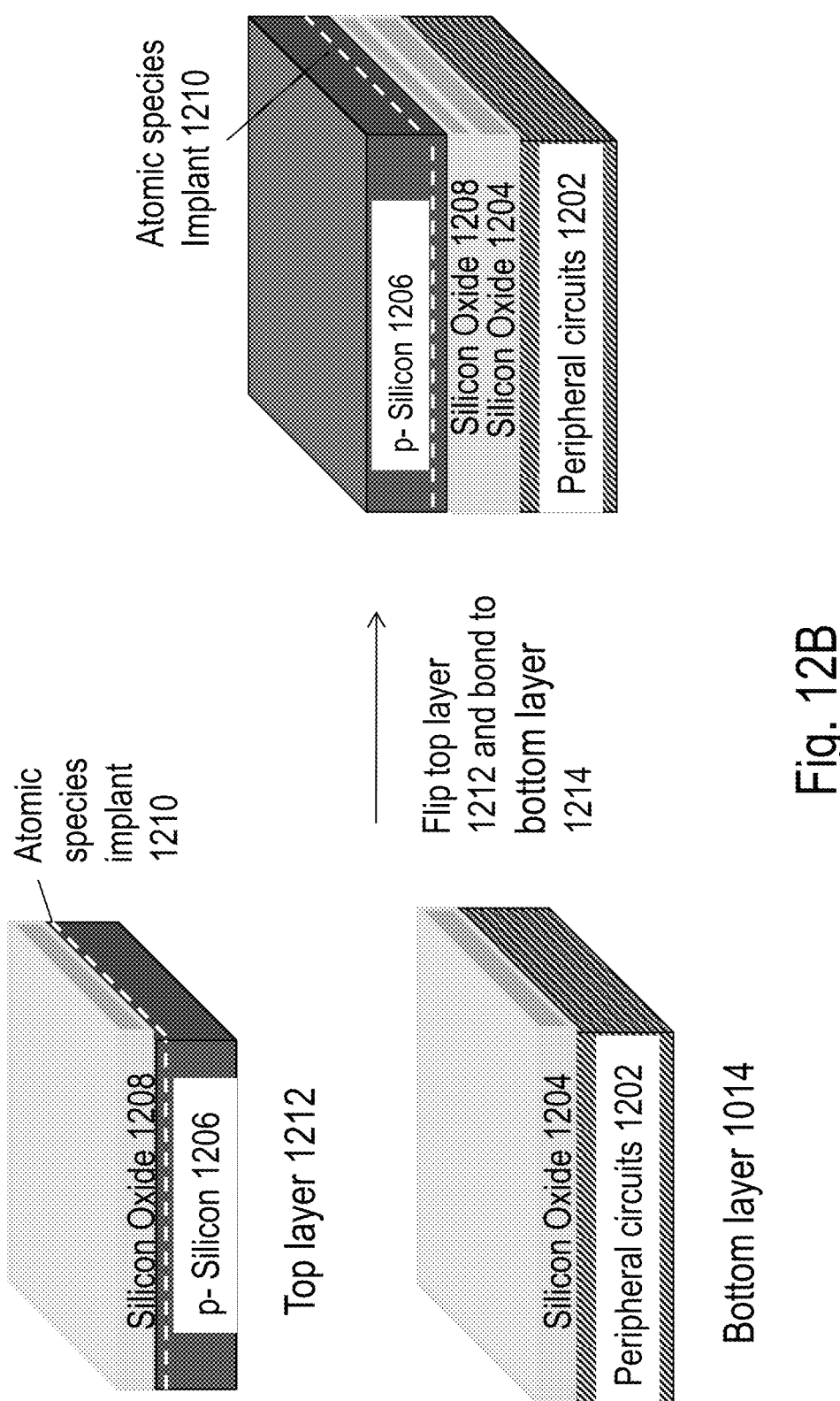

Step (B): FIG. 12B illustrates the structure after Step (B). A wafer of p– Silicon 1206 may have an oxide layer 1208 grown or deposited above it. Following this, hydrogen may be implanted into the p– Silicon wafer at a certain depth indicated by 1210. Alternatively, some other atomic species such as Helium could be (co-)implanted. This hydrogen implanted p– Silicon wafer 1206 may form the top layer 1212. The bottom layer 1214 may include the peripheral circuits 1202 with oxide layer 1204. The top layer 1212 may be flipped and bonded to the bottom layer 1214 using oxide-to-oxide bonding.

Figure 12C:
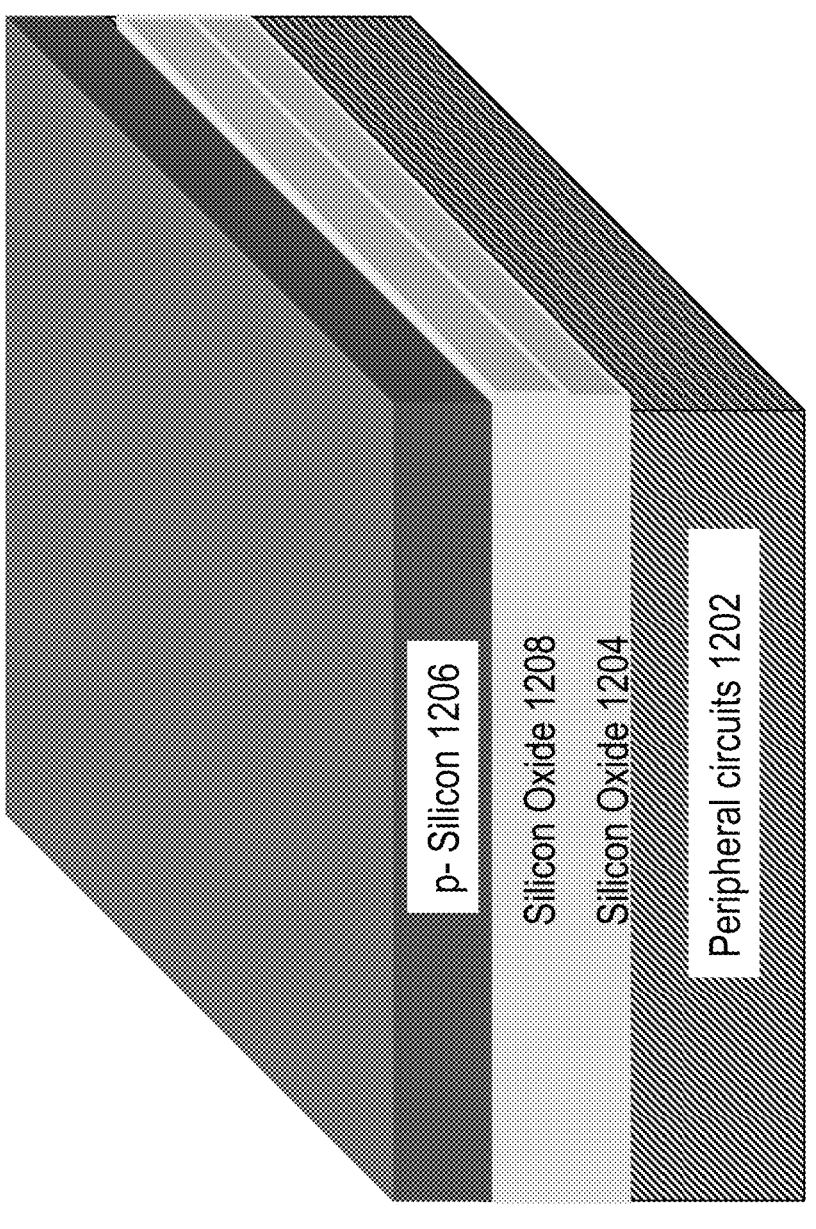

Step (C): FIG. 12C illustrates the structure after Step (C). The stack of top and bottom wafers after Step (B) may be cleaved at the hydrogen plane 1210 using either a anneal or a sideways mechanical force or other means. A CMP process may be conducted. At the end of this step, a single-crystal p– Si layer exists atop the peripheral circuits, and this has been achieved using layer-transfer techniques.

Figure 12D:
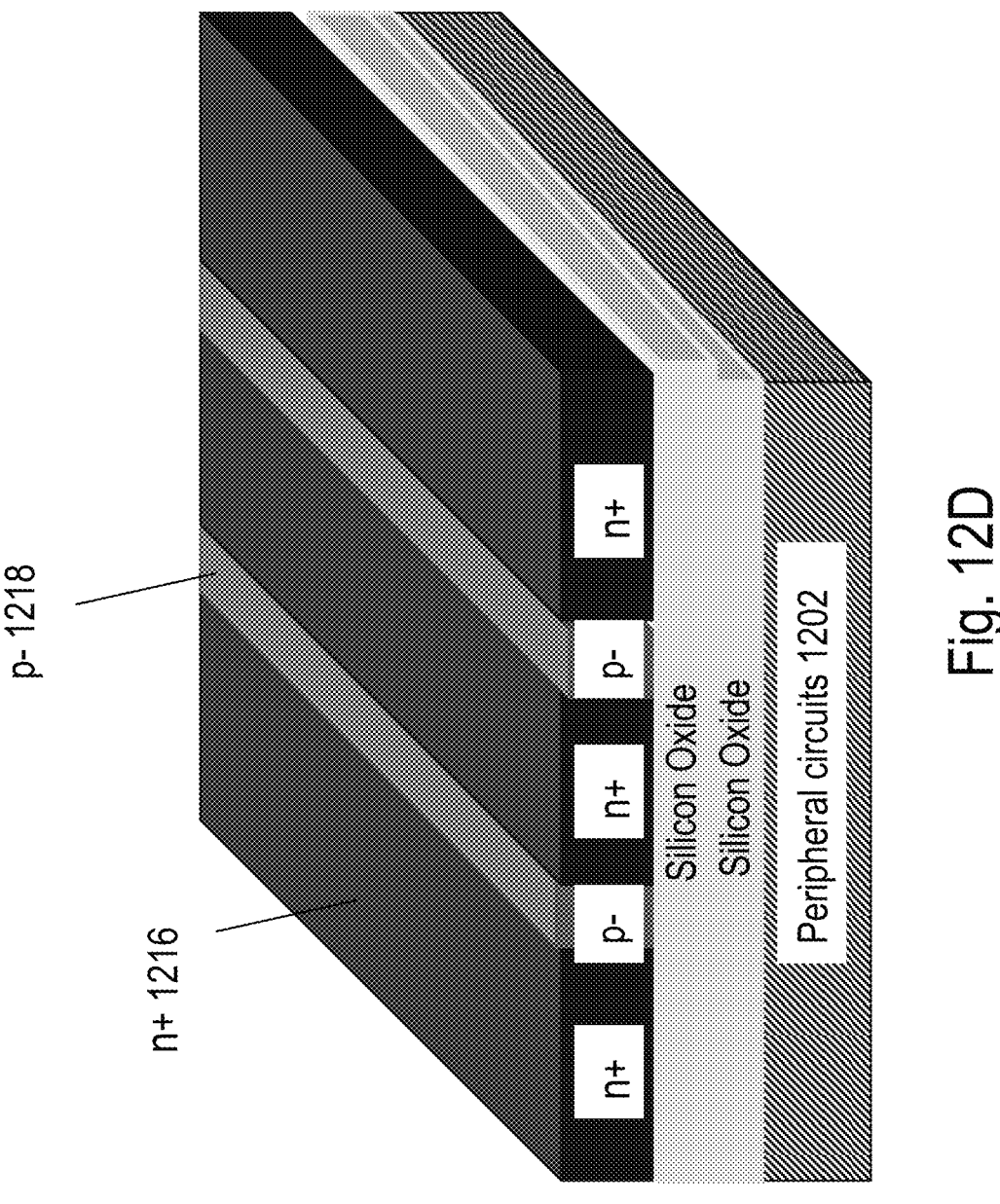

Step (D): FIG. 12D illustrates the structure after Step (D). Using lithography and then implantation, n+ regions 1216 and p– regions 1218 may be formed on the transferred layer of p– Si after Step (C).

Figure 12E:
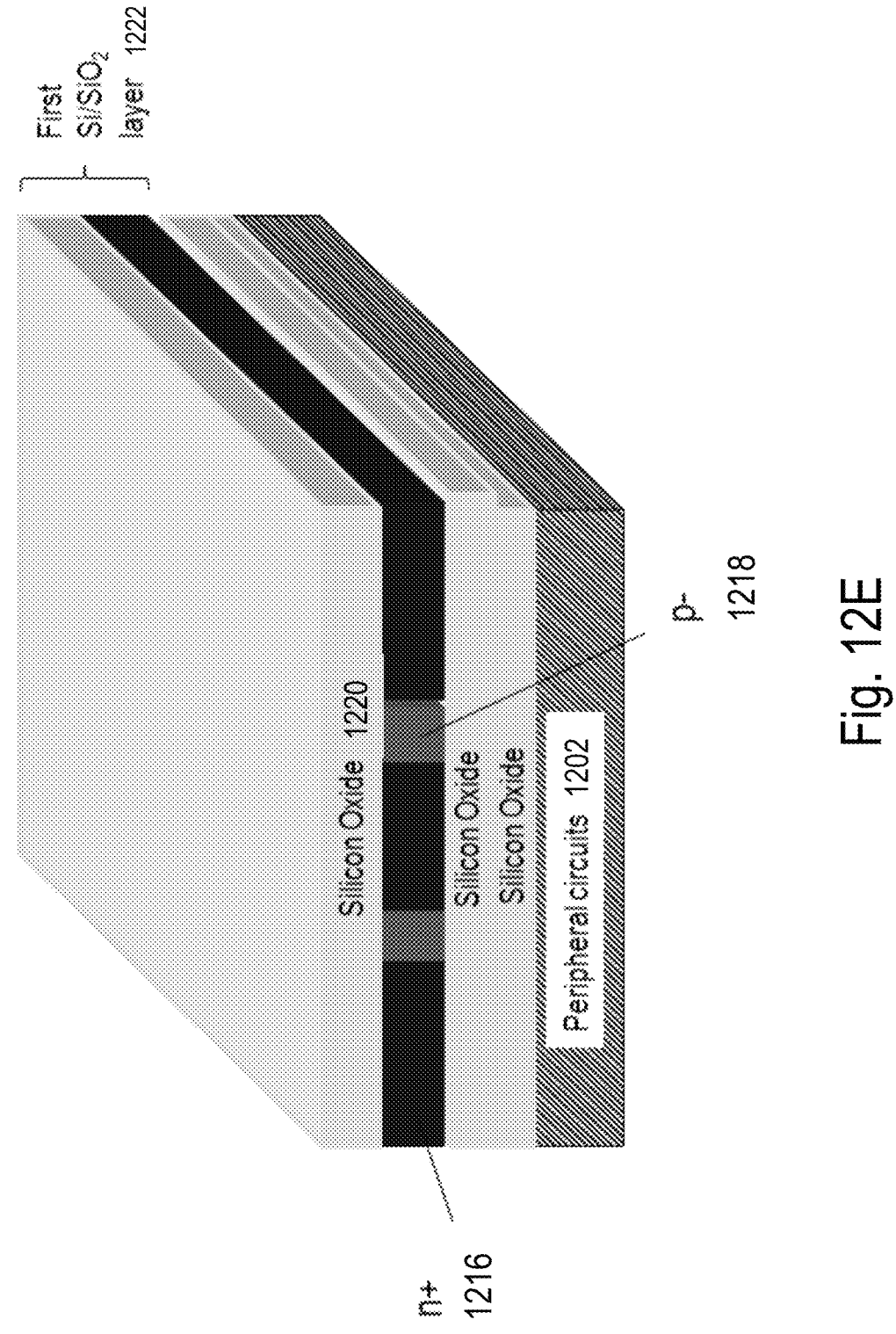

Step (E): FIG. 12E illustrates the structure after Step (E). An oxide layer 1220 may be deposited atop the structure obtained after Step (D). A first layer of Si/SiO$_2$ 1222 may be formed atop the peripheral circuit layer 1202. The composition of the 'SiO$_2$' layer within the stacked Si/SiO$_2$ layers such as Si/SiO$_2$ 1222, may be insulators or dielectrics other than silicon dioxide such as, for example, a low-k dielectric, carbon containing silicon oxides, amorphous carbon. The thickness of the 'SiO$_2$' insulator layer within the stacked Si/SiO$_2$ layers such as Si/SiO$_2$ 1222 may be adjusted to minimize layer to layer, strata to strata disturb mechanisms, and may include thicknesses of 50 nm, 75 nm, 100 nm, 150 nm, 200 nm, 500 nm, and less than 1000 nm. A thin conductive layer, such as a metal, may also be formed between the two bonding oxides to form a field shield to mitigate layer to layer, strata to strata disturb mechanisms, and may be electrically floating or tied to a bias, such as ground or Vdd. The stacked Si/SiO$_2$ layers, such as Si/SiO$_2$ 1222, may alternatively be formed by successive ion implants of oxygen atoms/ions to various depths from the top surface of a mono-crystalline silicon wafer/substrate and then heat treated to form oxide layers thus forming silicon layers in-between the oxide layers, a layered 'SIMOX' process approach.

Figure 12F:
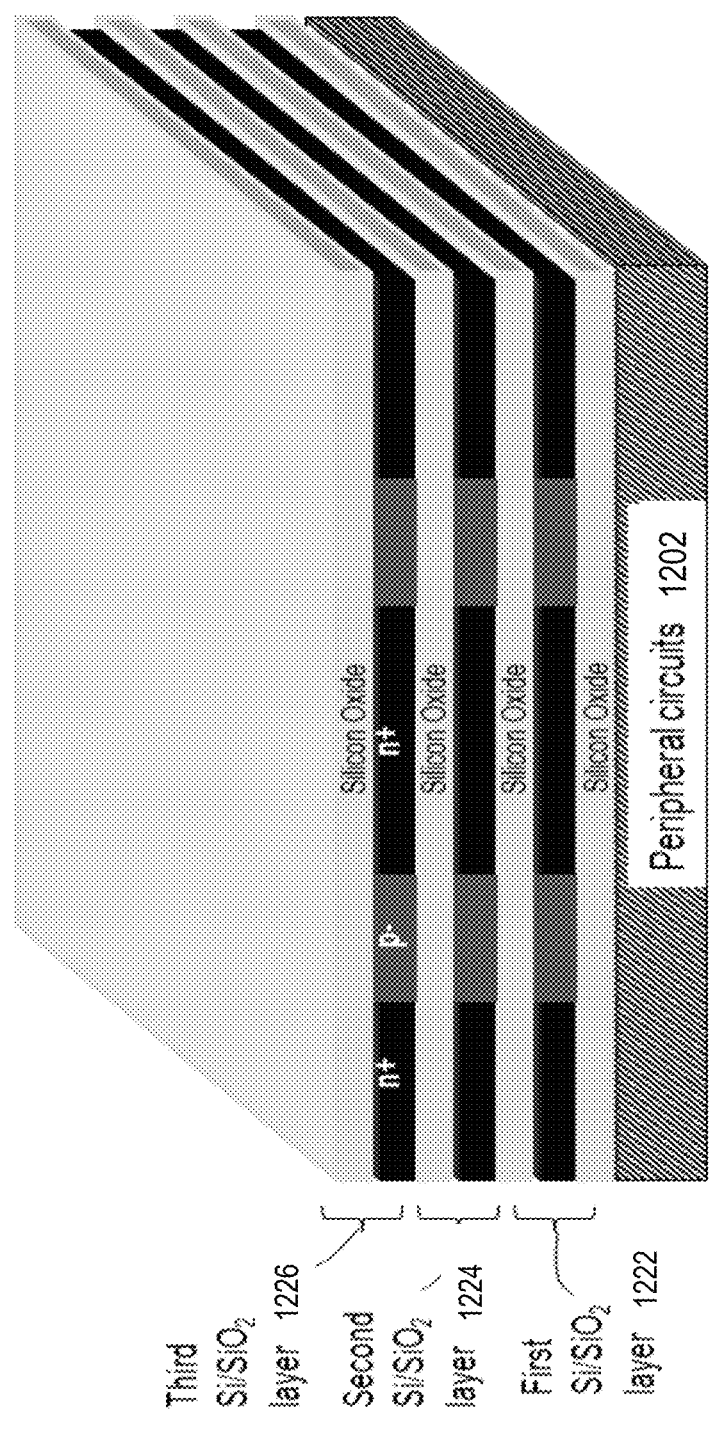

Step (F): FIG. 12F illustrates the structure after Step (F). Using procedures similar to Steps (B)-(E), additional Si/SiO$_2$ layers 1224 and 1226 may be formed atop Si/SiO$_2$ layer 1222. A rapid thermal anneal (RTA) or spike anneal or flash anneal or laser anneal may be done to activate implanted layers 1222, 1224 and 1226 (and possibly also the peripheral circuit layer 1202). Alternatively, the layers 1222, 1224 and 1226 may be annealed layer-by-layer as soon as their implantations are done using a laser anneal system.

Figure 12G:
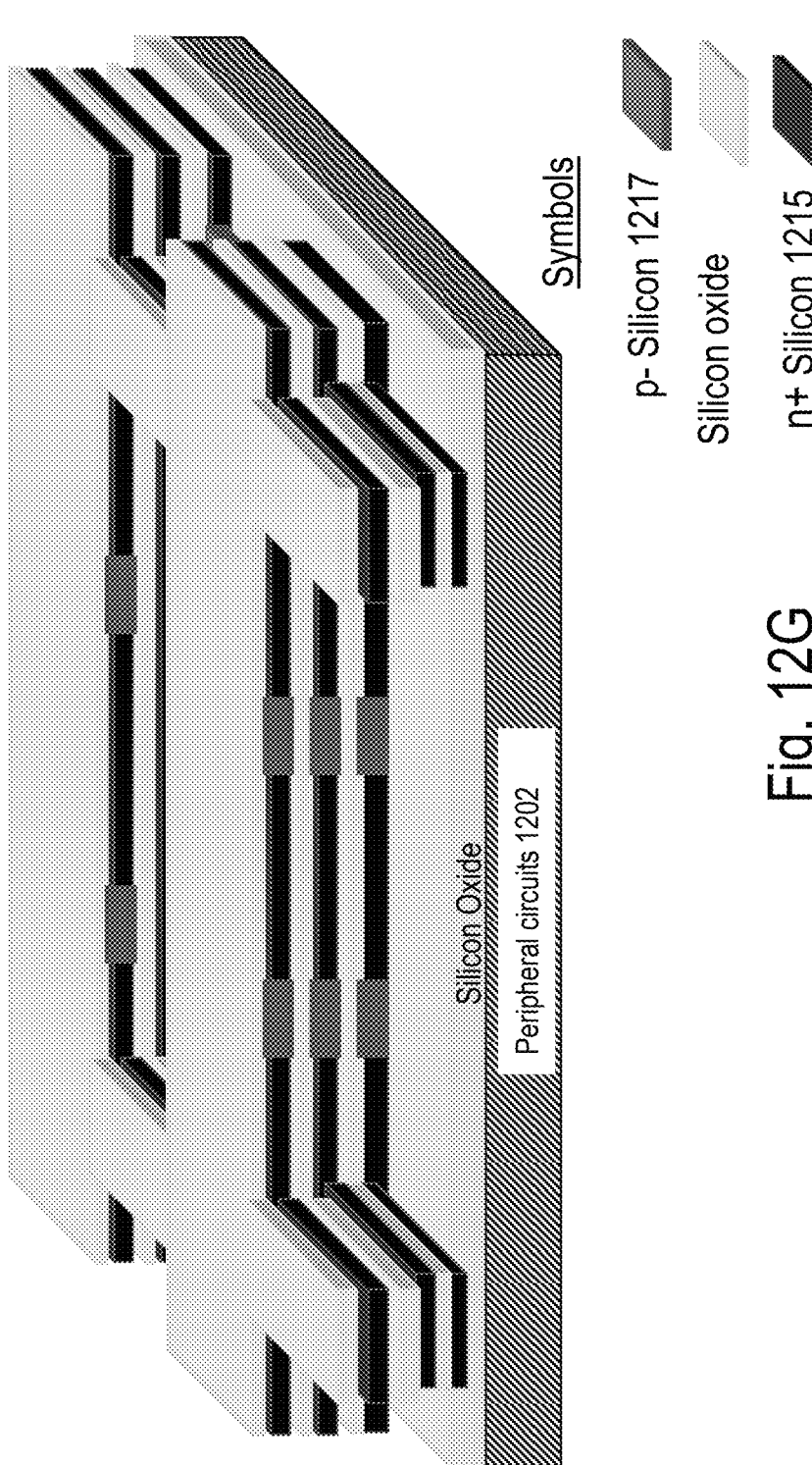

Step (G): FIG. 12G illustrates the structure after Step (G). Lithography and etch processes may be utilized to make a structure as shown in the figure.

Figure 12H:
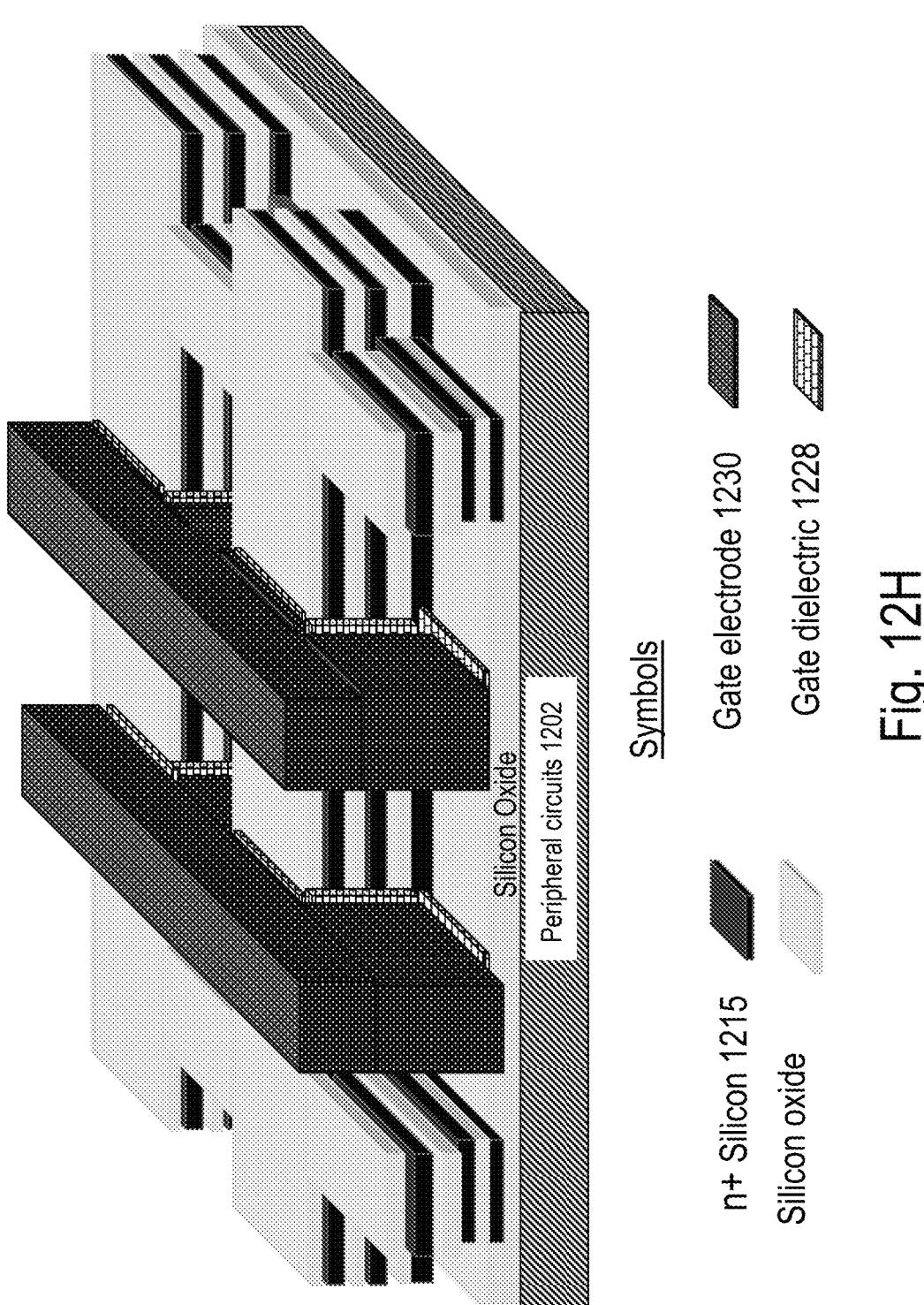

Step (H): FIG. 12H illustrates the structure after Step (H). Gate dielectric 1228 and gate electrode 1230 may be deposited following which a CMP may be done to planarize the gate electrode 1230 regions. Lithography and etch may be utilized to define gate regions over the p– silicon regions (eg, p– Si region 1218 after Step (D)). Note that gate width could be slightly larger than p– region width to compensate for overlay errors in lithography. Gate dielectric 1228 and gate electrode 1230 may be, for example, a HKMG structure or a TEL SPA radical oxidation oxide and an appropriate work function electrode, for example, tungsten, degenerately doped polysilicon or amorphous silicon. Although the width of the p– regions 1217 and n+ regions 1215 near and under the gates are illustrated as being larger than the thickness, one skilled in the art would recognize that the reverse (i.e., thickness larger than width) could be formed to provide increased gate control of the transistor channel.

Figure 12I:
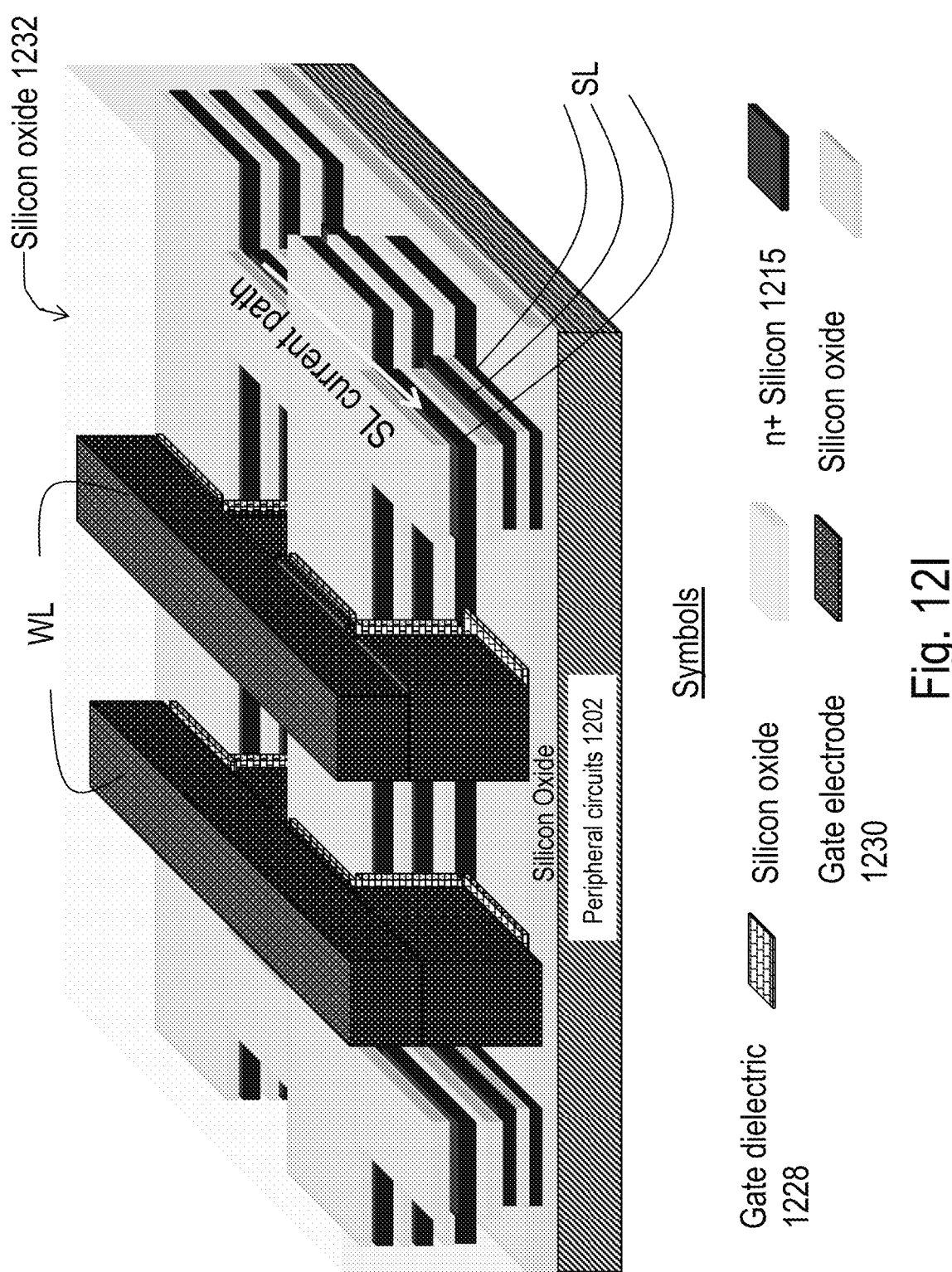

Step (I): FIG. 12I illustrates the structure after Step (I). A silicon oxide layer 1232 may be deposited and planarized. It is shown transparent in the figure for clarity. Word-line (WL) and Source-line (SL) regions are shown in the figure.

Figure 12J:
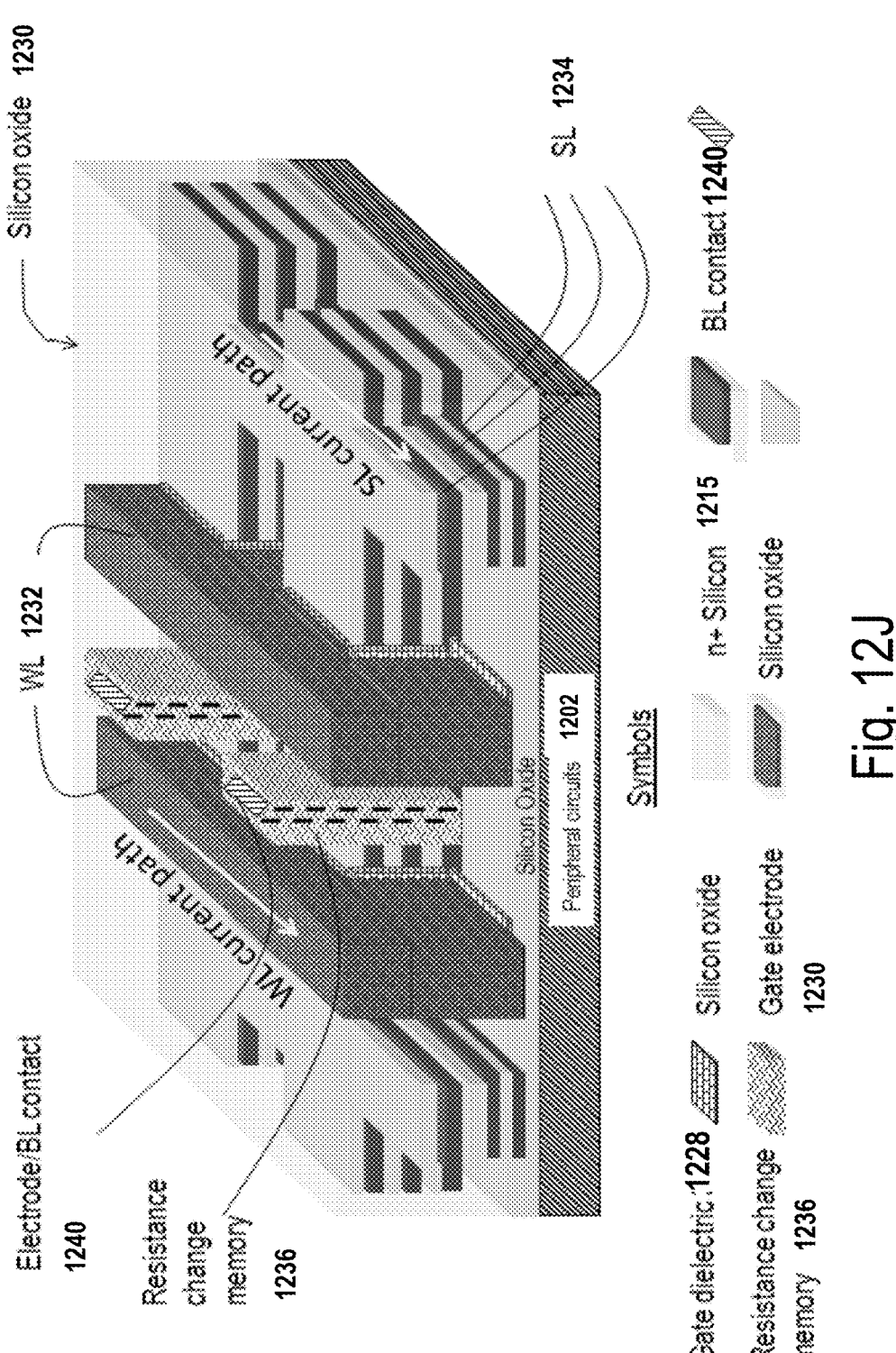

Step (J): FIG. 12J illustrates the structure after Step (J). Vias may be etched through multiple layers of silicon and silicon dioxide as shown in the figure. A resistance change memory material 1236 may be deposited (preferably with atomic layer deposition (ALD)). Examples of such a material include hafnium oxide, which is well known to change resistance by applying voltage. An electrode for the resistance change memory element may be deposited (preferably using ALD) and is shown as electrode/BL contact 1240. A CMP process may be conducted to planarize the surface. It can be observed that multiple resistance change memory elements in series with transistors are created after this step.

Figure 12K:
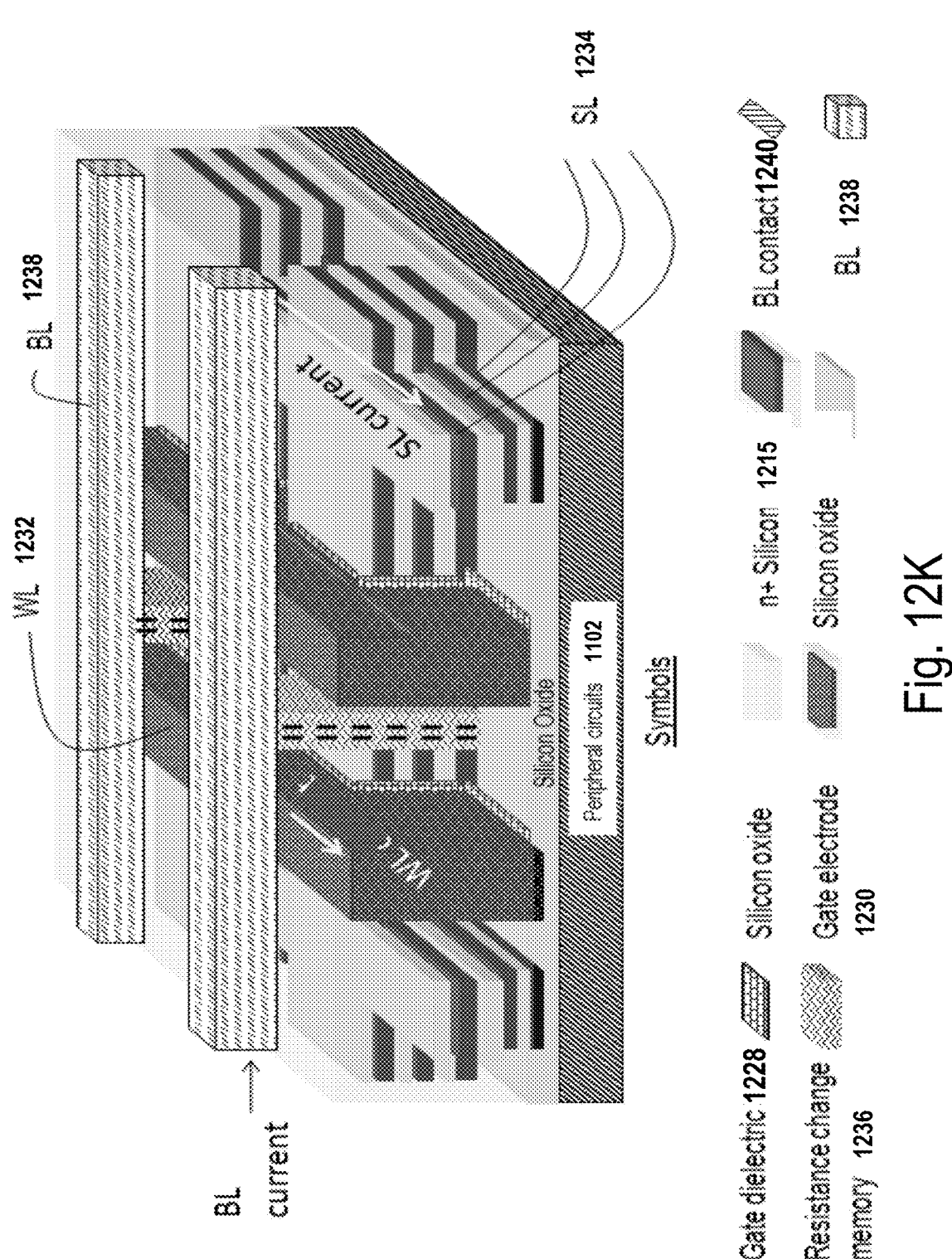

Step (K): FIG. 12K illustrates the structure after Step (K). BLs 1236 may be constructed. Contacts may be made to BLs 1238, WLs 1232 and SLs 1234 of the memory array at its edges. SL contacts can be made into stair-like structures using techniques described in "Bit Cost Scalable Technology with Punch and Plug Process for Ultra High Density Flash Memory," *VLSI Technology,* 2007 *IEEE Symposium on,* vol., no., pp. 14-15, 12-14 Jun. 2007 by Tanaka, H.; Kido, M.; Yahashi, K.; Oomura, M.; et al., following which contacts can be constructed to them. Formation of stair-like structures for SLs could be achieved in steps prior to Step (J) as well.

FIG. 12L shows cross-sectional views of the array for clarity.

A 3D resistance change memory has thus been constructed, with (1) horizontally-oriented transistors—i.e. current flowing in substantially the horizontal direction in transistor channels, (2) some of the memory cell control lines, e.g., source-lines SL, constructed of heavily doped silicon and embedded in the memory cell layer, (3) side gates simultaneously deposited over multiple memory layers for transistors, and (4) monocrystalline (or single-crystal) silicon layers obtained by layer transfer techniques such as ion-cut.

FIG. 13A-F describes an alternative process flow to construct a horizontally-oriented monolithic 3D resistive memory array. This embodiment has a resistance-based memory element in series with a transistor selector. Two masks are utilized on a "per-memory-layer" basis for the monolithic 3D resistance change memory (or resistive memory) concept shown in FIG. 13A-F, and all other masks may be shared between different layers. The process flow may include several steps as described in the following sequence.

Figures 13A, 13B, 13C, 13D:
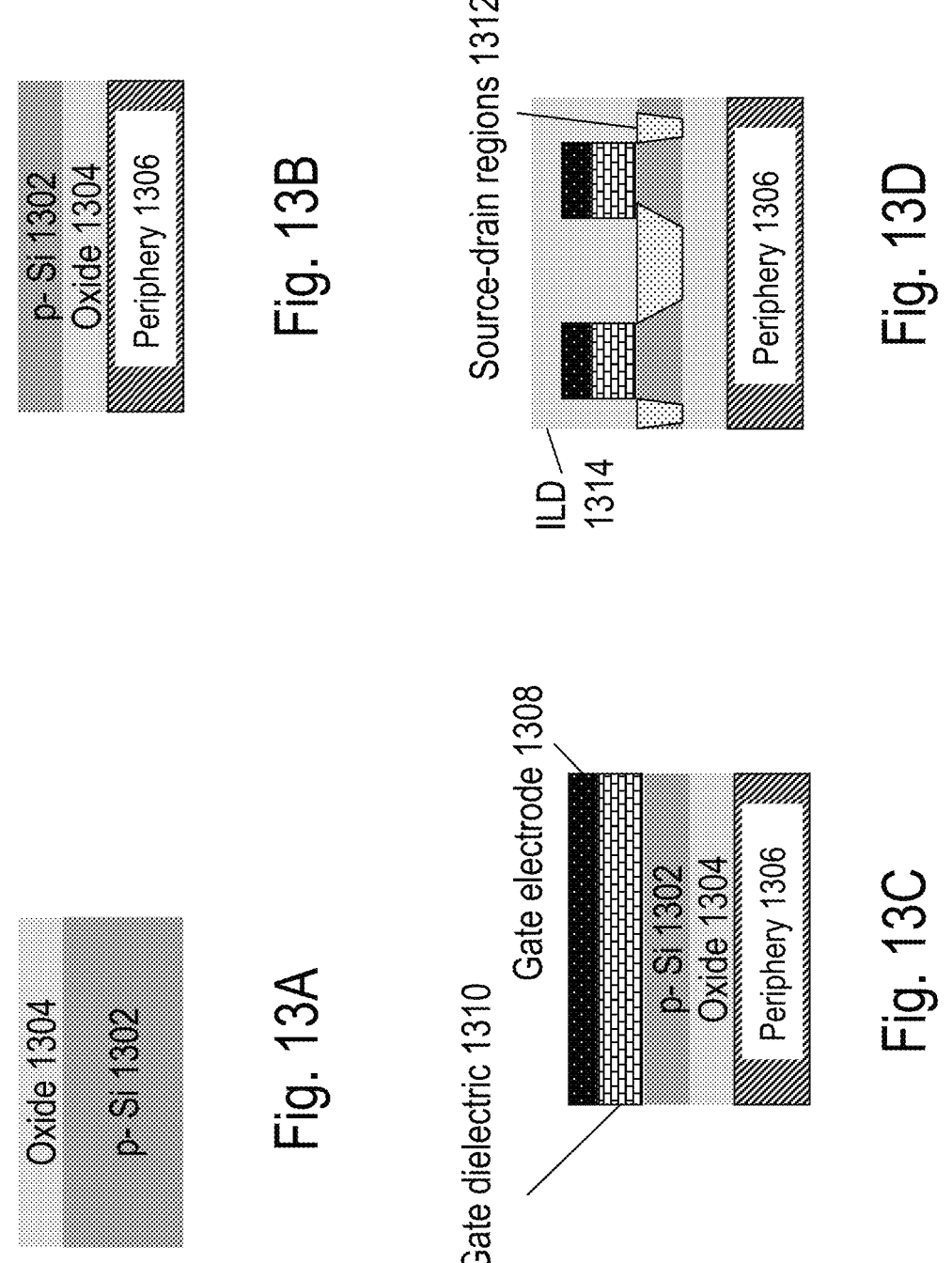
FIGS. 13A-13F are drawing illustrations of a two-mask per layer 3D resistive memory.

Step (A): The process flow may start with a p– silicon wafer 1302 with an oxide coating 1304. FIG. 13A illustrates the structure after Step (A).

Step (B): FIG. 13B illustrates the structure after Step (B). Using a process flow similar to FIG. 12B, a portion of the p– silicon layer 1302 may be transferred atop a layer of peripheral circuits 1306. The peripheral circuits 1306 preferably use tungsten wiring.

Step (C): FIG. 13C illustrates the structure after Step (C). Isolation regions for transistors may be formed using a shallow-trench-isolation (STI) process. Following this, a gate dielectric 1310 and a gate electrode 1308 may be deposited. Gate dielectric 1310 and gate electrode 1308 may be, for example, a HKMG structure or a TEL SPA radical oxidation oxide and an appropriate work function electrode, for example, tungsten, degenerately doped polysilicon or amorphous silicon.

Step (D): FIG. 13D illustrates the structure after Step (D). The gate may be patterned, and source-drain regions 1312 may be formed by implantation. An inter-layer dielectric (ILD) 1314 may be also formed.

Figure 13F:
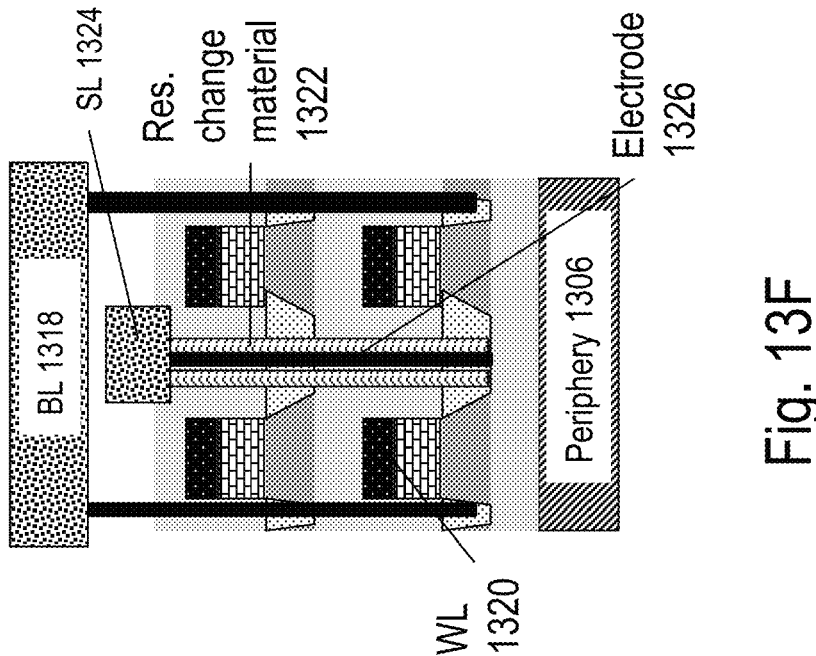
Figure 13E:
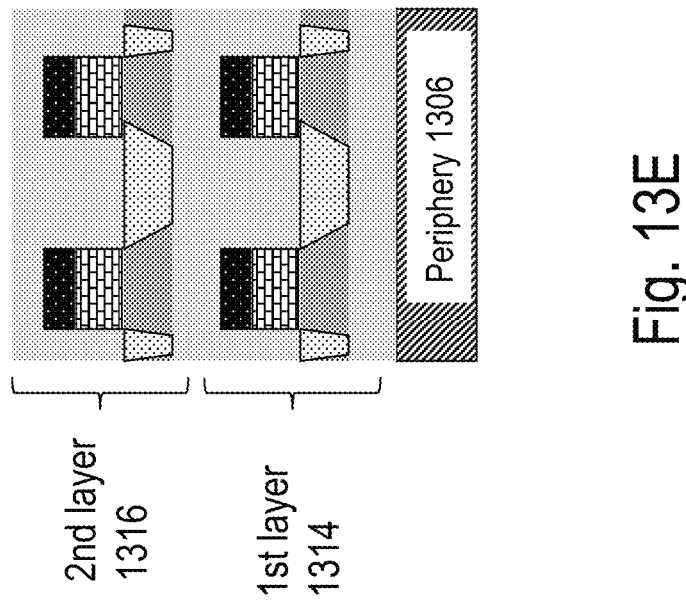

Step (E): FIG. 13E illustrates the structure after Step (E). Using steps similar to Step (A) to Step (D), a second layer of transistors 1316 may be formed above the first layer of transistors 1314. An RTA or some other type of anneal, such as the optical anneals described herein, may be performed to activate dopants in the memory layers (and potentially also the peripheral transistors).

Step (F): FIG. 13F illustrates the structure after Step (F). Vias may be etched through multiple layers of silicon and silicon dioxide as shown in the figure. A resistance change memory material 1322 may be deposited (preferably with atomic layer deposition (ALD)). Examples of such a material include hafnium oxide, which is well known to change resistance by applying voltage. An electrode for the resistance change memory element may be deposited (preferably using ALD) and is shown as electrode 1326. A CMP process may be conducted to planarize the surface. Contacts are made to drain terminals of transistors in different memory layer as well. Note that gates of transistors in each memory layer may be connected together perpendicular to the plane of the figure to form word-lines (WL 1320). Wiring for bit-lines (BL 1318) and source-lines (SL 1324) may be constructed. Contacts may be made between BLs, WLs and SLs with the periphery at edges of the memory array. Multiple resistance change memory elements in series with transistors may be created after this step.

A 3D resistance change memory has thus been constructed, with (1) horizontally-oriented transistors—i.e. current flowing in substantially the horizontal direction in the transistor channels, and (2) monocrystalline (or single-crystal) silicon layers obtained by layer transfer techniques such as ion-cut.

While explanations have been given for formation of monolithic 3D resistive memories with ion-cut in this section, it is clear to one skilled in the art that alternative implementations are possible. BL and SL nomenclature has been used for two terminals of the 3D resistive memory array, and this nomenclature can be interchanged. Moreover, selective epi technology or laser recrystallization technology could be utilized for implementing structures shown in FIG. 10A-J, FIG. 11A-K, FIG. 12A-L and FIG. 13A-F. Various other types of layer transfer schemes that have been described herein and in incorporated patent references can be utilized for construction of various 3D resistive memory structures. One could also use buried wiring, i.e. where wiring for memory arrays is below the memory layers but above the periphery. Other variations of the monolithic 3D resistive memory concepts are possible.

Section 3: Monolithic 3D Charge-Trap Memory

While resistive memories described previously form a class of non-volatile memory, others classes of non-volatile memory exist. NAND flash memory forms one of the most common non-volatile memory types. It can be constructed of two main types of devices: floating-gate devices where charge is stored in a floating gate and charge-trap devices where charge is stored in a charge-trap layer such as Silicon Nitride. Background information on charge-trap memory can be found in "*Integrated Interconnect Technologies for 3D Nanoelectronic Systems*", Artech House, 2009 by Bakir and Meindl ("Bakir") and "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al. The architectures shown in FIG. 14A-F, FIG. 15A-G and FIG. 16A-D are relevant for any type of charge-trap memory.

FIG. 14A-F describes a process flow to construct a horizontally-oriented monolithic 3D charge trap memory. Two masks are utilized on a "per-memory-layer" basis for the monolithic 3D charge trap memory concept shown in FIG. 14A-F, while other masks may be shared between all constructed memory layers. The process flow may include several steps, which may occur in the following sequence.

Figures 14A, 14B, 14C, 14D:
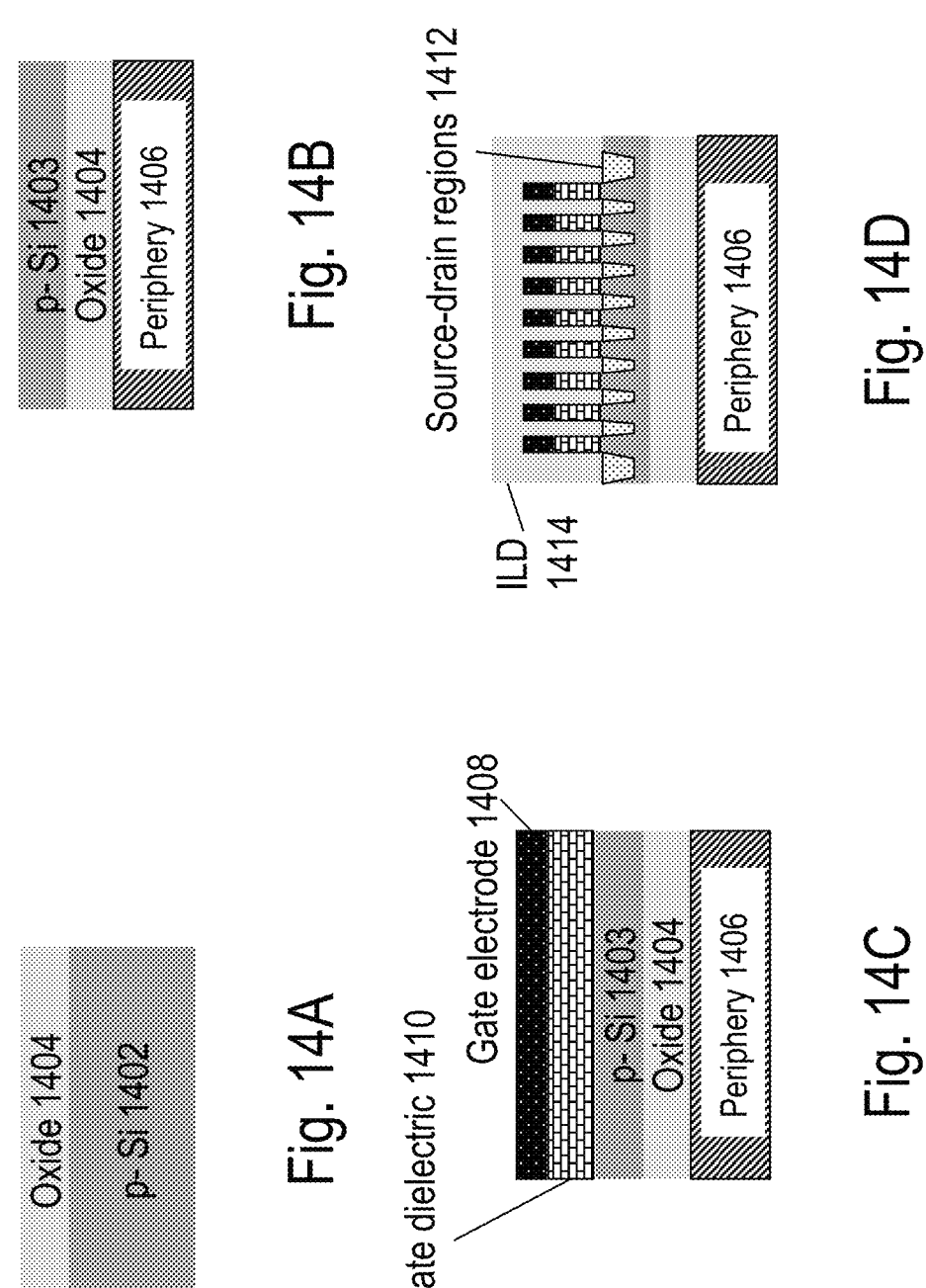
FIGS. 14A-14F are drawing illustrations of a two-mask per layer 3D charge-trap memory.

Step (A): A p– Silicon wafer 1402 may be taken and an oxide layer 1404 may be grown or deposited above it. FIG. 14A illustrates the structure after Step (A).

Step (B): FIG. 14B illustrates the structure after Step (B). Using a procedure similar to the one shown in FIG. 12B, a portion of the p– Si wafer 1402, such as p– silicon layer 1403, may be transferred atop a peripheral circuit layer 1406. The periphery may be designed such that it can withstand the RTA or optical anneals for activating dopants in the memory layers formed atop it.

Step (C): FIG. 14C illustrates the structure after Step (C). Isolation regions may be formed in the p– Si layer 1403 atop the peripheral circuit layer 1406. This lithography step and all future lithography steps may be formed with good alignment to features on the peripheral circuit layer 1406 since the p– silicon layer 1403 is thin and reasonably transparent to the lithography tool. A dielectric layer 1410 (eg. Oxide-nitride-oxide ONO layer) may be deposited following which a gate electrode layer 1408 (eg, polysilicon) may be deposited.

Step (D): FIG. 14D illustrates the structure after Step (D). The gate regions deposited in Step (C) may be patterned and etched. Following this, source-drain regions 1412 may be implanted. An inter-layer dielectric 1414 may be deposited and planarized.

Figure 14F:
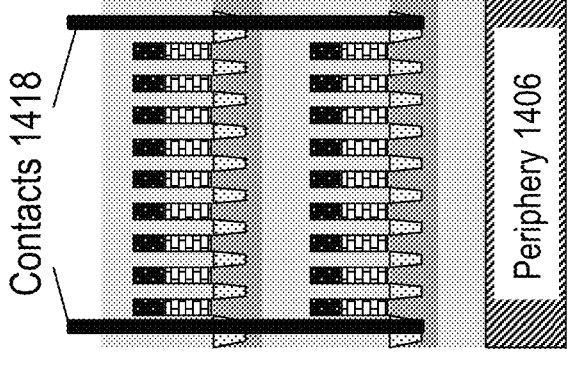
Figure 14E:
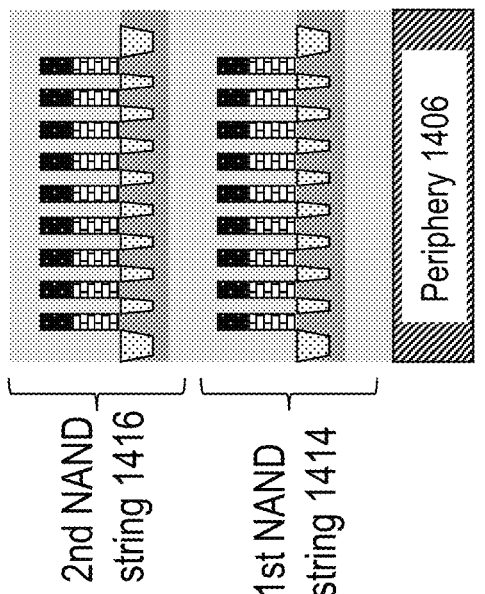

Step (E): FIG. 14E illustrates the structure after Step (E). Using procedures similar to Step (A) to Step (D), another layer of memory, such as a second NAND string 1416, may be formed atop the first NAND string 1414.

Step (F): FIG. 14F illustrates the structure after Step (F). Contacts 1418 may be made to connect bit-lines (BL) and source-lines (SL) to the NAND string. Contacts to the well of the NAND string may be made. All these contacts could be constructed of heavily doped polysilicon or some other material. An anneal to activate dopants in source-drain regions of transistors in the NAND string (and potentially also the periphery) may be conducted. Following this, construction of wiring layers for the memory array may be conducted.

A 3D charge-trap memory has thus been constructed, with (1) horizontally-oriented transistors—i.e. current flowing in substantially the horizontal direction in transistor channels, and (2) monocrystalline (or single-crystal) silicon layers obtained by layer transfer techniques such as ion-cut. This use of monocrystalline silicon (or single crystal silicon) using ion-cut can be a key differentiator for some embodiments of the current invention vis-à-vis prior work.

FIG. 15A-G describes a memory architecture for single-crystal 3D charge-trap memories, and a procedure for its construction. It utilizes junction-less transistors. No mask is utilized on a "per-memory-layer" basis for the monolithic 3D charge-trap memory concept shown in FIG. 15A-G, and all other masks are shared between different layers. The process flow may include several steps as described in the following sequence.

Figure 15A:
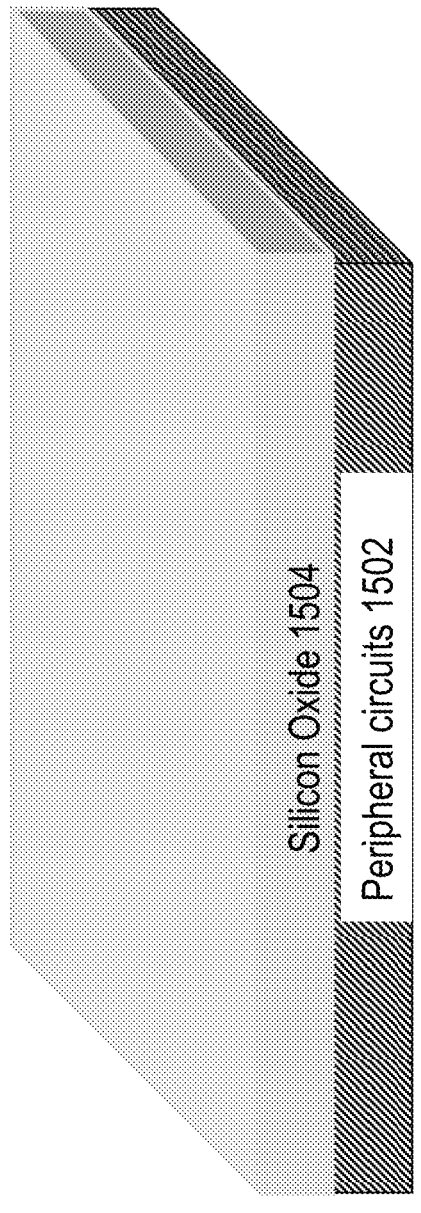
FIGS. 15A-15G are drawing illustrations of a zero-mask per layer 3D charge-trap memory.

Step (A): Peripheral circuits 1502 may be constructed and above this a layer of silicon dioxide 1504 may be deposited. FIG. 15A shows a drawing illustration after Step (A).

Figure 15B:
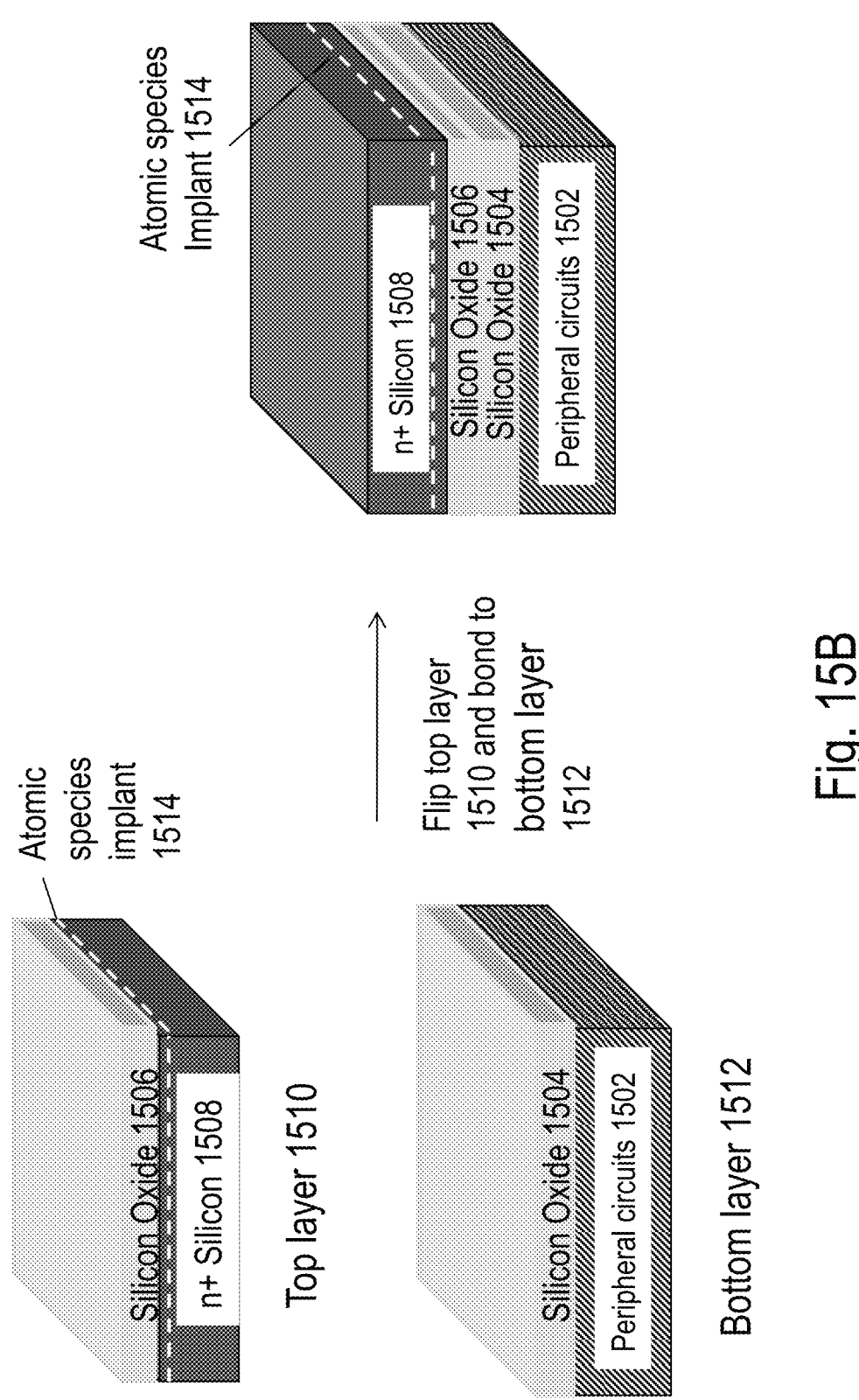

Step (B): FIG. 15B illustrates the structure after Step (B). A wafer of n+ Silicon 1508 may have an oxide layer 1506 grown or deposited above it. Following this, hydrogen may be implanted into the n+ Silicon wafer at a certain depth indicated by 1514. Alternatively, some other atomic species such as Helium could be implanted. This hydrogen implanted n+ Silicon wafer 1508 may form the top layer 1510. The bottom layer 1512 may include the peripheral circuits 1502 with oxide layer 1504. The top layer 1510 may be flipped and bonded to the bottom layer 1512 using oxide-to-oxide bonding.

Figure 15C:
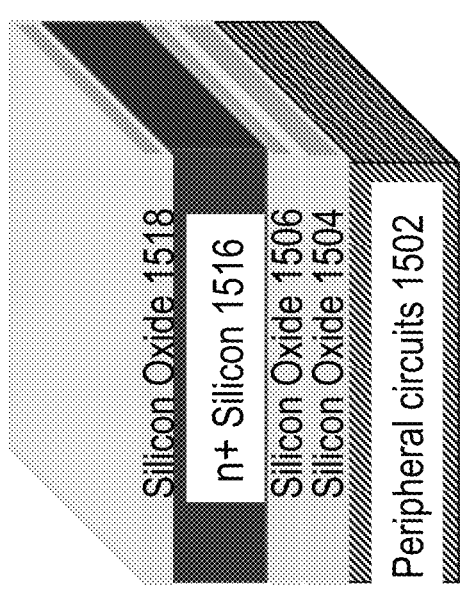

Step (C): FIG. 15C illustrates the structure after Step (C). The stack of top and bottom wafers after Step (B) may be cleaved at the hydrogen plane 1514 using either a anneal or a sideways mechanical force or other means. A CMP process may be conducted. A layer of silicon oxide 1518 may be deposited atop the n+ Silicon layer 1516. At the end of this step, a single-crystal n+ Si layer 1516 exists atop the peripheral circuits, and this has been achieved using layer-transfer techniques.

Figure 15D:
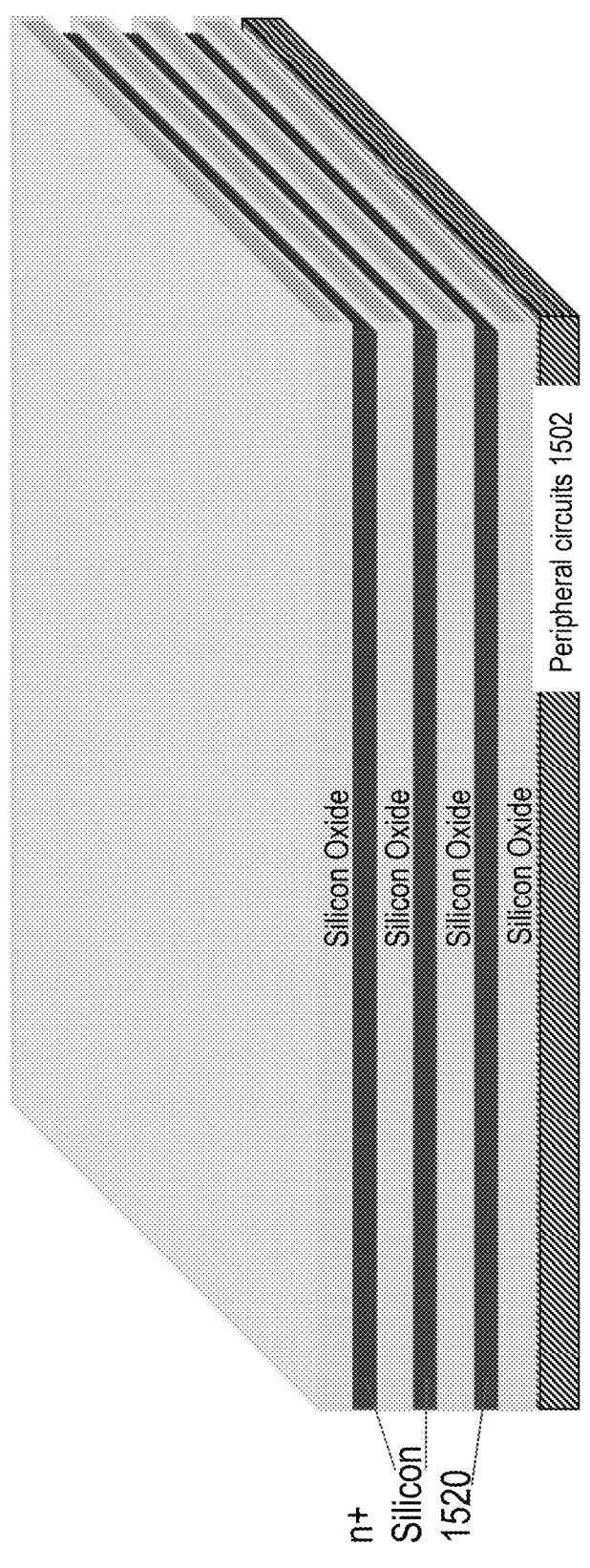

Step (D): FIG. 15D illustrates the structure after Step (D). Using methods similar to Step (B) and (C), multiple n+ silicon layers 1520 may be formed with silicon oxide layers in between. The composition of the 'SiO$_2$' layer within the stacked Si/SiO$_2$ layers may be insulators or dielectrics other than silicon dioxide such as, for example, a low-k dielectric, carbon containing silicon oxides, amorphous carbon. The thickness of the 'SiO$_2$' insulator layer within the stacked Si/SiO$_2$ layers may be adjusted to minimize layer to layer, strata to strata disturb mechanisms, and may include thicknesses of 50 nm, 75 nm, 100 nm, 150 nm, 200 nm, 500 nm, and less than 1000 nm. A thin conductive layer, such as a metal, may also be formed between the two bonding oxides to form a field shield to mitigate layer to layer, strata to strata disturb mechanisms, and may be electrically floating or tied to a bias, such as ground or Vdd. The stacked Si/SiO$_2$ layers may alternatively be formed by successive ion implants of oxygen atoms/ions to various depths from the top surface of a mono-crystalline silicon wafer/substrate and then heat treated to form oxide layers thus forming silicon layers in-between the oxide layers, a layered 'SIMOX' process approach.

Figure 15E:
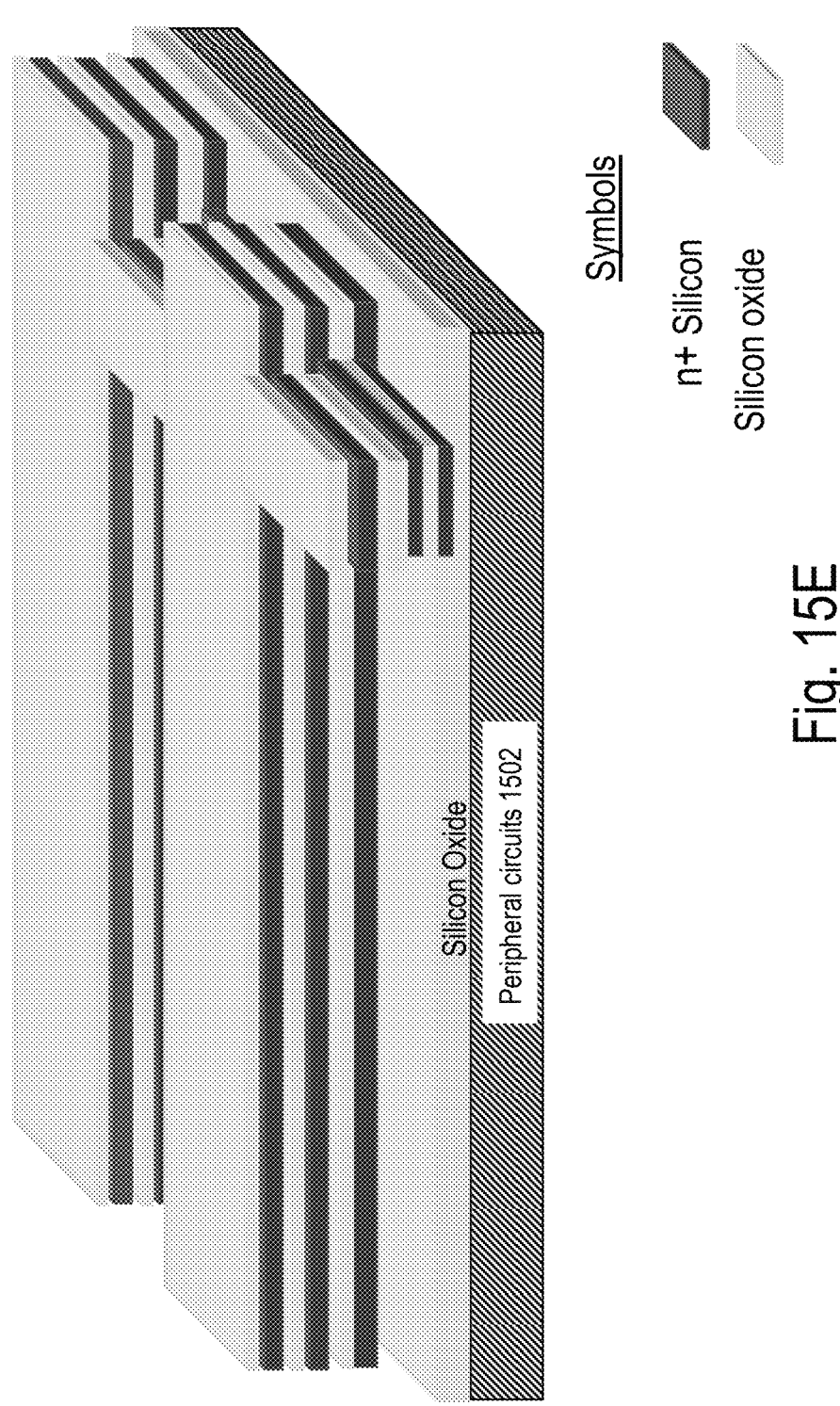

Step (E): FIG. 15E illustrates the structure after Step (E). Lithography and etch processes may be utilized to make a structure as shown in the figure.

Figure 15F:
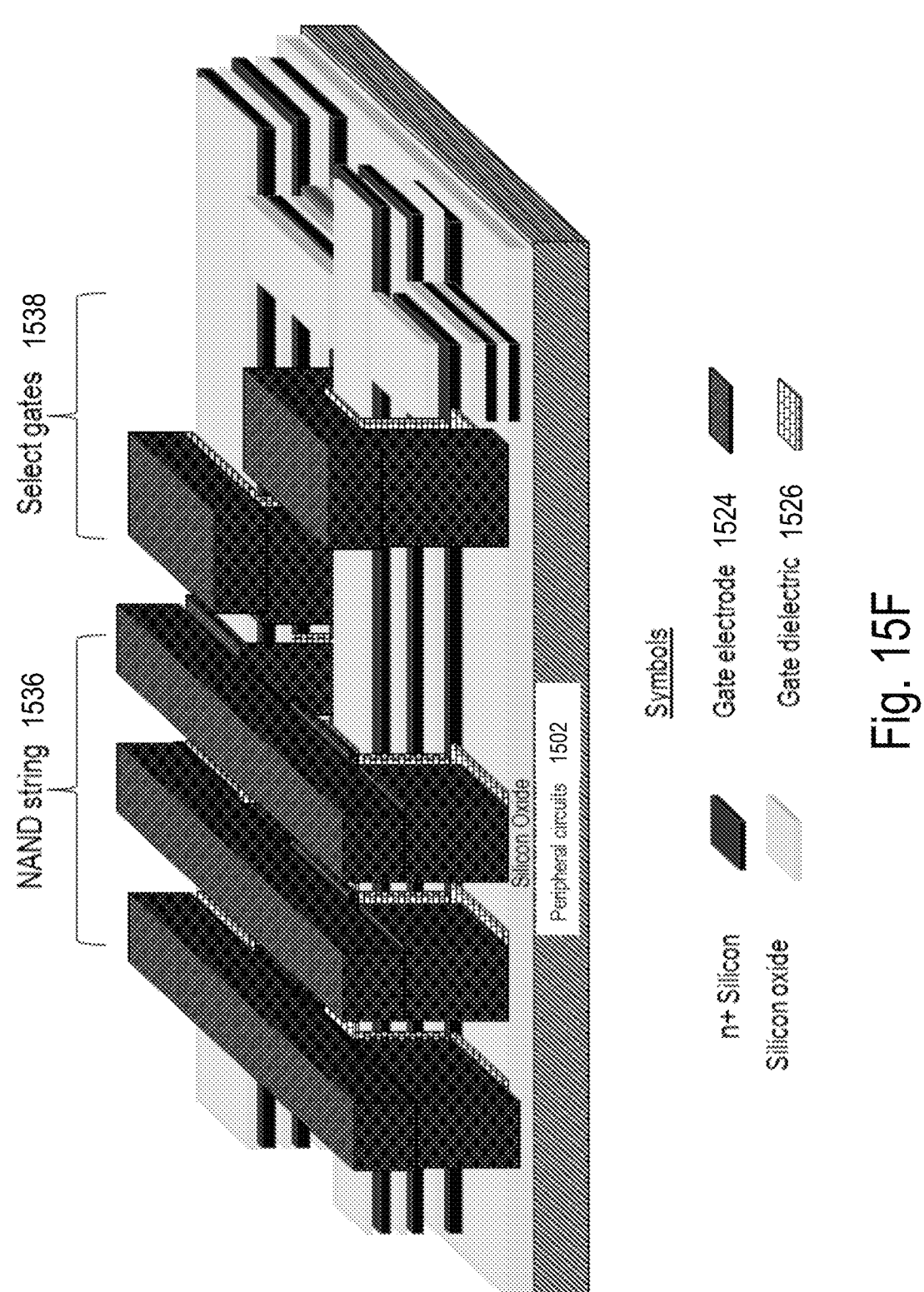

Step (F): FIG. 15F illustrates the structure after Step (F). Gate dielectric 1526 and gate electrode 1524 may be deposited following which a CMP may be done to planarize the gate electrode 1524 regions. Lithography and etch may be utilized to define gate regions. Gates of the NAND string 1536 as well as gates of select gates of the NAND string 1538 may be defined. Gate dielectric 1526 and gate electrode 1524 may be, for example, a HKMG structure or a TEL SPA radical oxidation oxide and an appropriate work function electrode, for example, tungsten, degenerately doped polysilicon or amorphous silicon. Although the width of the n+ regions near and under the gates are illustrated as being larger than the thickness, one skilled in the art would recognize that the reverse (i.e., thickness larger than width) could be formed to provide increased gate control of the transistor channel.

Figure 15G:
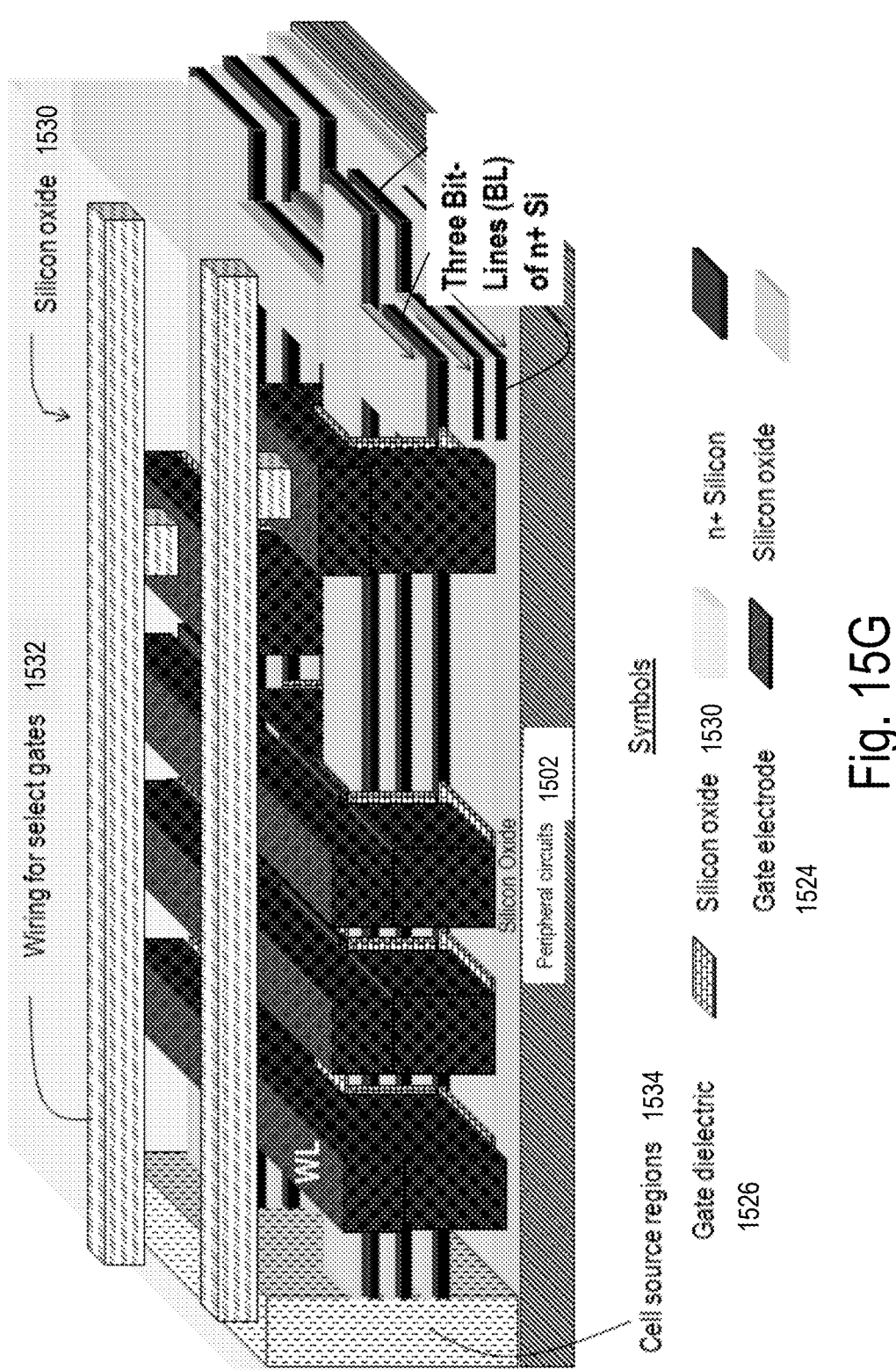

Step (G): FIG. 15G illustrates the structure after Step (G). A silicon oxide layer 1530 may be deposited and planarized. It is shown transparent in the figure for clarity. Word-lines, bit-lines and source-lines may be defined as shown in the figure, including wiring for the select gates 1532 and cell source regions 1534 for connection to the cell sources. Contacts may be formed to various regions/wires at the edges of the array as well. SL contacts can be made into stair-like structures using techniques described in "Bit Cost Scalable Technology with Punch and Plug Process for Ultra High Density Flash Memory," *VLSI Technology*, 2007 *IEEE Symposium on*, vol., no., pp. 14-15, 12-14 Jun. 2007 by Tanaka, H.; Kido, M.; Yahashi, K.; Oomura, M.; et al., following which contacts can be constructed to them. Formation of stair-like structures for SLs could be performed in steps prior to Step (G) as well.

A 3D charge-trap memory has thus been constructed, with (1) horizontally-oriented transistors—i.e. current flowing in substantially the horizontal direction in transistor channels, (2) some of the memory cell control lines—e.g., bit lines BL, constructed of heavily doped silicon and embedded in the memory cell layer, (3) side gates simultaneously deposited over multiple memory layers for transistors, and (4) monocrystalline (or single-crystal) silicon layers obtained by layer transfer techniques such as ion-cut. This use of single-crystal silicon obtained with ion-cut is a key differentiator from past work on 3D charge-trap memories such as "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al. that used polysilicon.

Figures 16A, 16B, 16C:
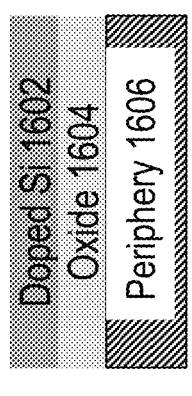

While FIG. 14A-F and FIG. 15A-G give two examples of how single-crystal silicon layers with ion-cut can be used to produce 3D charge-trap memories, the ion-cut technique for 3D charge-trap memory is fairly general. It could be utilized to produce any horizontally-oriented 3D monocrystalline-silicon charge-trap memory. FIG. 16A-D further illustrate how general the process can be. One or more doped silicon layers 1602 can be layer transferred atop any peripheral circuit layer 1606 using procedures shown in FIG. 12B, including insulator layers such as oxide 1604. These are indicated in FIG. 16A, FIG. 16B and FIG. 16C. Following this, different procedures can be utilized to form different types of 3D charge-trap memories. For example, procedures shown in "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al, and "Multi-layered Vertical Gate NAND Flash overcoming stacking limit for terabit density storage", Symposium on VLSI Technology, 2009 by W. Kim, S. Choi, et al. can be used to produce the two different types of horizontally oriented single crystal silicon 3D charge trap memory shown in FIG. 16D.

Section 4: Monolithic 3D Floating-Gate Memory

While charge-trap memory forms one type of non-volatile memory, floating-gate memory is another type. Background information on floating-gate NAND flash memory can be found in Bez, R. et al. "Introduction to Flash memory." Proc. IEEE 91, 489-502 (2003). There are different types of floating-gate memory based on different materials and device structures. The architectures shown in FIG. 17A-F and FIG. 18A-H are relevant for any type of floating-gate memory.

FIG. 17A-F describe a process flow to construct a horizontally-oriented monolithic 3D floating-gate memory. Two masks are utilized on a "per-memory-layer" basis for the monolithic 3D floating-gate memory concept shown in FIG. 17A-F, while other masks may be shared between all constructed memory layers. The process flow may include several steps as described in the following sequence.

Step (A): A p− Silicon wafer 1702 may be taken and an oxide layer 1704 may be grown or deposited above it. FIG. 17A illustrates the structure after Step (A).

Step (B): FIG. 17B illustrates the structure after Step (B). Using a procedure similar to the one shown in FIG. 12B, a portion of the p− Si wafer 1702, such as p− silicon layer 1703, may be transferred atop a peripheral circuit layer 1706. The periphery may be designed such that it can withstand the RTA or optical annealing techniques for activating dopants in memory layers formed atop it.

Step (C): FIG. 17C illustrates the structure after Step (C). After deposition of the tunnel oxide 1710 and floating gate 1708, isolation regions may be formed in the p− silicon layer 1703 atop the peripheral circuit layer 1706. This lithography step and all future lithography steps may be formed with good alignment to features on the peripheral circuit layer 1706 since the p− silicon layer 1703 is thin and reasonably transparent to the lithography tool.

Step (D): FIG. 17D illustrates the structure after Step (D). An inter-poly-dielectric (IPD) layer (eg. Oxide-nitride-oxide ONO layer) may be deposited following which a control gate electrode 1720 (eg, polysilicon) may be deposited. The gate regions deposited in Step (C) may be patterned and etched. Following this, source-drain regions 1712 may be implanted. An inter-layer dielectric 1714 may be deposited and planarized.

Figure 17F:
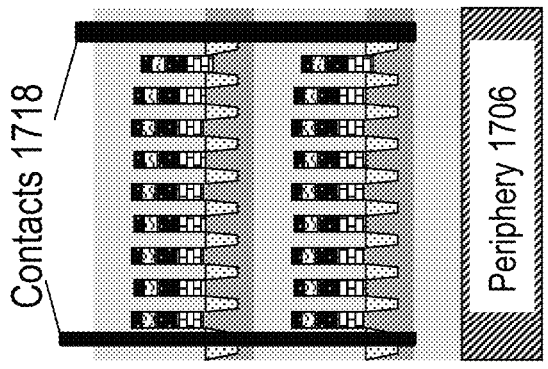
Figure 17E:
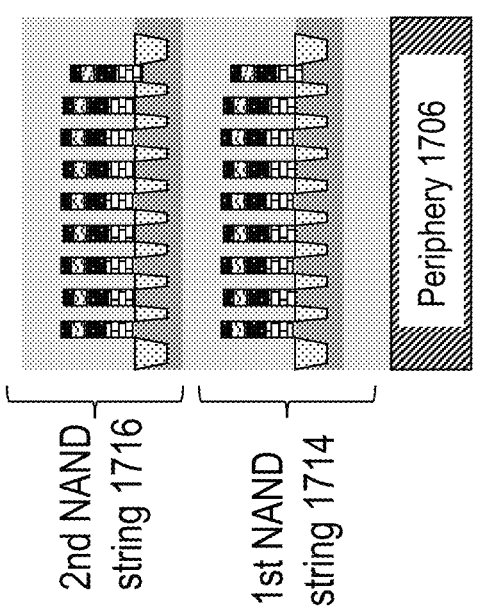

Step (E): FIG. 17E illustrates the structure after Step (E). Using procedures similar to Step (A) to Step (D), another layer of memory, a second NAND string 1716, may be formed atop the first NAND string 1714.

Step (F): FIG. 17F illustrates the structure after Step (F). Contacts 1718 may be made to connect bit-lines (BL) and source-lines (SL) to the NAND string. Contacts to the well of the NAND string may be made. All these contacts could be constructed of heavily doped poly-silicon or some other material. An anneal to activate dopants in source-drain regions of transistors in the NAND string (and potentially also the periphery) may be conducted. Following this, wiring layers for the memory array may be constructed.

A 3D floating-gate memory has thus been constructed, with (1) horizontally-oriented transistors—i.e. current flow in substantially the horizontal direction in transistor channels, (2) monocrystalline (or single-crystal) silicon layers obtained by layer transfer techniques such as ion-cut. This use of monocrystalline silicon (or single crystal silicon) using ion-cut is a key differentiator for some embodiments of the current invention vis-à-vis prior work. Past work used selective epi technology or laser recrystallization or polysilicon.

FIG. 18A-H show a novel memory architecture for 3D floating-gate memories, and a procedure for its construction. The memory architecture utilizes junction-less transistors. One mask is utilized on a "per-memory-layer" basis for the monolithic 3D floating-gate memory concept shown in FIG. 18A-H, and all other masks may be shared between different layers. The process flow may include several steps that may be described in the following sequence.

Figure 18A:
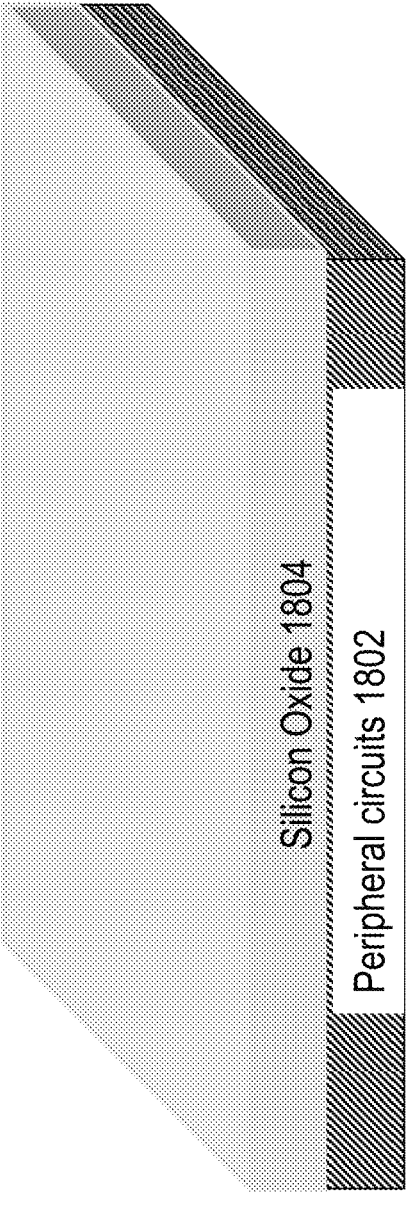
FIGS. 18A-18H are drawing illustrations of a one-mask per layer 3D horizontally-oriented floating-gate memory.

Step (A): Peripheral circuits 1802 may be constructed and above this a layer of silicon dioxide 1804 may be deposited. FIG. 18A illustrates the structure after Step (A).

Figure 18B:
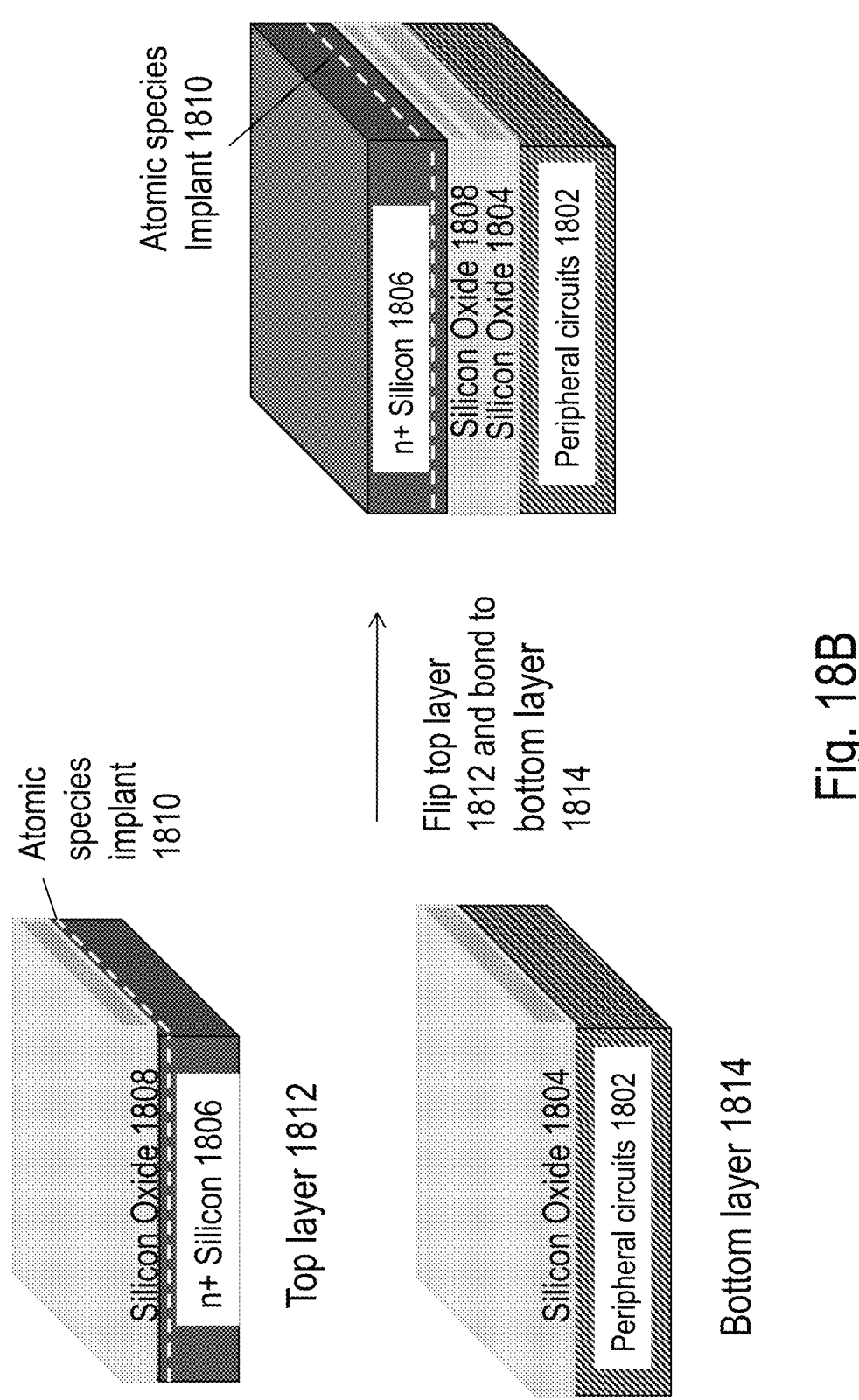

Step (B): FIG. 18B illustrates the structure after Step (B). A wafer of n+ Silicon 1808 may have an oxide layer 1806 grown or deposited above it. Following this, hydrogen may be implanted into the n+ Silicon wafer at a certain depth indicated by 1814. Alternatively, some other atomic species such as Helium could be implanted. This hydrogen implanted n+ Silicon wafer 1808 may form the top layer 1810. The bottom layer 1812 may include the peripheral circuits 1802 with oxide layer 1804. The top layer 1810 may be flipped and bonded to the bottom layer 1812 using oxide-to-oxide bonding.

Figure 18C:
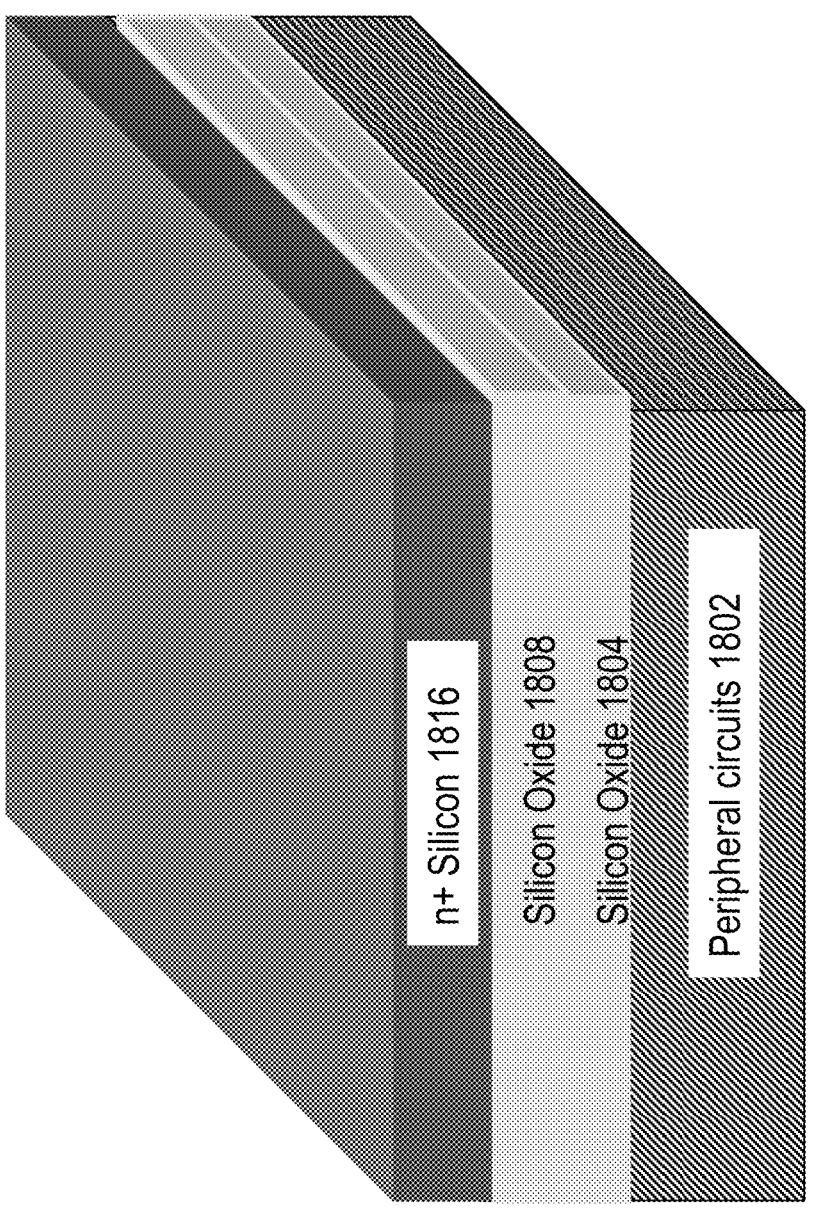

Step (C): FIG. 18C illustrates the structure after Step (C). The stack of top and bottom wafers after Step (B) may be cleaved at the hydrogen plane 1814 using either a anneal or a sideways mechanical force or other means. A CMP process may be conducted. At the end of this step, a single-crystal n+ Si layer 1816 exists atop the peripheral circuits, and this has been achieved using layer-transfer techniques.

Figure 18D:
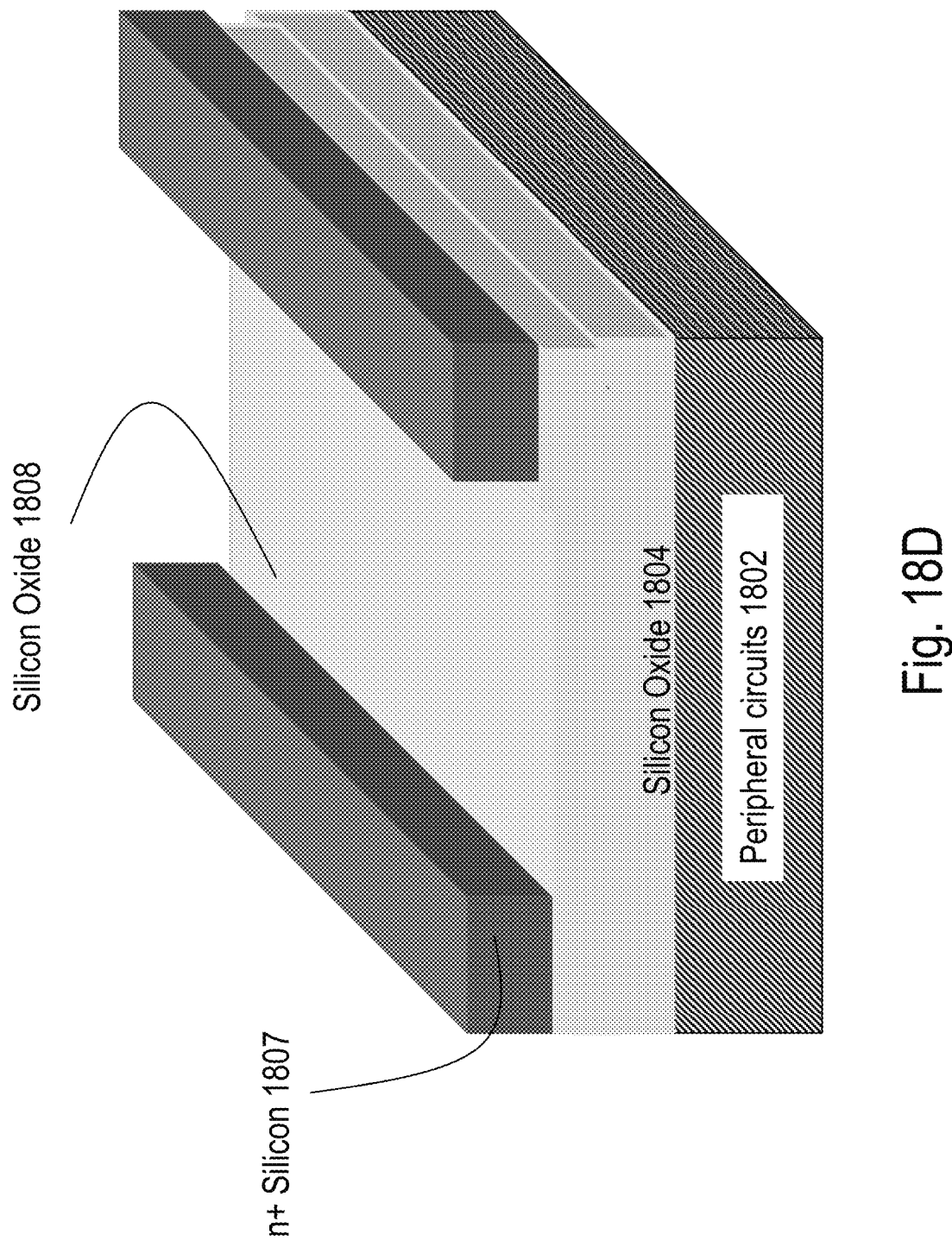

Step (D): FIG. 18D illustrates the structure after Step (D). Using lithography and etch, the n+ silicon layer 1807 may be defined.

Figure 18E:
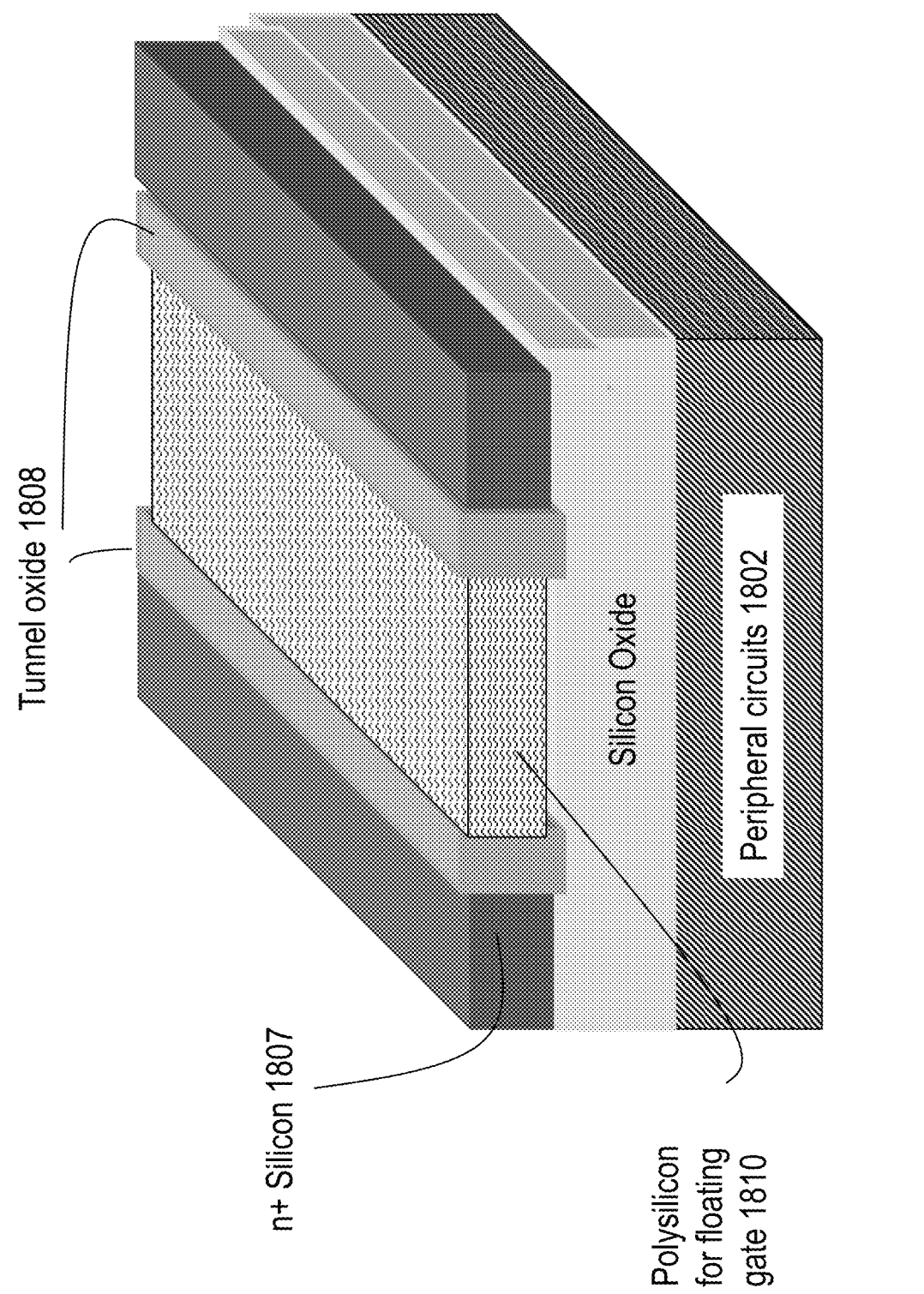

Step (E): FIG. 18E illustrates the structure after Step (E). A tunnel oxide layer 1808 may be grown or deposited following which a polysilicon layer 1810 for forming future floating gates may be deposited. A CMP process may be conducted.

Figure 18F:
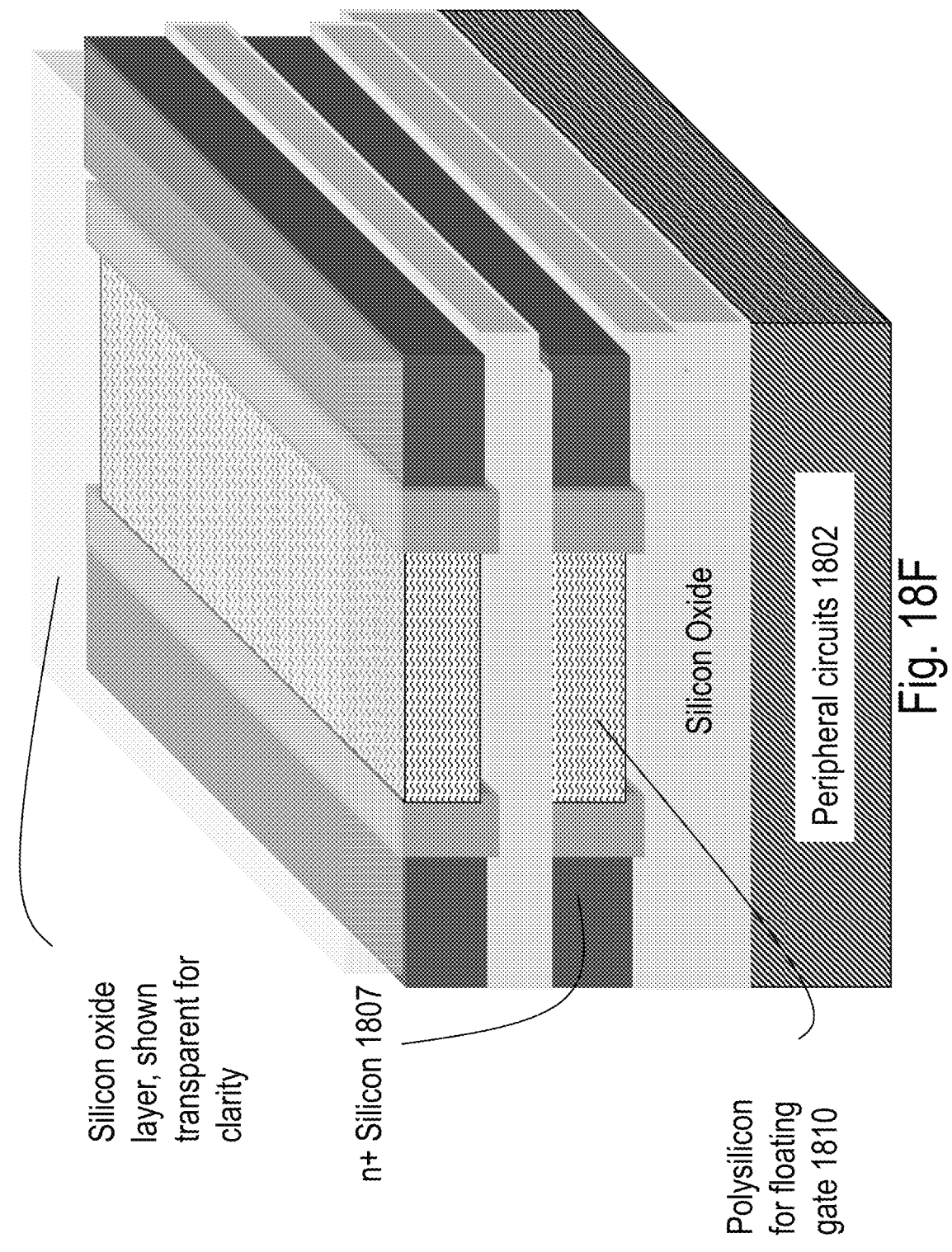

Step (F): FIG. 18F illustrates the structure after Step (F). Using similar procedures, multiple levels of memory may be formed with oxide layers in between.

Figure 18G:
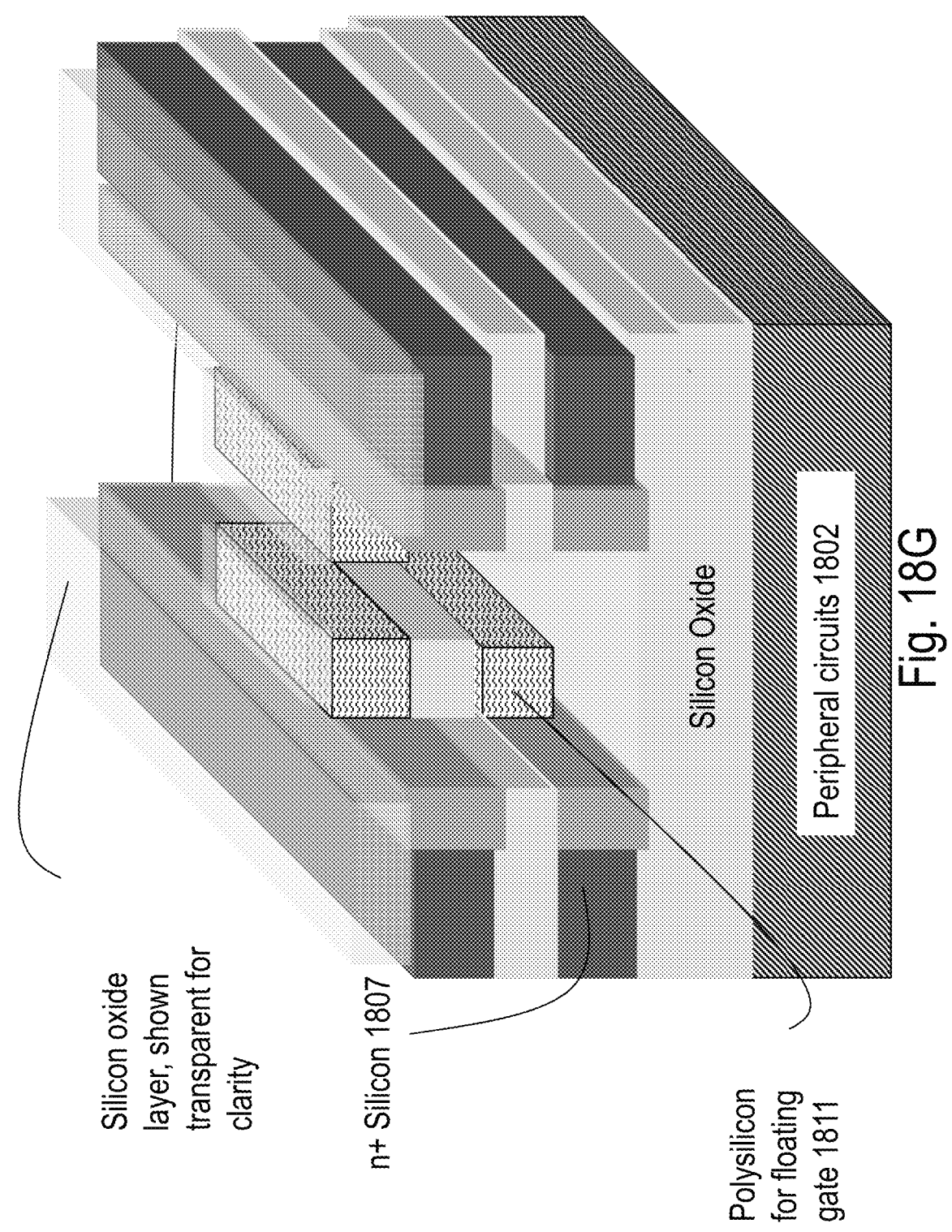

Step (G): FIG. 18G illustrates the structure after Step (G). The polysilicon region for floating gates 1810 may be etched to form the polysilicon region 1811.

Figure 18H:
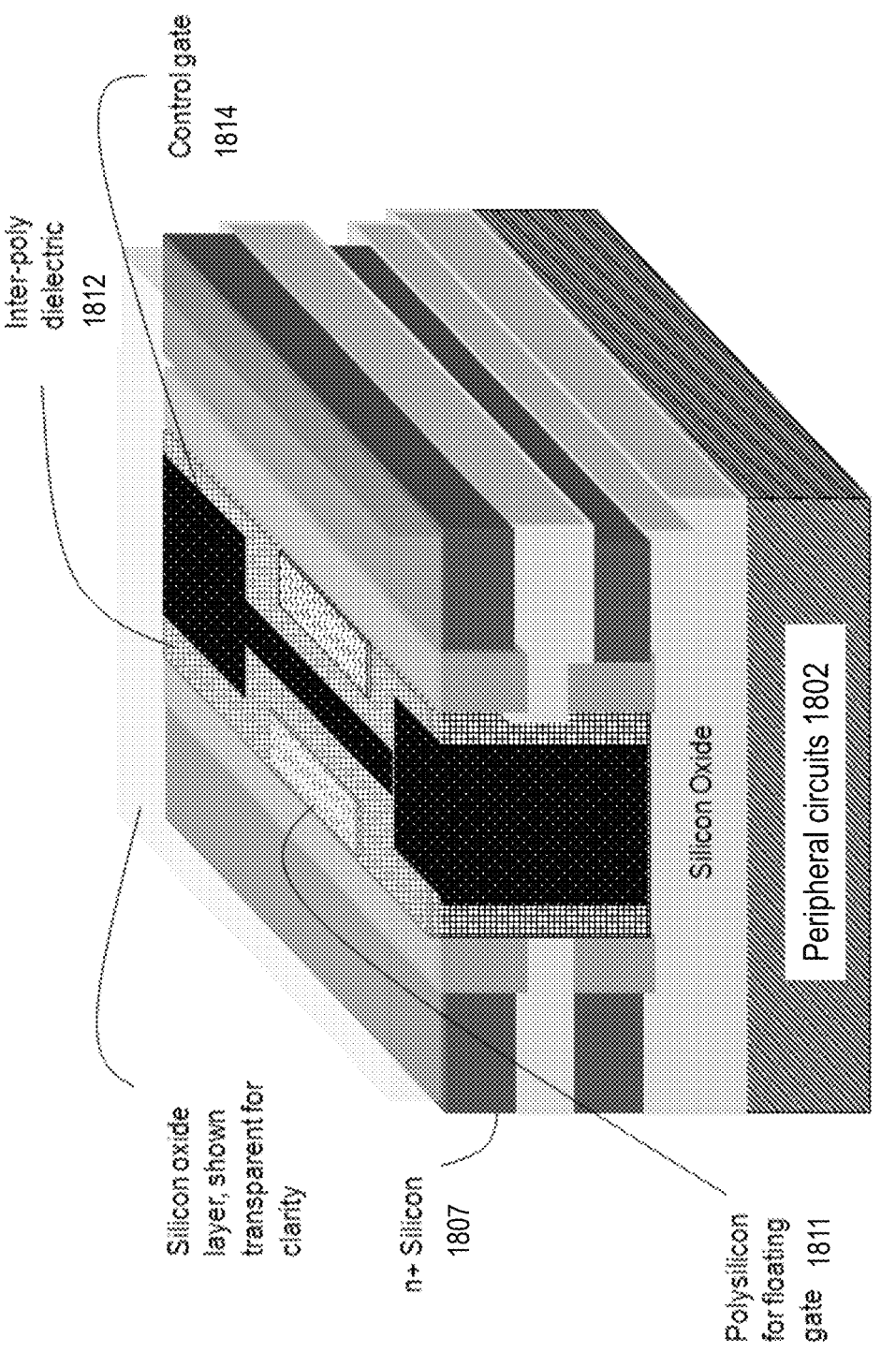

Step (H): FIG. 18H illustrates the structure after Step (H). Inter-poly dielectrics (IPD) 1812 and control gates 1814 may be deposited and polished.

While the steps shown in FIG. 18A-H describe formation of a few floating gate transistors, it will be obvious to one skilled in the art that an array of floating-gate transistors can be constructed using similar techniques and well-known memory access/decoding schemes.

A 3D floating-gate memory has thus been constructed, with (1) horizontally-oriented transistors—i.e. current flowing in substantially the horizontal direction in transistor channels, (2) monocrystalline (or single-crystal) silicon layers obtained by layer transfer techniques such as ion-cut, (3) side gates that are simultaneously deposited over multiple memory layers for transistors, and (4) some of the memory cell control lines are in the same memory layer as the devices. The use of monocrystalline silicon (or single crystal silicon) layer obtained by ion-cut in (2) is a key differentiator for some embodiments of the current invention vis-à-vis prior work. Past work used selective epi technology or laser recrystallization or polysilicon.

Section 5: Alternative Implementations of Various Monolithic 3D Memory Concepts

While the 3D DRAM and 3D resistive memory implementations in Section 1 and Section 2 have been described with single crystal silicon constructed with ion-cut technology, other options exist. One could construct them with selective epi technology. Procedures for doing these will be clear to those skilled in the art.

Various layer transfer schemes described herein and in patent reference incorporated can be utilized for constructing single-crystal silicon layers for memory architectures described in Section 1, Section 2, Section 3 and Section 4.

FIG. 19A-B show it is not the only option for the architecture, as depicted in FIG. 2-FIG. 18A-H, to have the peripheral transistors, such as within bottom side periphery 1902, below the memory layers, such as memory layer 1 1904, memory layer 2 1906, and memory layer 3 1908. Peripheral transistors, such as within topside periphery 1910, could also be constructed above the memory layers, as shown in FIG. 19B, and may include substrate or memory layer 4 1912. This periphery layer would utilize technologies described in Section 1 and Section 2, and could utilize junction-less transistors or recessed channel transistors, and may utilize optical annealing, shielding layers, and absorbers/reflectors as described in incorporated patent references.

The double gate devices shown in FIG. 2-FIG. 18A-H may have both gates connected to each other. Each gate terminal may be designed to be controlled independently, which may lead to design advantages for memory chips.

One of the concerns with using n+ Silicon as a control line for 3D memory arrays is its high resistance. Using lithography and (single-step of multi-step) ion-implantation, one could dope heavily the n+ silicon control lines while not doping transistor gates, sources and drains in the 3D memory array. This preferential doping may mitigate the concern of high resistance.

Figure 20A:
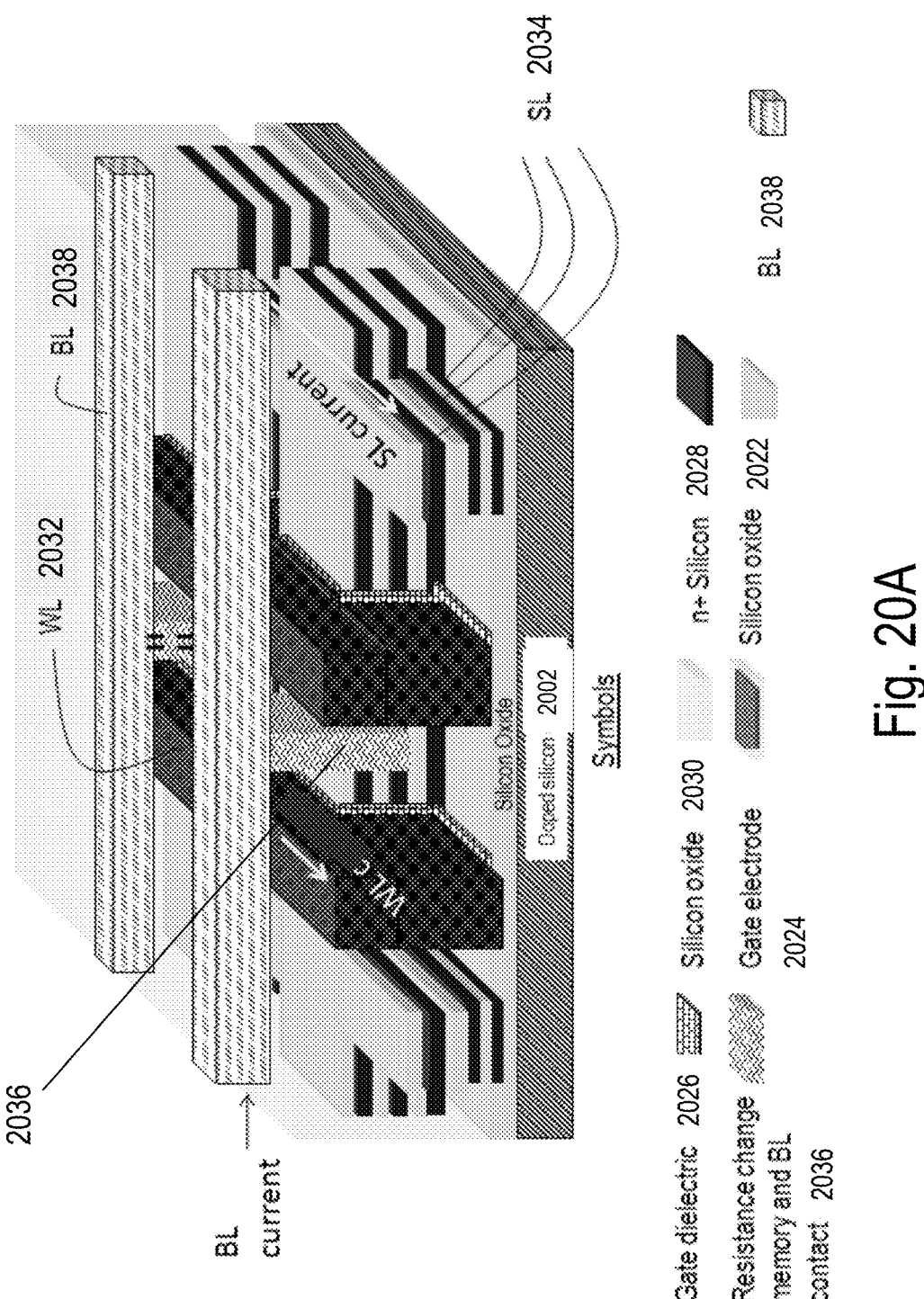
FIGS. 20A-20E are drawing illustrations of a method to make high-aspect ratio vias in 3D memory architectures.

In many of the described 3D memory approaches, etching and filling high aspect ratio vias forms a serious limitation. One way to circumvent this obstacle is by etching and filling vias from two sides of a wafer. A procedure for doing this is shown in FIG. 20A-E. Although FIG. 20A-E describe the process flow for a resistive memory implementation, similar processes can be used for DRAM, charge-trap memories and floating-gate memories as well. The process may include several steps that proceed in the following sequence:

Step (A): 3D resistive memories may be constructed as shown in FIG. 11A-K but with a bare silicon wafer 2002 instead of a wafer with peripheral circuits on it. Due to aspect ratio limitations, the resistance change memory and BL contact 2036 may be formed to the top layers of the memory, as illustrated in FIG. 20A. Bit line contacts may be formed, for example, as sidewall structures or end-wall structures, with various overlaps as required by the process and layout.

Figure 20B:
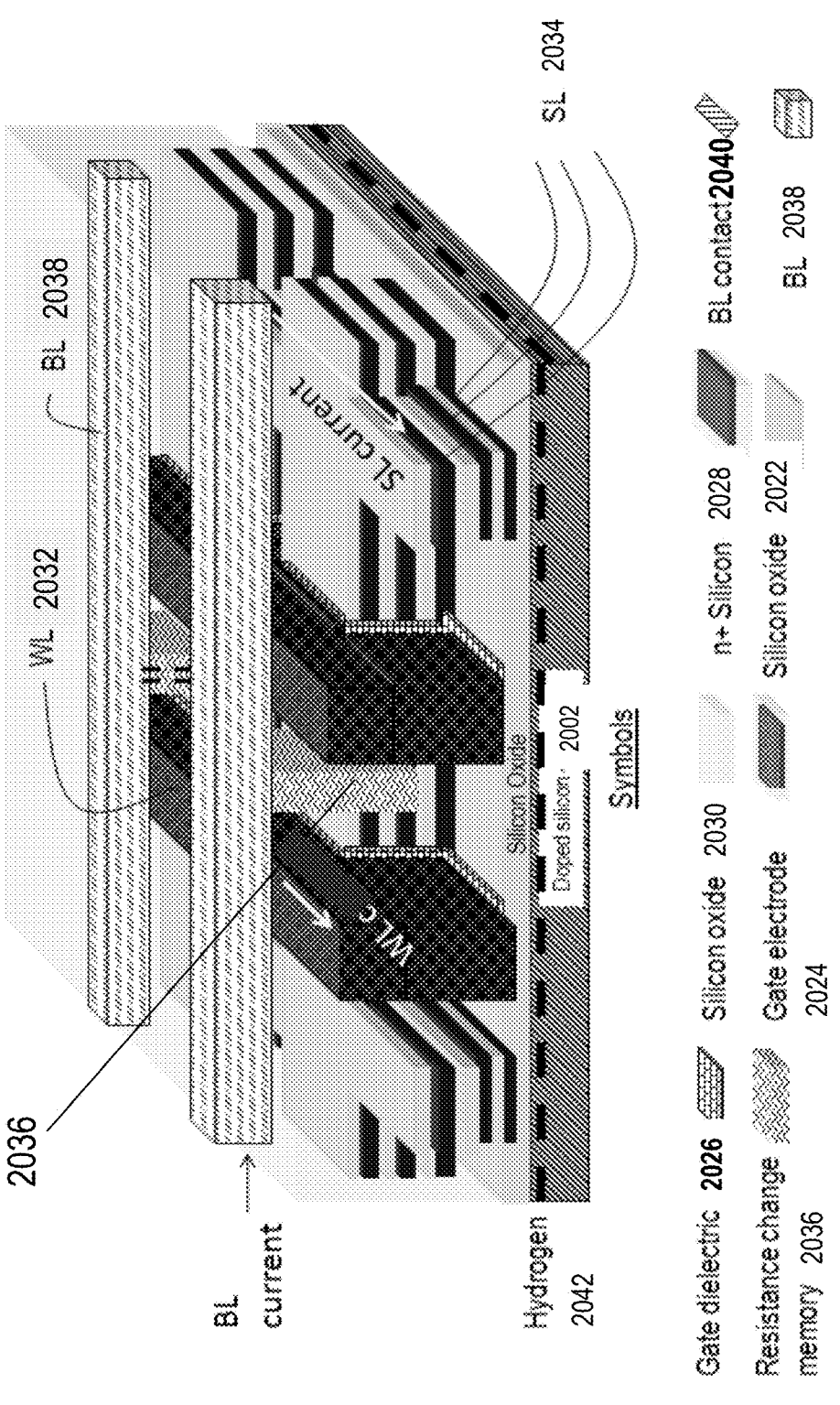

Step (B): Hydrogen may be implanted into the wafer 2002 at a certain depth such as hydrogen implant plane 2042. FIG. 20B illustrates the structure after Step B including silicon oxide 2022.

Figure 20C:
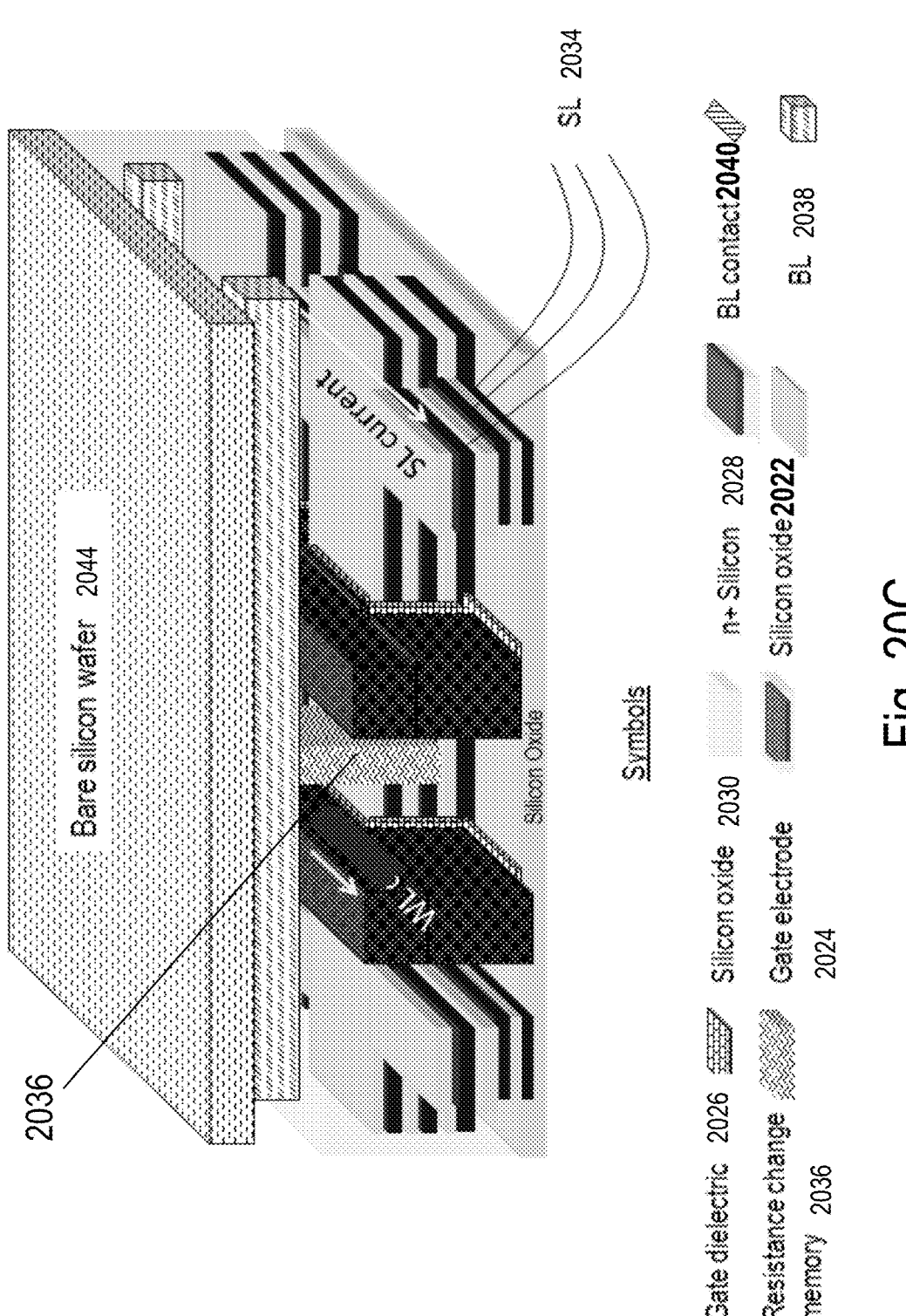

Step (C): The wafer with the structure after Step (B) may be bonded to a bare silicon wafer 2044. Cleaving may be performed at the hydrogen implant plane 2042. A CMP process may be conducted to polish off the silicon wafer. FIG. 20C illustrates the structure after Step C.

Figure 20D:
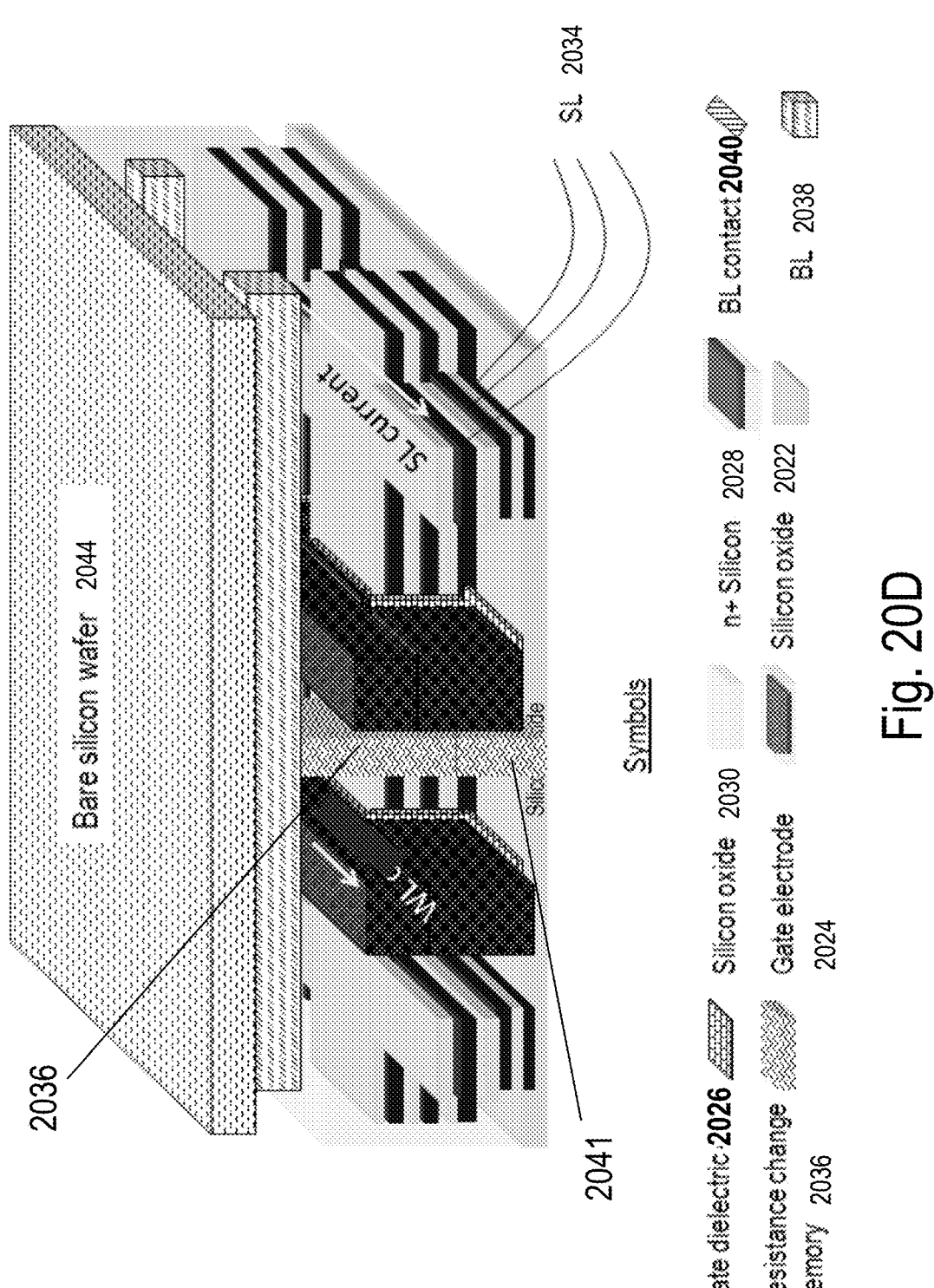

Step (D): Resistance change memory material and BL contact layers 2041 may be constructed for the bottom memory layers. They may connect to the partially made top BL contacts 2036 with state-of-the-art alignment. Bit line contacts may be formed, for example, as sidewall structures or end-wall structures, with various overlaps as required by the process and layout. FIG. 20D illustrates the structure after Step D, including gate electrodes 2024, gate dielectric 2026, n+ silicon regions 2028, BL contacts 2040, BLs 3038, WLs 2032, and SL 2034.

Figure 20E:
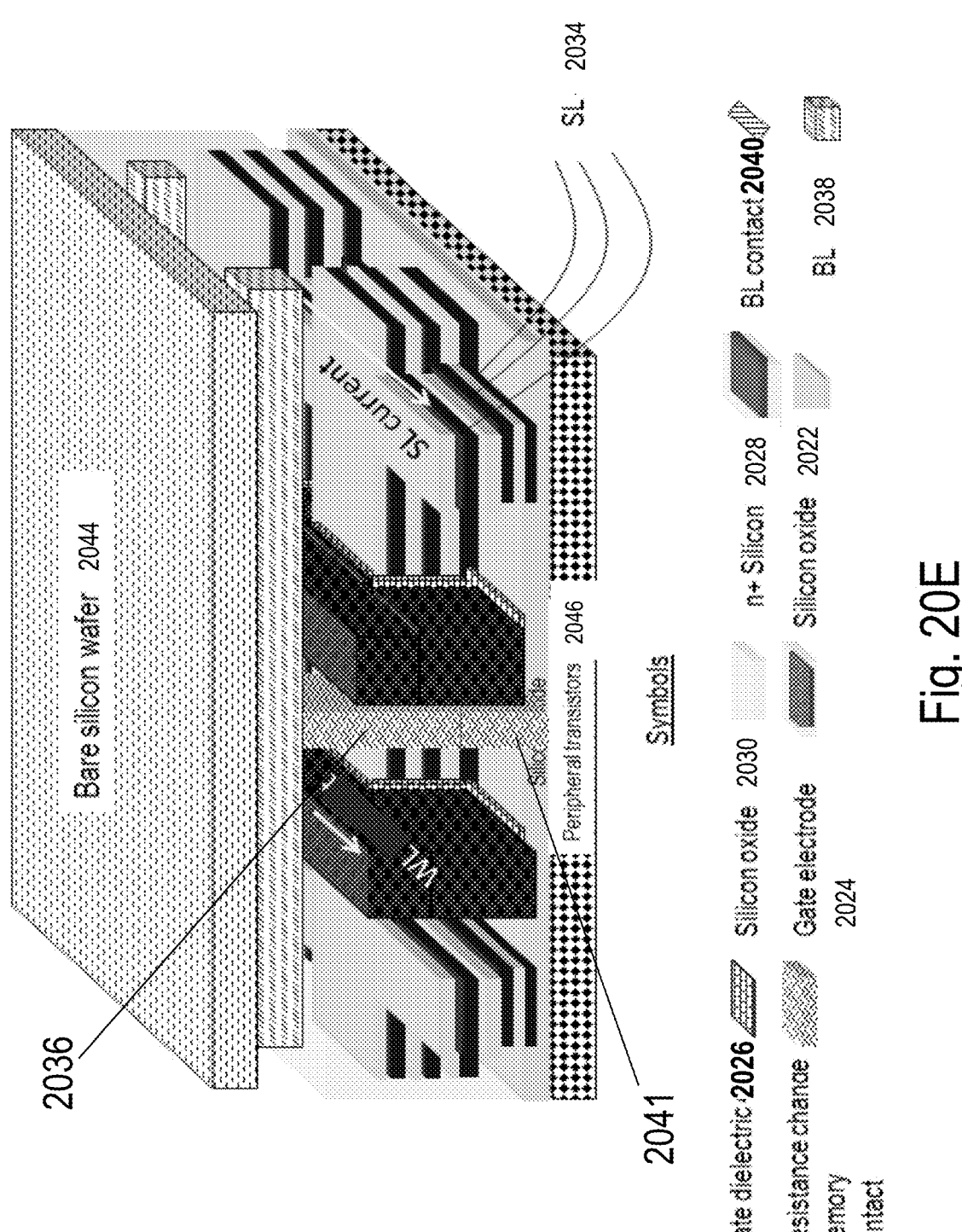

Step (E): Peripheral transistors 2046 may be constructed using procedures shown previously in this document. FIG. 20E illustrates the structure after Step E. Connections may be made to various wiring layers.

The charge-trap and floating-gate architectures shown in FIG. 14A-F-FIG. 18A-H are based on NAND flash memory. To one skilled in the art that these architectures can be modified into a NOR flash memory style as well.

Section 6: Poly-Silicon-Based Implementation of Various Memory Concepts

The monolithic 3D integration concepts described herein can lead to novel embodiments of poly-silicon-based memory architectures as well. Poly silicon based architectures could potentially be cheaper than single crystal silicon based architectures when a large number of memory layers need to be constructed. While the below concepts are explained by using resistive memory architectures as an example, it will be clear to one skilled in the art that similar concepts can be applied to NAND flash memory and DRAM architectures described previously in this patent application.

Figure 21A:
FIGS. 21A-21E are drawing illustrations of polysilicon select devices for 3D memory and peripheral circuits at the bottom according to some embodiments of the current invention.

FIG. 21A-E shows an embodiment of the current invention, where polysilicon junctionless transistors are used to form a 3D resistance-based memory. The utilized junctionless transistors can have either positive or negative threshold voltages. The process may include the following steps as described in the following sequence:

Step (A): As illustrated in FIG. 21A, peripheral circuits 2102 may be constructed above which a layer of silicon dioxide 2104 may be made.

Figure 21B:
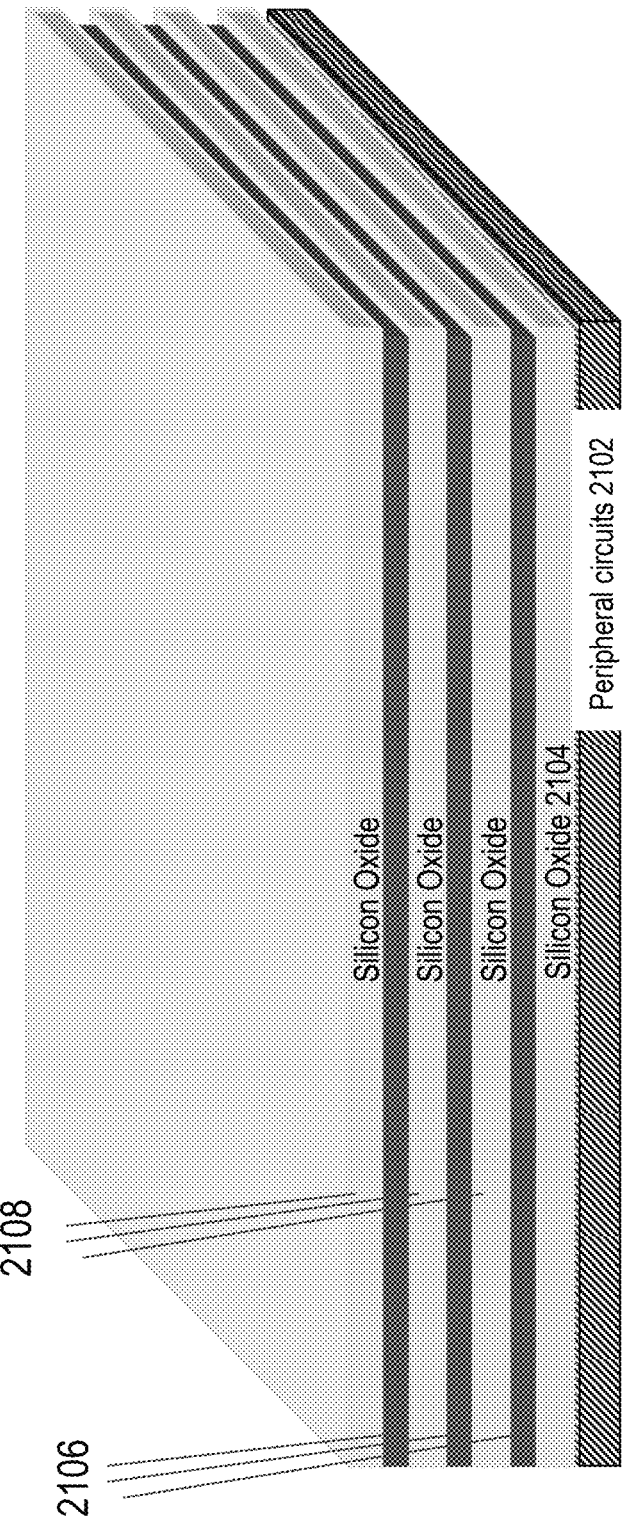

Step (B): As illustrated in FIG. 21B, multiple layers of n+ doped amorphous silicon or polysilicon 2106 may be deposited with layers of silicon dioxide 2108 in between. The amorphous silicon or polysilicon layers 2106 could be deposited using a chemical vapor deposition process, such as LPCVD or PECVD. The composition of the 'SiO$_2$' layer within the stacked Si/SiO$_2$ layers such as silicon dioxide 2108, may be insulators or dielectrics other than silicon dioxide such as, for example, a low-k dielectric, carbon containing silicon oxides, amorphous carbon. The thickness of the 'SiO$_2$' insulator layer within the stacked Si/SiO$_2$ layers such as silicon dioxide 2108 may be adjusted to minimize layer to layer, strata to strata disturb mechanisms, and may include thicknesses of 50 nm, 75 nm, 100 nm, 150 nm, 200 nm, 500 nm, and less than 1000 nm. A thin conductive layer, such as a metal, may also be formed between the two bonding oxides to form a field shield to mitigate layer to layer, strata to strata disturb mechanisms, and may be electrically floating or tied to a bias, such as ground or Vdd. The stacked Si/SiO$_2$ layers may alternatively be formed by successive ion implants of oxygen atoms/ions to various depths from the top surface of a mono-crystalline silicon wafer/substrate and then heat treated to form oxide layers thus forming silicon layers in-between the oxide layers, a layered 'SIMOX' process approach.

Figure 21C:
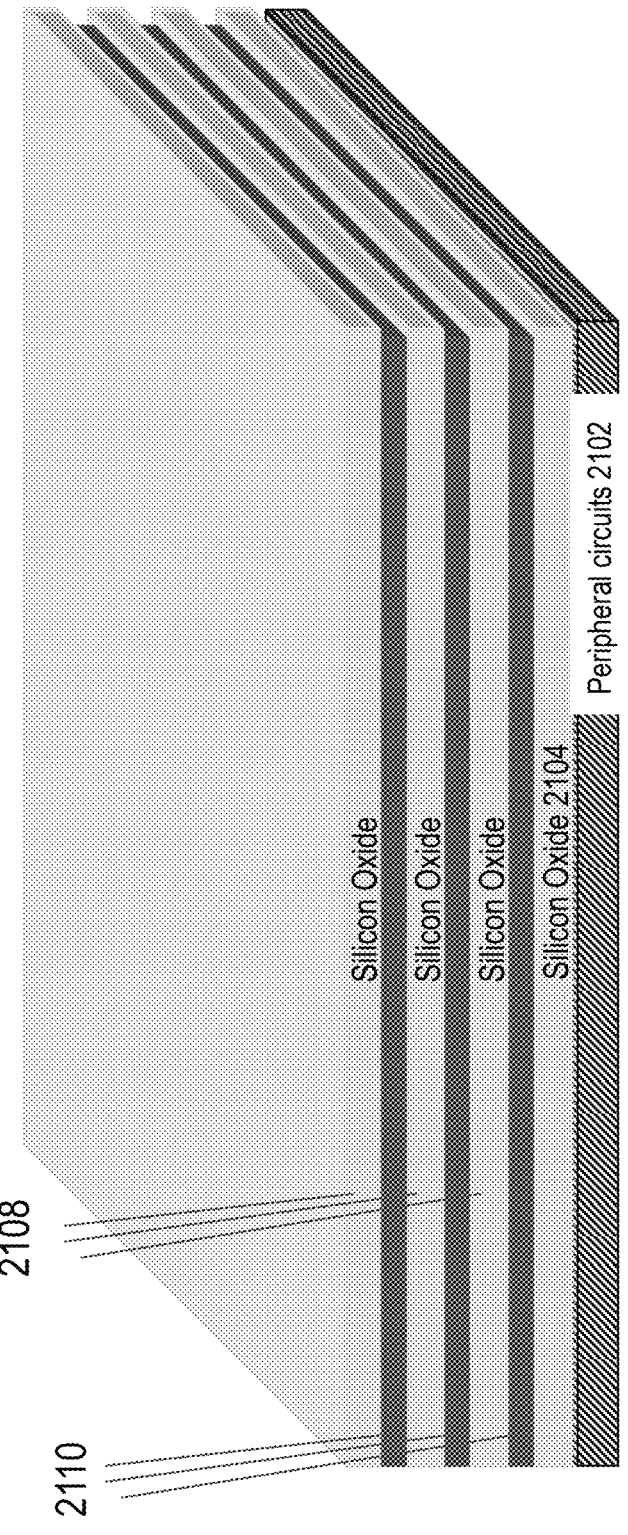

Step (C): As illustrated in FIG. 21C, a Rapid Thermal Anneal (RTA) may be conducted to crystallize the layers of polysilicon or amorphous silicon deposited in Step (B). Temperatures during this RTA could be as high as 210° C. or more, and could even be as high as 800° C. The polysilicon region obtained after Step (C) is indicated as 2110. Alternatively, a laser anneal could be conducted, either for all layers 2106 at the same time or layer by layer.

Figure 21D:
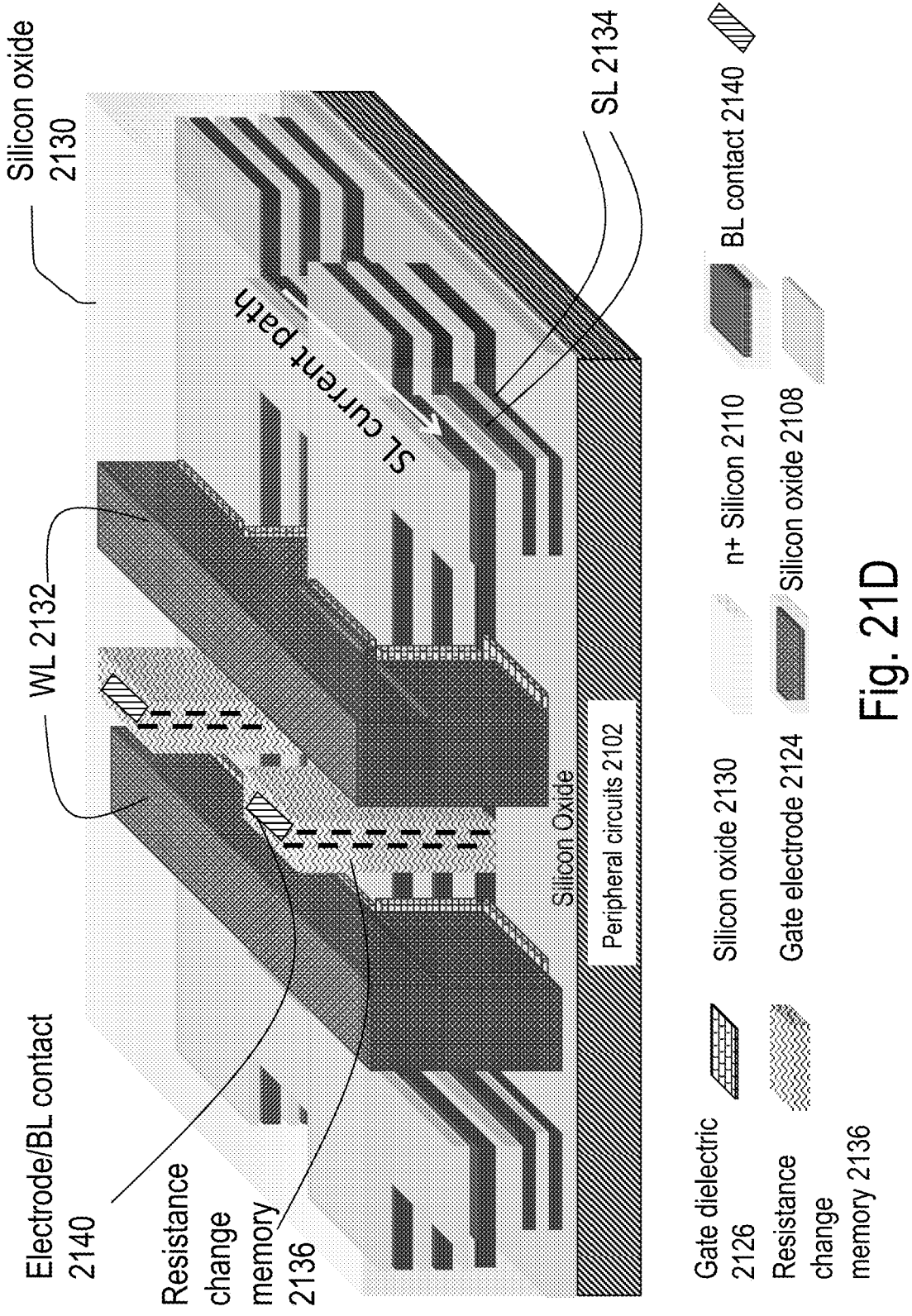

Step (D): As illustrated in FIG. 21D, procedures similar to those described in FIG. 10E-H may be utilized to construct the structure shown. The structure in FIG. 21D has multiple levels of junction-less transistor selectors for resistive memory devices, including isolation regions such as silicon oxide regions 2130. The resistance change memory is indicated as 2136 while its electrode and contact to the BL is indicated as 2140. The WL is indicated as 2132, while the SL is indicated as 2134. Gate dielectric of the junction-less transistor is indicated as 2126 while the gate electrode of the junction-less transistor is indicated as 2124, this gate electrode also serves as part of the WL 2132. Gate dielectric 2126 and gate electrode 2124 may be, for example, a HKMG structure or a TEL SPA radical oxidation oxide and an appropriate work function electrode, for example, tungsten, degenerately doped polysilicon or amorphous silicon. Although the width of the n+ regions 2110 near and under the gates are illustrated as being larger than the thickness, one skilled in the art would recognize that the reverse (i.e., thickness larger than width) could be formed to provide increased gate control of the transistor channel.

Figure 21E:
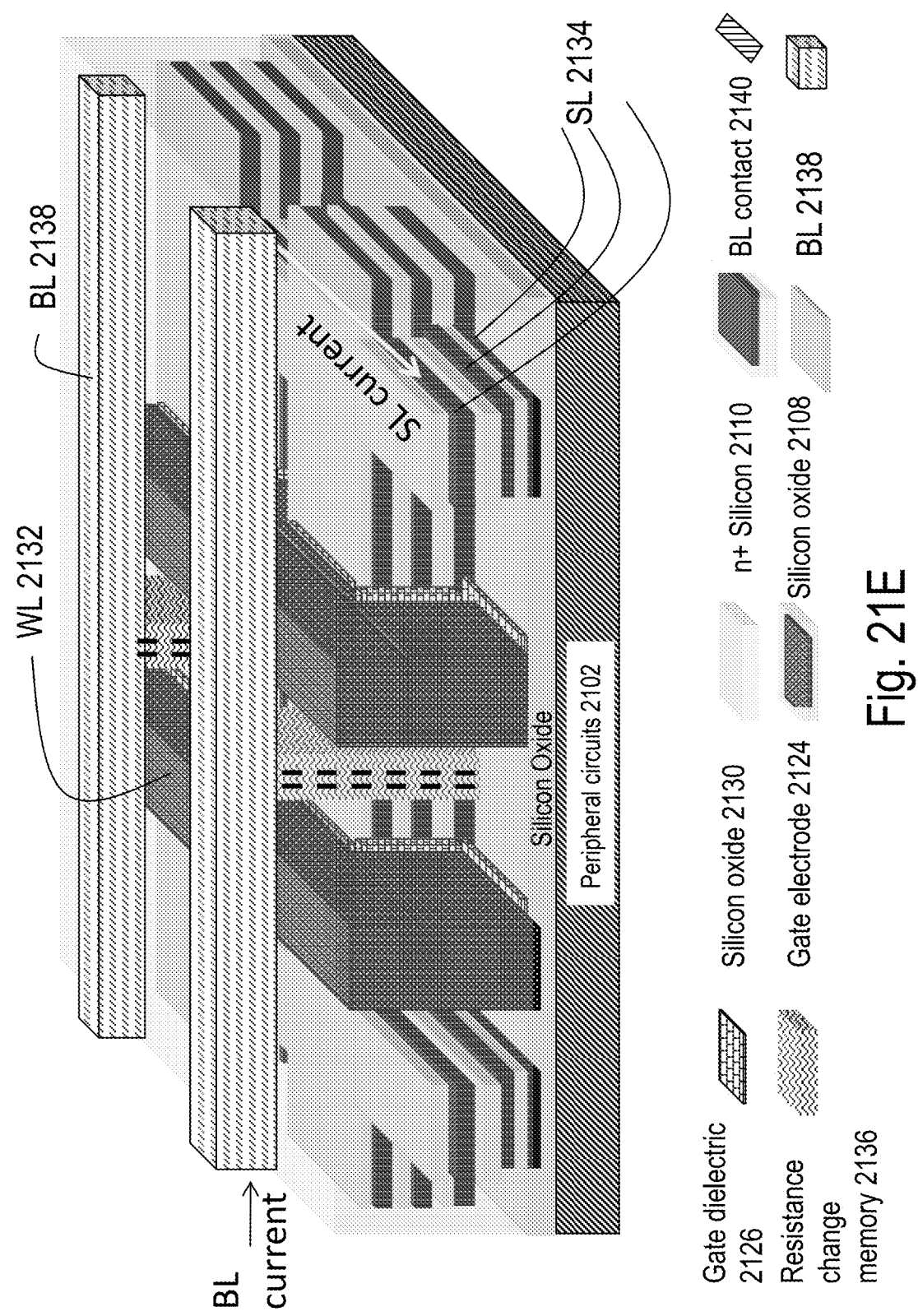

Step (E): As illustrated in FIG. 21E, bit lines (indicated as BL 2138) may be constructed. Contacts may be made to peripheral circuits and various parts of the memory array as described in embodiments described previously.

Figure 22A:
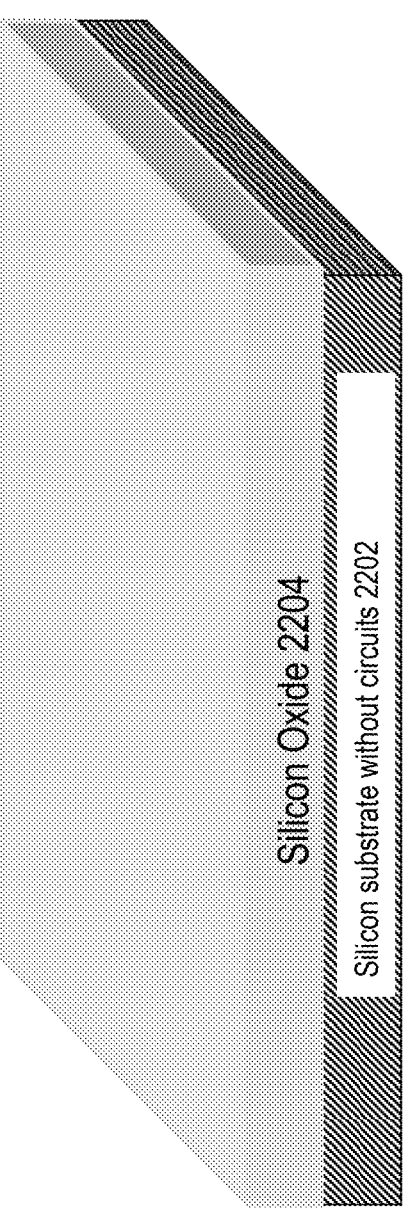
FIGS. 22A-22F are drawing illustrations of polysilicon select devices for 3D memory and peripheral circuits at the top according to some embodiments of the current invention.

FIG. 22A-F show another embodiment of the current invention, where polysilicon junction-less transistors are used to form a 3D resistance-based memory. The utilized junction-less transistors can have either positive or negative threshold voltages. The process may include the following steps:

Step (A): As illustrated in FIG. 22A, a layer of silicon dioxide 2204 may be deposited or grown above a silicon substrate without circuits 2202.

Figure 22B:
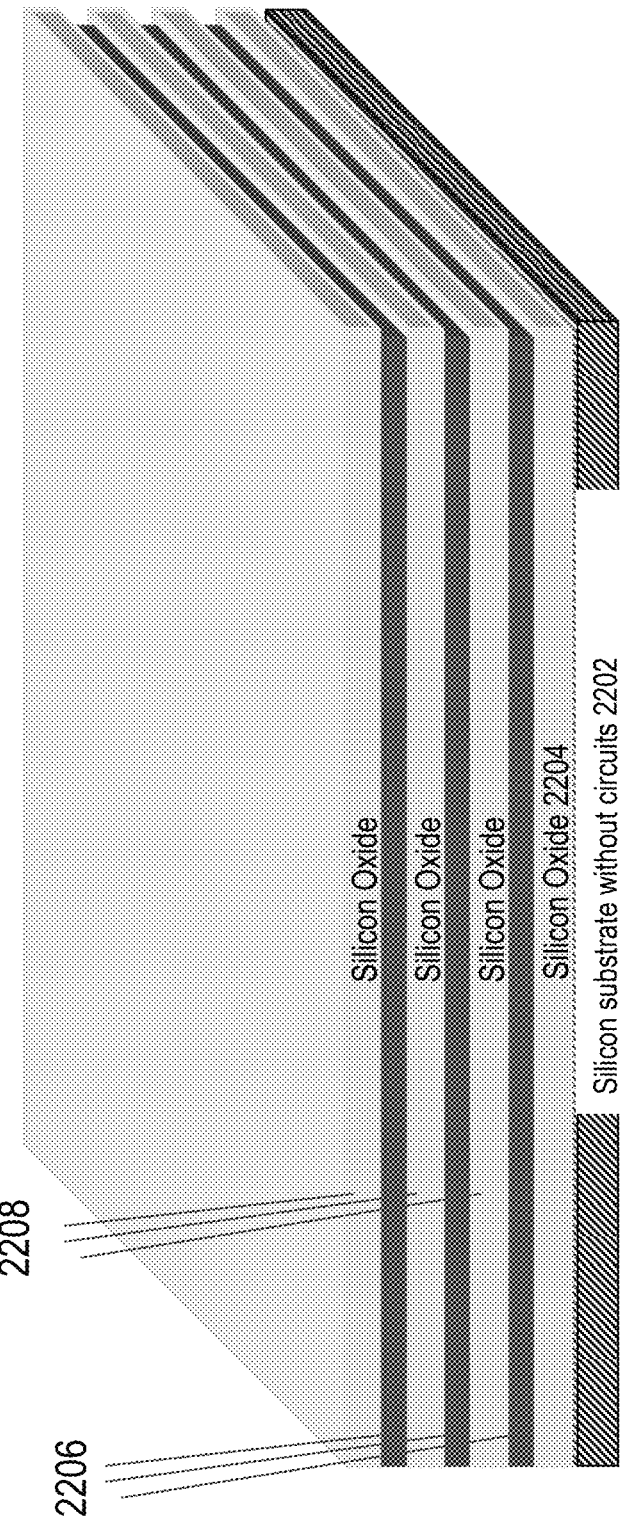

Step (B): As illustrated in FIG. 22B, multiple layers of n+ doped amorphous silicon or polysilicon 2206 may be deposited with layers of silicon dioxide 2208 in between. The amorphous silicon or polysilicon layers 2206 could be deposited using a chemical vapor deposition process, such as LPCVD or PECVD described above. The composition of the 'SiO$_2$' layer within the stacked Si/SiO$_2$ layers such as silicon dioxide 2208, may be insulators or dielectrics other than silicon dioxide such as, for example, a low-k dielectric, carbon containing silicon oxides, amorphous carbon. The thickness of the 'SiO$_2$' insulator layer within the stacked Si/SiO$_2$ layers such as silicon dioxide 2208 may be adjusted to minimize layer to layer, strata to strata disturb mechanisms, and may include thicknesses of 50 nm, 75 nm, 100 nm, 150 nm, 200 nm, 500 nm, and less than 1000 nm. A thin conductive layer, such as a metal, may also be formed between the two bonding oxides to form a field shield to mitigate layer to layer, strata to strata disturb mechanisms, and may be electrically floating or tied to a bias, such as ground or Vdd. The stacked Si/SiO$_2$ layers may alternatively be formed by successive ion implants of oxygen atoms/ions to various depths from the top surface of a mono-crystalline silicon wafer/substrate and then heat treated to form oxide layers thus forming silicon layers in-between the oxide layers, a layered 'SIMOX' process approach.

Figure 22C:
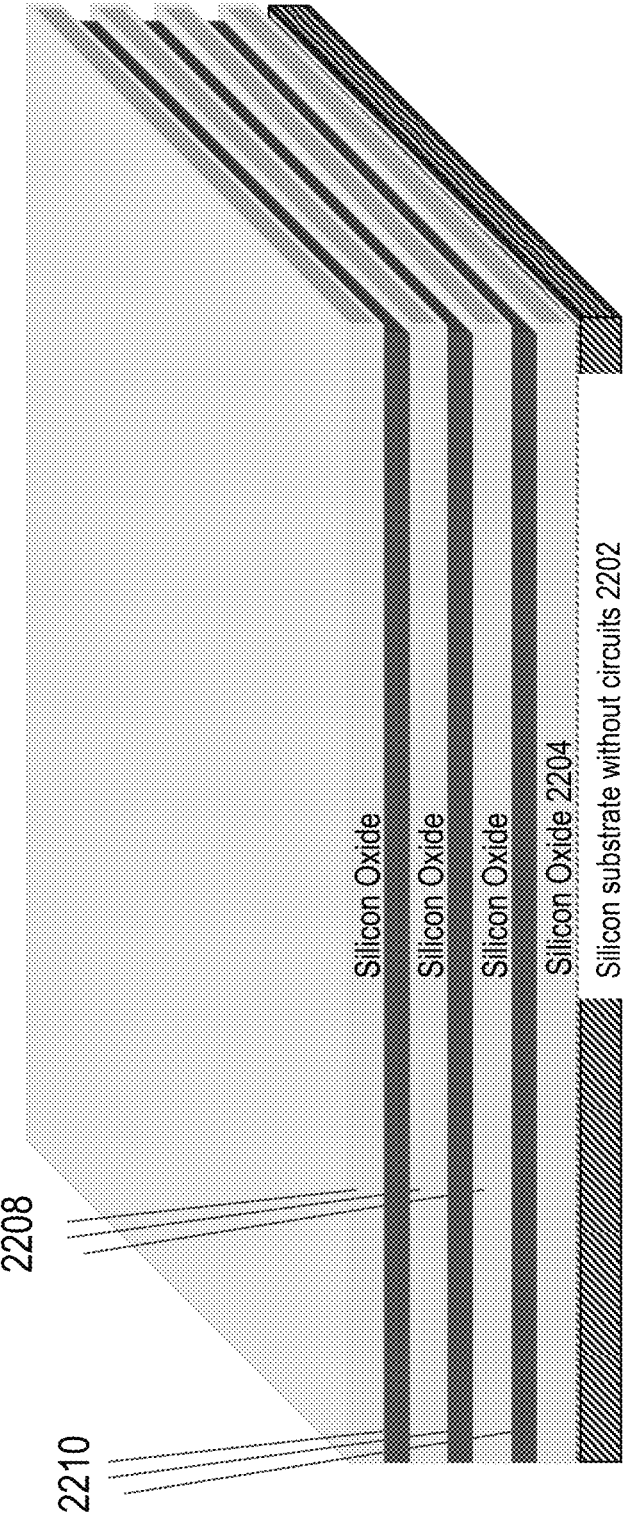

Step (C): As illustrated in FIG. 22C, a Rapid Thermal Anneal (RTA) or standard anneal may be conducted to crystallize the layers of polysilicon or amorphous silicon deposited in Step (B). Temperatures during this RTA could be as high as 700° C. or more, and could even be as high as 1400° C. The polysilicon region obtained after Step (C) is indicated as 2210. Since there are no circuits under these layers of polysilicon, very high temperatures (such as 1400° C.) can be used for the anneal process, leading to very good quality polysilicon with few grain boundaries and very high mobilities approaching those of single crystal silicon. Alternatively, a laser anneal could be conducted, either for all layers 2206 at the same time or layer by layer at different times.

Figure 22D:
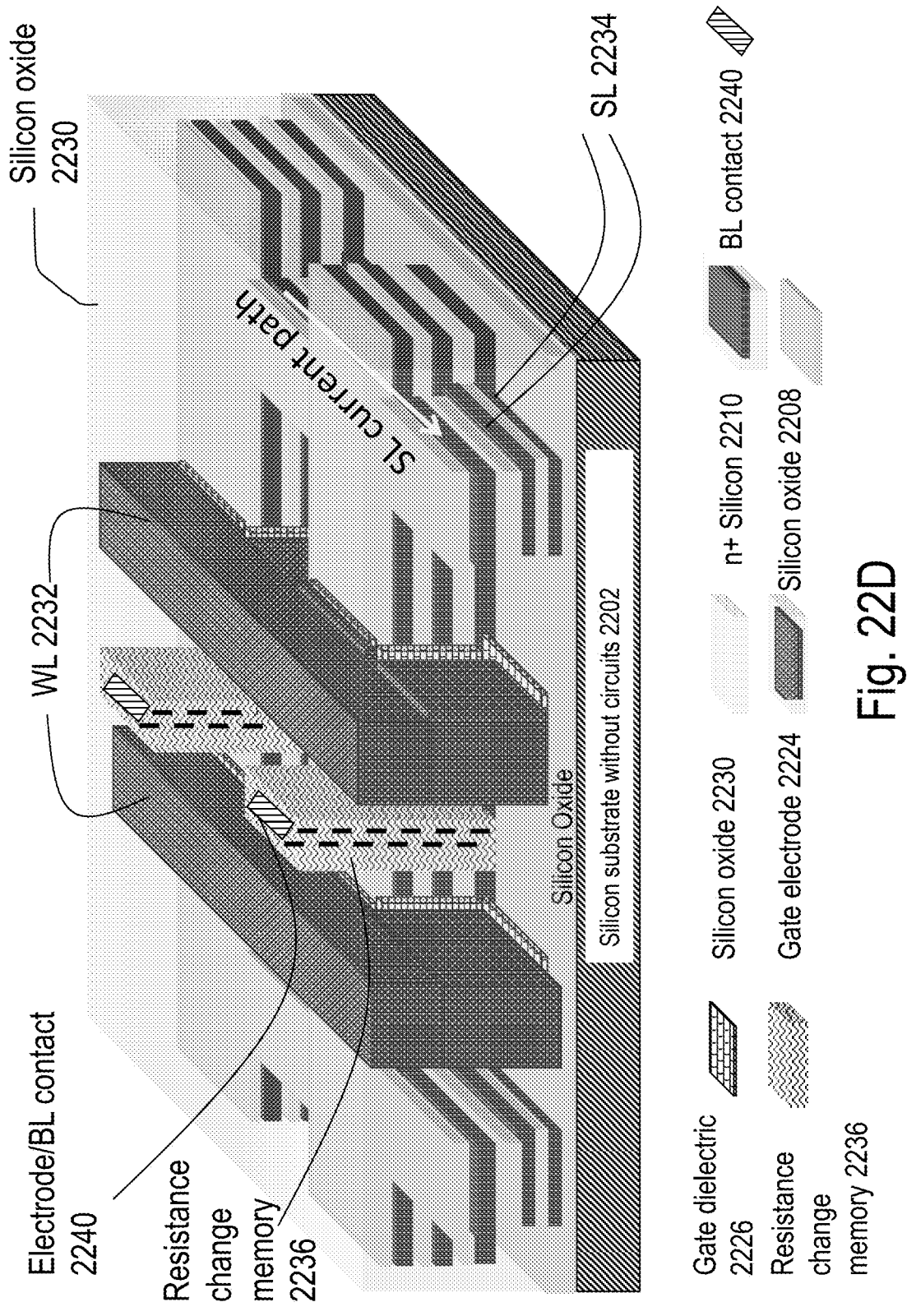

Step (D): This is illustrated in FIG. 22D. Procedures similar to those described in FIG. 10E-H may be utilized to get the structure shown in FIG. 22D that has multiple levels of junction-less transistor selectors for resistive memory devices, including insulator regions such as silicon oxide regions 2230. The resistance change memory is indicated as 2236 while its electrode and contact to the BL is indicated as 2240. The WL is indicated as 2232, while the SL is indicated as 2234. Gate dielectric of the junction-less transistor is indicated as 2226 while the gate electrode of the junction-less transistor is indicated as 2224, this gate electrode also serves as part of the WL 2232. Gate dielectric 2226 and gate electrode 2224 may be, for example, a HKMG structure or a TEL SPA radical oxidation oxide and an appropriate work function electrode, for example, tungsten, degenerately doped polysilicon or amorphous silicon. Although the width of the n+ regions 2210 near and under the gates are illustrated as being larger than the thickness, one skilled in the art would recognize that the reverse (i.e., thickness larger than width) could be formed to provide increased gate control of the transistor channel.

Figure 22E:
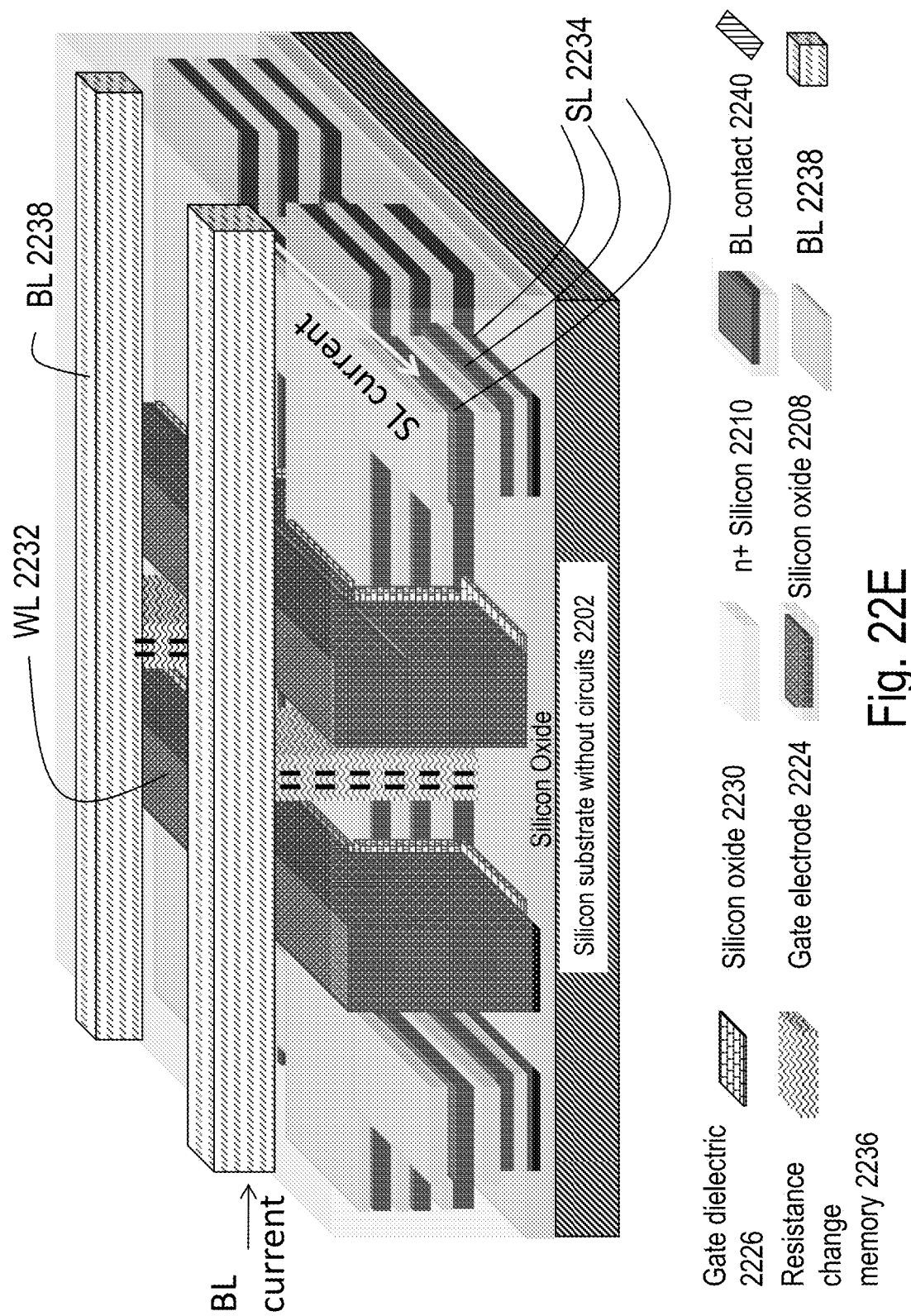
Figure 22F:
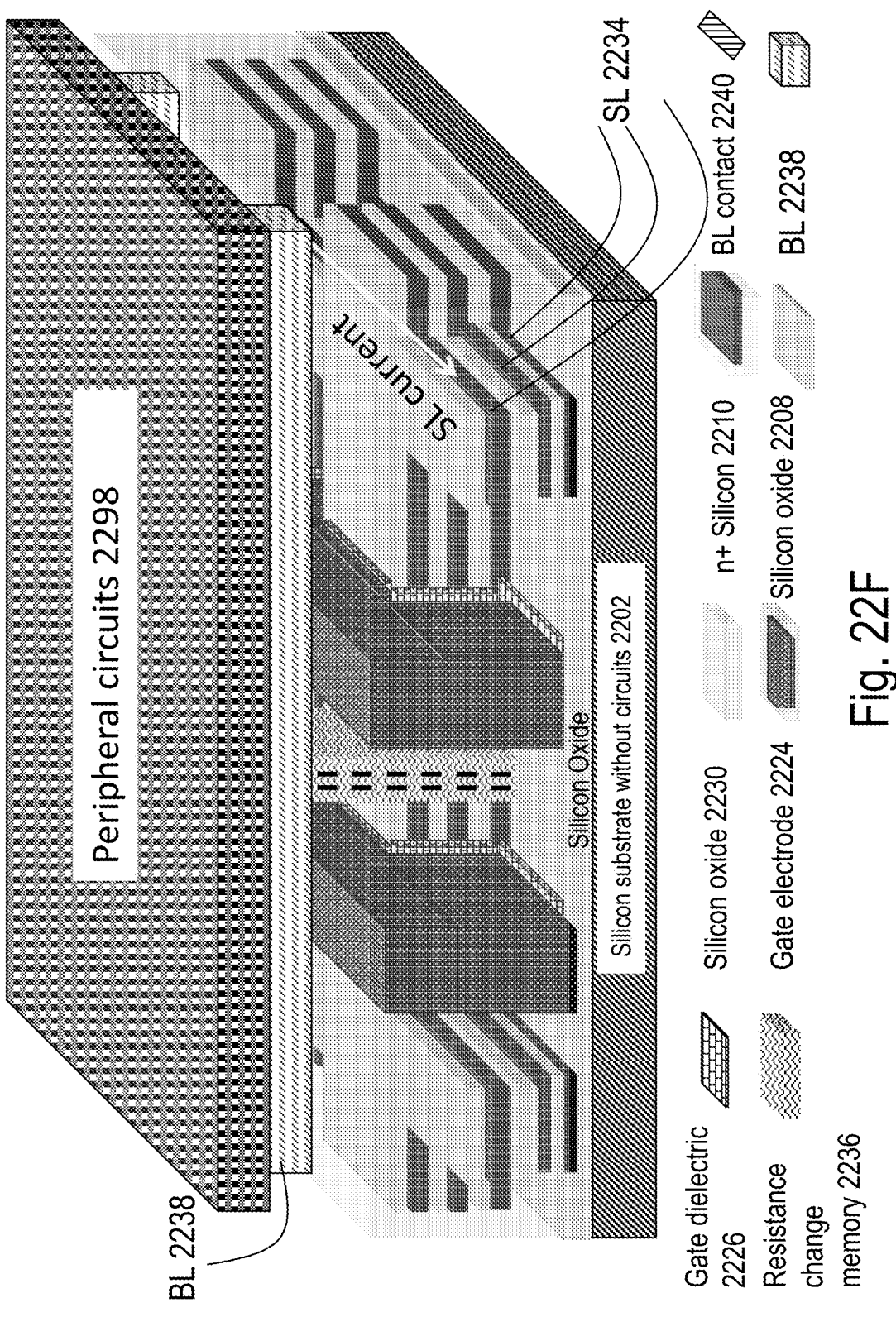

Step (E): This is illustrated in FIG. 22E. Bit lines (indicated as BL 2238) may be constructed. Contacts may be made to peripheral circuits and various parts of the memory array as described in embodiments described previously.

Step (F): Using procedures described herein and in incorporated by reference patents, peripheral circuits 2298 (with transistors and wires) could be formed well aligned to the multiple memory layers shown in Step (E). For the periphery, one could use the process flow wherein replacement gate processing is used, or one could use sub-400° C. processed transistors such as junction-less transistors or recessed channel transistors. Alternatively, one could use laser anneals for peripheral transistors' source-drain processing. Connections can then be formed between the multiple memory layers and peripheral circuits. By proper choice of materials for memory layer transistors and memory layer wires (e.g., by using tungsten and other materials that withstand high temperature processing for wiring), or by using optical annealing and proper shielding layers, even standard transistors processed at high temperatures (>1000° C.) for the periphery could be used.

Section 7: Monolithic 3D SRAM

The techniques described in this patent application can be used for constructing monolithic 3D SRAMs.

FIG. 23A-D represents an SRAM embodiment of the current invention, wherein ion-cut is utilized for constructing a monolithic 3D SRAM. Peripheral circuits may be constructed on a silicon substrate, and above this, two layers of nMOS transistors and one layer of pMOS transistors may be formed using ion-cut and procedures described earlier in this patent application. Implants for each of these layers may be performed when the layers are being constructed, and finally, after all layers have been constructed, a RTA may be conducted to activate dopants. If high k dielectrics are utilized for this process, a gate-first approach may be preferred.

Figure 23A:
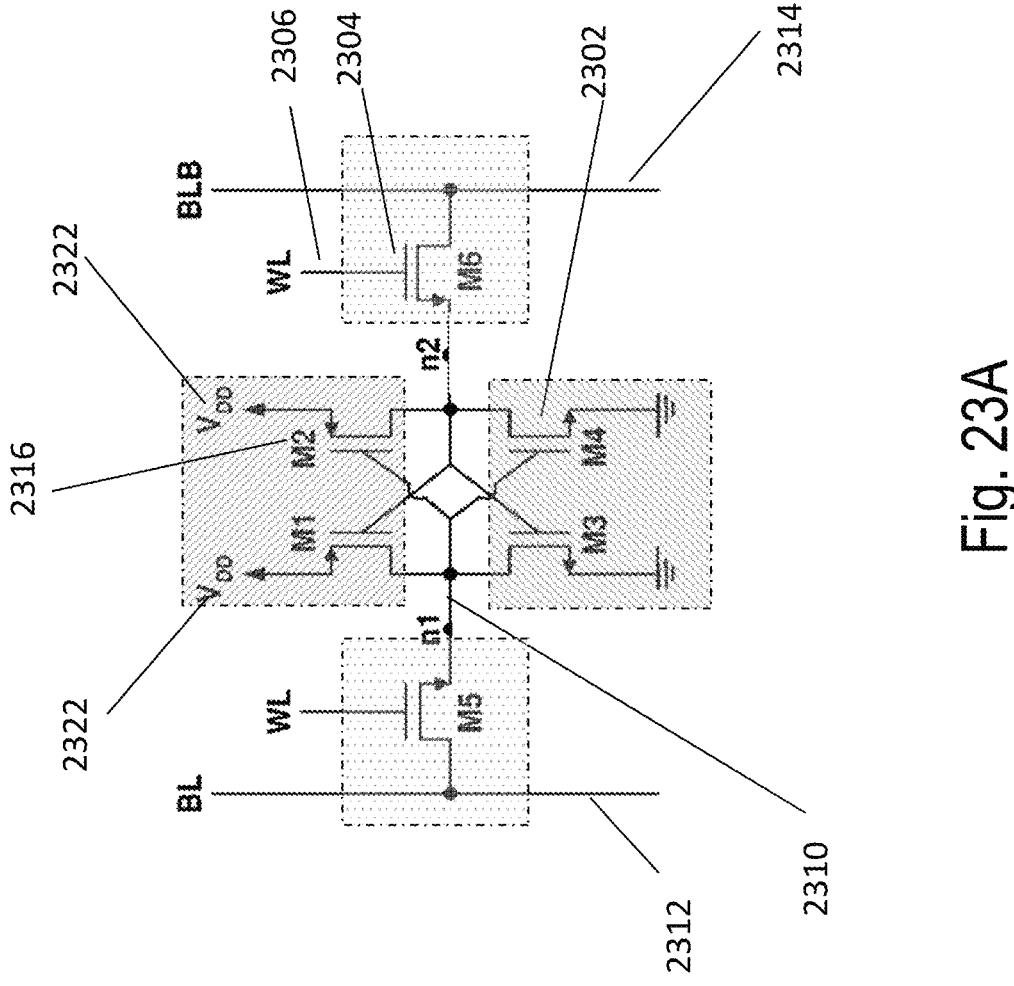
FIGS. 23A-23D are drawing illustrations of a monolithic 3D SRAM according to some embodiments of the current invention.

FIG. 23A shows a standard six-transistor SRAM cell according to an embodiment of the current invention. There are two pull-down nMOS transistors, and 2302 represents a pull-down nMOS transistor in FIG. 23A-D. There are also two pull-up pMOS transistors, each of which is represented by 2316. There are two nMOS pass transistors 2304 connecting bit-line wiring 2312 and bit line complement wiring 2314 to the pull-up transistors 2316 and pull-down transistors 2302, and these are represented by 2314. Gates of nMOS pass transistors 2314 are represented by 2306 and are connected to word-lines (WL) using WL contacts 2308. Supply voltage VDD is denoted as 2322 while ground voltage GND is denoted as 2324. Nodes n1 and n2 within the SRAM cell are represented as 2310.

Figure 23B:
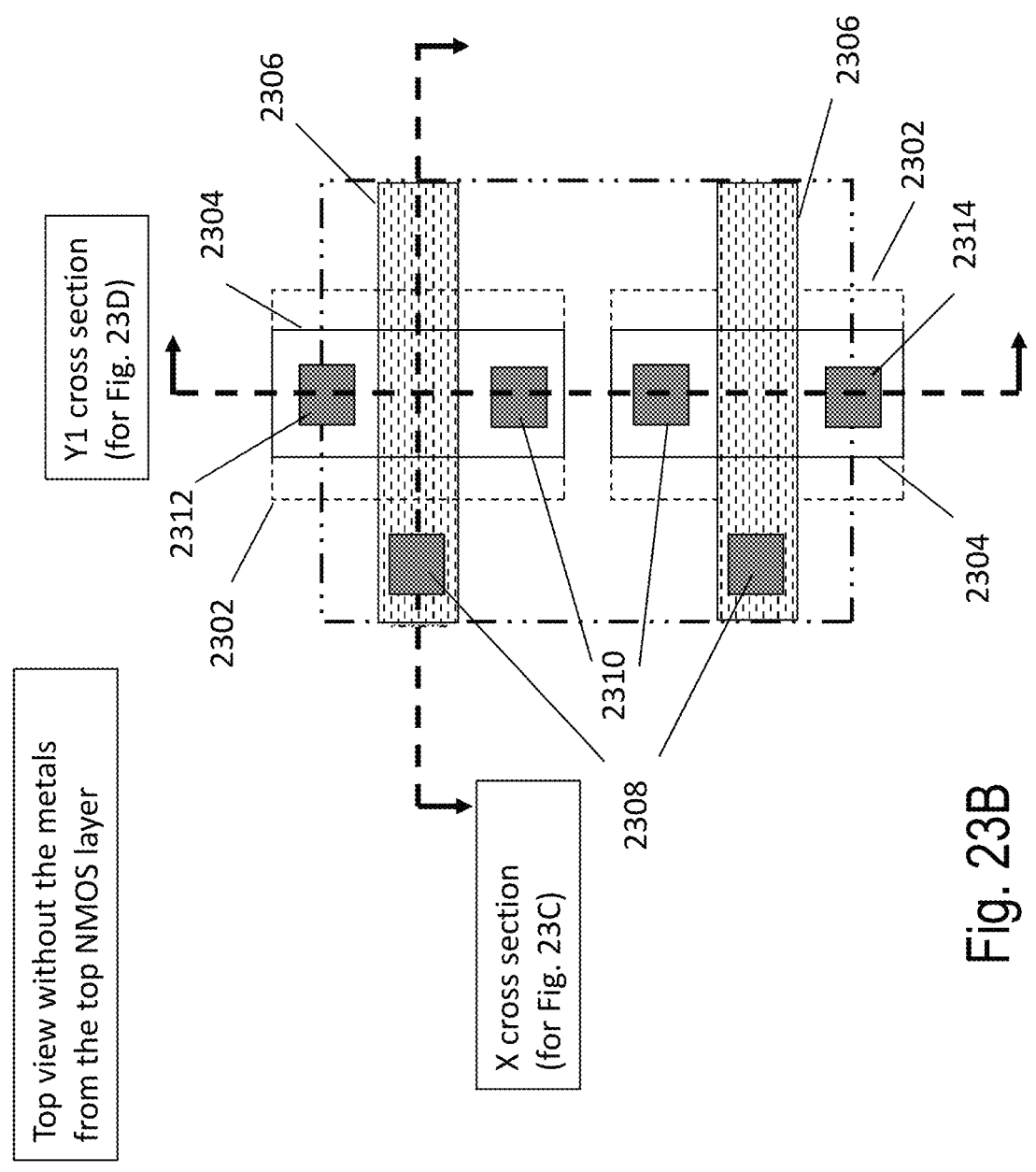

FIG. 23B shows a top view of the SRAM according to an embodiment of the invention. For the SRAM described in FIG. 23A-D, the bottom layer may be the periphery. The nMOS pull-down transistors may be above the bottom layer. The pMOS pull-up transistors may be above the nMOS pull-down transistors. The nMOS pass transistors may be above the pMOS pull-up transistors. The nMOS pass transistors 2304 on the topmost layer may be displayed in FIG. 23B. Gates 2306 for nMOS pass transistors 2304 are also shown in FIG. 23B. Other numerals have been described previously in respect of FIG. 23A.

Figure 23C:
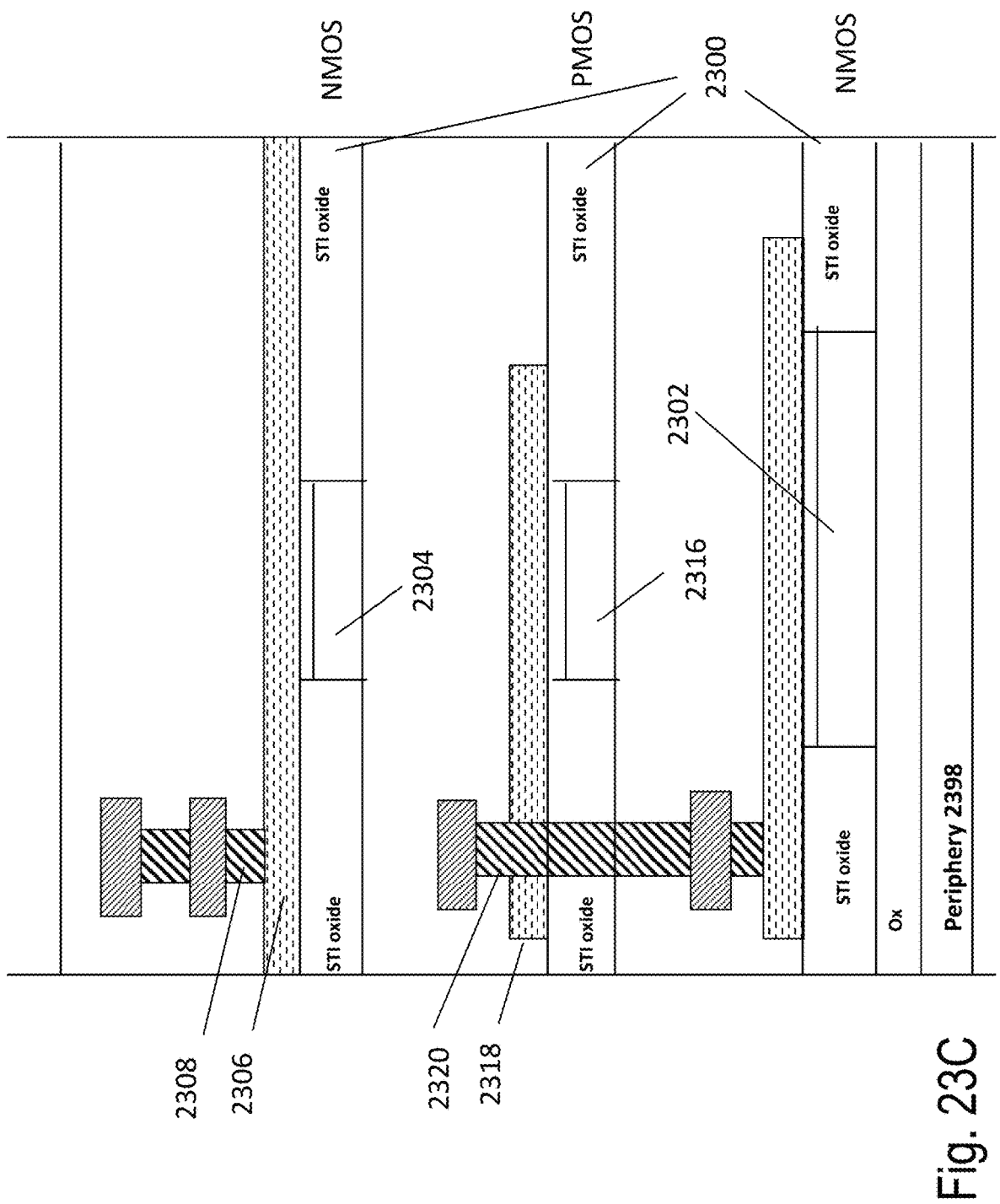

FIG. 23C shows a cross-sectional view of the SRAM according an embodiment of the invention. Oxide isolation using a STI process is indicated as 2300. Gates for pull-up pMOS transistors are indicated as 2318 while the vertical contact to the gate of the pull-up pMOS and nMOS transistors is indicated as 2320. The periphery layer is indicated as 2398. Other numerals have been described in respect of FIG. 23A and FIG. 23B.

Figure 23D:
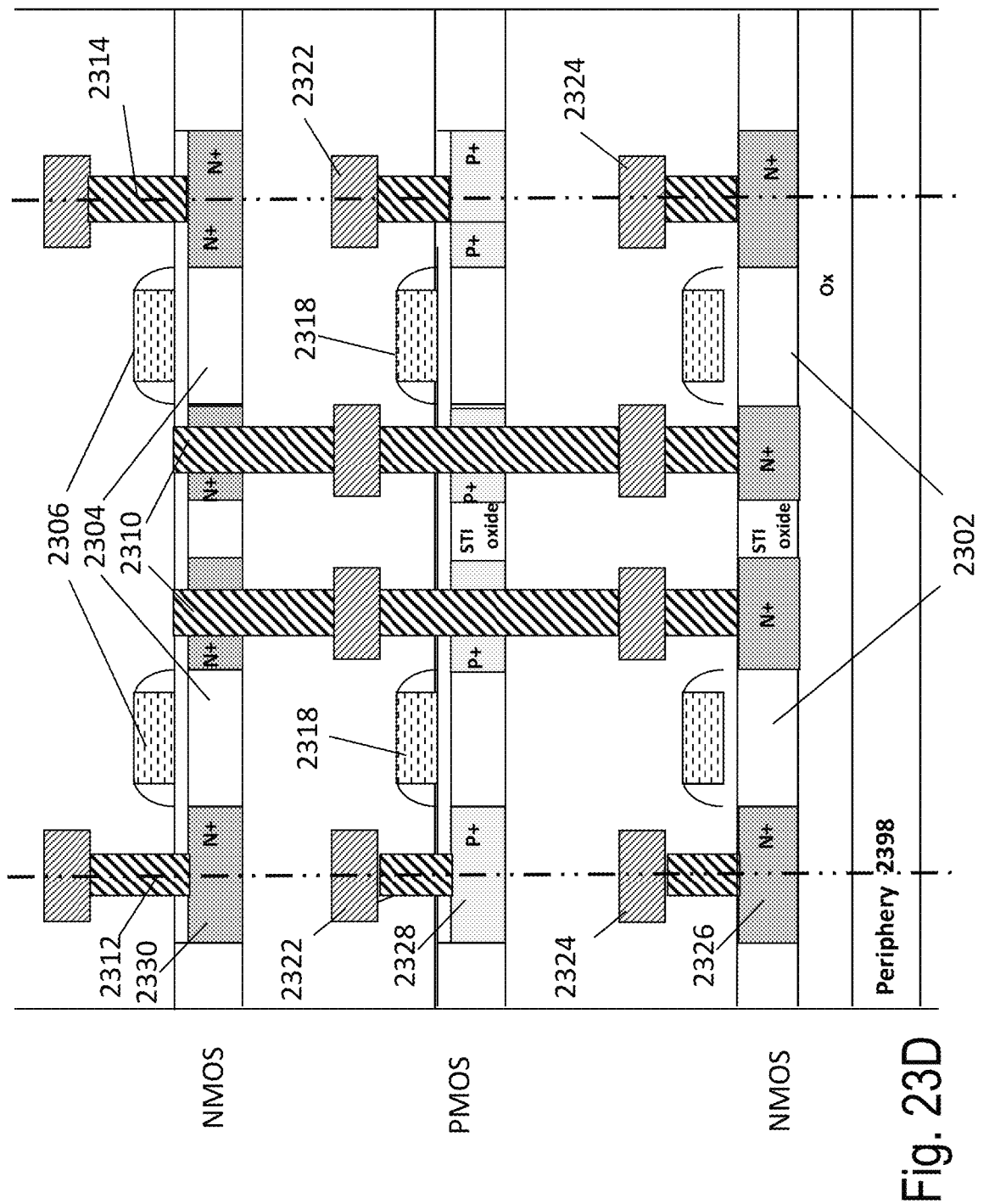

FIG. 23D shows another cross-sectional view of the SRAM according to an embodiment of the current invention. The nodes n1 and n2 may be connected to pull-up, pull-down and pass transistors by using a vertical via 2310. 2326 is a heavily doped n+ Si region of the pull-down transistor, 2328 is a heavily doped p+ Si region of the pull-up transistor and 2330 is a heavily doped n+ region of a pass transistor. Other symbols have been described previously in respect of FIG. 23A, FIG. 23B and FIG. 23C. Wiring may connect together different elements of the SRAM as shown in FIG. 23A.

It can be seen that the SRAM cell shown in FIG. 23A-D is small in terms of footprint compared to a standard 6 transistor SRAM cell. Previous work has suggested building six-transistor SRAMs with nMOS and pMOS devices on different layers with layouts similar to the ones described in FIG. 23A-D. These are described in "The revolutionary and truly 3-dimensional 25F² SRAM technology with the smallest S³ (stacked single-crystal Si) cell, 0.16 um², and SSTFT (stacked single-crystal thin film transistor) for ultra high density SRAM," VLSI Technology, 2004, Digest of Technical Papers, 2004 Symposium on, vol., no., pp. 228-229, 15-17 Jun. 2004 by Soon-Moon Jung; Jachoon Jang; Wonscok Cho; Jachwan Moon; Kunho Kwak; Bonghyun Choi; Byungjun Hwang; Hoon Lim; Jachun Jeong; Jonghyuk Kim; Kinam Kim. However, these devices are constructed using selective epi technology, which suffers from defect issues. These defects severely impact SRAM operation. The embodiment of this invention described in FIG. 23A-D is constructed with ion-cut technology and is thus far less prone to defect issues compared to selective epi technology.

It is clear to one skilled in the art that other techniques described in this patent application, such as use of junction-less transistors or recessed channel transistors, could be utilized to form the structures shown in FIG. 23A-D. Alternative layouts for 3D stacked SRAM cells are possible as well, where heavily doped silicon regions could be utilized as GND, VDD, bit line wiring and bit line complement wiring. For example, the region 2326 (in FIG. 23D), instead of serving just as a source or drain of the pull-down transistor, could also run all along the length of the memory array and serve as a GND wiring line. Similarly, the heavily doped p+ Si region 2328 (in FIG. 23D), instead of serving just as a source or drain of the pull-up transistor, could run all along the length of the memory array and serve as a VDD wiring line. The heavily doped n+ region 2330 could run all along the length of the memory array and serve as a bit line.

Figures 24, 25:
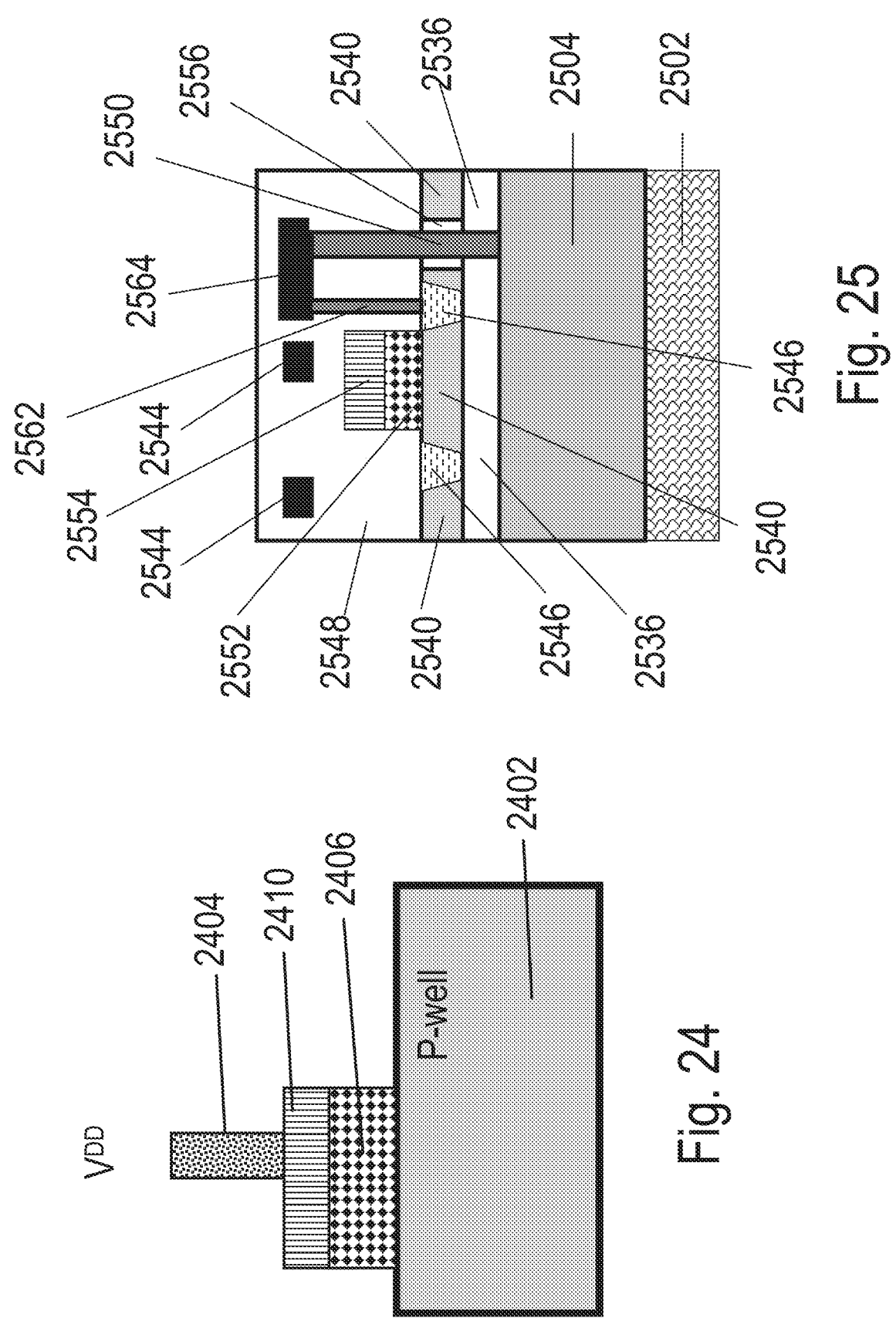
FIG. 24 is a drawing illustration of a type of thermal contact structure which may be used as a decoupling capacitor.
FIG. 25 is a drawing illustration of a technique that could reduce heat-up of transistors fabricated on silicon-on-insulator (SOI) substrates.

FIG. 24 describes an embodiment of the invention, wherein a type of thermal contact structure is illustrated. The embodiment shown in FIG. 24 could also function as a decoupling capacitor to mitigate power supply noise. It could consist of a thermal contact 2404, an electrode 2410, a dielectric 2406 and P-well 2402. The dielectric 2406 may be electrically insulating, and could be optimized to have high thermal conductivity. Dielectric 2406 could be formed of materials, such as, for example, hafnium oxide, silicon dioxide, other high k dielectrics, carbon, carbon based material, or various other dielectric materials with electrical conductivity below 1 Nano-amp per square micron. Further information may be found in at least FIG. 5 and FIG. 6 of U.S. Pat. No. 8,674,470, the entire contents of the patent are incorporated by reference.

FIG. 25 illustrates an embodiment of the invention that describes a technique that could reduce heat-up of transistors fabricated on silicon-on-insulator (SOI) substrates. SOI substrates have a buried oxide (BOX) or other insulator between the silicon transistor regions and the heat sink. This BOX region may have a high thermal resistance, and makes heat transfer from the transistor regions to the heat sink difficult. The nMOS transistor in SOI may include buried oxide regions 2536, BEOL metal insulator regions 2548, and STI insulator regions 2556, such as silicon dioxide. The nMOS transistor in SOI may include n+ silicon regions 2546, p− silicon regions 2540, gate dielectric region 2552, gate electrode region 2554, interconnect wiring regions 2544, and highly doped silicon substrate 2504. Use of silicon-on-insulator (SOI) substrates may lead to low heat transfer from the transistor regions to the heat removal apparatus 2502 through the buried oxide regions 2536 (generally a layer) that may have low thermal conductivity. The ground contact 2562 of the nMOS transistor shown in FIG. 25 can be connected to the ground distribution network wiring 2564 which in turn can be connected with a low thermal resistance connection 2550 to highly doped silicon substrate 2504. This enables low thermal conductivity, a thermal conduction path, between the transistor shown in FIG. 25 and the heat removal apparatus 2502. While FIG. 25 described how heat could be transferred among an nMOS transistor and the heat removal apparatus, similar approaches can also be used for pMOS transistors, and many other transistors, for example, FinFets, BJTs, HEMTs, and HBTs. Many of the aforementioned transistors may be constructed as fully depleted channel devices. The heat removal apparatus 2502 may include an external surface from which heat transfer may take place by methods such as air cooling, liquid cooling, or attachment to another heat sink or heat spreader structure.

Figure 26:
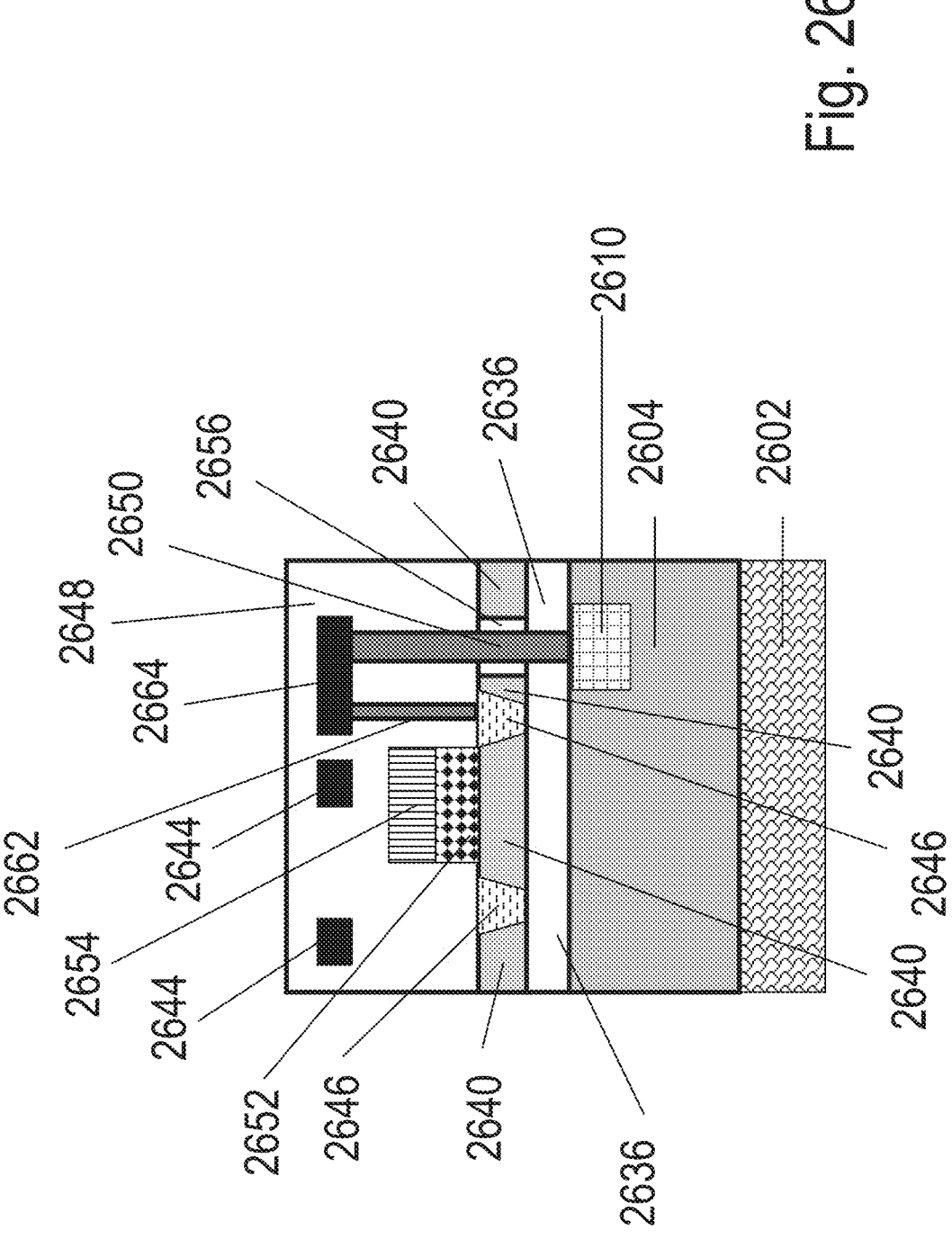
FIG. 26 is a drawing illustration of an additional technique that could reduce heat-up of transistors fabricated on silicon-on-insulator (SOI) substrates.

FIG. 26 illustrates an embodiment of the invention which describes a technique that could reduce heat-up of transistors fabricated on silicon-on-insulator (SOI) substrates. The nMOS transistor in SOI may include buried oxide regions 2636, BEOL metal insulator regions 2648, and STI insulator regions 2656, such as silicon dioxide. The nMOS transistor in SOI may include n+ silicon regions 2646, p− silicon regions 2640, gate dielectric region 2652, gate electrode region 2654, interconnect wiring regions 2644, and highly doped silicon substrate 2604. Use of silicon-on-insulator (SOI) substrates may lead to low heat transfer from the transistor regions to the heat removal apparatus 2602 through the buried oxide regions 2636 (generally a layer) that may have low thermal conductivity. The ground contact 2662 of the nMOS transistor shown in FIG. 26 can be connected to the ground distribution network 2664 which in turn can be connected with a low thermal resistance connection 2650 to highly doped silicon substrate 2604 through an implanted and activated region 2610. The implanted and activated region 2610 could be such that thermal contacts similar to those in FIG. 6 of U.S. Pat. No. 8,674,470 can be formed. This may enable low thermal conductivity, a thermal conduction path, between the transistor shown in FIG. 26 and the heat removal apparatus 2602. This thermal conduction path, whilst thermally conductive, may not be electrically conductive (due to the reverse biased junctions that could be constructed in the path), and thus, not disturb the circuit operation. While FIG. 26 described how heat could be transferred among the nMOS transistor and the heat removal apparatus, similar approaches can also be used for pMOS transistors, and other transistors, for example, FinFets, BJTs, HEMTs, and HBTs.

It will also be appreciated by persons of ordinary skill in the art that the invention is not limited to what has been particularly shown and described hereinabove. For example, drawings or illustrations may not show n or p wells for clarity in illustration. Moreover, transistor channels illustrated or discussed herein may include doped semiconductors, but may instead include undoped semiconductor material. Further, any transferred layer or donor substrate or wafer preparation illustrated or discussed herein may include one or more undoped regions or layers of semiconductor material. Moreover, although the insulator between the stacked crystalline layers is identified as silicon oxide, other dielectrics may be utilized such as, for example, a low-k dielectric, carbon containing silicon oxides. Further, contacts may be formed, for example, as sidewall structures or end-wall structures, with various overlaps as required by the process and layout. Furthermore, the wiring of the peripheral circuits may be done using a lower melting point metal than tungsten, for example copper, and care taken not to exceed a damaging temperature during processing and may employ optical annealing. Rather, the scope of the invention includes both combinations and sub-combinations of the various features described herein above as well as modifications and variations which would occur to such skilled persons upon reading the foregoing description. Thus the invention is to be limited only by the appended claims.

I claim:

1. A 3D semiconductor device, the device comprising:
a first level comprising single crystal first transistors, a first metal layer, and a first isolation layer;
a second level comprising second transistors and a second isolation layer,
    wherein said first level is overlaid by said second level;
a third level comprising single crystal third transistors,
    wherein said second level is overlaid by said third level,
    wherein said third level comprises a third isolation layer, and
    wherein said third level is bonded to said second level;
a power delivery path to said second transistors,
    wherein at least a portion of said power delivery path is connected to at least one of said first transistors; and
a plurality of capacitors,
    wherein said single crystal first transistors or said second transistors comprise at least two FinFet transistors, and
    wherein two of said at least two FinFet transistors have different threshold voltages (Vt).

2. The device according to claim 1, further comprising:
wherein said plurality of capacitors comprises a configuration as a decoupling capacitor to mitigate power supply noise.

3. The device according to claim 1,
wherein at least one of said second transistors comprises hafnium oxide.

4. The device according to claim 1,
wherein said second level is bonded to said first level.

5. The device according to claim 1,
wherein said second level comprises a plurality of DRAM memory cells.

6. The device according to claim 1,
wherein at least one of said second transistors comprises a two-sided gate.
7. The device according to claim 1,
wherein said first level comprises at least one digital to analog converter circuit.
8. A 3D semiconductor device, the device comprising:
a first level comprising single crystal first transistors, a first metal layer, and a first isolation layer;
a second level comprising second transistors and a second isolation layer,
wherein said first level is overlaid by said second level;
a third level comprising third transistors;
a fourth level comprising a single crystal layer,
wherein said second level is overlaid by said third level,
wherein said third level is overlaid by said fourth level,
wherein said third level comprises a third isolation layer, and
wherein said third level is bonded to said second level; and
a power delivery path to said second transistors,
wherein at least a portion of said power delivery path is connected to at least one of said single crystal first transistors; and
wherein said first level comprises power delivery control for at least one of said second transistors.
9. The device according to claim 8, further comprising:
a plurality of capacitors,
wherein said plurality of capacitors comprises a configuration as a decoupling capacitor to mitigate power supply noise.
10. The device according to claim 8, further comprising:
a thermally conductive path from said second transistors to an external surface of said 3D semiconductor device.
11. The device according to claim 8,
wherein said second level is bonded to said first level.
12. The device according to claim 8,
wherein said second level comprises a plurality of DRAM memory cells.
13. The device according to claim 8,
wherein at least one of said second transistors comprises a two-sided gate.

14. The device according to claim 8,
wherein said first level comprises at least one digital to analog converter circuit.
15. A 3D semiconductor device, the device comprising:
a first level comprising single crystal first transistors, a first metal layer, and a first isolation layer;
a second level comprising second transistors and a second isolation layer,
wherein said first level is overlaid by said second level;
a third level comprising third transistors;
a fourth level comprising a single crystal layer,
wherein said second level is overlaid by said third level,
wherein said third level is overlaid by said fourth level,
wherein said third level comprises a third isolation layer, and
wherein said third level is bonded to said second level; and
a power delivery path to said second transistors,
wherein at least a portion of said power delivery path is connected to at least one of said first transistors,
wherein said second level comprises an array of memory cells,
wherein each of said memory cells comprise at least one of said second transistors, and
wherein said first level comprises control circuits to control data written to said array of memory cells.
16. The device according to claim 15, further comprising:
a plurality of capacitors,
wherein said plurality of capacitors comprises a configuration as a decoupling capacitor to mitigate power supply noise.
17. The device according to claim 15, further comprising:
a thermally conductive path from said second transistors to an external surface of said 3D semiconductor device.
18. The device according to claim 15,
wherein said second level is bonded to said first level.
19. The device according to claim 15, further comprising:
a global power distribution metal layer,
wherein said global power distribution metal layer comprises a metal thickness twice as thick as said first metal layer.
20. The device according to claim 15,
wherein said first level comprises at least one digital to analog converter circuit.

* * * * *